US010804197B1

(12) United States Patent
Kawasaki et al.

(10) Patent No.: US 10,804,197 B1
(45) Date of Patent: Oct. 13, 2020

(54) MEMORY DIE CONTAINING STRESS REDUCING BACKSIDE CONTACT VIA STRUCTURES AND METHOD OF MAKING THE SAME

(71) Applicant: SANDISK TECHNOLOGIES LLC, Addison, TX (US)

(72) Inventors: Motoki Kawasaki, Yokkaichi (JP); Arata Okuyama, Nagoya (JP); Xun Gu, Yokkaichi (JP); Kengo Kajiwara, Yokkaichi (JP); Jixin Yu, Milpitas, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/516,726

(22) Filed: Jul. 19, 2019

Related U.S. Application Data

(63) Continuation-in-part of application No. 16/367,455, filed on Mar. 28, 2019, now Pat. No. 10,658,381.

(51) Int. Cl.
*H01L 27/11582* (2017.01)
*H01L 23/522* (2006.01)
(Continued)

(52) U.S. Cl.
CPC ...... *H01L 23/5226* (2013.01); *H01L 27/1157* (2013.01); *H01L 27/11519* (2013.01);
(Continued)

(58) Field of Classification Search
CPC ............................................... H01L 27/11582
See application file for complete search history.

(56) References Cited

U.S. PATENT DOCUMENTS 5,915,167 A 6/1999 Leedy
9,230,984 B1 1/2016 Takeguchi
(Continued)

FOREIGN PATENT DOCUMENTS

JP 06082819 A 3/1994

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Peniel M Gumedzoe
*Assistant Examiner* — Christopher A Johnson
(74) *Attorney, Agent, or Firm* — The Marbury Law Group PLLC

(57) ABSTRACT

A three-dimensional memory device includes a pair of alternating stacks of insulating layers and electrically conductive layers located over a semiconductor region, and laterally spaced from each other by a backside trench, memory stack structures extending through the pair of alternating, each memory stack structure containing a vertical semiconductor channel and a memory film, and a backside contact assembly located in the backside trench. The backside contact assembly includes an isolation dielectric spacer contacting the pair of alternating stacks, a conductive liner contacting inner sidewalls of the isolation dielectric spacer and a top surface of the semiconductor region, and composite non-metallic core containing at least one outer dielectric fill material portion that is laterally enclosed by a lower portion of the conductive liner and a dielectric core contacting an inner sidewall of the at least one outer dielectric fill material portion.

19 Claims, 86 Drawing Sheets

(51) Int. Cl.
  *H01L 27/11519* (2017.01)
  *H01L 27/11524* (2017.01)
  *H01L 27/11529* (2017.01)
  *H01L 27/11565* (2017.01)
  *H01L 27/1157* (2017.01)
  *H01L 27/11573* (2017.01)
  *H01L 27/11556* (2017.01)

(52) U.S. Cl.
  CPC .. *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(56) References Cited

U.S. PATENT DOCUMENTS

| | | |
|---|---|---|
| 9,343,358 B1 | 5/2016 | Xu |
| 9,419,135 B2 | 8/2016 | Baenninger et al. |
| 9,437,543 B2 | 9/2016 | Nakada et al. |
| 9,443,861 B1 | 9/2016 | Pachamuthu et al. |
| 9,455,267 B2 | 9/2016 | Zhang et al. |
| 9,524,981 B2 | 12/2016 | Pachamuthu et al. |
| 9,698,223 B2 | 7/2017 | Sharangpani et al. |
| 9,799,671 B2 | 10/2017 | Pachamuthu et al. |
| 9,887,207 B2 | 2/2018 | Zhang et al. |
| 9,917,093 B2 | 3/2018 | Chu et al. |
| 10,103,161 B2 | 10/2018 | Ito et al. |
| 10,242,994 B2 | 3/2019 | Inomata et al. |
| 2016/0049421 A1 | 2/2016 | Zhang et al. |
| 2016/0086969 A1 | 3/2016 | Zhang et al. |
| 2016/0141419 A1 | 5/2016 | Baenninger et al. |
| 2016/0149002 A1 | 5/2016 | Sharangpani et al. |
| 2016/0204117 A1* | 7/2016 | Liu ............... H01L 29/66825 257/324 |
| 2016/0218059 A1* | 7/2016 | Nakada ............ H01L 27/11556 |
| 2016/0300848 A1 | 10/2016 | Pachamuthu et al. |
| 2016/0329343 A1 | 11/2016 | Pachamuthu et al. |
| 2017/0025421 A1 | 1/2017 | Sakakibara et al. |
| 2017/0373078 A1 | 12/2017 | Chu et al. |
| 2017/0373087 A1 | 12/2017 | Ito et al. |
| 2018/0006049 A1 | 1/2018 | Inomata et al. |
| 2018/0011398 A1 | 1/2018 | Tel et al. |
| 2018/0366487 A1 | 12/2018 | Okizumi et al. |
| 2018/0374865 A1 | 12/2018 | Shimabukuro et al. |

OTHER PUBLICATIONS

Nahar, M. et al. "Stress Modulation of Titanium Nitride Thin Films Deposited Using Atomic Layer Deposition," Journal of Vacuum Science & Technology, vol. 35, No. 1 (2016), (Abstract Only). https://avs.scitation.org/doi/abs/10.1116/1.4972859.

Guo, X. et al., "Study on polysilicon resistivity control with nano-scale grain size," Conference: 2013 IEEE 13th International Conference on Nanotechnology (IEEE-NANO), DOI: 10.1109/NANO.2013.6721040, (2013), (Abstract Only). https://www.researchgate.net/publication/269329212_Study_on_polysilicon_resistivity_control_with_nano-scale_grain_size.

Mackenzie, K.D. et al., "Stress Control of Si-Based PECVD Dielectrics," Invited paper presented at 207th Electrochemical Society Meeting, Quebec City Canada, May 2005. Proc. Symp. Silicon Nitride and Silicon Dioxide Thin Insulating Films & Other Emerging Dielectrics VIII, PV2005-01, 148-159, Electrochemical Society, Pennington, NJ (2005).

U.S. Appl. No. 16/249,352, filed Jan. 16, 2019, SanDisk Technologies LLC.

U.S. Appl. No. 16/367,455, Notice of Allowance, dated Jan. 17, 2020, 16pgs.

Notification of Transmittal of the International Search Report and Written Opinion of the International Search Authority for International Patent Application No. PCT/US2019/063597, dated Apr. 5, 2020, 13 pages.

\* cited by examiner

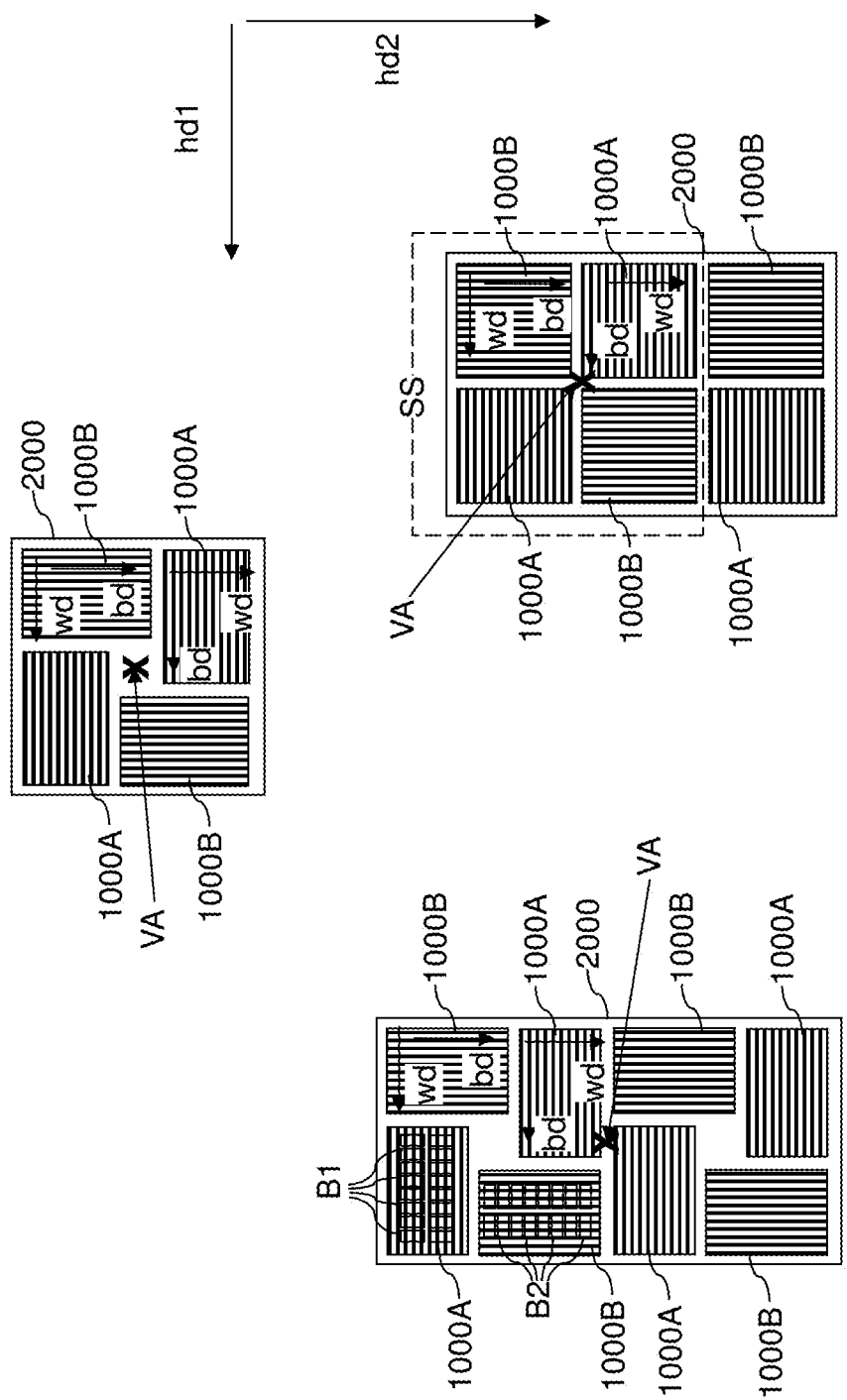

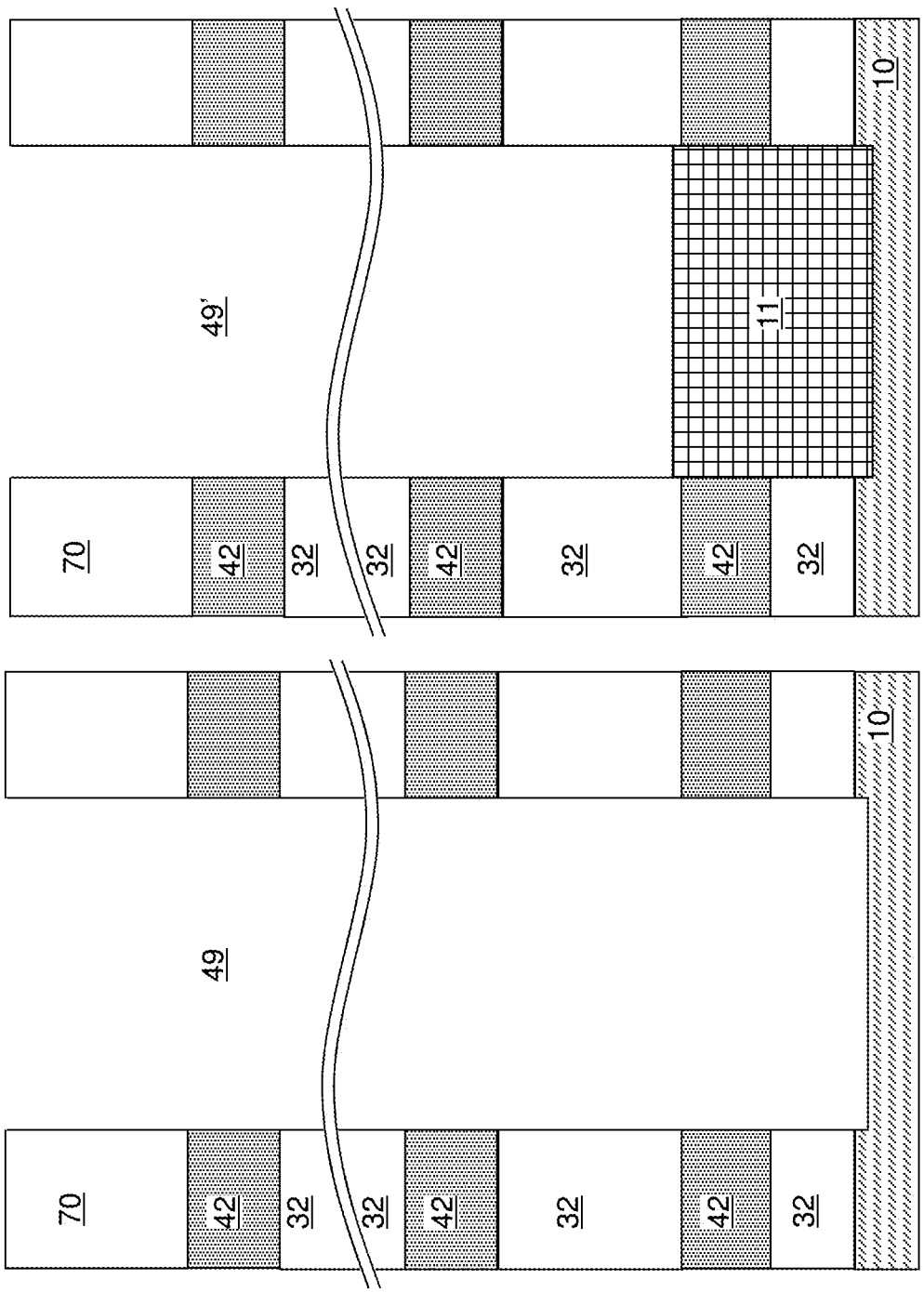

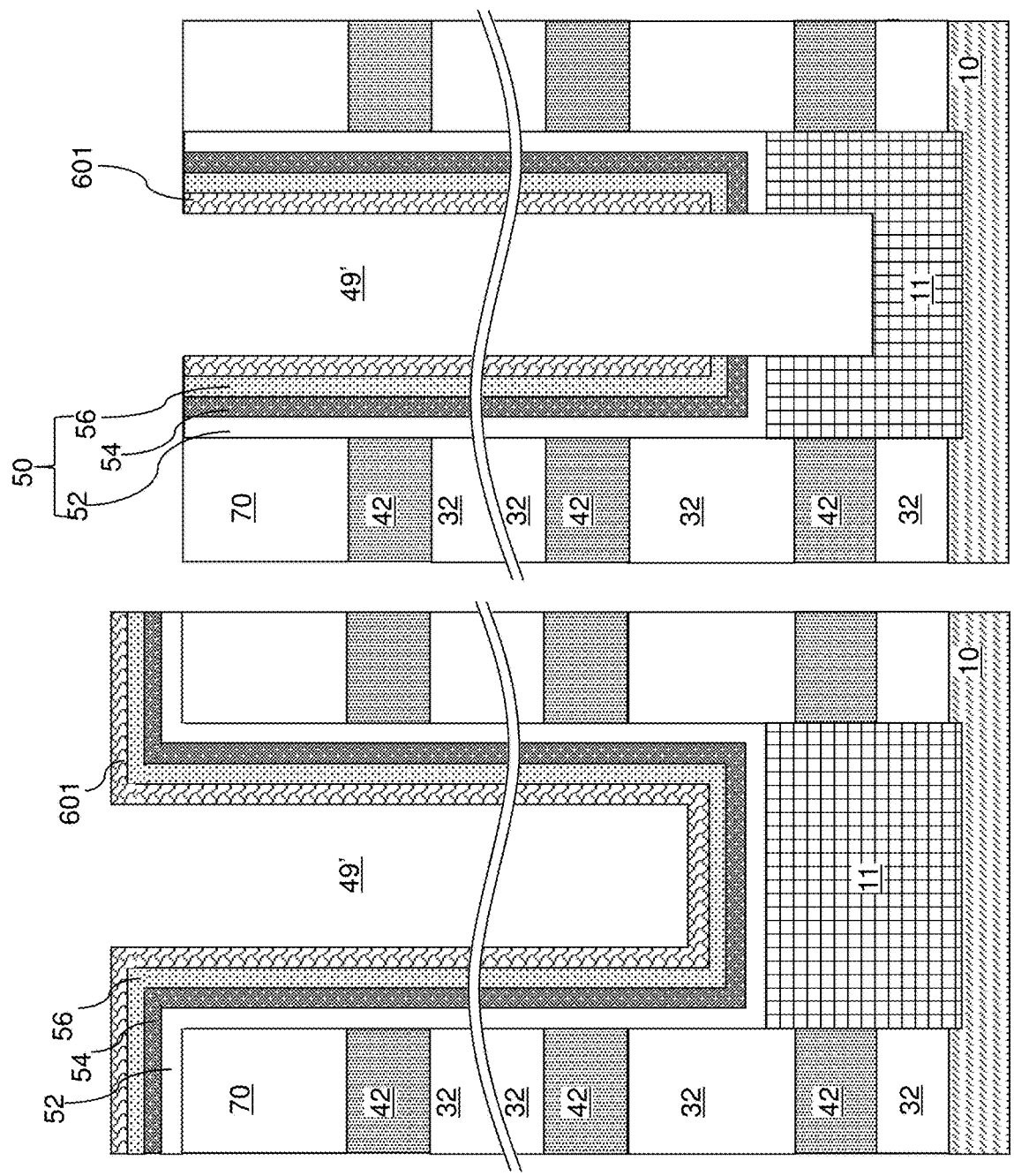

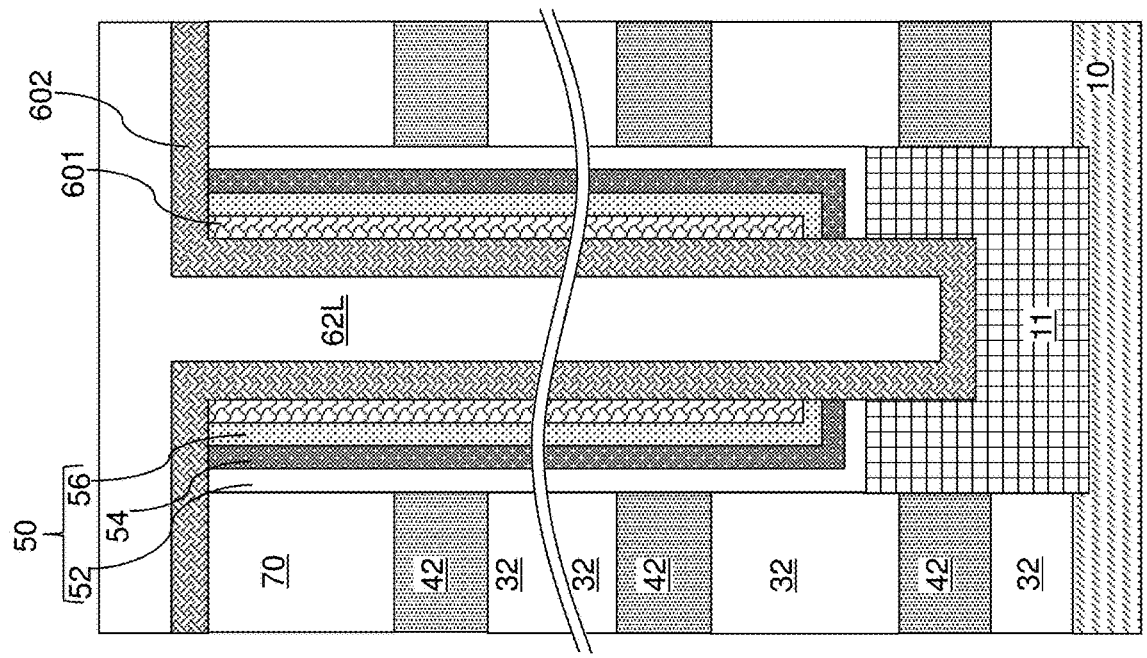
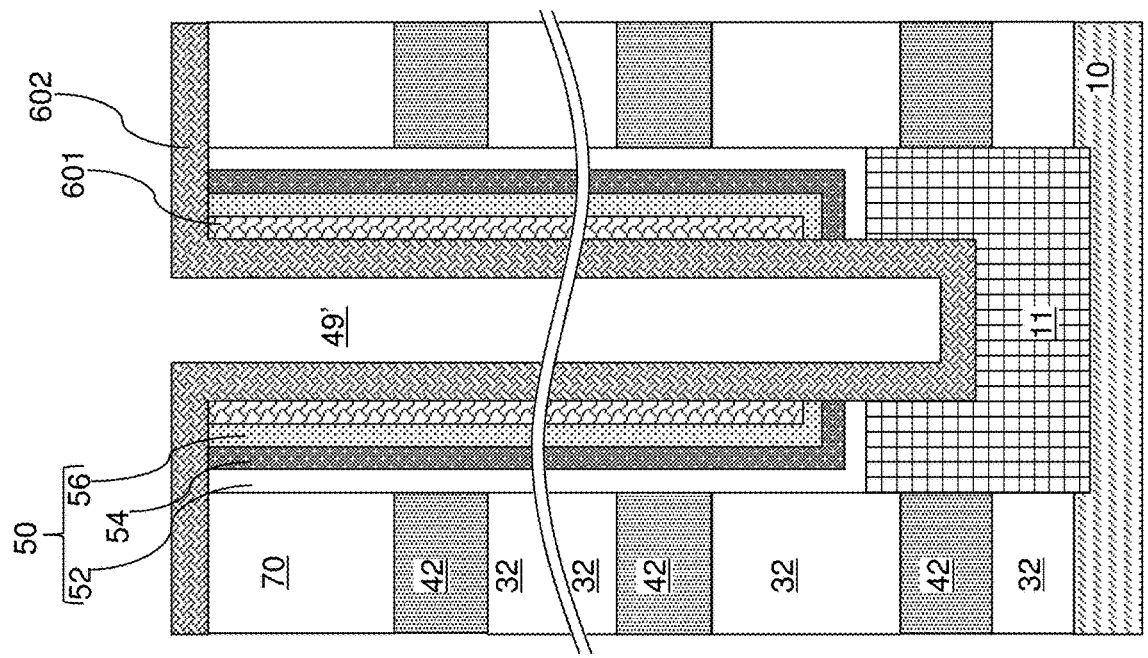

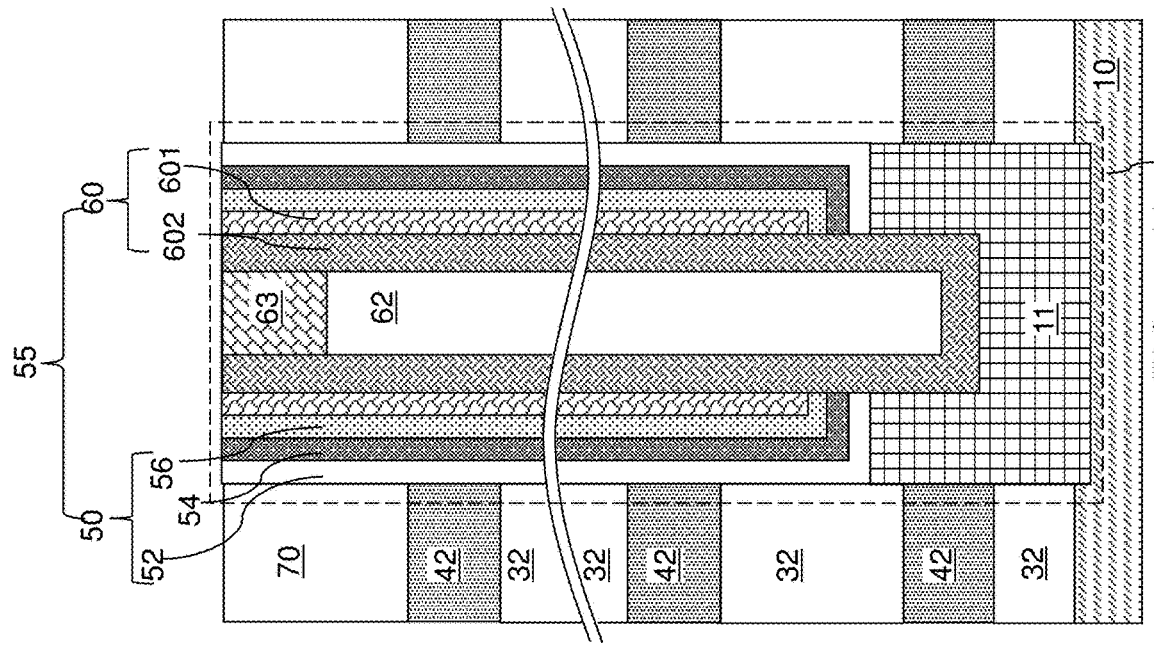
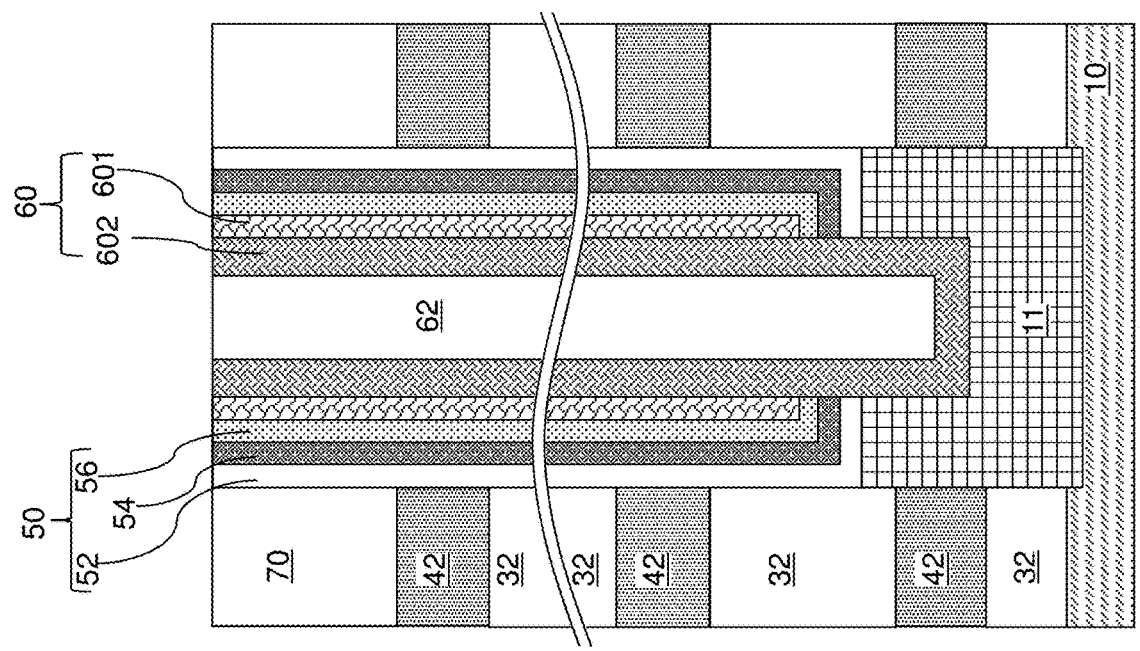

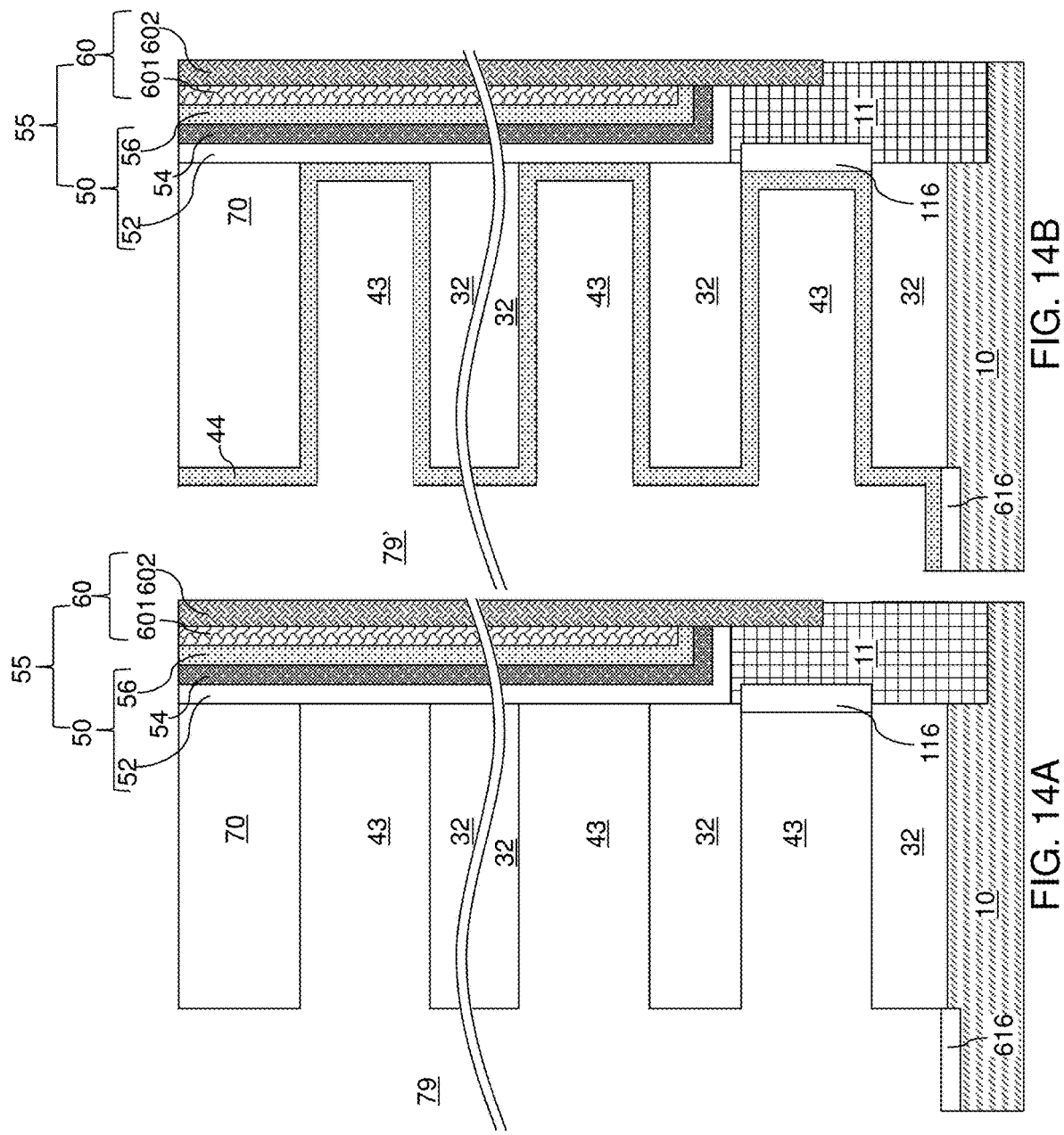

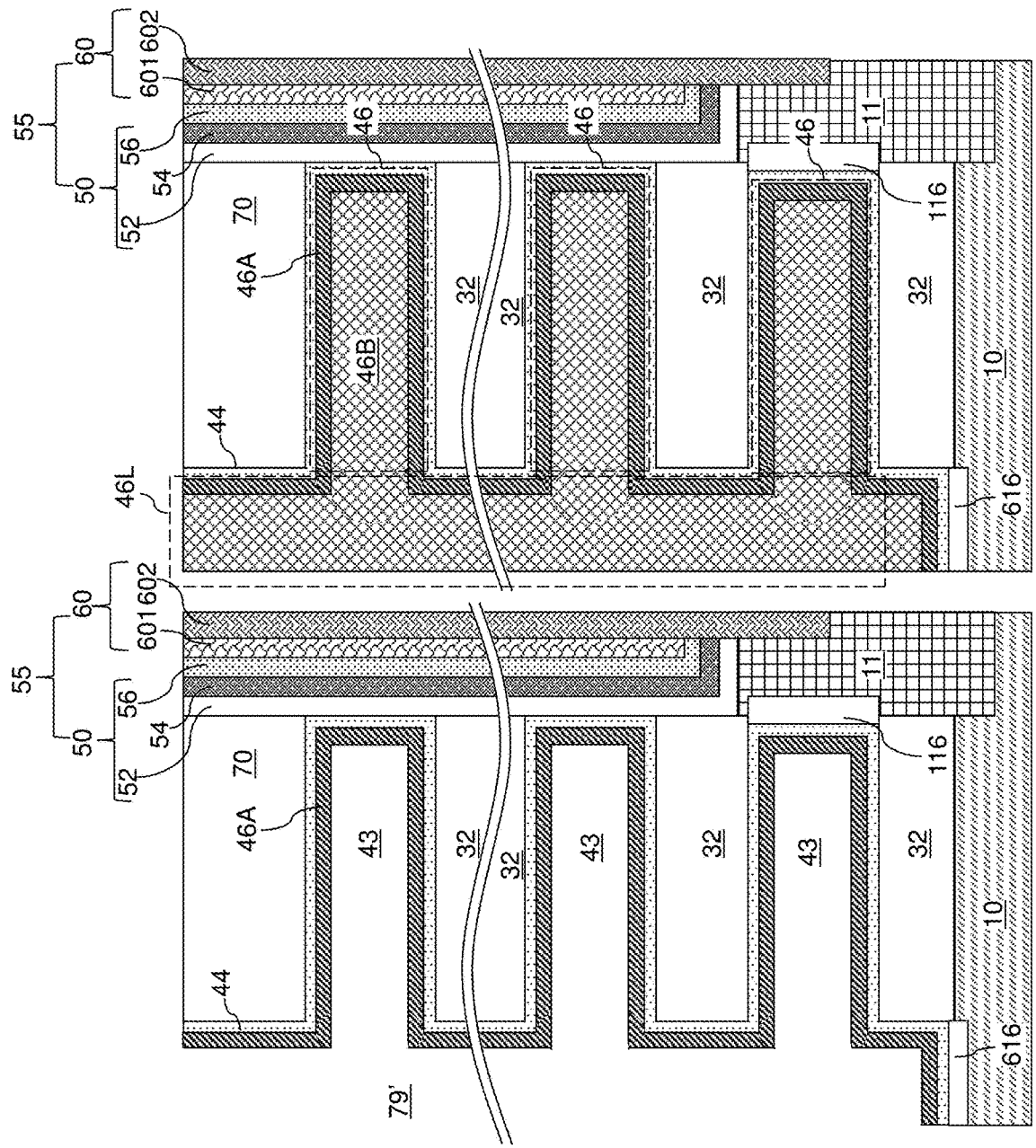

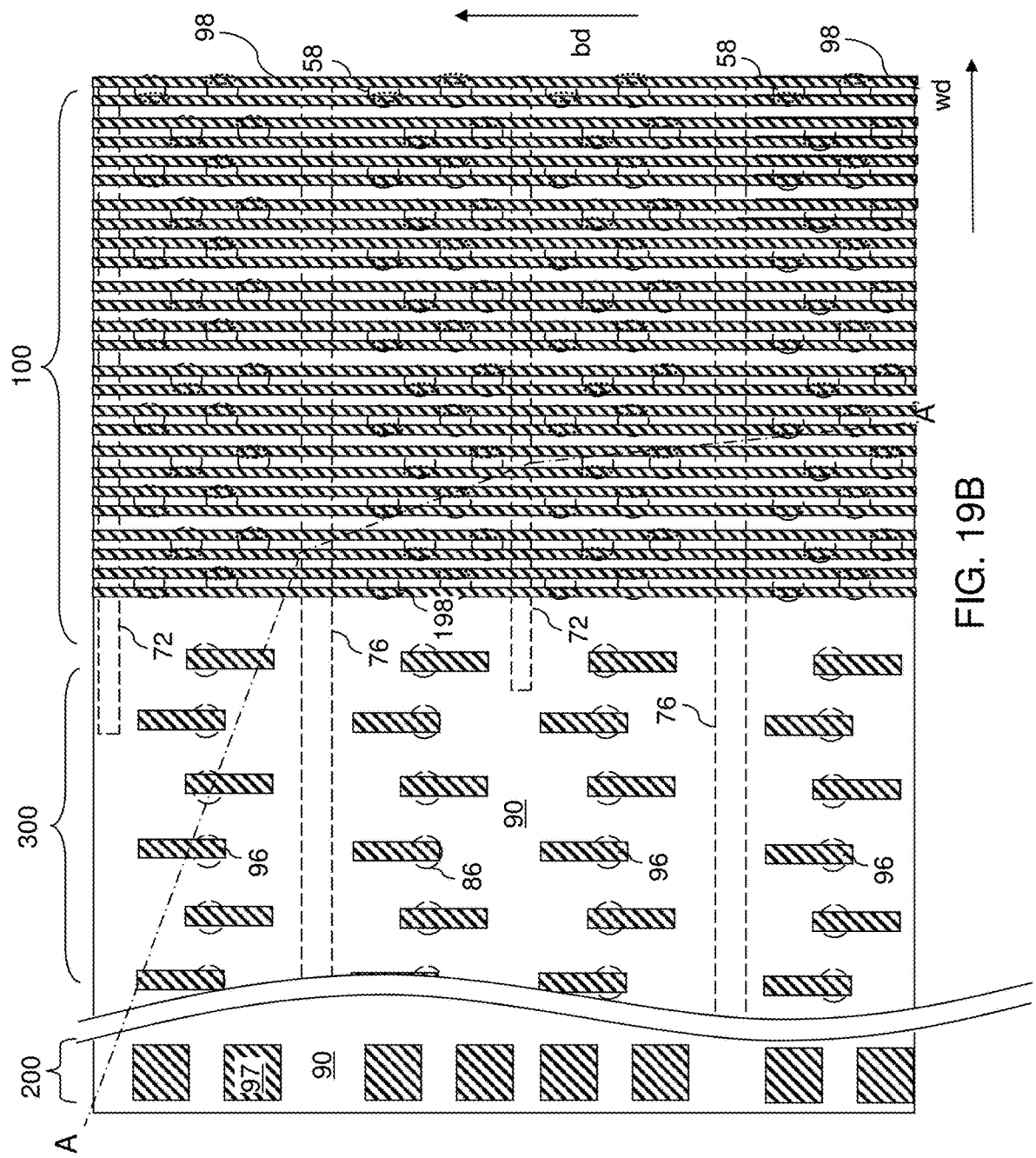

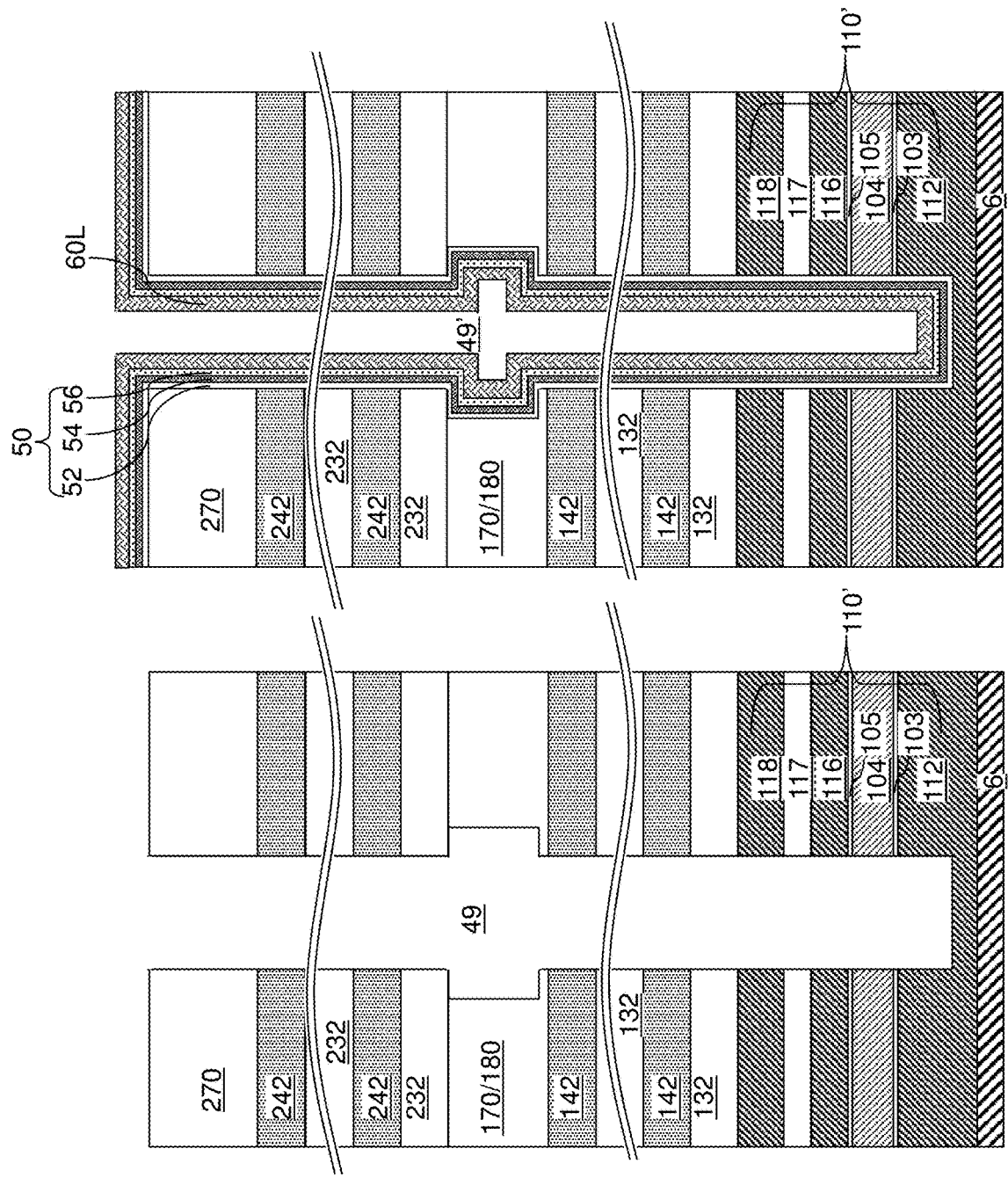

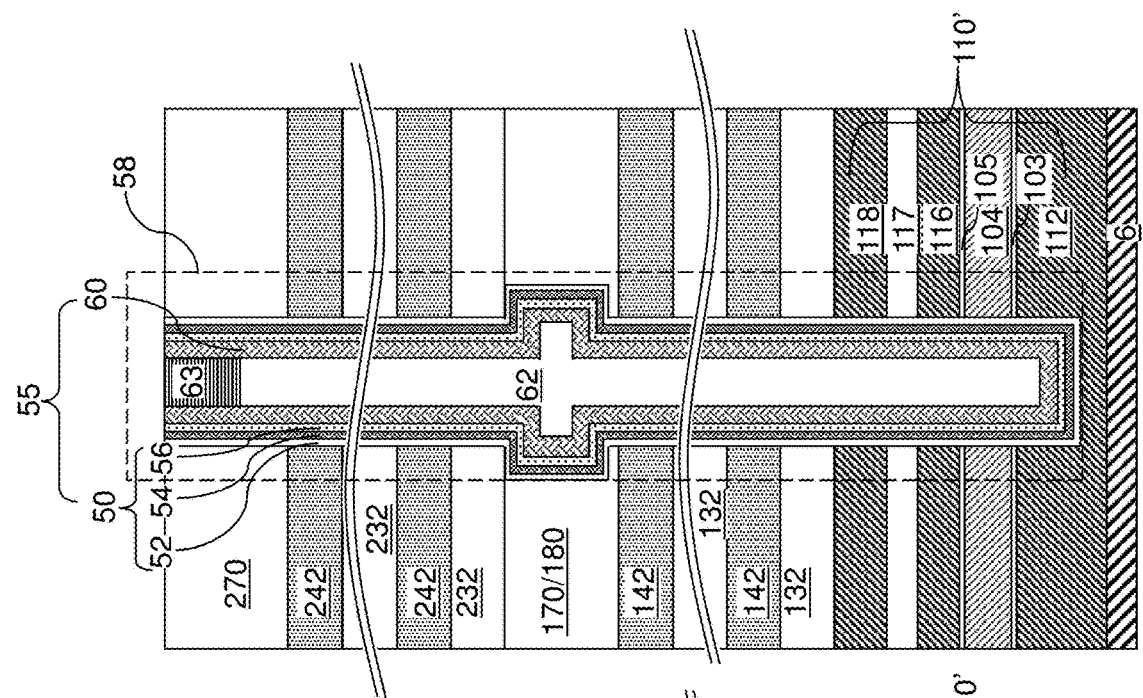
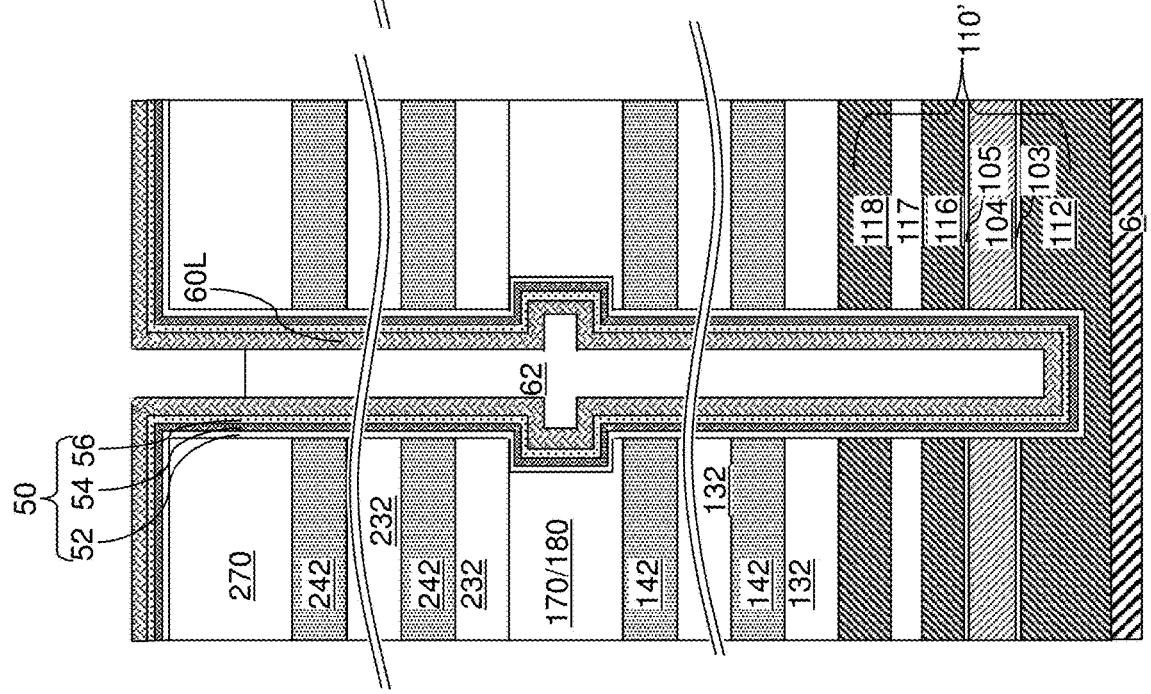

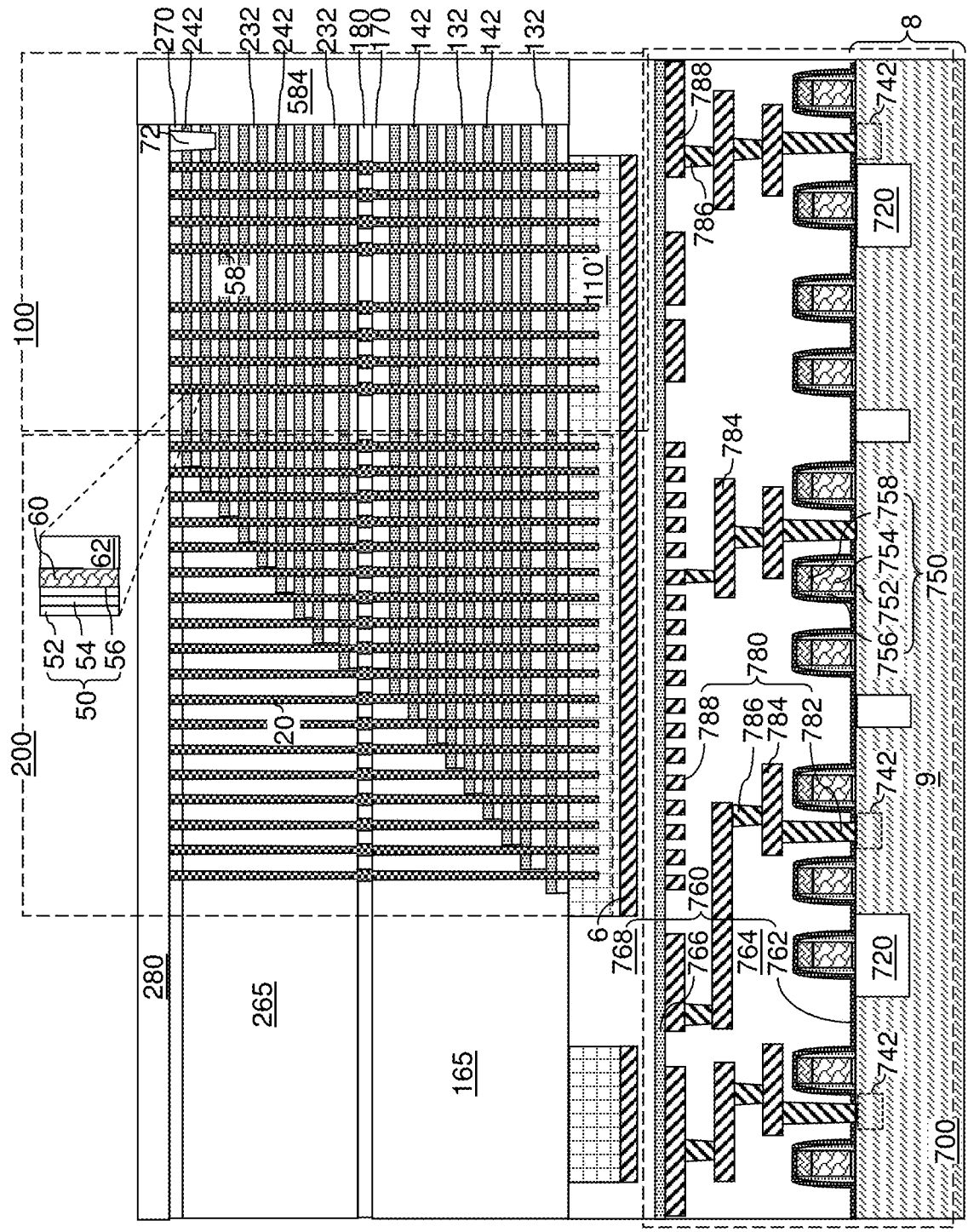

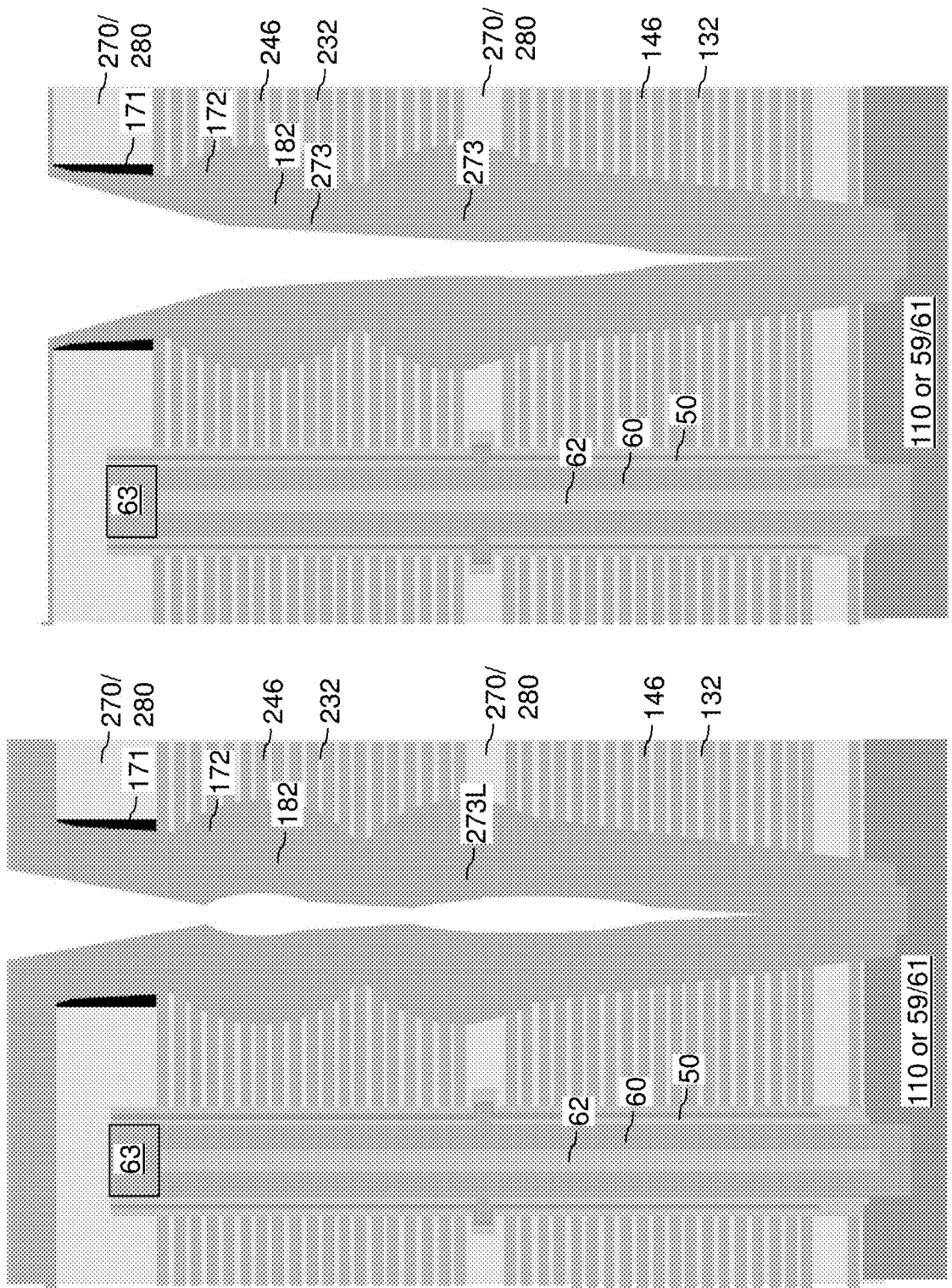

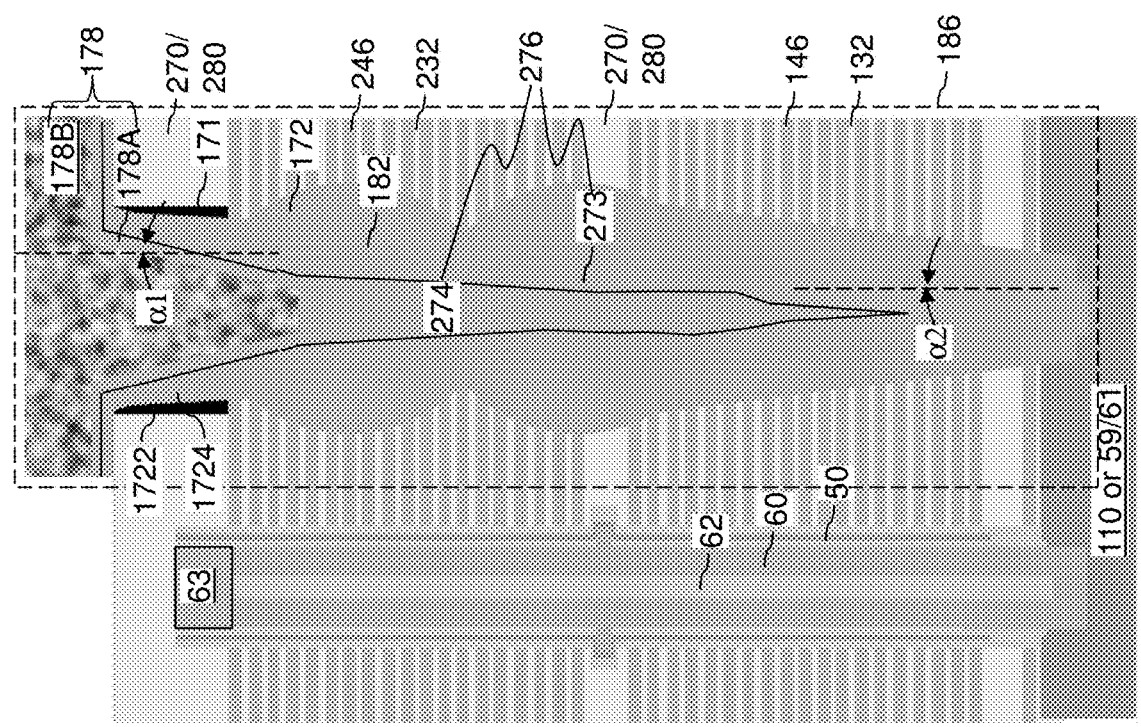

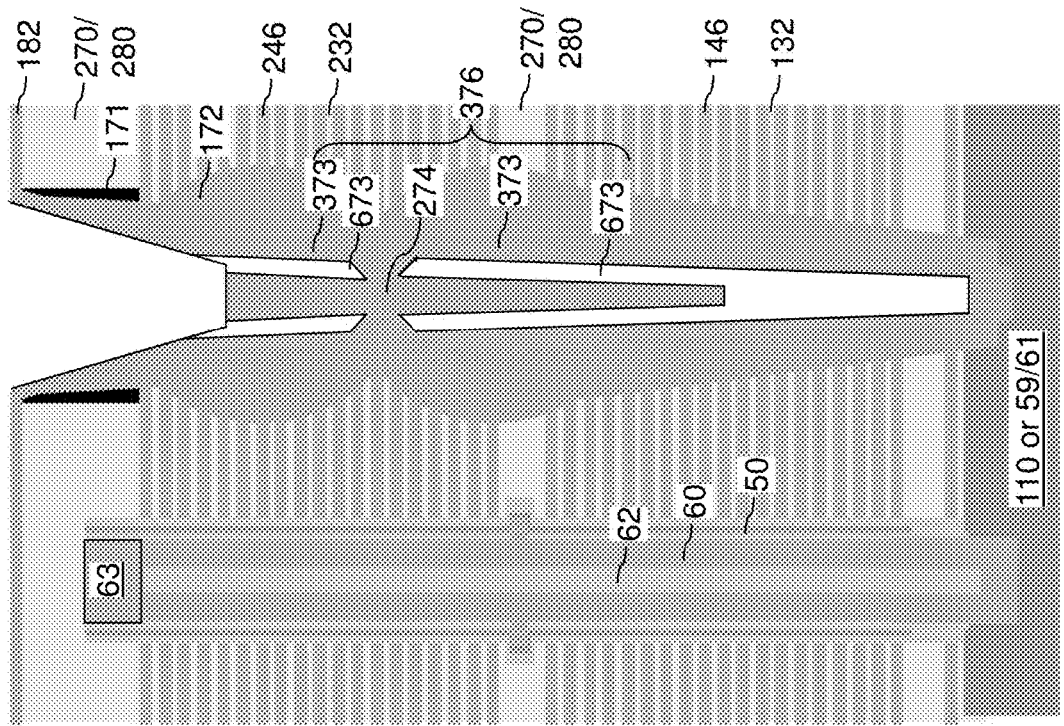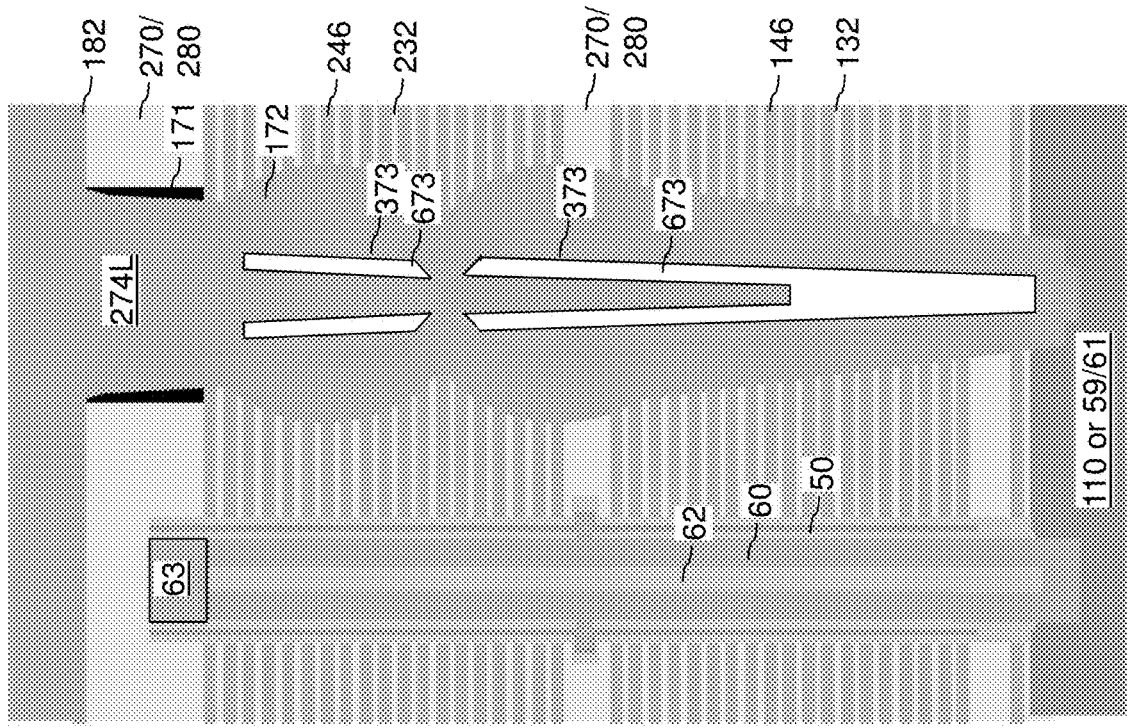

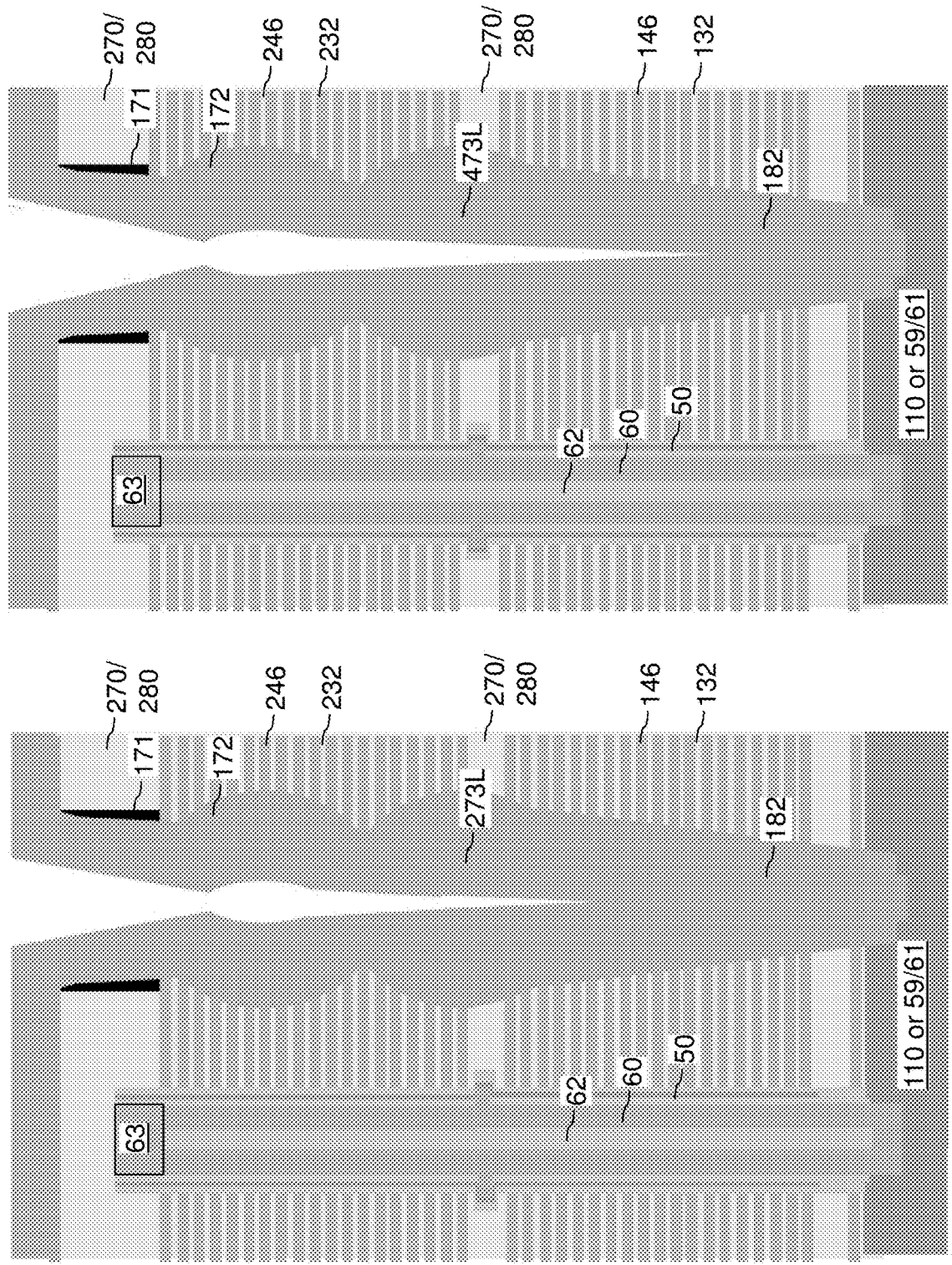

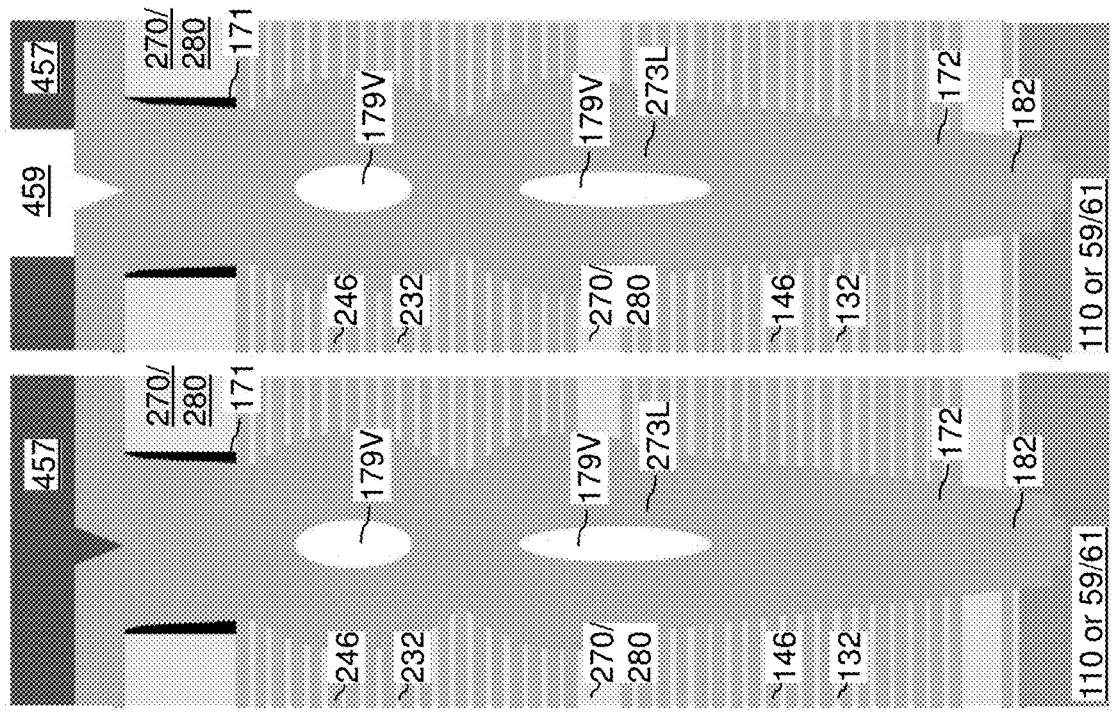
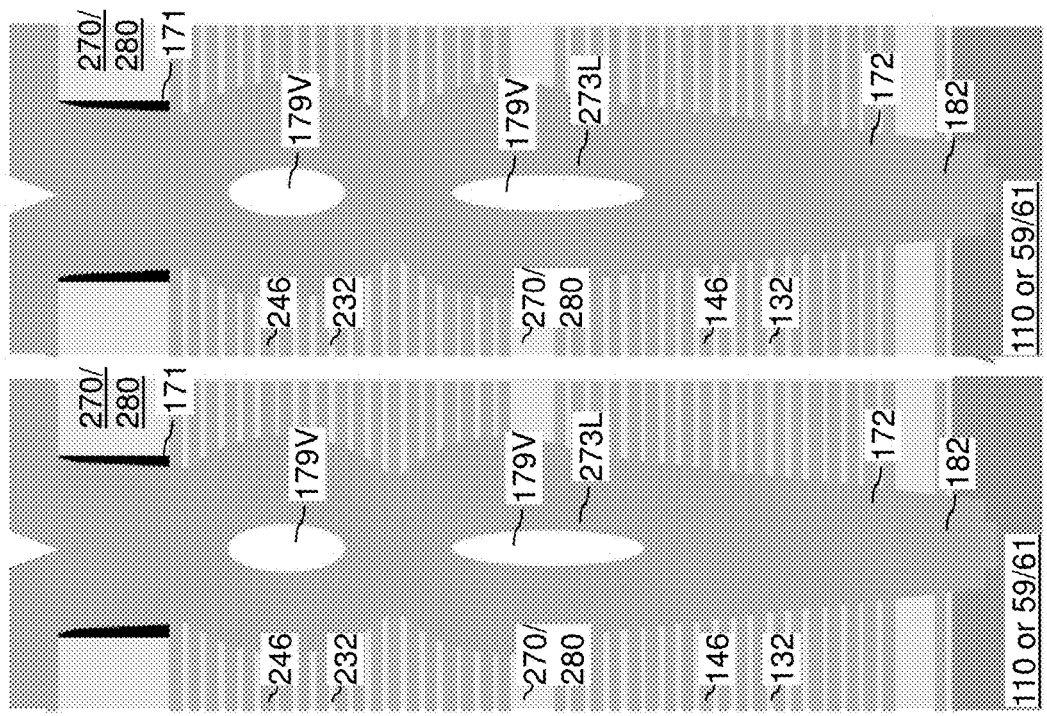

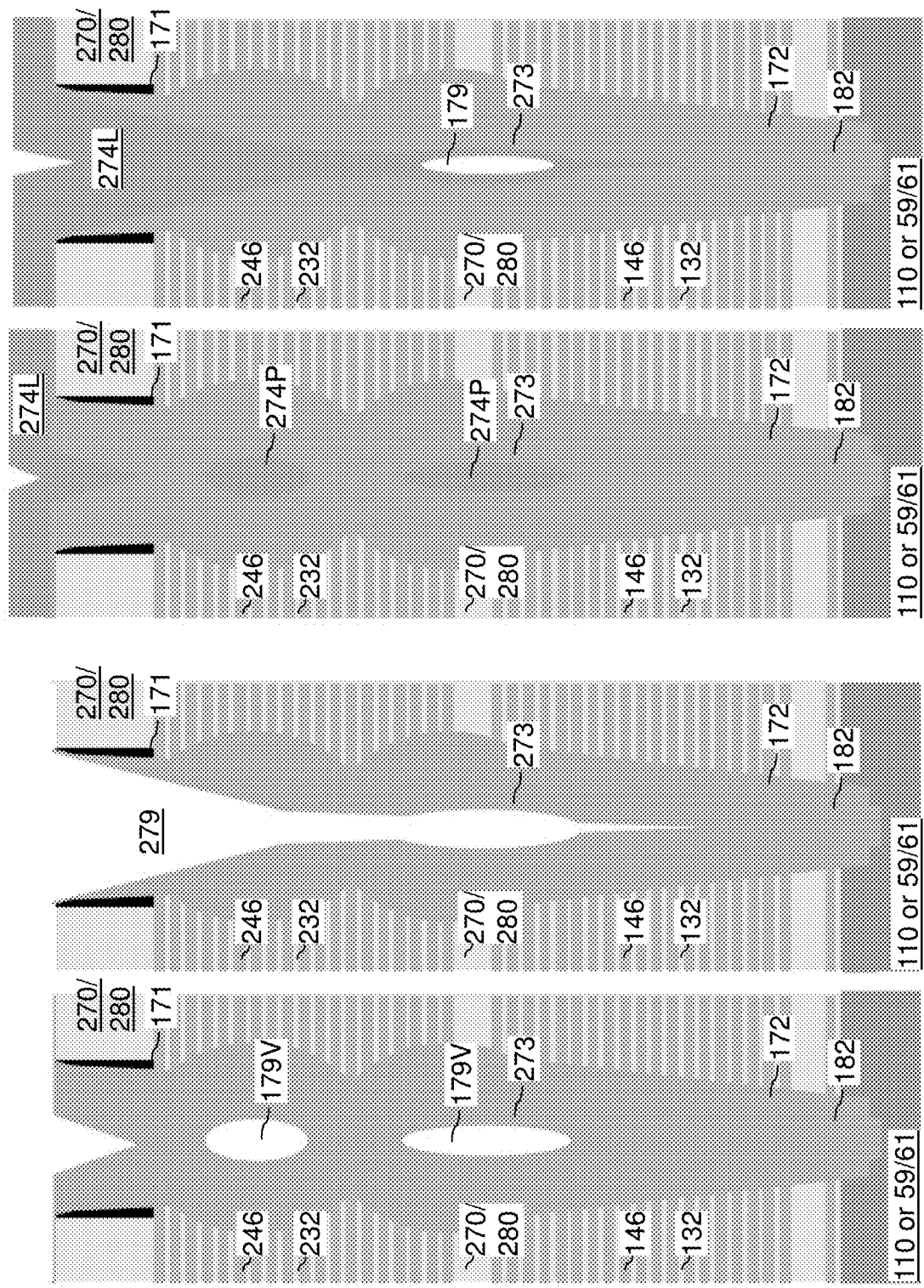

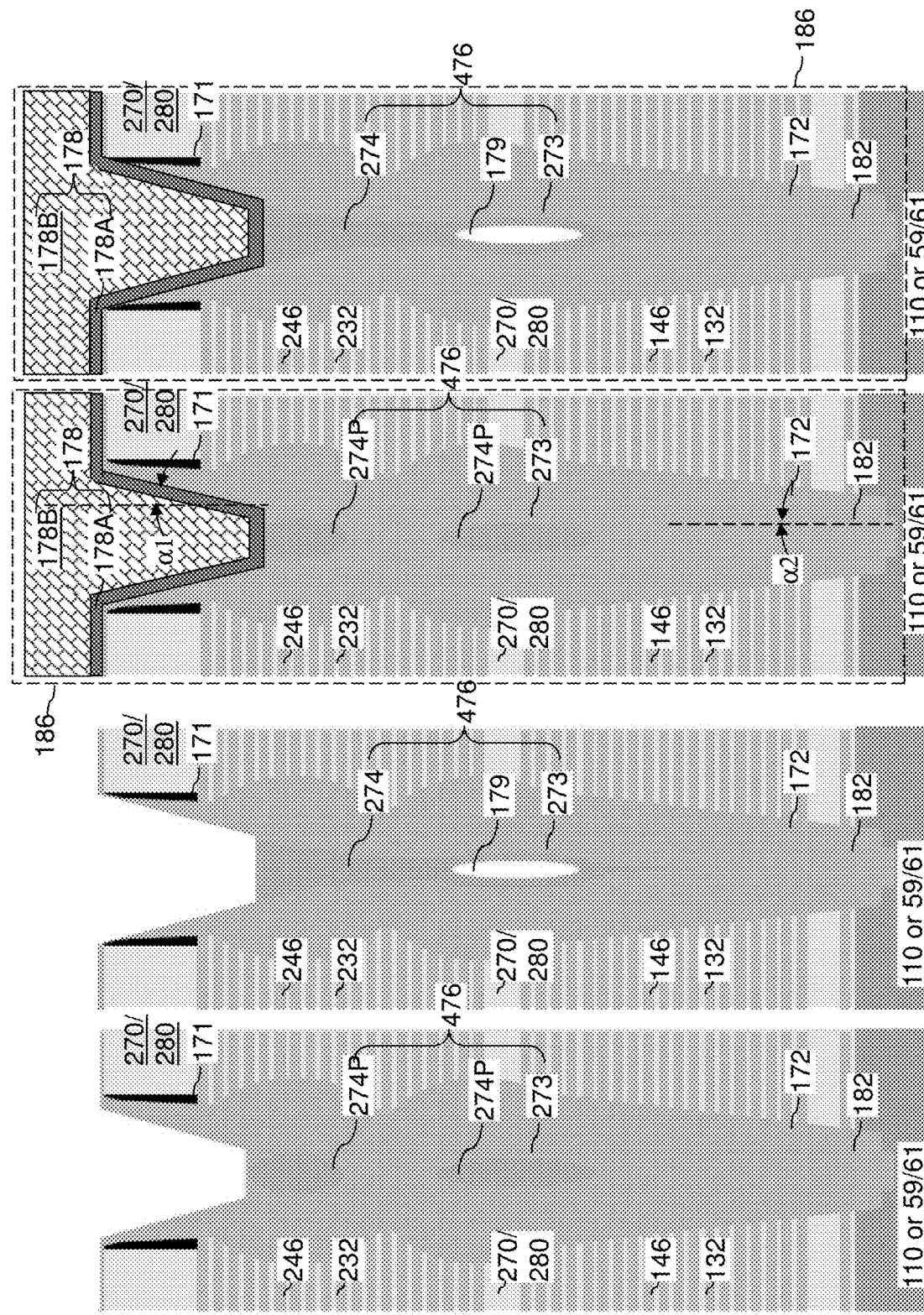

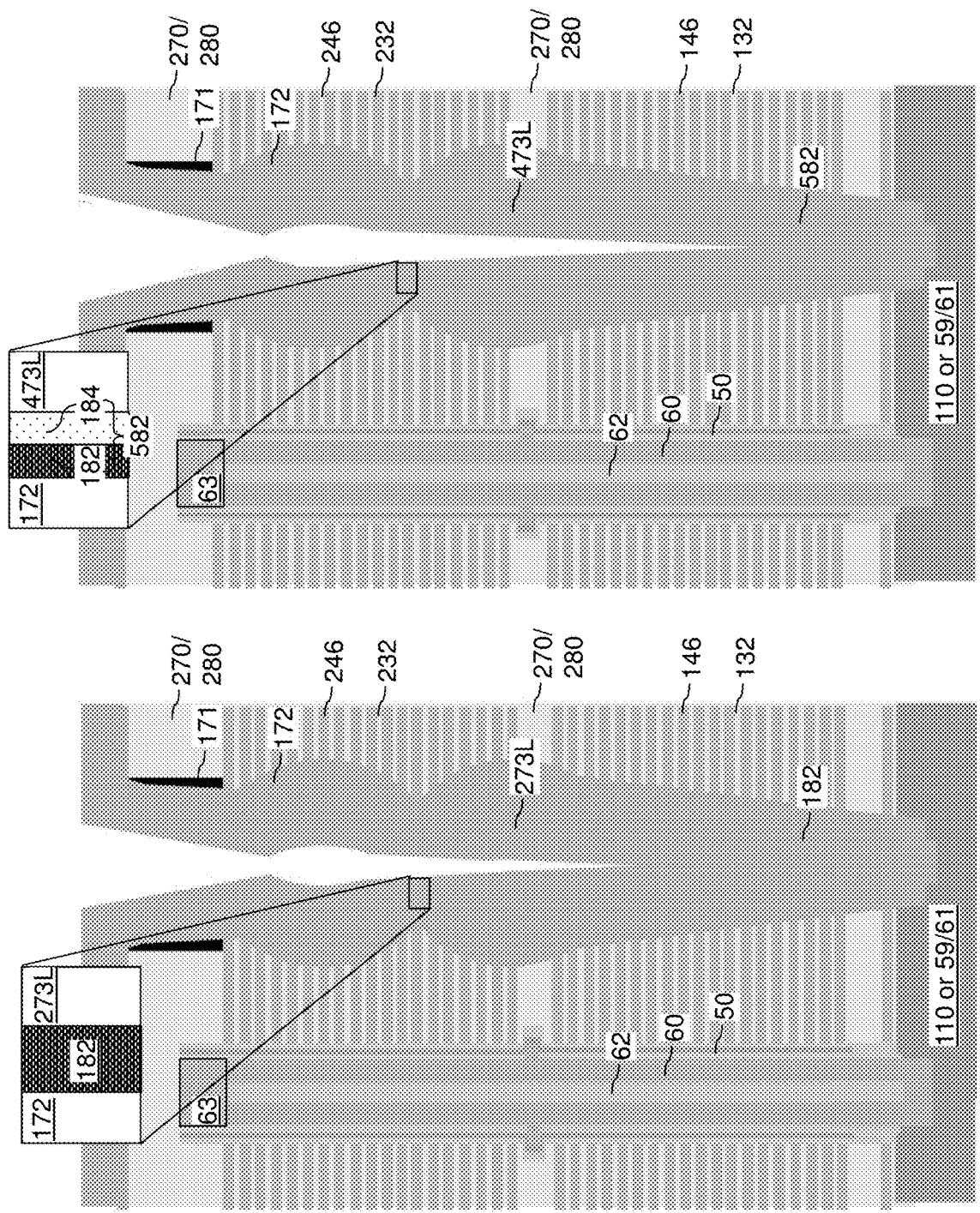

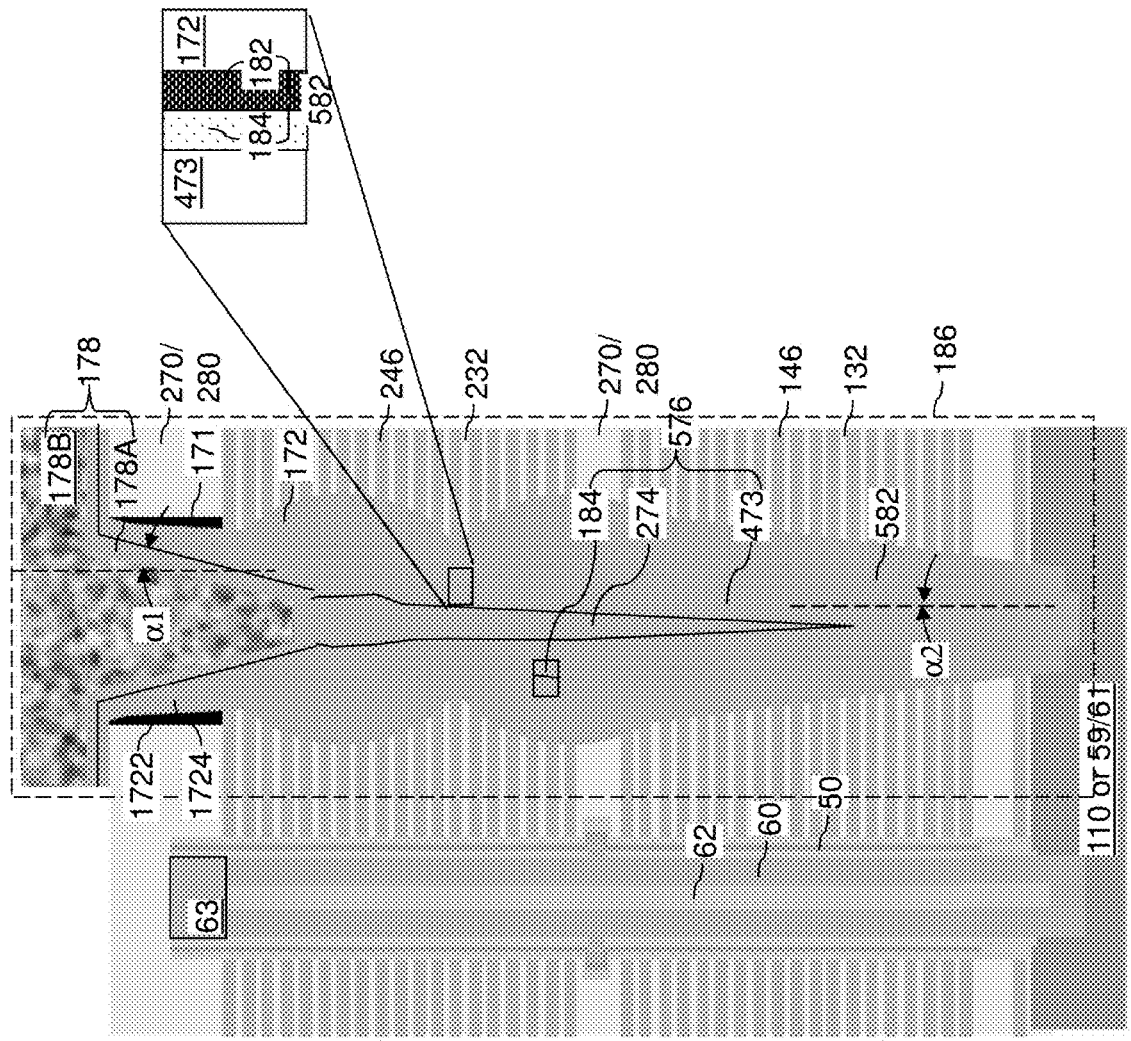

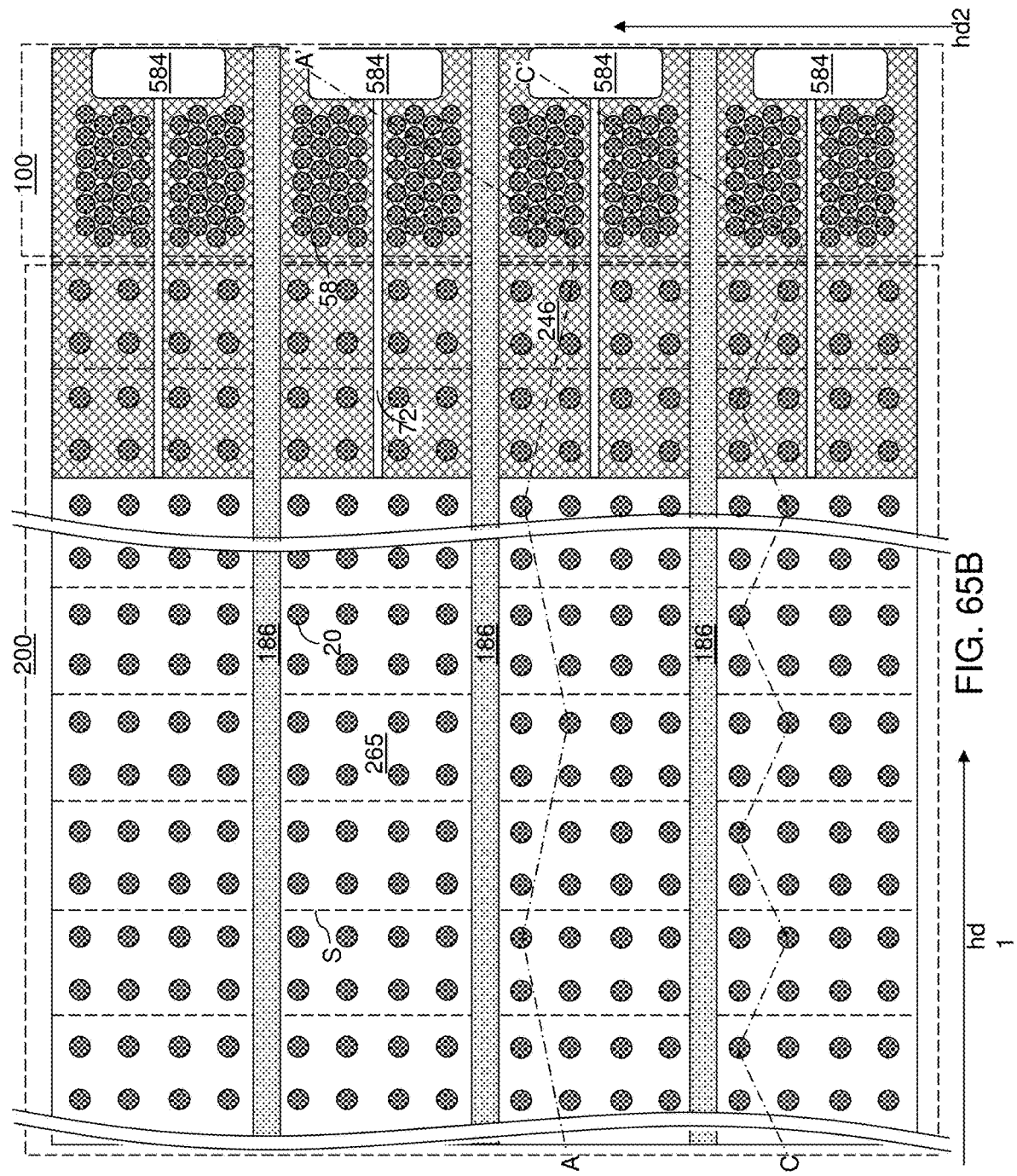

US 10,804,197 B1

MEMORY DIE CONTAINING STRESS REDUCING BACKSIDE CONTACT VIA STRUCTURES AND METHOD OF MAKING THE SAME

RELATED APPLICATIONS

The present application is a continuation-in-part application of U.S. application Ser. No. 16/367,455 filed on Mar. 28, 2019, the entire contents of which are incorporated herein by reference.

FIELD

The present disclosure relates generally to the field of semiconductor devices, and particular to methods for wafer warpage reduction by stress-reducing backside contact via structures in three-dimensional memory devices.

BACKGROUND

A three-dimensional memory device including vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. Memory stack structures may be formed on a semiconductor chip through an alternating stack of insulating layers and electrically conductive layers that function as word lines. Various additional structures vertically extend through the alternating stack. Local variations in the material composition in the memory stack structures may induce stress that deforms or warps the semiconductor wafer upon which structures are formed. The deformation or warping may cause difficulty in subsequent processing steps that may include chip bonding or packaging.

SUMMARY

According to an aspect of the present disclosure, a three-dimensional memory device includes a pair of alternating stacks of insulating layers and electrically conductive layers located over a semiconductor region, and laterally spaced from each other by a backside trench, memory stack structures extending through the pair of alternating, each memory stack structure containing a vertical semiconductor channel and a memory film, and a backside contact assembly located in the backside trench. The backside contact assembly includes an isolation dielectric spacer contacting the pair of alternating stacks, a conductive liner contacting inner sidewalls of the isolation dielectric spacer and a top surface of the semiconductor region, and composite non-metallic core containing at least one outer dielectric fill material portion that is laterally enclosed by a lower portion of the conductive liner and a dielectric core contacting an inner sidewall of the at least one outer dielectric fill material portion.

According to another aspect of the present disclosure, a method of forming a three-dimensional memory device is provided, which comprises: forming a vertically alternating sequence of insulating layers and sacrificial material layers over a semiconductor region; forming memory stack structures through the vertically alternating sequence; forming backside trenches through the vertically alternating sequence; replacing the sacrificial material layers with electrically conductive layers through the backside trenches; and forming backside contact assemblies in a respective one of the backside trenches, wherein each of the backside contact assemblies comprises: an isolation dielectric spacer formed on the insulating layers and the electrically conductive layers; a conductive liner formed on inner sidewalls of the isolation dielectric spacer and a top surface of the semiconductor layer; and composite non-metallic core comprising at least one outer dielectric fill material portion that is laterally enclosed by a lower portion of the conductive liner, and comprising a dielectric core contacting an inner sidewall of the at least one outer dielectric fill material portion.

According to an aspect of the present disclosure, a memory die is provided, which comprises: at least one first plane including a plurality of first memory blocks; and at least one second plane including a plurality of second memory blocks. Each memory block selected from the plurality of first memory blocks and the plurality of second memory blocks includes a respective set of memory stack structures that vertically extend through a respective alternating stack of insulating layers and electrically conductive layers. Each memory stack structure within the sets of memory stack structures comprises a respective vertical semiconductor channel and a respective memory film. Each of the at least one first plane includes a respective set of first bit lines that laterally extend along a first horizontal direction and electrically connected to a respective subset of vertical semiconductor channels. Each of the at least one second plane includes a respective set of second bit lines that are parallel with respect to one another and laterally extend along a second horizontal direction that is perpendicular to the first horizontal direction and electrically connected to a respective subset of vertical semiconductor channels within the at least one second plane.

According to another aspect of the present disclosure, a method of forming memory dies is provided. The method comprises: providing a set of reticles that include lithographic patterns for multiple exposure levels of at least one semiconductor die. A layout for each semiconductor die within the set of reticles comprises a first sub-layout for at least one first plane including a plurality of first memory blocks and a second sub-layout for at least one second plane including a plurality of second memory blocks. The memory dies may be formed on a wafer by performing a sequence of processing steps including deposition processes, etch processes, and lithographic patterning processes that employ the set of reticles, wherein the memory dies are physical implementations of a design for the at least one semiconductor die as embodied in the set of reticles. For each of the memory dies, each memory block selected from the plurality of first memory blocks and the plurality of second memory blocks includes a respective set of memory stack structures that vertically extend through a respective alternating stack of insulating layers and electrically conductive layers, wherein each memory stack structure within the sets of memory stack structures comprises a respective vertical semiconductor channel and a respective memory film. Each of the at least one first plane includes a respective set of first bit lines that laterally extend along a first horizontal direction and electrically connected to a respective subset of vertical semiconductor channels; and each of the at least one second plane includes a respective set of second bit lines that are parallel with respect to one another and laterally extend along a second horizontal direction that is perpendicular to the first horizontal direction and electrically connected to a respective subset of vertical semiconductor channels within the at least one second plane.

According to yet another aspect of the present disclosure, a method of forming memory dies is provided. The method comprises: providing a set of reticles that includes lithographic patterns for multiple exposure levels of a plurality of semiconductor dies, wherein a layout for one of at least one first-type semiconductor die within the plurality of semiconductor dies is congruent, with or without a mirror symmetry reflection, with a layout for one of at least one second-type semiconductor die within the plurality of semiconductor dies, and is rotated, with or without a mirror symmetry reflection, from the layout for the one of the at least one first-type semiconductor die by 90 degrees or 270 degrees; and forming memory dies on a wafer by performing a sequence of processing steps including deposition processes, etch processes, and lithographic patterning processes that employ the set of reticles, wherein the memory dies are physical implementations of a design for each of the plurality of semiconductor dies as embodied in the set of reticles. Each memory die comprises a respective set of memory blocks; and each of the memory blocks comprises a respective set of memory stack structures that vertically extend through a respective alternating stack of insulating layers and electrically conductive layers, wherein each memory stack structure within the sets of memory stack structures comprises a respective vertical semiconductor channel and a respective memory film.

According to still another aspect of the present disclosure, a method of forming memory dies is provided. The method comprises: providing a set of reticles that include lithographic patterns for multiple exposure levels of at least one semiconductor die; and forming memory dies on a wafer by performing a sequence of processing steps including deposition processes, etch processes, and lithographic patterning processes that employ the set of reticles, wherein the memory dies are physical implementations of a design for the at least one semiconductor die as embodied in the set of reticles. Each of the lithographic patterning steps comprises: a photoresist application step in which a photoresist layer is applied over the wafer; a first lithographic exposure step in which the photoresist layer is lithographically exposed within a lithographic pattern in a respective reticle selected from the set of reticles in a plurality of first exposure fields over the wafer while the wafer is oriented at a first rotational angle with respect to orientations of the first exposure fields about an vertical axis passing through a geometrical center of the wafer; and a second lithographic exposure step in which the photoresist layer is lithographically exposed within the lithographic pattern in the respective reticle selected from the set of reticles in a plurality of second exposure fields over the wafer while the wafer is oriented at a second rotational angle with respect to orientations of the second exposure fields about the vertical axis passing through the geometrical center of the wafer.

BRIEF DESCRIPTION OF THE DRAWINGS

FIG. 2A illustrates schematic layouts of exemplary memory dies that may be used on the wafer of FIG. 1.

FIGS. 10A-10H are sequential schematic vertical cross-sectional views of a memory opening within the first exemplary structure during formation of a memory stack structure, an optional dielectric core, and a drain region therein according to an embodiment of the present disclosure.

FIGS. 14A-14D are sequential vertical cross-sectional views of a region of the first exemplary structure during formation of electrically conductive layers according to an embodiment of the present disclosure.

FIG. 19B is a top-down view of the first exemplary structure of FIG. 19A. The vertical plane A-A' is the plane of the schematic vertical cross-sectional view of FIG. 19A.

FIGS. 29A-29D illustrate sequential vertical cross-sectional views of a memory opening during formation of a memory opening fill structure according to an embodiment of the present disclosure.

FIG. 32 is a vertical cross-sectional view of the second exemplary structure after formation of dielectric pillar structures according to an embodiment of the present disclosure.

FIG. 39 is a vertical cross-sectional view of a region of a first configuration of the second exemplary structure after formation of an isolation dielectric spacer, a conductive liner, and an outer dielectric fill material layer in each backside trench according to an embodiment of the present disclosure.

FIG. 40 is a vertical cross-sectional view of a region of the first configuration of the second exemplary structure after formation of an isolation dielectric spacer, a conductive liner, and at least one outer dielectric fill material portion in each backside trench according to an embodiment of the present disclosure.

FIG. 43 is a vertical cross-sectional view of a region of the first configuration of the second exemplary structure after formation of a conductive plug over each backside trench according to an embodiment of the present disclosure.

FIG. 46 is a vertical cross-sectional view of a region of the second configuration of the second exemplary structure after formation of a dielectric core material layer in each backside trench according to an embodiment of the present disclosure.

FIG. 47 is a vertical cross-sectional view of a region of the second configuration of the second exemplary structure after formation of a dielectric core in each backside trench according to an embodiment of the present disclosure.

FIG. 49 is a vertical cross-sectional view of a region of a third configuration of the second exemplary structure after formation of an isolation dielectric spacer, a conductive liner, and an outer dielectric fill material layer in each backside trench according to an embodiment of the present disclosure.

FIG. 50 is a vertical cross-sectional view of a region of the third configuration of the second exemplary structure after densification of the outer dielectric fill material layer according to an embodiment of the present disclosure.

FIG. 54A is a vertical cross-sectional view of a first region of a fourth configuration of the second exemplary structure after formation of an isolation dielectric spacer, a conductive liner, and an outer dielectric fill material layer in each backside trench according to an embodiment of the present disclosure.

FIG. 54B is a vertical cross-sectional view of a second region of a fourth configuration of the second exemplary structure after formation of an isolation dielectric spacer, a conductive liner, and an outer dielectric fill material layer in each backside trench according to an embodiment of the present disclosure.

FIG. 55A is a vertical cross-sectional view of the first region of the fourth configuration of the second exemplary structure after formation of a patterned etch mask layer according to an embodiment of the present disclosure.

FIG. 55B is a vertical cross-sectional view of the second region of the fourth configuration of the second exemplary structure after formation of the patterned etch mask layer according to an embodiment of the present disclosure.

FIG. 56A is a vertical cross-sectional view of the first region of the fourth configuration of the second exemplary structure after formation of an outer dielectric fill material portion in each backside trench according to an embodiment of the present disclosure.

FIG. 56B is a vertical cross-sectional view of the second region of the fourth configuration of the second exemplary structure after formation of an outer dielectric fill material portion in each backside trench according to an embodiment of the present disclosure.

FIG. 57A is a vertical cross-sectional view of the first region of the fourth configuration of the second exemplary structure after formation of a dielectric core material layer in the backside trenches according to an embodiment of the present disclosure.

FIG. 57B is a vertical cross-sectional view of the second region of the fourth configuration of the second exemplary structure after formation of a dielectric core material layer in the backside trenches according to an embodiment of the present disclosure.

FIG. 58A is a vertical cross-sectional view of the first region of the fourth configuration of the second exemplary structure after formation of a dielectric core in each backside trench according to an embodiment of the present disclosure.

FIG. 58B is a vertical cross-sectional view of the second region of the fourth configuration of the second exemplary structure after formation of a dielectric core in each backside trench according to an embodiment of the present disclosure.

FIG. 59A is a vertical cross-sectional view of the first region of the fourth configuration of the second exemplary structure after formation of a conductive plug over each backside trench according to an embodiment of the present disclosure.

FIG. 59B is a vertical cross-sectional view of the second region of the fourth configuration of the second exemplary structure after formation of a conductive plug over each backside trench according to an embodiment of the present disclosure.

FIG. 60 is a vertical cross-sectional view of a region of a fifth configuration of the second exemplary structure after formation of an isolation dielectric spacer, a conductive liner, and an outer dielectric fill material layer in each backside trench according to an embodiment of the present disclosure.

FIG. 61 is a vertical cross-sectional view of a region of the first configuration of the second exemplary structure after an oxidation process that converts an outer portion of the conductive liner into a metal oxide layer in each backside trench according to an embodiment of the present disclosure.

FIG. 64 is a vertical cross-sectional view of a region of the fifth configuration of the second exemplary structure after formation of a conductive plug over each backside trench according to an embodiment of the present disclosure.

FIG. 65B is a horizontal cross-sectional view of the second exemplary structure along the horizontal plane B-B' of FIG. 65A. The hinged vertical plane A-A' corresponds to the plane of the vertical cross-sectional view of FIG. 65A.

DETAILED DESCRIPTION

Figure 1:
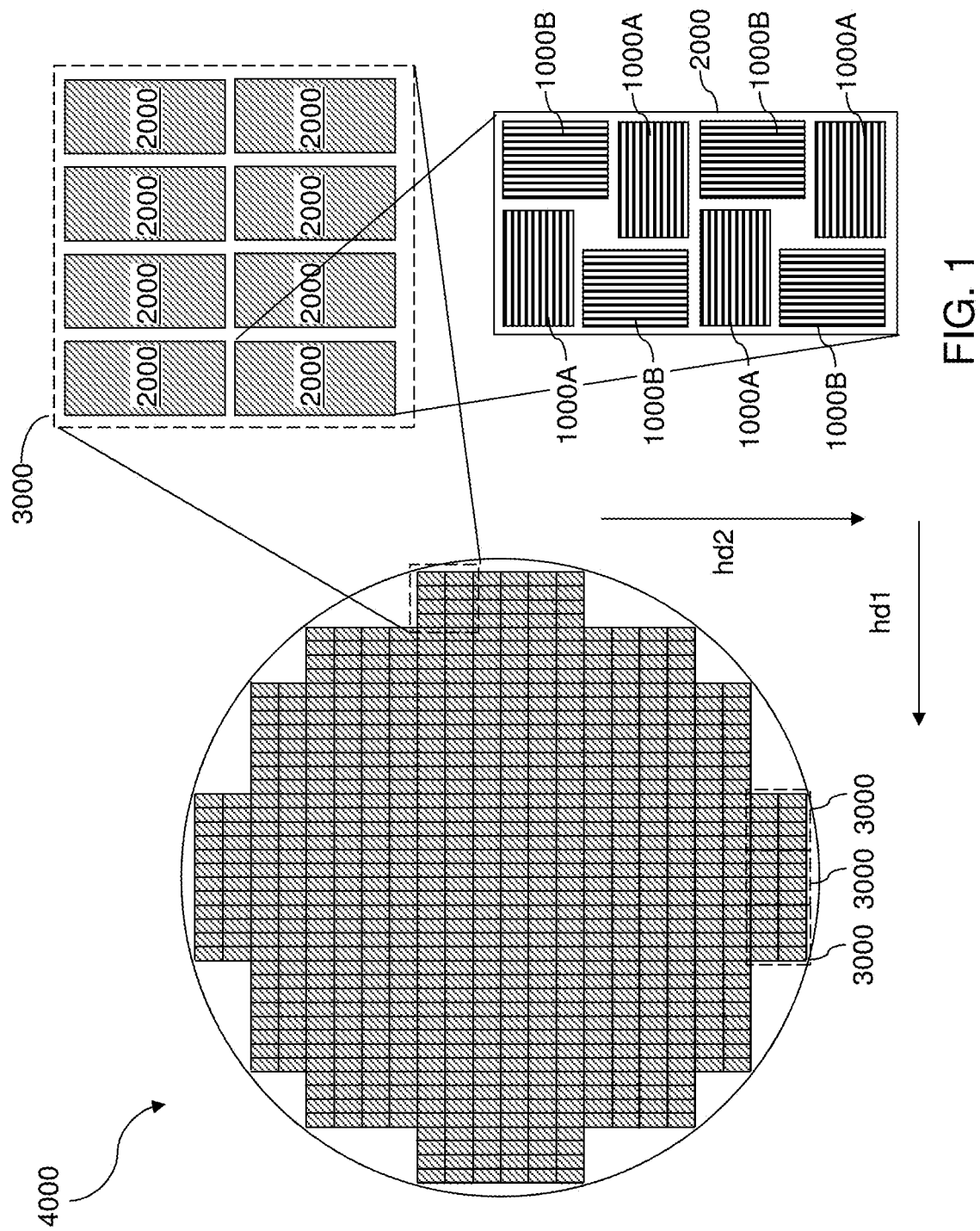
FIG. 1 illustrates a schematic view of a layout of exposure fields on a wafer, a layout of memory dies within an exposure field, and a layout of planes within a memory die according to a first embodiment of the present disclosure.

Memory stack structures including a respective memory film and a respective vertical semiconductor channel are formed through an alternating stack of insulating layers and electrically conductive layers that function as word lines. Various additional structures vertically extend through the alternating stack. Such additional structures may include source contact lines, dielectric wall structures that separate neighboring pairs of alternating stacks, and/or through-array contact via structures. Local variations in the material composition in the three-dimensional array device induces stress that deforms the semiconductor chip, which cause difficulty in subsequent processing steps that may include chip bonding or packaging. Normally, process conditions are optimized to minimize stress. However, such methods of optimizing process conditions may not be effective. In addition, a degradation of Cell and CMOS devices may be seen as a side effect of such conventional approaches. Thus, a method is desired to minimize the deformation of the semiconductor chip due to stress.

As discussed above, embodiments are disclosed herein that may be directed to methods for wafer warpage reduction through stress balancing by using rotated memory blocks including three-dimensional memory devices and structures formed by the same, the various aspects of which are described below. Various embodiments may form various structures including a multilevel memory structure, non-limiting examples of which include semiconductor devices such as three-dimensional monolithic memory array devices comprising a plurality of NAND memory strings. Embodiment structures may be formed to equally distribute stress due to local variations in the material composition in the memory stack structures in x and y-directions to minimize warpage.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated employing the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming, i.e., a smallest unit on which a programming operation may be performed.

Figure 2B:
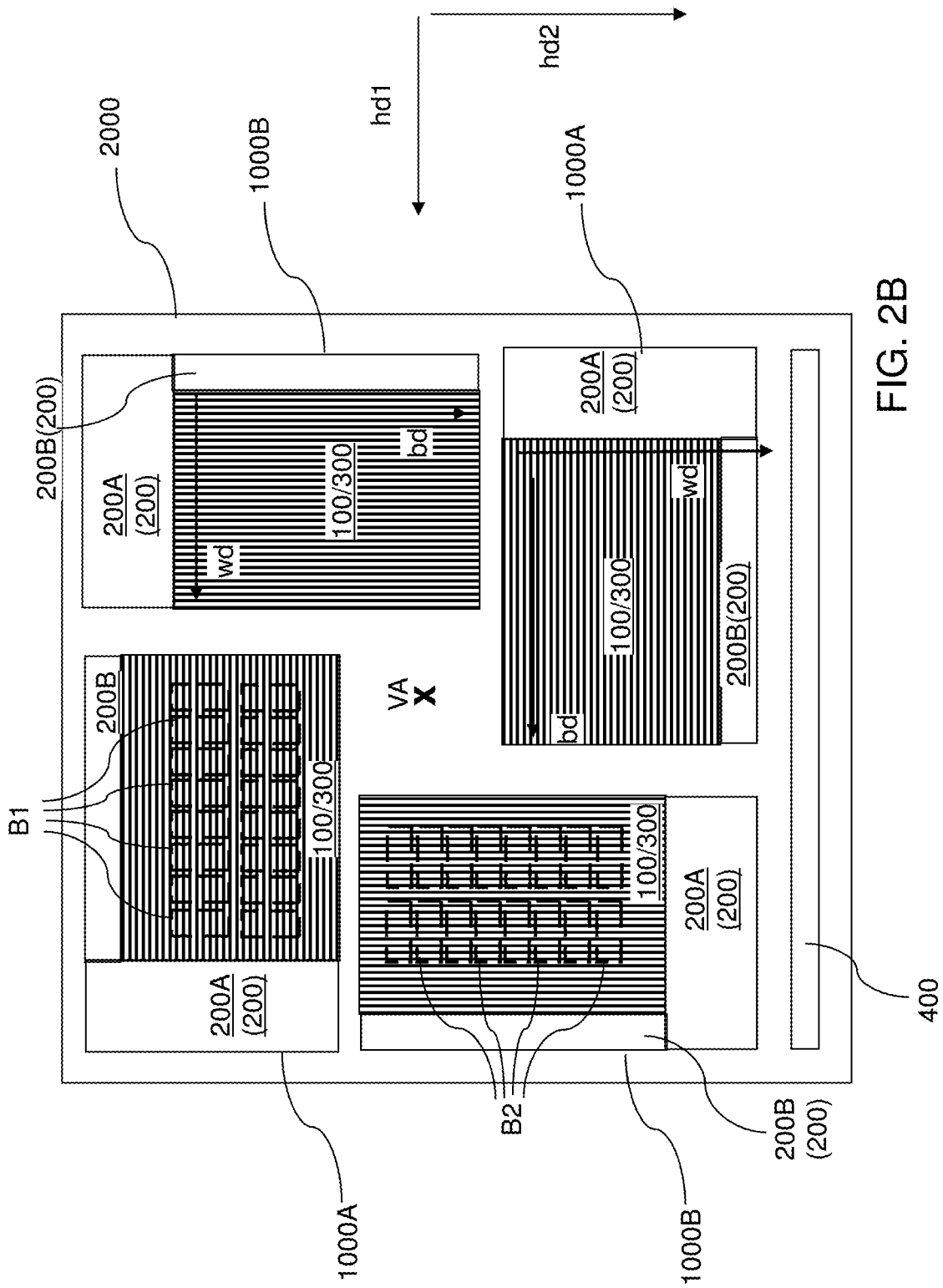
FIG. 2B illustrates a schematic layout of another memory die that may be used on the wafer of FIG. 1.
Figure 2C:
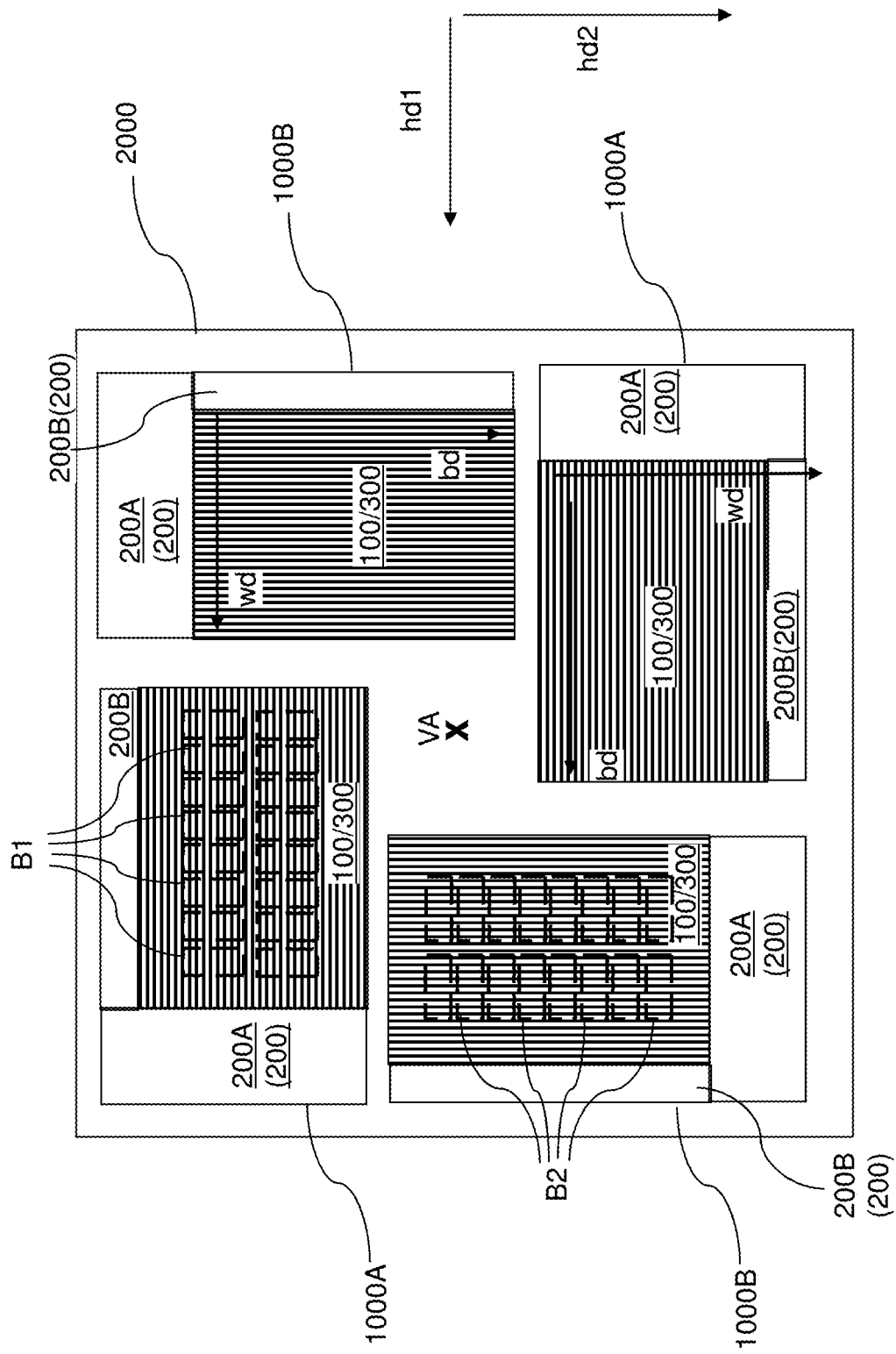
FIG. 2C illustrates a schematic layout of yet another memory die that may be used on the wafer of FIG. 1.

Referring to FIGS. 1, 2A, 2B, and 2C, a layout of exposure fields 3000 on a wafer 4000, a layout of semiconductor dies 2000 within an exposure field 3000, and a layout of planes (1000A, 1000B) within a semiconductor die 2000 are illustrated. FIG. 1 illustrates the various layouts on a wafer 4000, which may be a commercially available semiconductor substrate. FIGS. 2A-2C illustrate various layouts of planes (1000A, 1000B) within exemplary semiconductor dies 2000 in various configurations. The layout of each semiconductor die 2000 may be selected such that multiple planes (1000A, 1000B) within the semiconductor die 2000 have different layouts that provide the same mechanical stress along a first horizontal direction hd1 and a second horizontal direction hd2 that is perpendicular to the first horizontal direction hd2.

Each exposure field 3000 corresponds to the area of the wafer 4000 that is lithographically exposed during a single illumination step in a lithographic exposure tool. In case semiconductor dies 2000 are manufactured employing lithographic exposure and development processes, each exposure field 3000 may correspond to the area of a single semiconductor die 2000, or may correspond to the area of a plurality of semiconductor dies 2000. In one embodiment, the exposure fields 3000 may be arranged as a subset of a rectangular array such that the exposure fields 3000 are arranged as rows and columns that fit within the area of the wafer 4000. The rows and columns of the rectangular array may be arranged along the first horizontal direction hd1 and along the second horizontal direction hd2. During each lithographic exposure process, a photoresist layer may be applied over the wafer 4000 and each exposure field 3000 may be sequentially lithographically exposed. Upon completion of lithographic exposure of all exposure fields 3000, the photoresist layer may be developed to generate a pattern in the developed photoresist layer. A suitable processing step such as an etch step, a deposition step, and/or an ion implantation step may be performed employing the patterned photoresist layer. Generally, manufacture of semiconductor dies 2000 uses a sequence of processing steps including deposition steps, planarization steps, lithographic patterning steps, and etch steps. Each lithographic patterning step uses a reticle for lithographic exposure.

A set of reticles may be provided to manufacture semiconductor dies 2000. The set of reticles includes lithographic patterns for multiple exposure levels of at least one semiconductor die 2000, such as a memory die. In other words, each exposure field 3000 may include a pattern for a single semiconductor die 2000, or a pattern for a plurality of semiconductor dies 2000.

Each semiconductor die 2000 may include a plurality of planes (1000A, 1000B). Thus, each layout for each semiconductor die 2000 within the set of reticles comprises a first sub-layout for at least one first plane 1000A including a plurality of first memory blocks and a second sub-layout for at least one second plane 1000B including a plurality of second memory blocks. As used herein, a "sub-layout" refers to a subset of a layout that has a lesser area than the entire area of the layout. According to an aspect of the present disclosure, the sub-layout for each first plane 1000A is different from the sub-layout for each second plane 1000B. In case multiple first planes 1000A and multiple second planes 1000B are present within a semiconductor die 2000, the sub-layout for each of the multiple first planes 1000A may be the same throughout, and the sub-layout for each of the multiple second planes 1000B may be the same throughout.

In one embodiment, memory dies may be manufactured as the semiconductor dies 2000. The memory dies 2000 may be manufactured on the wafer 4000 by performing a sequence of processing steps including deposition processes, etch processes, and lithographic patterning processes that employ the set of reticles. The manufactured memory dies 2000 (i.e., the physical memory dies) are physical implementations of a design for the at least one semiconductor die 2000 as embodied in the set of reticles.

Each first plane 1000A may include a respective plurality of first memory blocks B1, which are multiple implementations of a first block design. Each second plane 1000B may include a respective plurality of second memory blocks B2, which are multiple implementations of a second block design that may be rotated from the first block design by 90 degrees or 270 degrees. In one embodiment, each memory block (B1, B2) respectively selected from the plurality of first memory blocks B1 and the plurality of second memory blocks B2 includes a respective set of memory stack structures that vertically extend through a respective alternating stack of insulating layers and electrically conductive layers for each of the memory dies 2000. Each memory stack structure within the sets of memory stack structures comprises a respective vertical semiconductor channel and a respective memory film. A first exemplary structure for a set of memory stack structures is described in detail in a subsequent section.

In some embodiments, each of the first planes 1000A and the second planes 1000B may include a memory array region 100, staircase regions 300 adjoined to the memory array region 100, and peripheral device regions 200. The memory array region 100 includes a respective set of memory stack structures vertically extending through alternating stacks of insulating layers and electrically conductive layers embodying the word lines for the memory stack structures, and bit lines connected to vertical semiconductor channels within the memory stack structures. Each staircase region 300 includes stepped surfaces of the electrically conductive layers on which word line contact via structures are formed. The peripheral device regions 200 include peripheral devices that support operation of the memory elements within the memory stack structures. In an illustrative example, a set of peripheral device regions 200 within a plane (1000A or 1000B) may include a first peripheral device region 200A including a bit line decoder circuitry, a bit line driver circuitry, and sense amplifiers, and a second peripheral device region 200B including a word line decoder circuitry and a word line driver circuitry.

In one embodiment, each of the at least one first plane 1000A within a memory die 2000 includes a respective set of first bit lines that laterally extend along a first horizontal direction hd1 (represented as the "bd" direction within first planes 1000A of FIGS. 2A-2C) and electrically connected to a respective subset of vertical semiconductor channels. Each of the at least one second plane 1000B includes a respective set of second bit lines that are parallel with respect to one another and laterally extend along a second horizontal direction hd2 (represented by the "bd" direction within second planes 1000B of FIGS. 2A-2C) that is perpendicular to the first horizontal direction hd1 and electrically connected to a respective subset of vertical semiconductor channels within the at least one second plane 1000B.

The word lines for each plane (1000A or 1000B) may be perpendicular to the bit lines for the same plane (1000A or 1000B). In one embodiment, each of the at least one first plane 1000A within a memory die 2000 includes a respective set of first word lines that laterally extend along the second horizontal direction hd2 (represented as the "wd" direction within first planes 1000A of FIGS. 2A-2C) and embodied as a respective electrically conductive layer within the first plane 1000A. Each of the at least one second plane 1000B includes a respective set of second word lines that are parallel with respect to one another and laterally extend along the first horizontal direction hd1 (represented by the "wd" direction within second planes 1000B of FIGS. 2A-2C) and embodied as a respective electrically conductive layer within the second plane 1000B.

In one embodiment, electrically conductive layers within the at least one first plane 1000A comprise word lines for a respective one of the first memory blocks B1 and laterally extend along the second horizontal direction hd2, and electrically conductive layers within the at least one second plane 1000B comprise word lines for a respective one of the second memory blocks B2 and laterally extend along the first horizontal direction hd1.

According to an aspect of the present disclosure, each memory die 2000 may include at least one first plane 1000A and at least one second plane 1000B such that the lateral stress along the first horizontal direction hd1 is balanced with the lateral stress along the second horizontal direction hd2. In other words, the overall magnitude and type of lateral stress applied by each memory die 2000 to neighboring memory dies 2000 along the first horizontal direction hd1 may be substantially the same as the overall magnitude and type of lateral stress applied by each memory die 2000 to neighboring memory dies 2000 along the second horizontal direction hd2. In this case, deformation of the wafer 4000 along the first horizontal direction hd1 may have the same magnitude and type as deformation of the wafer 4000 along the second horizontal direction hd2. For example, if deformation of the wafer 4000 along the first horizontal direction hd1 during, and after, manufacture of the memory dies 2000 on the wafer 4000 includes downward bowing of the wafer 4000 with a radius of curvature within a vertical plane including the first horizontal direction hd1, deformation of the wafer 4000 along the second horizontal direction hd2 during, and after, manufacture of the memory dies 2000 on the wafer 4000 also includes downward bowing of the wafer 4000 with the same radius of curvature within a vertical plane including the second horizontal direction hd2. Thus, saddle-shaped deformation or deformation having different radii of curvature along different horizontal directions may be avoided for the wafer 4000, and post-manufacture processing of the memory die 2000 (such as formation of a bonded assembly of dies) may be facilitated.

In one embodiment, each of the memory dies 2000 includes a same total number of the at least one first plane 1000A as a total number of the at least one second plane 1000B, and memory stack structures within each of the at least one second plane 1000B has a layout that is rotated, with or without a mirror symmetry reflection, from a layout of memory stack structures within one of the at least one first plane 1000A by 90 degrees or 270 degrees. As used herein, rotation of a layout refers to rotation of the entirety of the layout within the two-dimensional plane including the layout. As used herein, a mirror symmetry reflection refers to a reflection about the word line direction or about the bit line direction of a layout. In the examples illustrated in FIGS. 2A-2C, the total number of the at least one first plane 1000A (which is the same as the total number of the at least one second plane 1000B) within a memory die 2000 may be 2, 3, or 4. In addition, embodiments are expressly contemplated in which the total number of the at least one first plane 1000A within a memory die 2000 may be 1, 2, 3, 4, 5, 6, etc.

In one embodiment, the at least one first plane 1000A within each memory die 2000 comprises a plurality of first planes 1000A, and the at least one second plane 1000B within each memory die 2000 comprises a plurality of second planes 1000B. A total area of the plurality of first planes 1000A within each memory die 2000 is the same as a total area of the plurality of second planes 1000B within each memory die 2000.

In one embodiment, at least a subset SS of the plurality of first planes 1000A and the plurality of second planes 1000B within each memory die 2000 may be arranged with an inversion symmetry with respect to a vertical axis VA passing through a geometrical center of the subset of the plurality of first planes 1000A and the plurality of second planes 1000B. The subset SS of the plurality of first planes 1000A and the plurality of second planes 1000B within each memory die 2000 may include all, or less than all, of the first planes 1000A and the second planes 1000B in the memory die 2000. As used herein, an "inversion symmetry" refers to the change of signs for all x-coordinates and y-coordinates generated employing a point of symmetry (such as the vertical axis VA passing through the geometrical center of a set of planes (1000A, 1000B)) as the origin for the coordinate system. Exemplary vertical axes VA pasting through the geometrical center of the respective subset of the plurality of first planes 1000A and the plurality of second planes 1000B are illustrated in FIGS. 2A-2C.

Upon completion of manufacture of the memory dies 2000 on the wafer 4000, the memory dies 2000 may be singulated by dicing. The memory dies 2000 formed employing the layouts illustrated in FIGS. 1 and 2A-2C may include layout features that equalize mechanical deformation along two orthogonal directions of each memory die 2000, which may be the horizontal direction that is parallel to a first pair of sidewalls of the memory die 2000 and the horizontal direction that is parallel to a second pair of sidewalls of the memory die 2000.

According to an aspect of the present disclosure, a discrete memory die 2000 is provided by dicing the memory dies 2000 on the wafer 4000. The discrete memory die 2000 comprises: at least one first plane 1000A including a plurality of first memory blocks B1; and at least one second plane 1000B including a plurality of second memory blocks B2. Each memory block (B1, B2) respectively selected from the plurality of first memory blocks B1 and the plurality of second memory blocks B2 includes a respective set of memory stack structures that vertically extend through a respective alternating stack of insulating layers and electrically conductive layers. Each memory stack structure within the sets of memory stack structures comprises a respective vertical semiconductor channel and a respective memory film. Each of the at least one first plane 1000A includes a respective set of first bit lines that laterally extend along a first horizontal direction hd1 (which is the bit line direction "bd" in the respective first plane 1000A) and electrically connected to a respective subset of vertical semiconductor channels. Each of the at least one second plane 1000B includes a respective set of second bit lines that are parallel with respect to one another and laterally extend along a second horizontal direction hd2 (which is the bit line direction "bd" in the respective second plane 1000B) that is perpendicular to the first horizontal direction hd1 and electrically connected to a respective subset of vertical semiconductor channels within the at least one second plane 1000B.

In one embodiment, electrically conductive layers within the at least one first plane 1000A comprise word lines for a respective one of the first memory blocks B1 and laterally extend along the second horizontal direction hd2 (which is the word line direction "wd" in the respective first plane 1000A). Electrically conductive layers within the at least one second plane 1000B comprise word lines for a respective one of the second memory blocks and laterally extend along the first horizontal direction hd1 (which is the word line direction "wd" in the respective second plane 1000B).

In one embodiment, first memory blocks B1 within each first plane 1000A are laterally spaced apart respectively from one another by first trenches (such as backside trenches to be described below) that laterally extend along the second horizontal direction hd2 (which is the word line direction "wd" for the first plane 1000A), and second memory blocks B2 within each second plane 1000B are laterally spaced apart respectively from one another by second trenches (such as backside trenches to be described below) that laterally extend along the first horizontal direction hd1 (which is the word line direction "wd" for the second plane 1000B). In one embodiment, each of the first bit lines extends over a respective plurality of first memory blocks B1, and each of the second bit lines extends over a respective plurality of second memory blocks B2. In one embodiment shown in FIG. 2B, each semiconductor die 2000 may include an input/output circuit 400. In another embodiment shown in FIG. 2C, the input/output circuit 400 may be omitted from some or all semiconductor dies 2000.

The dicing channels used to singulate the semiconductor dies 2000 on the wafer 4000 may be parallel to the first horizontal direction hd1 or the second horizontal direction hd2. Each semiconductor die 2000 after singulation may comprise: a pair of first sidewalls that are parallel to the first horizontal direction hd1; a pair of second sidewalls that are parallel to the second horizontal direction hd2; a planar top surface adjoined to an upper edge of each of the pair of first sidewalls; and a planar bottom surface adjoined to a lower edge of each of the pair of second sidewalls.

In one embodiment, the memory die 2000 includes a same total number of the at least one first plane 1000A as a total number of the at least one second plane 1000B, and memory stack structures within each of the at least one second plane 1000B has a layout that is rotated from a layout of memory stack structures within one of the at least one first plane by 90 degrees or 270 degrees.

Figure 3:
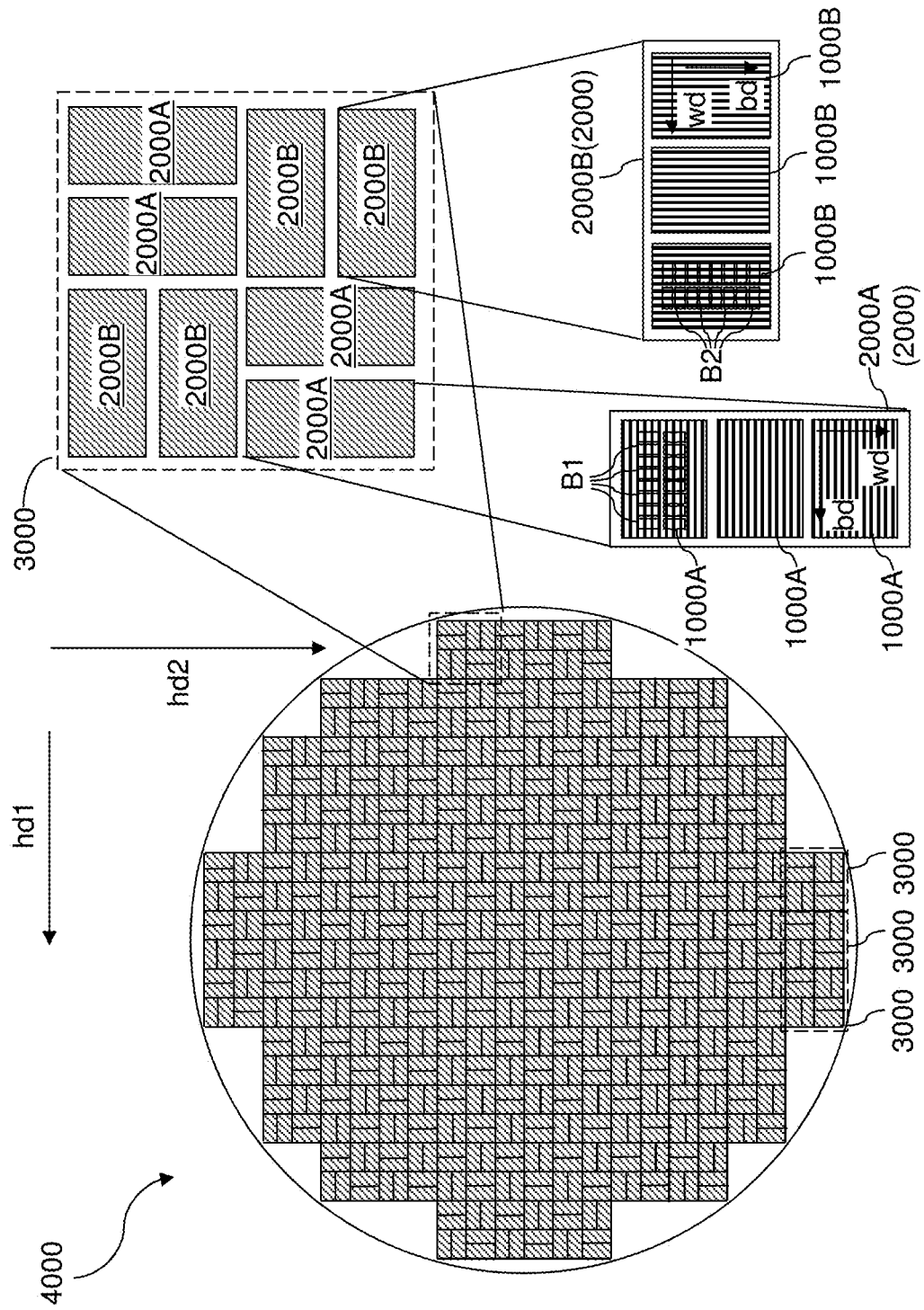
FIG. 3 illustrates a schematic view of a layout of exposure fields on a wafer, a layout of memory dies within an exposure field, and a layout of planes within a memory die according to a second embodiment of the present disclosure.

Referring to FIG. 3, a layout of exposure fields 3000 on a wafer 4000, a layout of semiconductor dies 2000 within an exposure field 3000, and a layout of planes (1000A, 1000B) within a semiconductor die 2000 are illustrated. The wafer 4000 may be a commercially available semiconductor substrate. The layout of each exposure field 3000 may be selected such that multiple semiconductor dies 2000 within the exposure field 3000 have different orientations that provide the same mechanical stress along a first horizontal direction hd1 and a second horizontal direction hd2 that is perpendicular to the first horizontal direction hd2. Each exposure field 3000 includes patterns for at least one first-type semiconductor die 2000A (which may be at least one first-type memory die) and at least one second-type semiconductor die 2000B (which may be at least one second-type memory die). For example, at least one first-type semiconductor die 2000A within each exposure field 3000 includes a set of at least one first plane 1000A including bit lines that extends along the first horizontal direction hd1, and a second group of at least one semiconductor die 2000B within each exposure field 3000 includes at least one second plane 1000B including bit lines that extends along the second horizontal direction hd2.

Generally, a set of reticles that includes lithographic patterns for multiple exposure levels of a plurality of semiconductor dies is provided. A layout for one of at least one first-type semiconductor die 2000A within the plurality of semiconductor dies 2000 is congruent, with or without a mirror symmetry reflection, with a layout for one of at least one second-type semiconductor die 2000B within the plurality of semiconductor dies 2000, and is rotated, with or without a mirror symmetry reflection, from the layout for the one of the at least one first-type semiconductor die 2000A by 90 degrees or 270 degrees. In one embodiment, the layout for each first-type semiconductor die 2000A may be congruent, with or without a mirror symmetry reflection, with the layout for each second-type semiconductor die 2000B, and is rotated, with or without a mirror symmetry reflection, from the layout for the first-type semiconductor die 2000A by 90 degrees or 270 degrees.

In one embodiment, the semiconductor dies 2000 may be memory dies 2000. The memory dies 2000 may be formed on the wafer by performing a sequence of processing steps including deposition processes, etch processes, and lithographic patterning processes that employ the set of reticles. The memory dies 2000 are physical implementations of a design for each of the plurality of semiconductor dies 2000 as embodied in the set of reticles. Each memory die 2000 comprises a respective set of memory blocks (B1, B2). Each of the memory blocks (B1, B2) comprises a respective set of memory stack structures that vertically extend through a respective alternating stack of insulating layers and electrically conductive layers. Each memory stack structure within the sets of memory stack structures comprises a respective vertical semiconductor channel and a respective memory film. Each of the memory dies 2000 comprises bit lines that are parallel with respect to one another and electrically connected to a respective subset of memory stack structures within a respective one of the memory dies 2000.

In one embodiment, all patterns for the bit lines within memory array regions in the layout for the one of the at least one first-type semiconductor die 2000A laterally extend along a first horizontal direction hd1 (which is the bit line direction "bd" within each first-type semiconductor die 2000A), and all patterns for the bit lines within memory array regions in the layout for the one of the at least one second-type semiconductor die 2000B laterally extend along a second horizontal direction hd2 (which is the bit line direction "bd" within each second-type semiconductor die 2000B) that is perpendicular to the first horizontal direction hd1.

In one embodiment, all patterns for the word lines within memory array regions in the layout for the one of the at least one first-type semiconductor die 2000A laterally extend along the second horizontal direction hd2 (which is the word line direction "wd" within each first-type semiconductor die 2000A), and all patterns for the word lines within memory array regions in the layout for the one of the at least one second-type semiconductor die 2000B laterally extend along the first horizontal direction hd1 (which is the word line direction "wd" within each second-type semiconductor die 2000B).

In one embodiment, the at least one first-type semiconductor die 2000A within the plurality of semiconductor dies 2000 in an exposure field 3000 comprises a plurality of first-type semiconductor dies 2000A, and the at least one second-type semiconductor die 2000B within the plurality of semiconductor dies 2000 comprises a plurality of second-type semiconductor dies 2000B. A total number of the plurality of first-type semiconductor dies 2000A in an exposure field 3000 may be the same as a total number of the plurality of second-type semiconductor dies 2000B in the exposure field 3000. The total number of the plurality of first-type semiconductor dies 2000A in an exposure field 3000 may be 2, 3, 4, 5, 6, etc. Alternatively, the at least one first-type semiconductor die 2000A within the plurality of semiconductor dies 2000 in an exposure field 3000 comprises a single first-type semiconductor die 2000A, and the at least one second-type semiconductor die 2000B within the plurality of semiconductor dies 2000 comprises a single second-type semiconductor die 2000B.

In one embodiment, each layout for any of the plurality of first-type semiconductor dies 2000A is congruent, with or without a mirror symmetry reflection, with a layout for any of the plurality of second-type semiconductor dies 2000B, and is rotated, with or without a mirror symmetry reflection, from the layout for any of the plurality of second-type semiconductor dies 2000B by 90 degrees or 270 degrees.

According to an aspect of the present disclosure, each exposure field 3000 may include at least one first-type semiconductor die 2000A (which may be at least one first-type memory die) and at least one second semiconductor die 2000B (which may be at least one second-type memory die) such that the lateral stress along the first horizontal direction hd1 is balanced with the lateral stress along the second horizontal direction hd2. In other words, the overall magnitude and type of lateral stress applied by a set of semiconductor dies 2000 within each exposure field 3000 to semiconductor dies 2000 within a neighboring exposure field 3000 along the first horizontal direction hd1 may be substantially the same as the overall magnitude and type of lateral stress applied by the set of semiconductor dies 2000 within the exposure field 3000 to semiconductor dies 2000 within another neighboring exposure field 3000 along the second horizontal direction hd2. In this case, deformation of the wafer 4000 along the first horizontal direction hd1 may have the same magnitude and type as deformation of the wafer 4000 along the second horizontal direction hd2. For example, if deformation of the wafer 4000 along the first horizontal direction hd1 during, and after, manufacture of the memory dies 2000 on the wafer 4000 includes downward bowing of the wafer 4000 with a radius of curvature within a vertical plane including the first horizontal direction hd1, deformation of the wafer 4000 along the second horizontal direction hd2 during, and after, manufacture of the memory dies 2000 on the wafer 4000 also includes downward bowing of the wafer 4000 with the same radius of curvature within a vertical plane including the second horizontal direction hd2. Thus, saddle-shaped deformation or deformation having different radii of curvature along different horizontal directions may be avoided for the wafer 4000, and post-manufacture processing of the memory die 2000 (such as formation of a bonded assembly of dies) may be facilitated.

Figure 4:
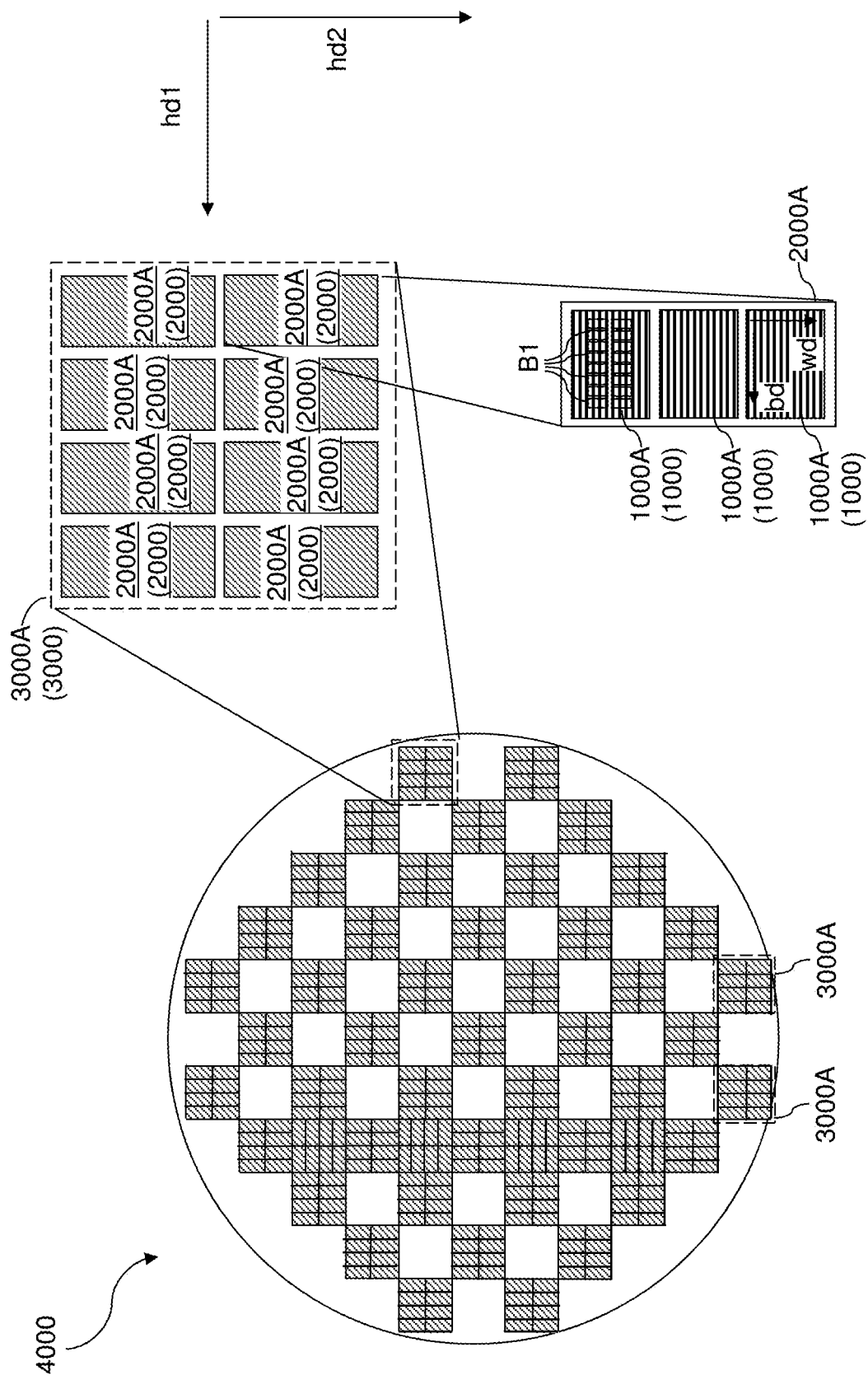
FIG. 4 illustrates a schematic view of a layout of first exposure fields on a wafer, a layout of memory dies within a first exposure field, and a layout of planes within a memory die after a first exposure step of a lithography process according to a third embodiment of the present disclosure.
Figure 5A:
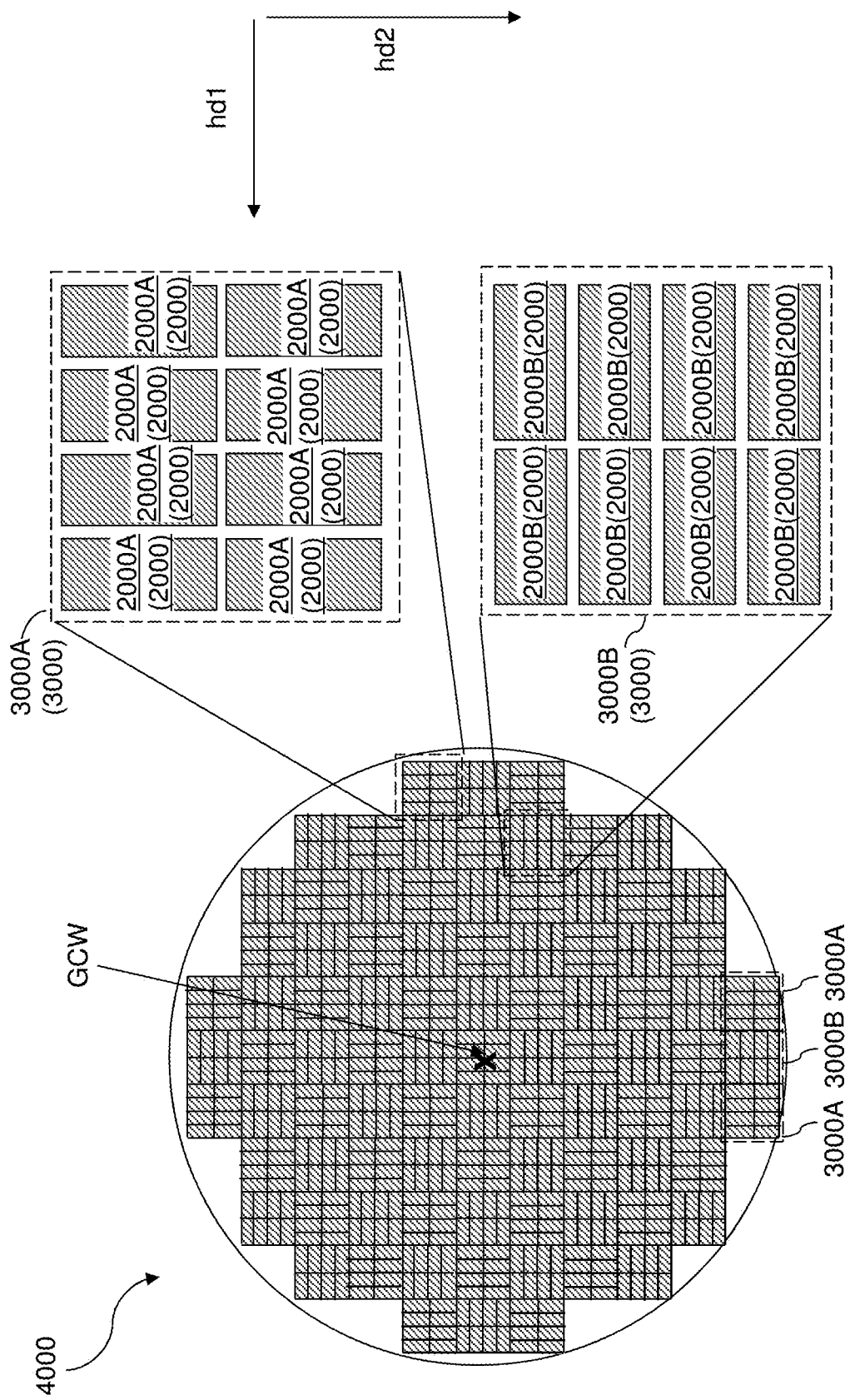
FIG. 5A illustrates a schematic view of a layout of first exposure fields and second exposure fields on a wafer, a layout of memory dies within a first exposure field, and a layout of memory dies within a second exposure field after a second exposure step of a lithography process according to a third embodiment of the present disclosure.
Figure 5B:
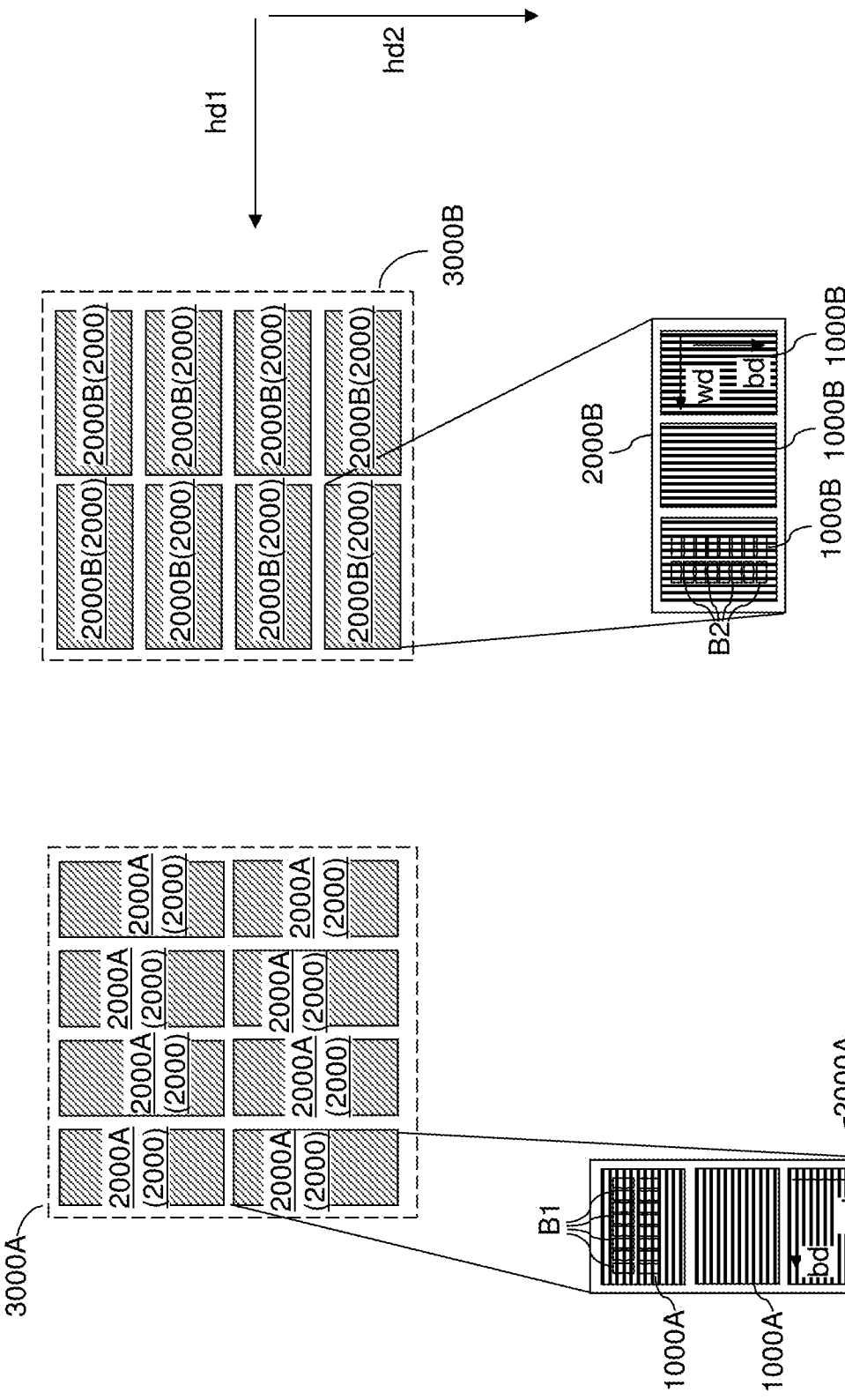
FIG. 5B illustrates a schematic view of a layout of planes within memory dies according to the third embodiment of the present disclosure.

Referring to FIGS. 4, 5A, and 5B, exposure field 3000 on a wafer may be divided into a first group including first exposure fields 3000A and a second group including second exposure fields 3000B. The total number of the first exposure fields 3000A may be about the same as the total number of the second exposure fields 3000B. For example, the total number of the first exposure fields 3000A may be in a range from 80% to 120% of the total number of the second exposure fields 3000B. Each lithographic exposure process may include a first step in which areas of the first exposure fields 3000A are exposed with a lithographic pattern while the wafer 4000 is oriented at a first rotational angle (such as zero degrees) with respect to the geometrical center of the wafer 4000 (such as the center of the circle including the circumference of the wafer 4000), and a second step in which the wafer 4000 is rotated to a second rotational angle (such as 90 degrees or 270 degrees) that is rotated from the first rotational angle by 90 degrees or 270 degrees relative to the first rotational angle and areas of the second exposure fields 3000B are exposed with the same lithographic pattern. FIG. 4 illustrates the wafer 4000 after performing the first step of a lithographic exposure process and prior to performing the second step of the lithographic exposure process. FIGS. 5A and 5B illustrate the wafer 4000 after performing the second step of the lithographic exposure process.

Each exposure field 3000 includes patterns for at least one semiconductor die 2000. The semiconductor dies 2000 that are formed within the first exposure fields 3000A are referred to as first semiconductor dies 2000A (which may be first memory dies), and the semiconductor dies 2000 that are formed within the second exposure fields 3000B are referred to as second semiconductor dies 2000B. Each first semiconductor die 2000A includes at least one first plane 1000A including first memory blocks B1, and each second semiconductor die 2000B includes at least one second plane 1000B including second memory blocks B2. Each first memory block B1 may include bit lines laterally extending along a first horizontal direction hd1 (which is the bit line direction "bd" in the first planes 1000A) and word lines laterally extending along a second horizontal direction hd2 (which is the word line direction "wd" in the first planes 1000A) that is perpendicular to the first horizontal direction hd1. Each second memory block B2 may include bit lines laterally extending along the second horizontal direction hd2 (which is the bit line direction "bd" in the second planes 1000B) and word lines laterally extending along the first horizontal direction hd1 (which is the word line direction "wd" in the second planes 1000B).

Generally, a set of reticles that include lithographic patterns for multiple exposure levels of at least one semiconductor die 2000 is provided. The at least one semiconductor die 2000 may include at least one memory die 2000. Memory dies 2000 may be formed on a wafer 4000 by performing a sequence of processing steps including deposition processes, etch processes, and lithographic patterning processes that employ the set of reticles. The memory dies 2000 are physical implementations of a design for the at least one semiconductor die 2000 as embodied in the set of reticles.

Each of the lithographic patterning steps may comprise a photoresist application step in which a photoresist layer is applied over the wafer 4000, a first lithographic exposure step in which the photoresist layer is lithographically exposed within a lithographic pattern in a respective reticle selected from the set of reticles in a plurality of first exposure fields 3000A over the wafer 4000 while the wafer 4000 is oriented at a first rotational angle with respect to orientations of the first exposure fields about an vertical axis passing through a geometrical center GCW of the wafer 4000, and a second lithographic exposure step in which the photoresist layer is lithographically exposed within the lithographic pattern in the respective reticle selected from the set of reticles in a plurality of second exposure fields 3000B over the wafer 4000 while the wafer 4000 is oriented at a second rotational angle with respect to orientations of the second exposure fields 3000B about the vertical axis passing through the geometrical center GWC of the wafer 4000. The second exposure fields 3000B are not lithographically exposed during the first lithographic exposure step, and the first exposure fields are not lithographically exposed during the second lithographic exposure step.

In one embodiment, the each of the lithographic patterning steps comprises a development step in which lithographic patterns transferred into the photoresist layer in the first lithographic exposure step and in the second lithographic exposure step are simultaneously developed within areas of the plurality of first exposure fields 3000A and within areas of the plurality of second exposure fields 3000B. In one embodiment, the second rotational angle and the first rotational angle are different from each other by 90 degrees or 270 degrees.

In one embodiment, each memory die 2000 comprises a respective set of memory blocks (B1 or B2), each of the memory blocks (B1 or B2) comprises a respective set of memory stack structures that vertically extend through a respective alternating stack of insulating layers and electrically conductive layers. Each memory stack structure within the sets of memory stack structures comprises a respective vertical semiconductor channel and a respective memory film.

In one embodiment, a total area of the plurality of first exposure fields 3000A may be in a range from 35% to 60% of a total area of the wafer, and a total area of the plurality of second exposure fields 3000B is in a range from 35% to 60% of the total area of the wafer 4000. The total area of the first exposure fields 3000A does not overlap with any of the total area of the second exposure fields 3000B. Each of the memory dies 2000 comprises a plurality of planes 1000. Each plane within the plurality of planes 1000 includes a respective plurality of memory blocks (B1 or B2).

FIGS. 6-19B illustrate a first exemplary structure that may be used to implement a segment of each plane 1000. A first plurality of instances of the first exemplary structure may be used in first planes 1000A such that the bit line direction bd within the first plurality of instances of the first exemplary structure is the same as the first horizontal direction hd1 in FIGS. 1-5B, and the word line direction wd within the first plurality of instances of the first exemplary structure is the same as the second horizontal direction hd2 in FIGS. 1-5B. A second plurality of instances of the first exemplary structure may be used in second planes 1000B such that the bit line direction bd within the second plurality of instances of the first exemplary structure is the same as the second horizontal direction hd2 in FIGS. 1-5B, and the word line direction wd within the second plurality of instances of the first exemplary structure is the same as the first horizontal direction hd1 in FIGS. 1-5B. Multiple instances of the first exemplary structure may be replicated within exposure fields 3000 described above to provide multiple planes 1000 having different bit line directions bd.

Figure 6:
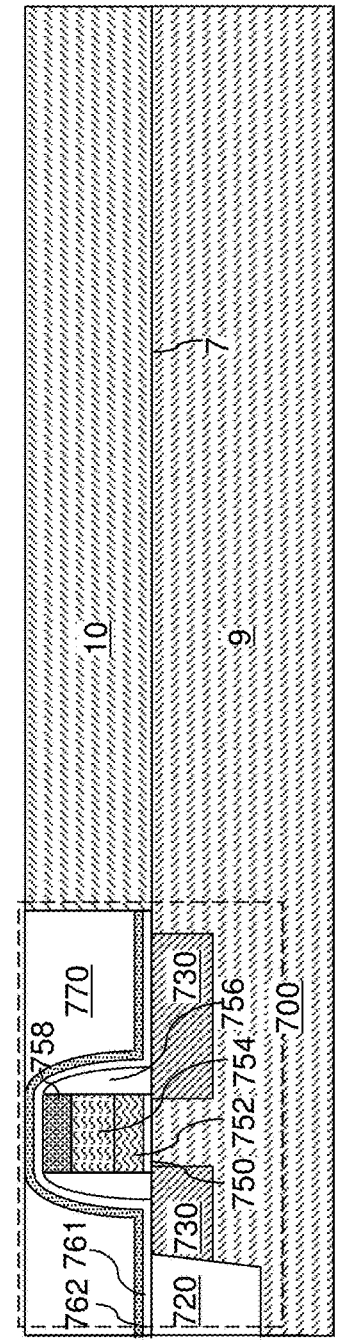
FIG. 6 is a vertical cross-sectional view of a first exemplary structure after formation of at least one peripheral device, and a semiconductor material layer according to an embodiment of the present disclosure.

Referring to FIG. 6, a first exemplary structure according to an embodiment of the present disclosure is illustrated, which may be used, for example, to fabricate a device structure containing vertical NAND memory devices. The first exemplary structure includes a carrier substrate 9 and a semiconductor material layer 10 located on a top surface of the carrier substrate 9. In one embodiment, the carrier substrate 9 and the semiconductor material layer 10 may be provided as a commercially available single crystalline semiconductor wafer. A surface portion of the single crystalline semiconductor wafer may include the semiconductor material layer 10, and a bulk portion of the single crystalline semiconductor wafer may include the carrier substrate 9 that is subsequently removed, for example, by backside grinding. An interface 7 between the carrier substrate 9 and the semiconductor material layer 10 may be located at a depth that corresponds to a target stopping plane for the backside grinding process. Alternatively, the semiconductor material layer 10 may include a single crystalline or polycrystalline semiconductor material layer provided on the carrier substrate 9 including a material different from the material of the semiconductor material layer 10. In this case, the carrier substrate 9 may include an insulating material (such as sapphire or silicon oxide), a conductive material, or a semiconductor material different from the material of the semiconductor material layer 10. The thickness of the carrier substrate 9 may be thick enough to mechanically support the semiconductor material layer 10 and structures to be subsequently formed thereupon. For example, the carrier substrate 9 may have a thickness in a range from 60 microns to 1,000 microns. The thickness of the semiconductor material layer 10 may be in a range from 100 nm to 5,000 nm, although lesser and greater thicknesses may also be used. The semiconductor material layer 10 includes at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Figure 7:
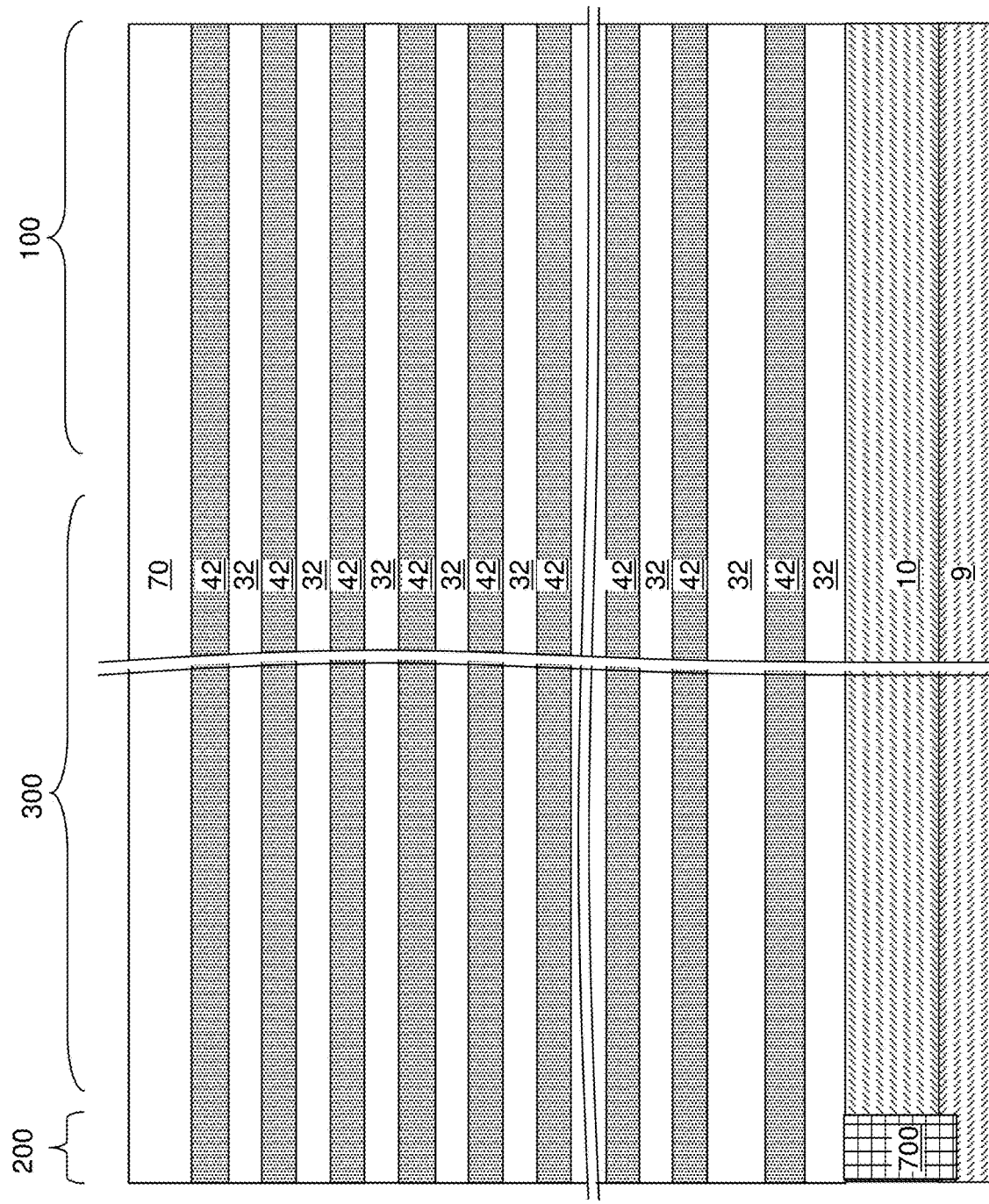
FIG. 7 is a schematic vertical cross-sectional view of the first exemplary structure after formation of an alternating stack of insulating layers and sacrificial material layers according to an embodiment of the present disclosure.

Referring to FIG. 7, a stack of an alternating plurality of first material layers (which may be insulating layers 32) and second material layers (which may be sacrificial material layer 42) is formed over the top surface of the semiconductor material layer 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer 42. In this case, the stack may include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 can be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the interface 7 between the carrier substrate 9 and the semiconductor material layer 10.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer 42 (e.g., a control gate electrode or a sacrificial material layer) may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

In alternative embodiments, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

The first exemplary structure may include at least one memory array region 100 in which a three-dimensional array of memory elements is to be subsequently formed, at least one staircase region 300 in which stepped surfaces of the alternating stack (32, 42) are to be subsequently formed, and an interconnection region 200 in which interconnection via structures extending through the levels of the alternating stack (32, 42) are to be subsequently formed.

Figure 8:
FIG. 8 is a schematic vertical cross-sectional view of the first exemplary structure after formation of stepped terraces and a retro-stepped dielectric material portion according to an embodiment of the present disclosure.

Referring to FIG. 8, stepped surfaces are formed in the staircase region 300, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the interconnection region 200 containing the at least one semiconductor device for the peripheral circuitry. The stepped cavity may have various stepped surfaces such that the horizontal cross-sectional shape of the stepped cavity changes in steps as a function of the vertical distance from the top surface of the semiconductor material layer 10. In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer 42. In one embodiment, each vertical step may have the height of a single pair of an insulating layer 32 and a sacrificial material layer 42. In another embodiment, multiple "columns" of staircases may be formed along a word line direction wd such that each vertical step has the height of a plurality of pairs of an insulating layer 32 and a sacrificial material layer 42, and the number of columns may be at least the number of the plurality of pairs. Each column of staircase may be vertically offset from one another such that each of the sacrificial material layers 42 has a physically exposed top surface in a respective column of staircases. In an illustrative example (not shown in FIG. 8), two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets from the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the word line direction wd, and the columns of staircases may be arranged along a bit line direction bd that is perpendicular to the word line direction wd. In one embodiment, the word line direction wd may be perpendicular to the boundary between the memory array region 100 and the staircase region 300.

A stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the carrier substrate 9.

Optionally, drain select level isolation structures 72 may be formed through the insulating cap layer 70 and a subset of the sacrificial material layers 42 located at drain select levels. The drain select level isolation structures 72 may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 9A:
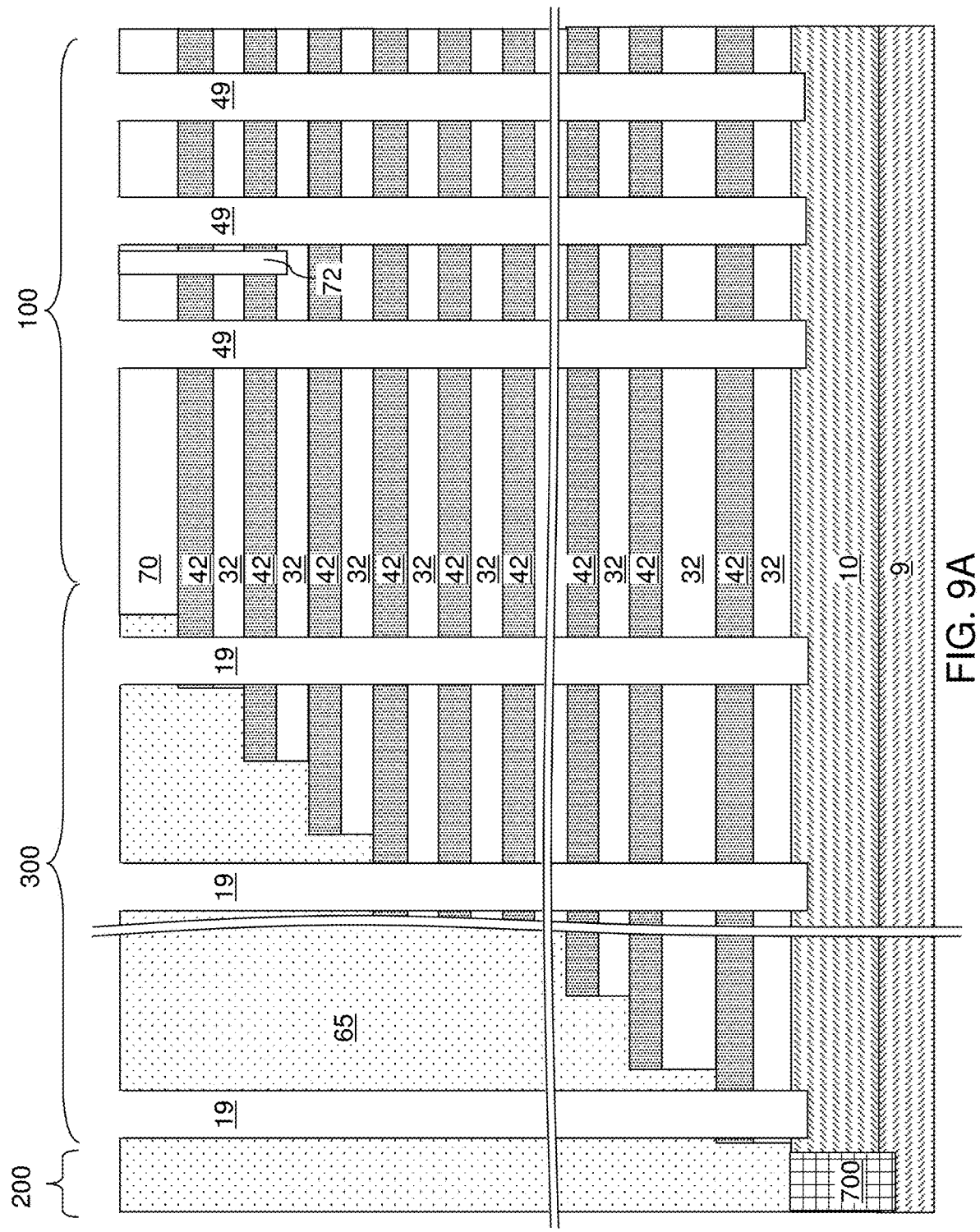
FIG. 9A is a schematic vertical cross-sectional view of the first exemplary structure after formation of memory openings and support openings according to an embodiment of the present disclosure.
Figure 9B:
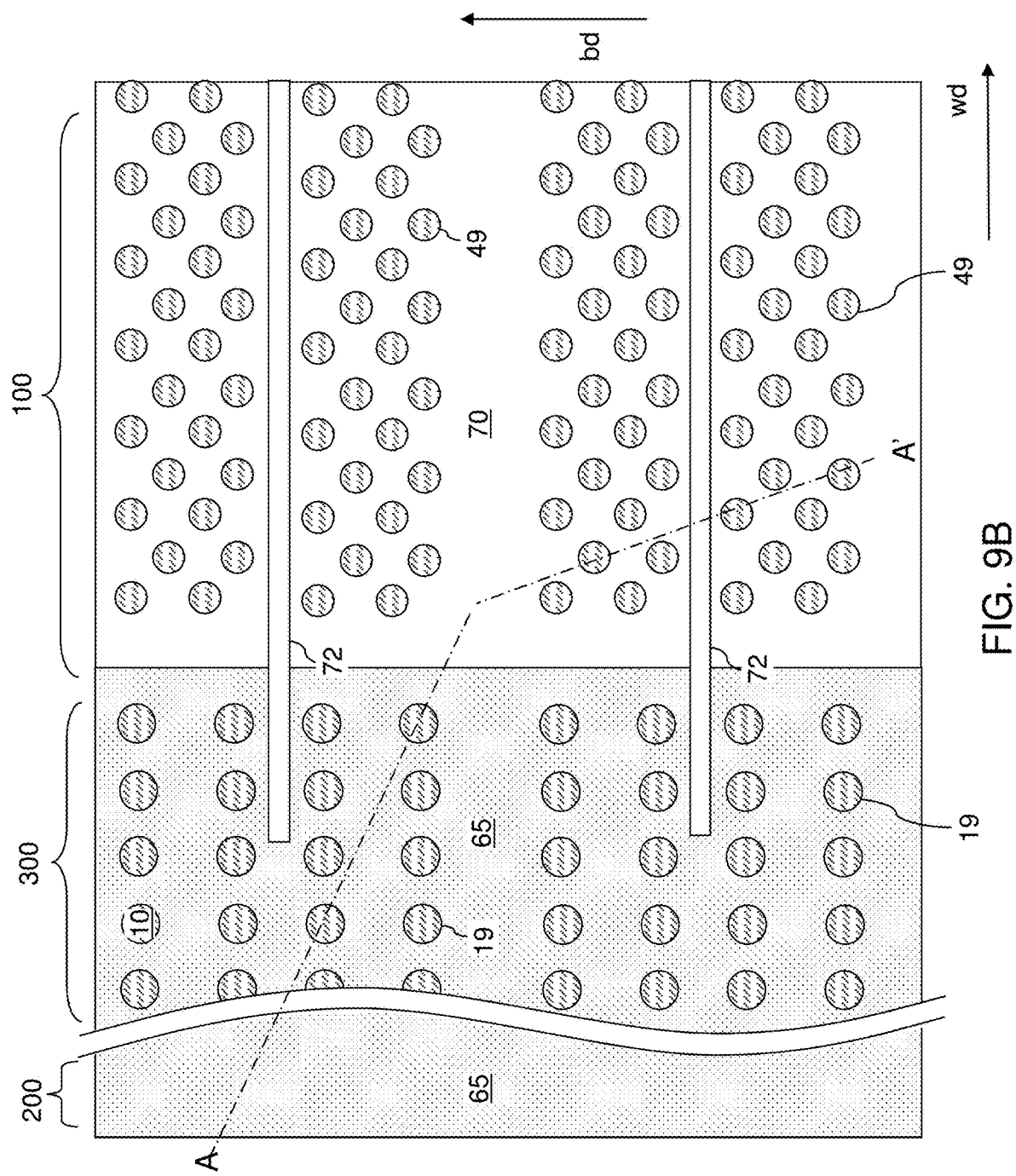
FIG. 9B is a top-down view of the first exemplary structure of FIG. 9A. The vertical plane A-A' is the plane of the cross-section for FIG. 9A.

Referring to FIGS. 9A and 9B, a lithographic material stack (not shown) including at least a photoresist layer may be formed over the insulating cap layer 70 and the stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300.

FIGS. 10A-10H illustrate structural changes in a memory opening 49, which is one of the memory openings 49 in the first exemplary structure of FIGS. 9A and 9B. The same structural change occurs simultaneously in each of the other memory openings 49 and in each support opening 19.

Referring to FIG. 10A, a memory opening 49 in the exemplary device structure of FIGS. 10A and 10B is illustrated. The memory opening 49 extends through the insulating cap layer 70, the alternating stack (32, 42), and optionally into an upper portion of the semiconductor material layer 10. At this processing step, each support opening 19 may extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Alternatively, the sacrificial material layers 42 may be laterally recessed partially to form lateral recesses (not shown), for example, by an isotropic etch.

Referring to FIG. 10B, an optional pedestal channel portion (e.g., an epitaxial pedestal) 11 may be formed at the bottom portion of each memory opening 49. While FIG. 10B illustrates the pedestal channel portion 11 formed in the bottom portion of a memory opening 49, such pedestal channel portion 11 may be formed in the bottom portion of support opening 19. In either case, the pedestal channel portion 11 may be formed, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 may be doped with electrical dopants of the same conductivity type as the semiconductor material layer 10. In one embodiment, the top surface of each pedestal channel portion 11 may be formed above a horizontal plane including the top surface of a sacrificial material layer 42. In this case, at least one source select gate electrode may be subsequently formed by replacing each sacrificial material layer 42 located below the horizontal plane including the top surfaces of the pedestal channel portions 11 with a respective conductive material layer. The pedestal channel portion 11 may be a portion of a transistor channel that extends between a source region to be subsequently formed in the carrier substrate, semiconductor material layer (9, 10) (collectively "substrate") and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the carrier substrate 9, which may have a doping of the first conductivity type.

Referring to FIG. 10C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may also be used to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' is formed in the volume of each memory opening 49 that is not filled with the deposited material layers (52, 54, 56, 601).

Referring to FIG. 10D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process employing a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in embodiments where pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Referring to FIG. 10E, a second semiconductor channel layer 602 may be deposited directly on the semiconductor surface of the pedestal channel portion 11 or the semiconductor material layer 10 if the pedestal channel portion 11 is omitted, and directly on the first semiconductor channel layer 601. Alternatively, the first semiconductor channel layer 601 may be optionally removed before depositing the second semiconductor channel layer 602. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 10F, in case the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 10G, the horizontal portion of the dielectric core layer 62L may be removed, for example, by a recess etch or CMP from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 may be removed by a planarization process, which may employ a recess etch or chemical mechanical planarization (CMP). Each remaining portion of the second semiconductor channel layer 602 may be located entirety within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 10H, the top surface of each dielectric core 62 may be further recessed within each memory opening, for example, by a recess etch to a depth that is located between the top surface of the insulating cap layer 70 and the bottom surface of the insulating cap layer 70. Drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon. Excess portions of the deposited semiconductor material may be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20 (not shown in FIG. 10H).

Figure 11:
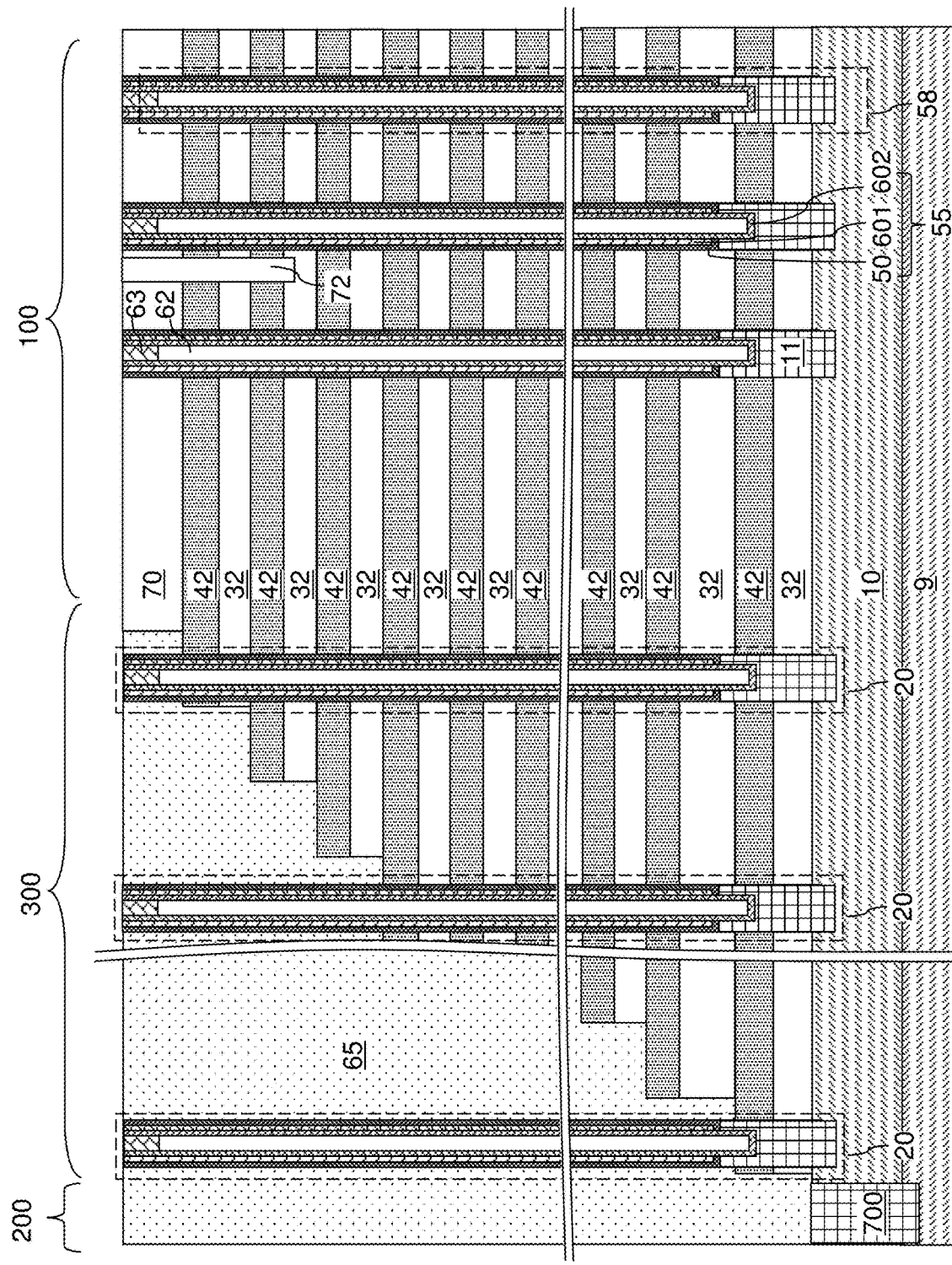
FIG. 11 is a schematic vertical cross-sectional view of the first exemplary structure after formation of memory stack structures and support pillar structures according to an embodiment of the present disclosure.

Referring to FIG. 11, the first exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 9A and 9B. An instance of the support pillar structure 20 may be formed within each support opening 19 of the structure of FIGS. 9A and 9B. The support pillar structures 20 are formed through a region of the alternating stack (32, 42) that underlie the stepped surfaces and a region of the stepped dielectric material portion 65 that overlie the stepped surfaces. Each of the support pillar structures 20 comprises a semiconductor material portion (i.e., a vertical semiconductor channel 60 of the support pillar structure 20) having a same composition as the vertical semiconductor channels 60 of the memory opening fill structures 58, and a dielectric layer stack (i.e., a memory film 50 of a support pillar structure 20) containing a same set of dielectric material layers as each of the memory films 50 of the memory opening fill structures 58. While the present disclosure is described employing the illustrated configuration for the memory stack structure, the methods of the present disclosure may be applied to alternative memory stack structures including different layer stacks or structures for the memory film 50 and/or for the vertical semiconductor channel 60.

Figure 12A:
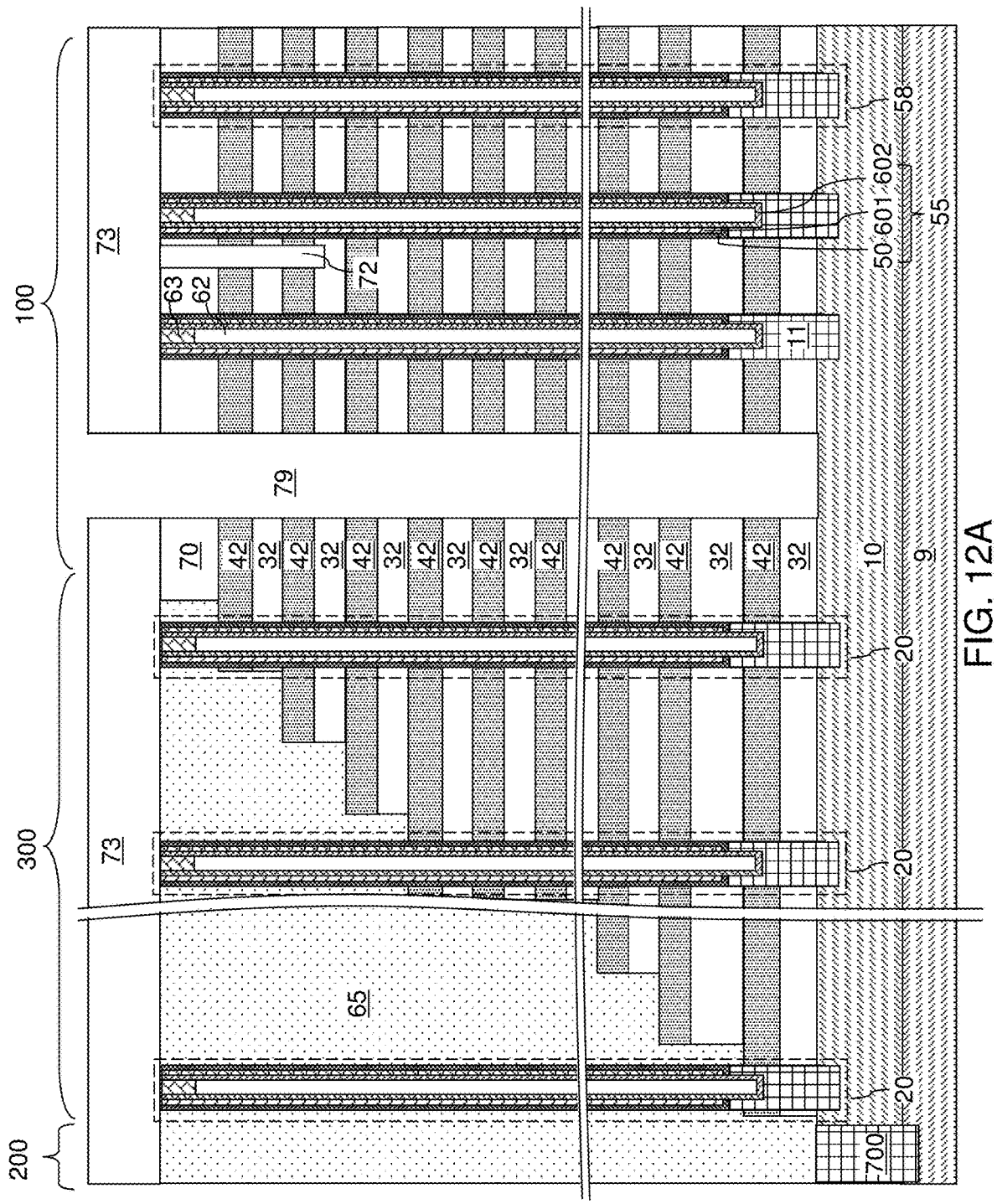
FIG. 12A is a schematic vertical cross-sectional view of the first exemplary structure after formation of backside trenches according to an embodiment of the present disclosure.
Figure 12B:
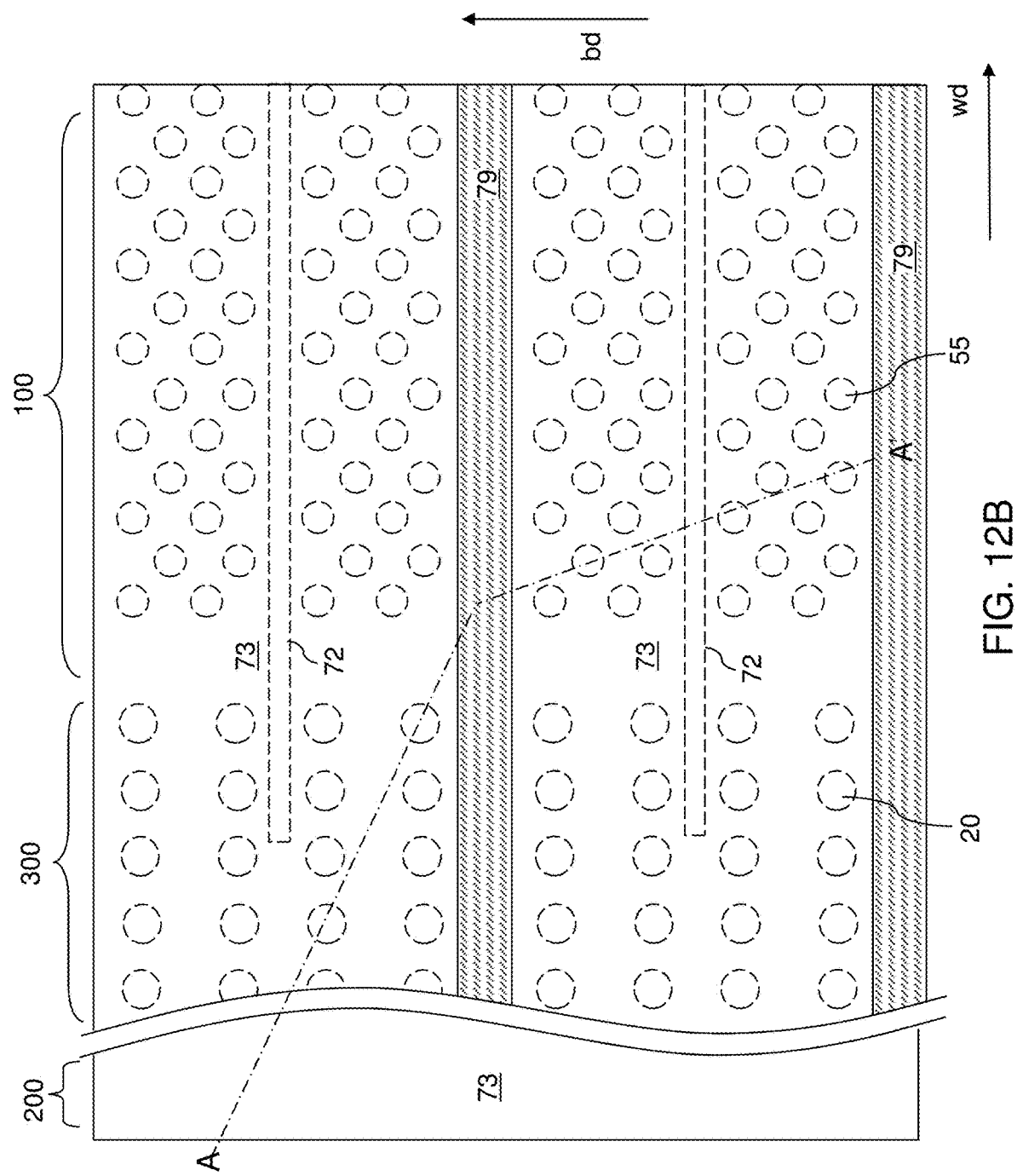
FIG. 12B is a partial see-through top-down view of the first exemplary structure of FIG. 12A. The vertical plane A-A' is the plane of the schematic vertical cross-sectional view of FIG. 12A.

Referring to FIGS. 12A and 12B, a contact level dielectric layer 73 may be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be used.

A photoresist layer (not shown) may be applied over the contact level dielectric layer 73, and is lithographically patterned to form openings in areas between clusters of memory stack structures 55. The pattern in the photoresist layer may be transferred through the contact level dielectric layer 73, the alternating stack (32, 42) and/or the stepped dielectric material portion 65 employing an anisotropic etch to form backside trenches 79, which vertically extend from the top surface of the contact level dielectric layer 73 at least to the top surface of the substrate semiconductor material layer 10, and laterally extend through the memory array region 100 and the staircase region 300.

In one embodiment, the backside trenches 79 may laterally extend along a word line direction wd and may be laterally spaced apart with respect to one another along a bit line direction bd that is perpendicular to the word line direction wd. The memory stack structures 55 may be arranged in rows that extend along the word line direction wd. The drain select level isolation structures 72 may laterally extend along the word line direction wd. Each backside trench 79 may have a uniform width that is invariant along the lengthwise direction (i.e., along the word line direction wd). Each drain select level isolation structure 72 may have a uniform vertical cross-sectional profile along vertical planes that are perpendicular to the word line direction wd that is invariant with translation along the word line direction wd. Multiple rows of memory stack structures 55 may be located between a neighboring pair of a backside trench 79 and a drain select level isolation structure 72, or between a neighboring pair of drain select level isolation structures 72. In one embodiment, the backside trenches 79 may include a source contact opening in which a source contact via structure may be subsequently formed. The photoresist layer may be removed, for example, by ashing.

Figure 13:
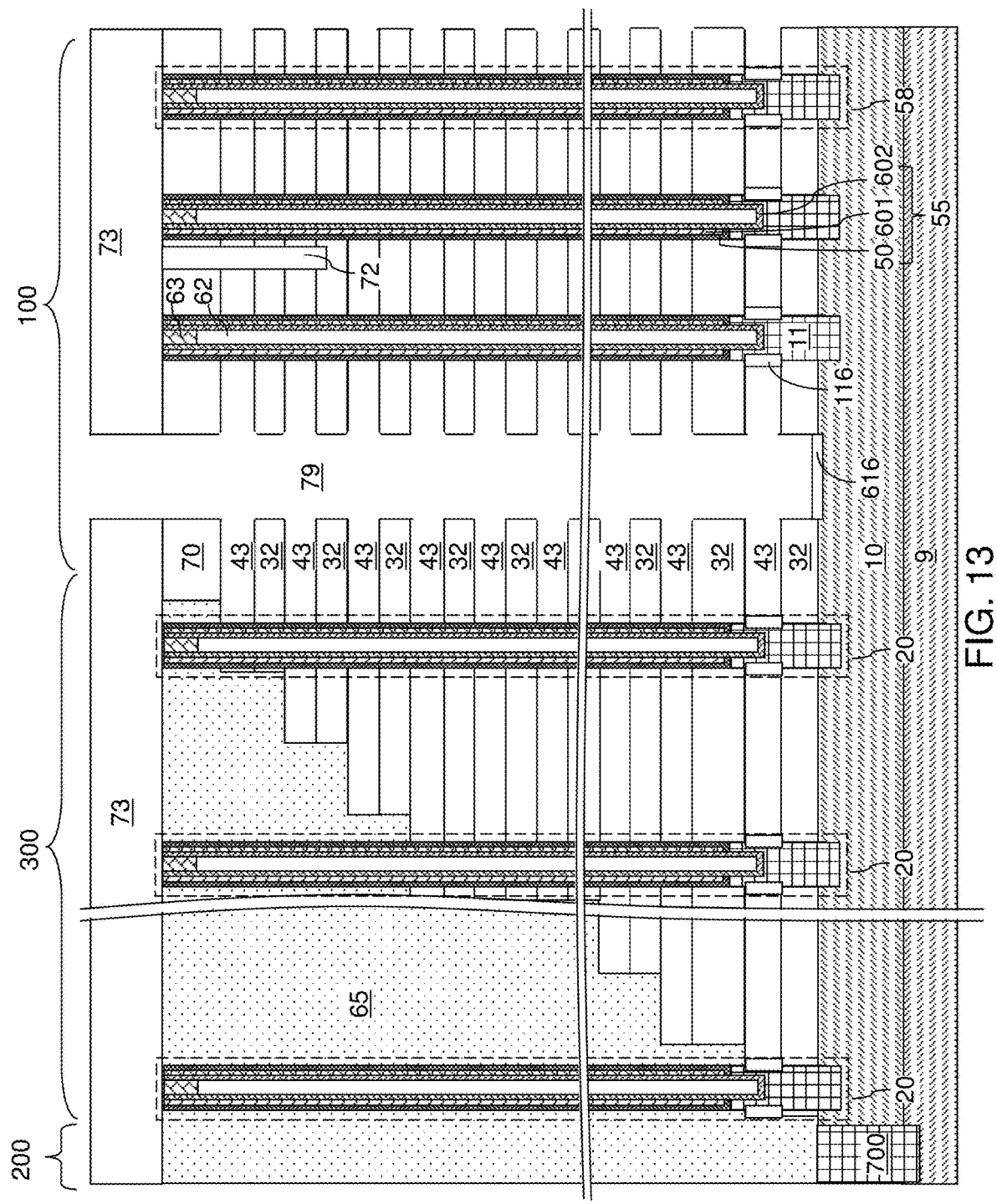
FIG. 13 is a schematic vertical cross-sectional view of the first exemplary structure after formation of backside recesses according to an embodiment of the present disclosure.

Referring to FIGS. 13 and 14A, an etchant that selectively etches the second material of the sacrificial material layers 42 with respect to the first material of the insulating layers 32 may be introduced into the backside trenches 79, for example, employing an etch process. FIG. 14A illustrates a region of the first exemplary structure of FIG. 13. Backside recesses 43 are formed in volumes from which the sacrificial material layers 42 are removed. The removal of the second material of the sacrificial material layers 42 may be selective to the first material of the insulating layers 32, the contact level dielectric layer 73, the insulating cap layer 70, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32 and the retro-stepped dielectric material portion 65 may be selected from silicon oxide and dielectric metal oxides.

The etch process that removes the second material selective to the first material and the outermost layer of the memory films 50 may be a wet etch process employing a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Referring to FIG. 14B, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 may include a silicon oxide layer. The backside blocking dielectric layer 44 may be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 14C, a metallic barrier layer 46A may be deposited in the backside recesses 43. The metallic barrier layer 46A includes an electrically conductive metallic material that may function as a diffusion barrier layer and/or adhesion promotion layer for a metallic fill material to be subsequently deposited. The metallic barrier layer 46A may include a conductive metallic nitride material such as TiN, TaN, WN, or a stack thereof, or may include a conductive metallic carbide material such as TiC, TaC, WC, or a stack thereof. In one embodiment, the metallic barrier layer 46A may be deposited by a conformal deposition process such as chemical vapor deposition (CVD) or atomic layer deposition (ALD). The thickness of the metallic barrier layer 46A may be in a range from 2 nm to 8 nm, such as from 3 nm to 6 nm, although lesser and greater thicknesses may also be used. In one embodiment, the metallic barrier layer 46A may consist essentially of a conductive metal nitride such as TiN.

Figure 15:
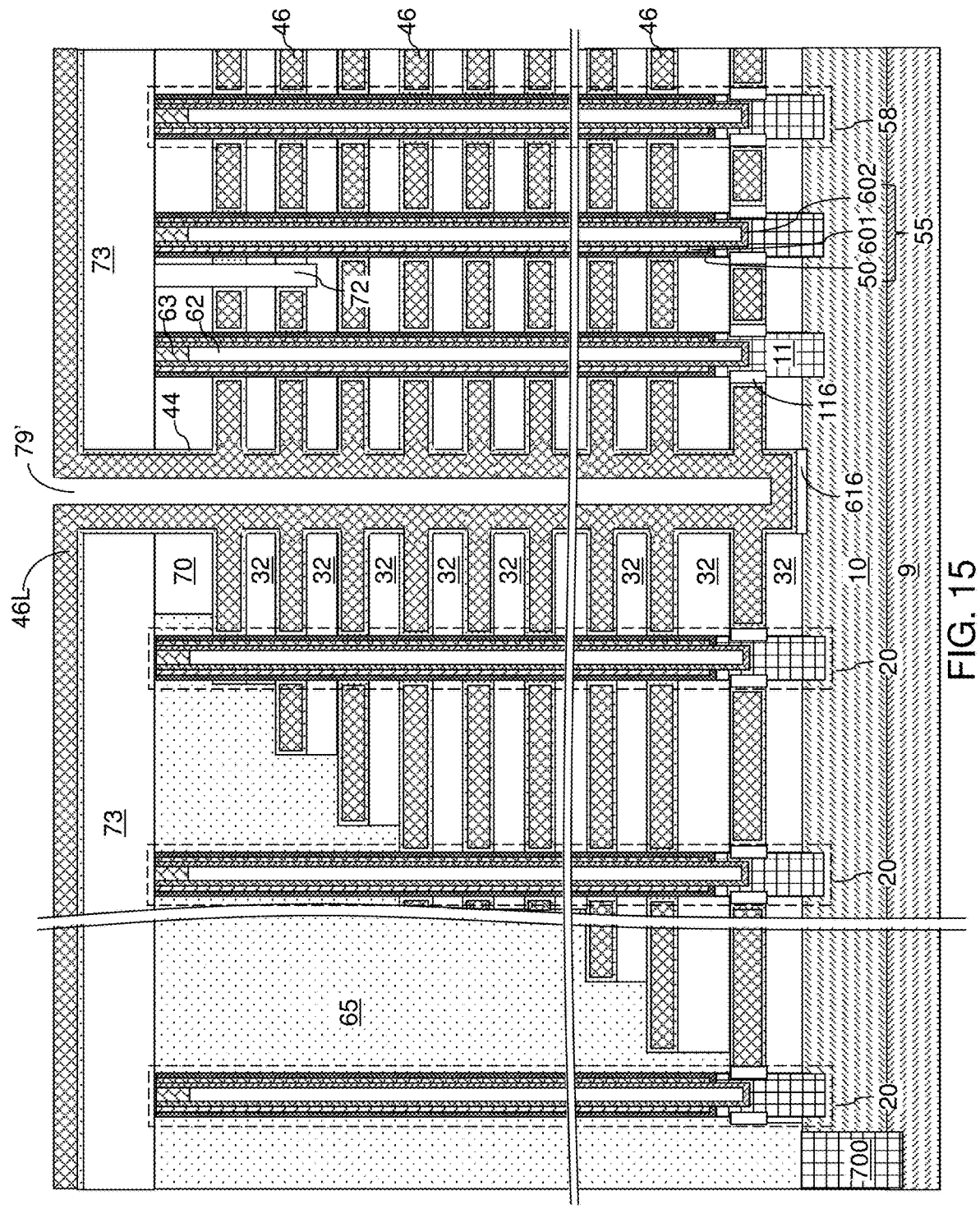
FIG. 15 is a schematic vertical cross-sectional view of the first exemplary structure at the processing step of FIG. 14D.

Referring to FIGS. 14D and 15, a metal fill material is deposited in the plurality of backside recesses 43, on the sidewalls of the backside trench 79, and over the top surface of the contact level dielectric layer 73 to form a metallic fill material layer 46B. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer 46B may consist essentially of at least one elemental metal. The at least one elemental metal of the metallic fill material layer 46B may be selected, for example, from tungsten, cobalt, ruthenium, titanium, and tantalum. In one embodiment, the metallic fill material layer 46B may consist essentially of a single elemental metal. In one embodiment, the metallic fill material layer 46B may be deposited employing a fluorine-containing precursor gas such as $WF_6$. In one embodiment, the metallic fill material layer 46B may be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 may be formed in the plurality of backside recesses 43, and a continuous metallic material layer 46L may be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 may be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 16A:
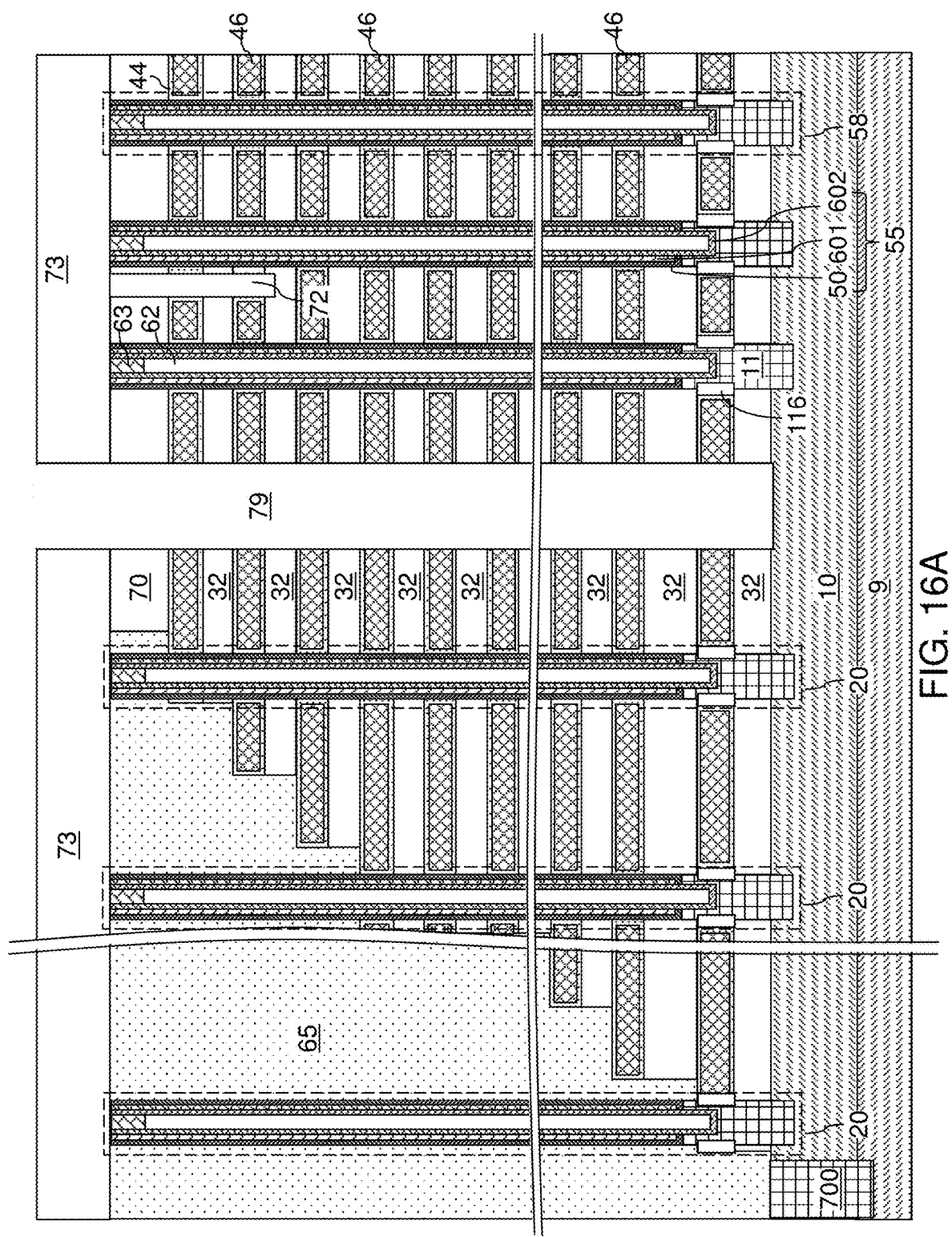
FIG. 16A is a schematic vertical cross-sectional view of the first exemplary structure after removal of a deposited conductive material from within the backside trench according to an embodiment of the present disclosure.
Figure 16B:
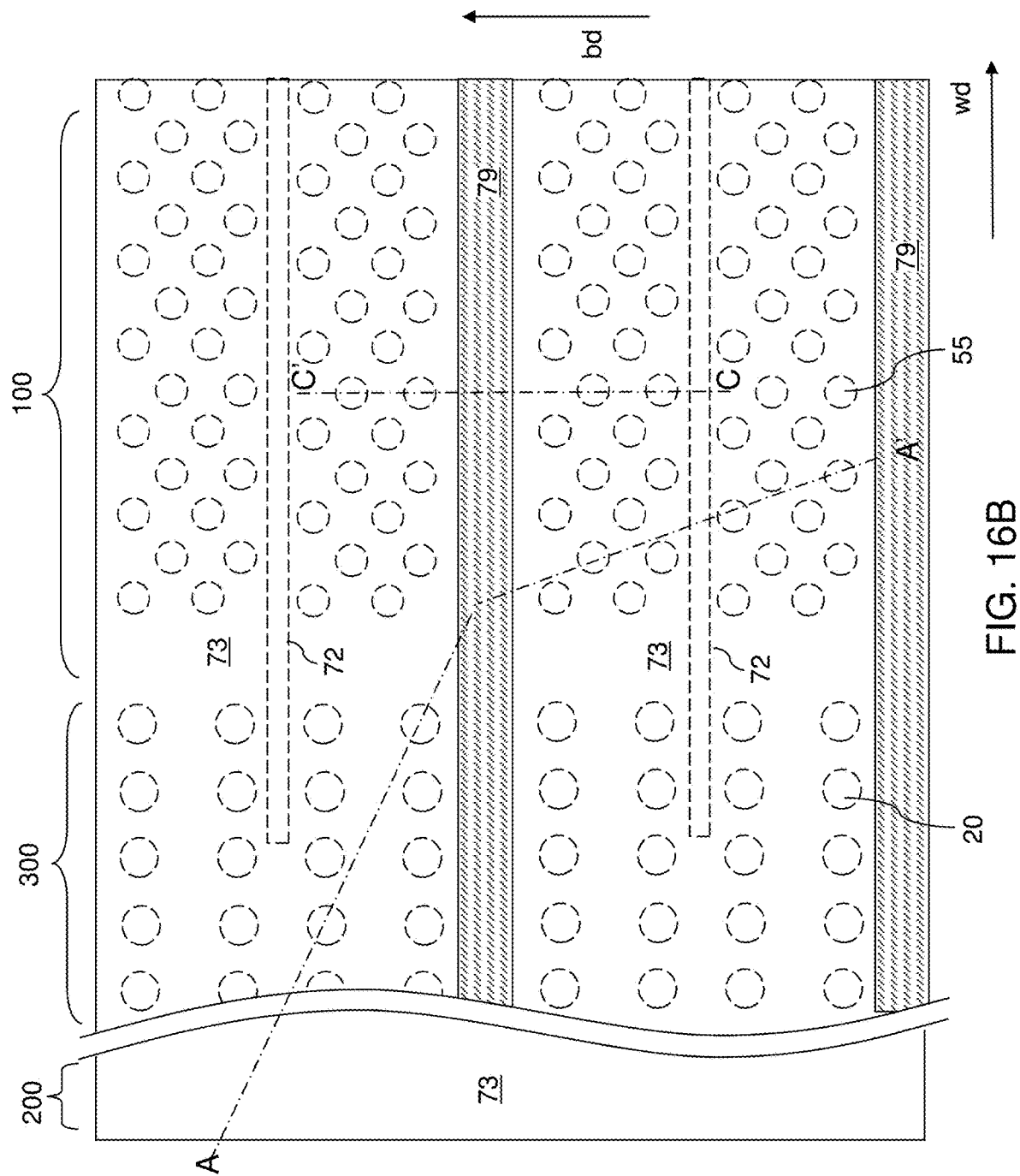
FIG. 16B is a partial see-through top-down view of the first exemplary structure of FIG. 16A. The vertical plane A-A' is the plane of the schematic vertical cross-sectional view of FIG. 16A.
Figure 16C:
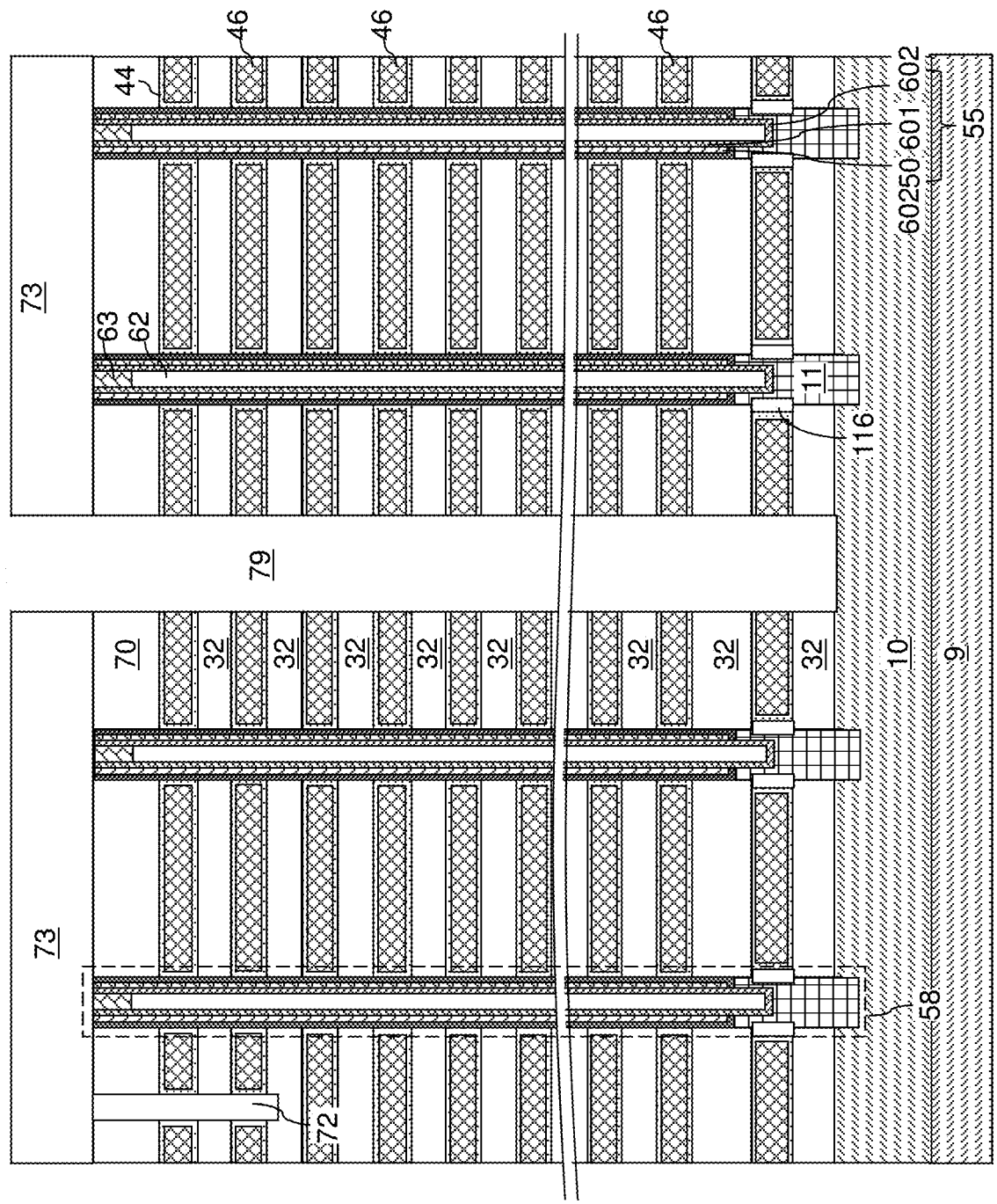
FIG. 16C is a vertical cross-sectional view of the first exemplary structure along the vertical plane C-C' of FIG. 16B.

Referring to FIGS. 16A-16C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer 46L may be selective to the material of the backside blocking dielectric layer 44. In this case, a horizontal portion of the backside blocking dielectric layer 44 may be present at the bottom of each backside trench 79. In another embodiment, the removal of the continuous electrically conductive material layer 46L may not be selective to the material of the backside blocking dielectric layer 44 or, the backside blocking dielectric layer 44 may not be used.

Figure 17A:
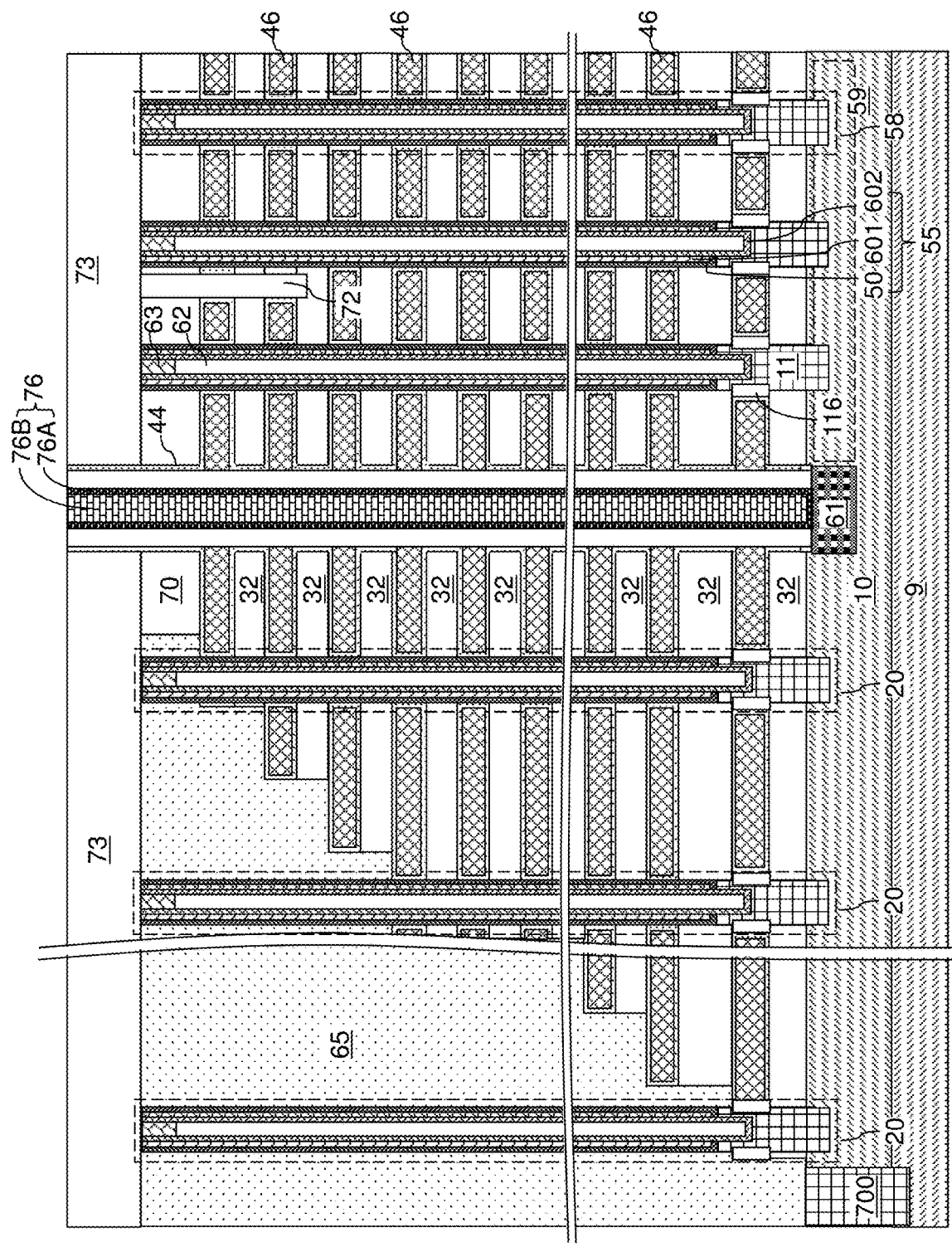
FIG. 17A is a schematic vertical cross-sectional view of the first exemplary structure after formation of an insulating spacer and a backside contact structure according to an embodiment of the present disclosure.
Figure 17B:
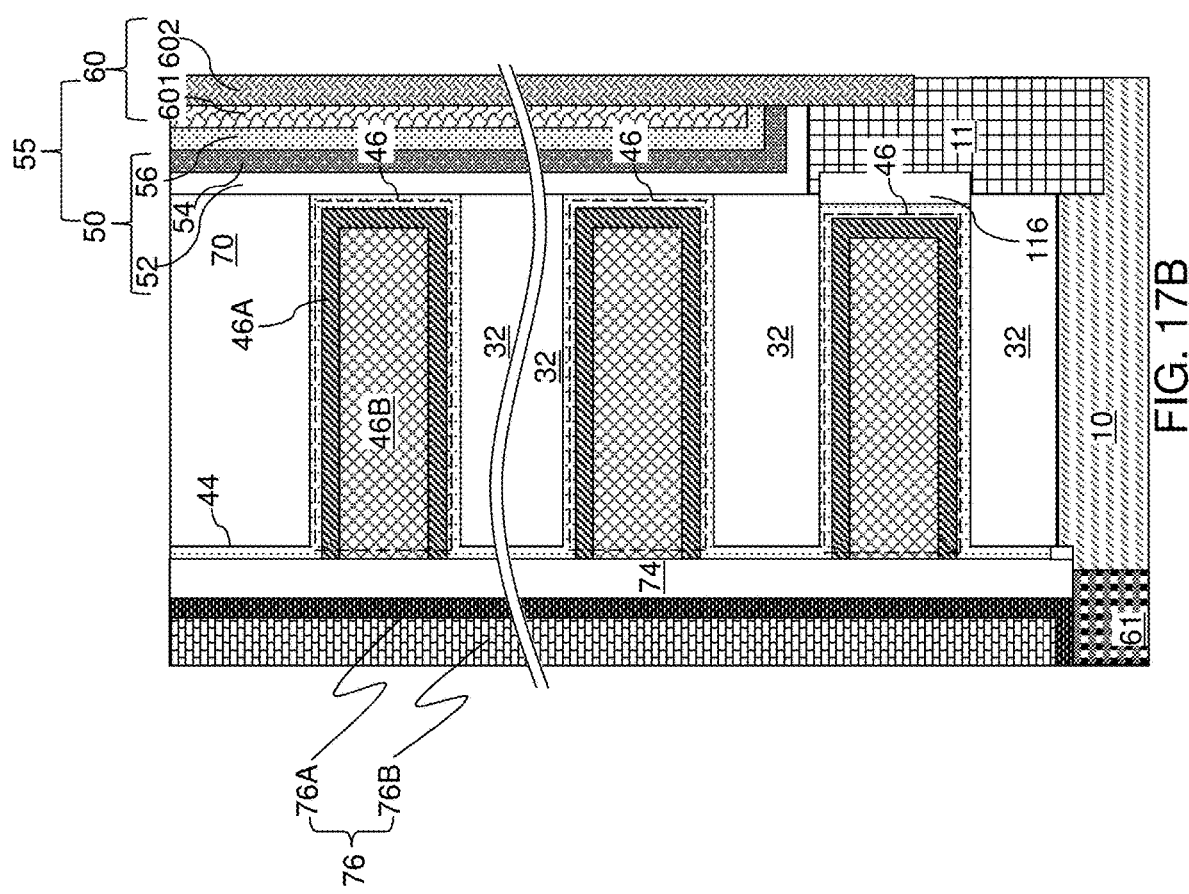
FIG. 17B is a magnified view of a region of the first exemplary structure of FIG. 17A.

Referring to FIGS. 17A and 17B, an insulating material layer may be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 may be physically exposed at the bottom of each backside trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized employing the contact level dielectric layer 73 overlying the alternating stack (32, 46) as a stopping layer. If chemical mechanical planarization (CMP) process is used, the contact level dielectric layer 73 may be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Figure 18A:
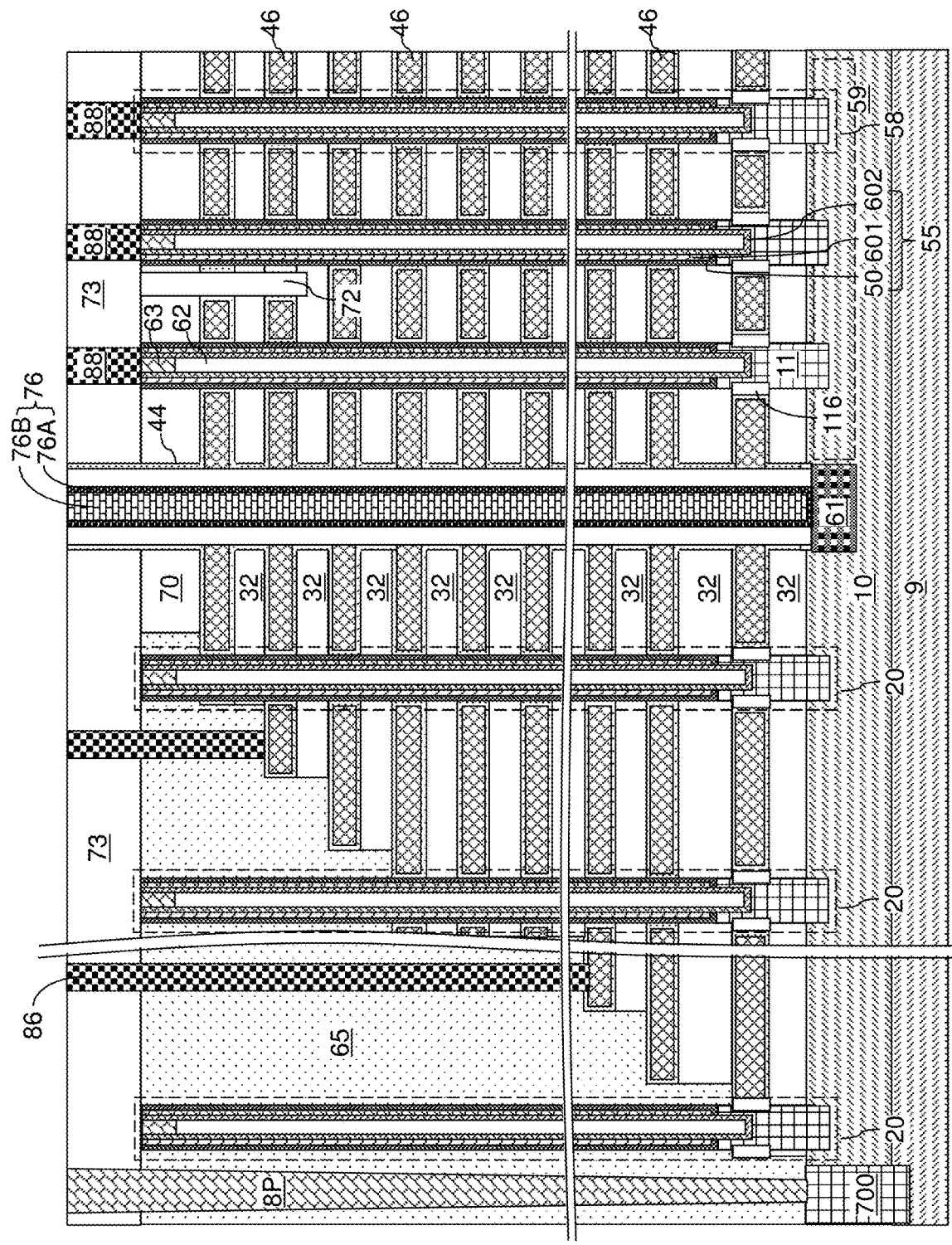
FIG. 18A is a schematic vertical cross-sectional view of the first exemplary structure after formation of additional contact via structures according to an embodiment of the present disclosure.
Figure 18B:
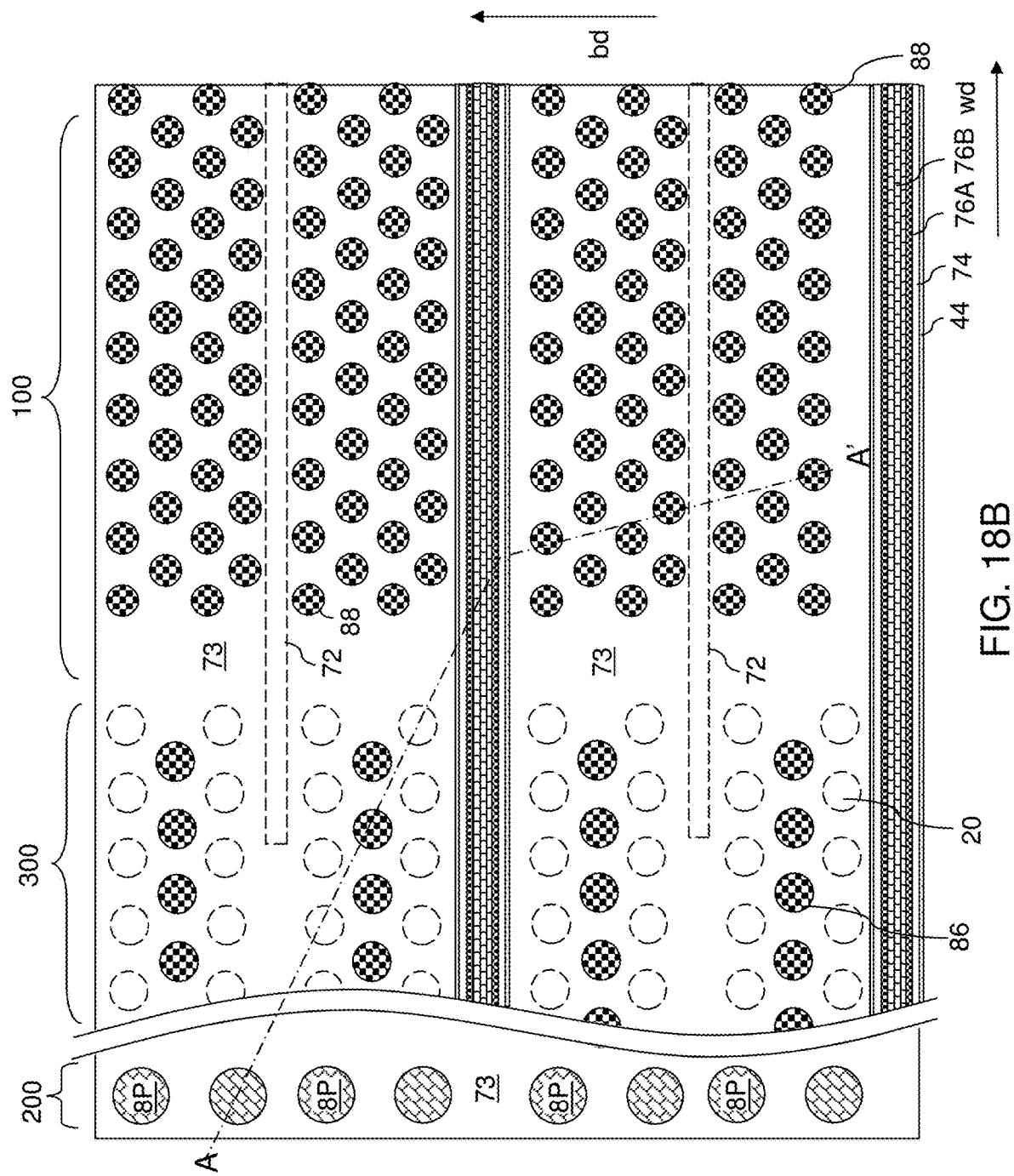
FIG. 18B is a top-down view of the first exemplary structure of FIG. 18A. The vertical plane A-A' is the plane of the schematic vertical cross-sectional view of FIG. 19A.

Referring to FIGS. 18A and 18B, additional contact via structures (88, 86, 8P) may be formed through the contact level dielectric layer 73, and optionally through the stepped dielectric material portion 65. For example, drain contact via structures 88 may be formed through the contact level dielectric layer 73 on each drain region 63. Word line contact via structures 86 may be formed on the electrically conductive layers 46 through the contact level dielectric layer 73, and through the stepped dielectric material portion 65. Pass-through via structures 8P may be formed through the stepped dielectric material portion 65 to the semiconductor material layer 10.

Figure 19A:
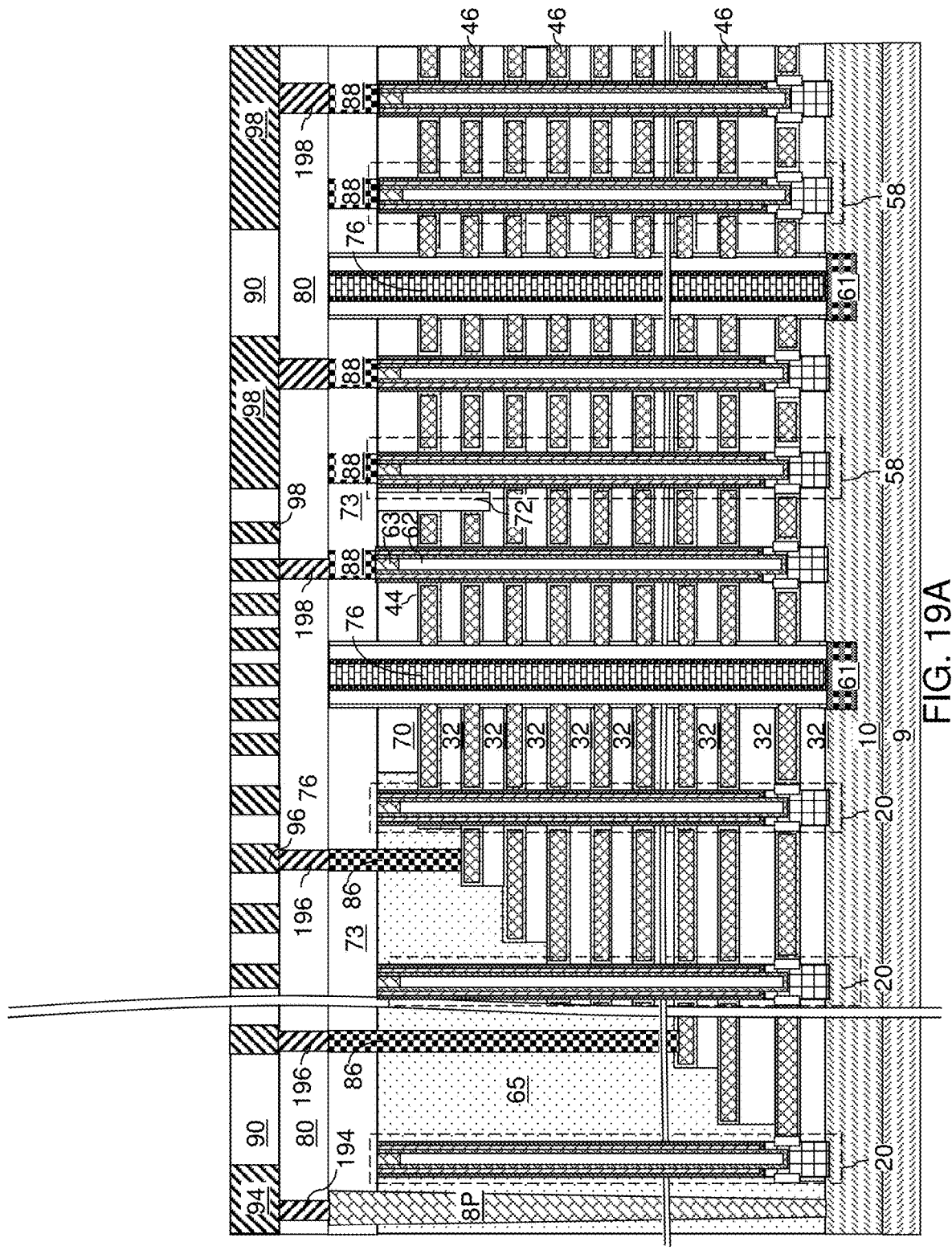
FIG. 19A is a schematic vertical cross-sectional view of the first exemplary structure after formation of bit lines and additional metal interconnect structures according to an embodiment of the present disclosure.

Referring to FIGS. 19A and 19B, a via level dielectric layer 80 is formed over the contact level dielectric layer 73. Various connection via structures (198, 196, 194) may be formed through the via level dielectric layer 80. For example, bit line connection via structures 198 may be formed on the drain contact via structures 88, word line connection via structures 196 may be formed on the word line contact via structures 86, and peripheral extension via structures 194 may be formed on the pass-through via structures 8P.

A first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 96 that are electrically connected to a respective one of the word line contact via structures 86 (for example, through a word line connection via structure 196), and peripheral metal interconnect lines 94 that are electrically connected to a respective one of the pass-through via structures 8P (for example, through a peripheral extension via structure 194).

The bit lines 98 are electrically connected to upper ends of a respective subset of the vertical semiconductor channels 60 in the memory stack structures 55 in the memory array region 100. In one embodiment, the memory stack structures 55 are arranged in rows that extend along the word line direction wd, and the bit lines 98 laterally extend along the bit line direction bd.

Figure 20:
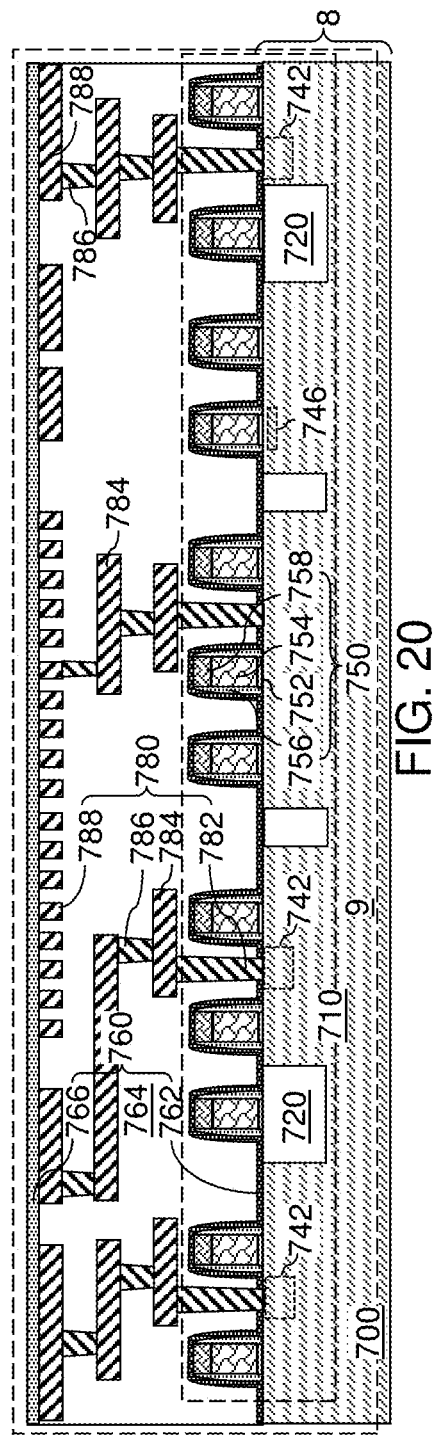
FIG. 20 is a vertical cross-sectional view of a second exemplary structure after formation of semiconductor devices, lower level dielectric layers, and lower metal interconnect structures according to an embodiment of the present disclosure.

Referring to FIG. 20, a second exemplary structure according to an embodiment of the present disclosure is illustrated. The second exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, and a silicon nitride layer (e.g., hydrogen diffusion barrier) 766 that overlies the first dielectric material layers 764.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

Figure 21A:
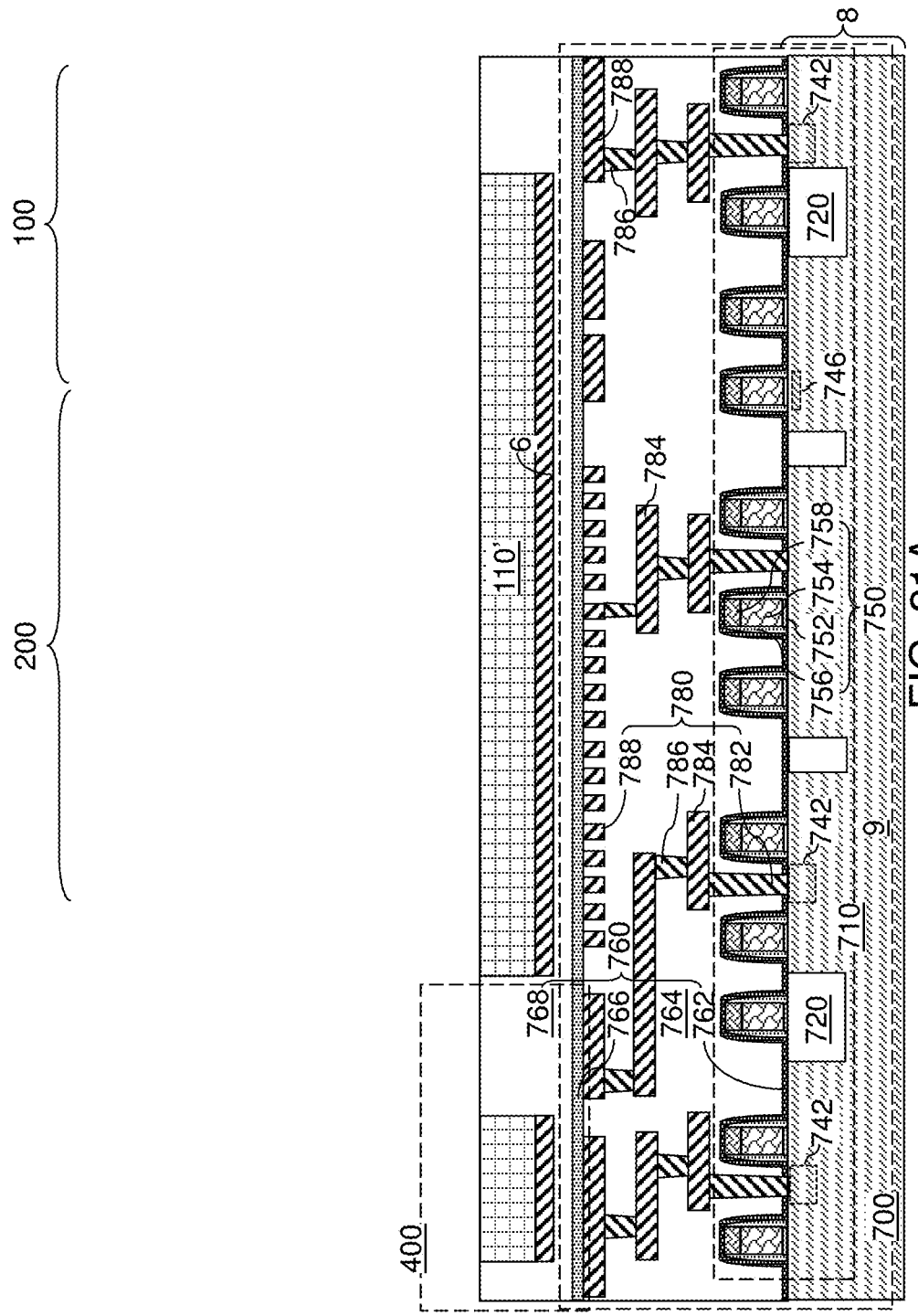
FIG. 21A is a vertical cross-sectional view of the second exemplary structure after formation of in-process source level material layers on a semiconductor substrate according to an embodiment of the present disclosure.
Figure 21B:
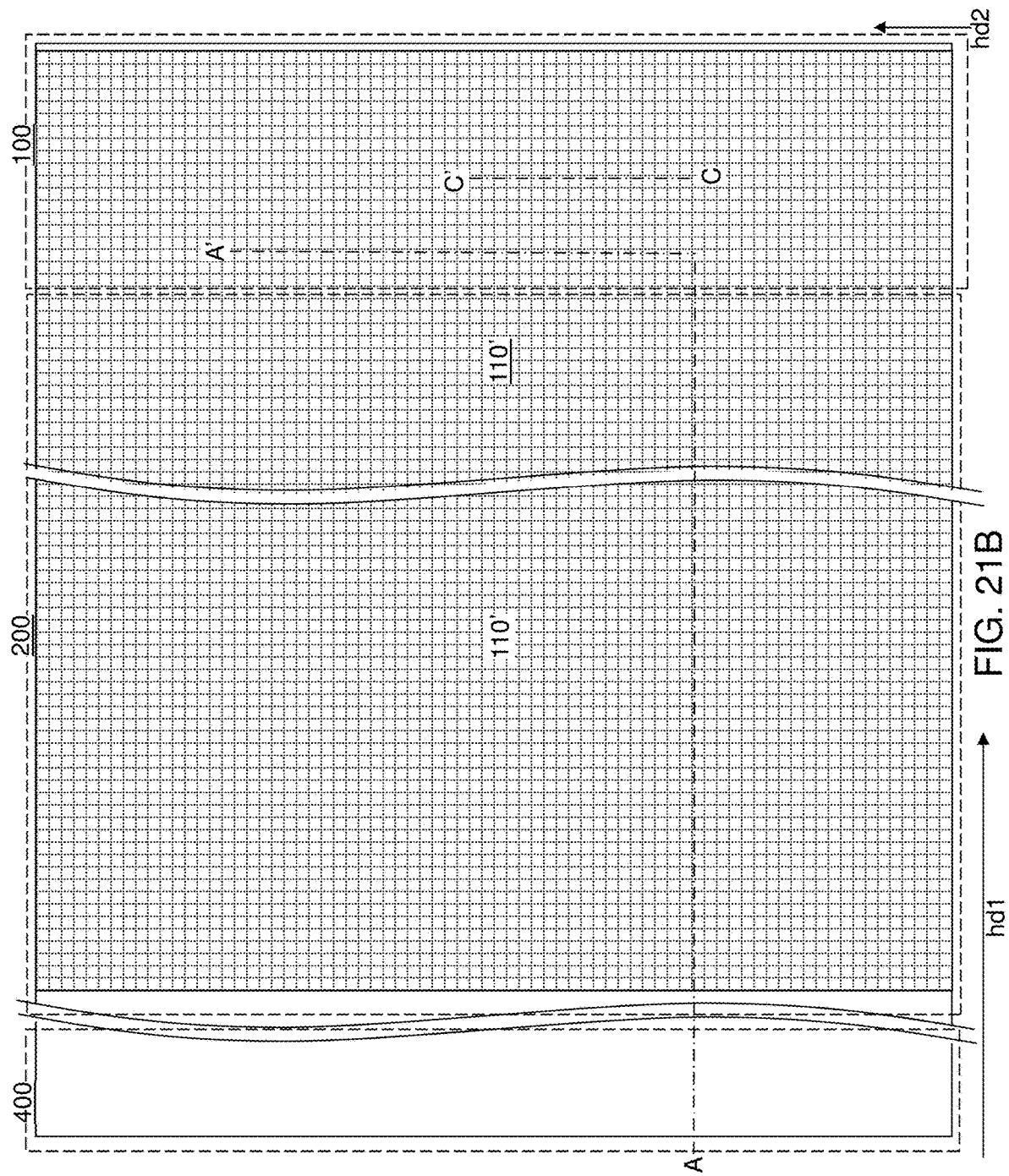
FIG. 21B is a top-down view of the second exemplary structure of FIG. 21A. The hinged vertical plane A-A' is the plane of the vertical cross-sectional view of FIG. 21A.
Figure 21C:
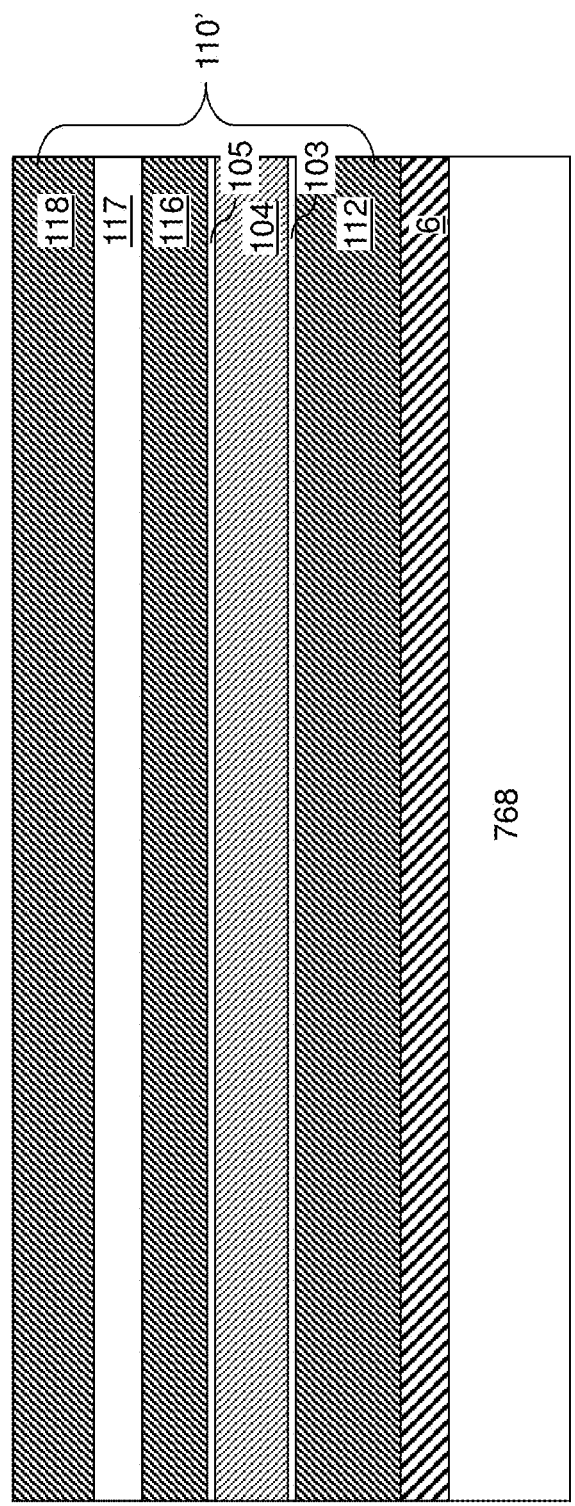
FIG. 21C is a magnified view of the in-process source level material layers along the vertical plane C-C' of FIG. 21B.

Referring to FIGS. 21A-21C, at least one second dielectric layer 768 can be formed as an additional component layer of the lower-level dielectric material layers 760. An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 22:
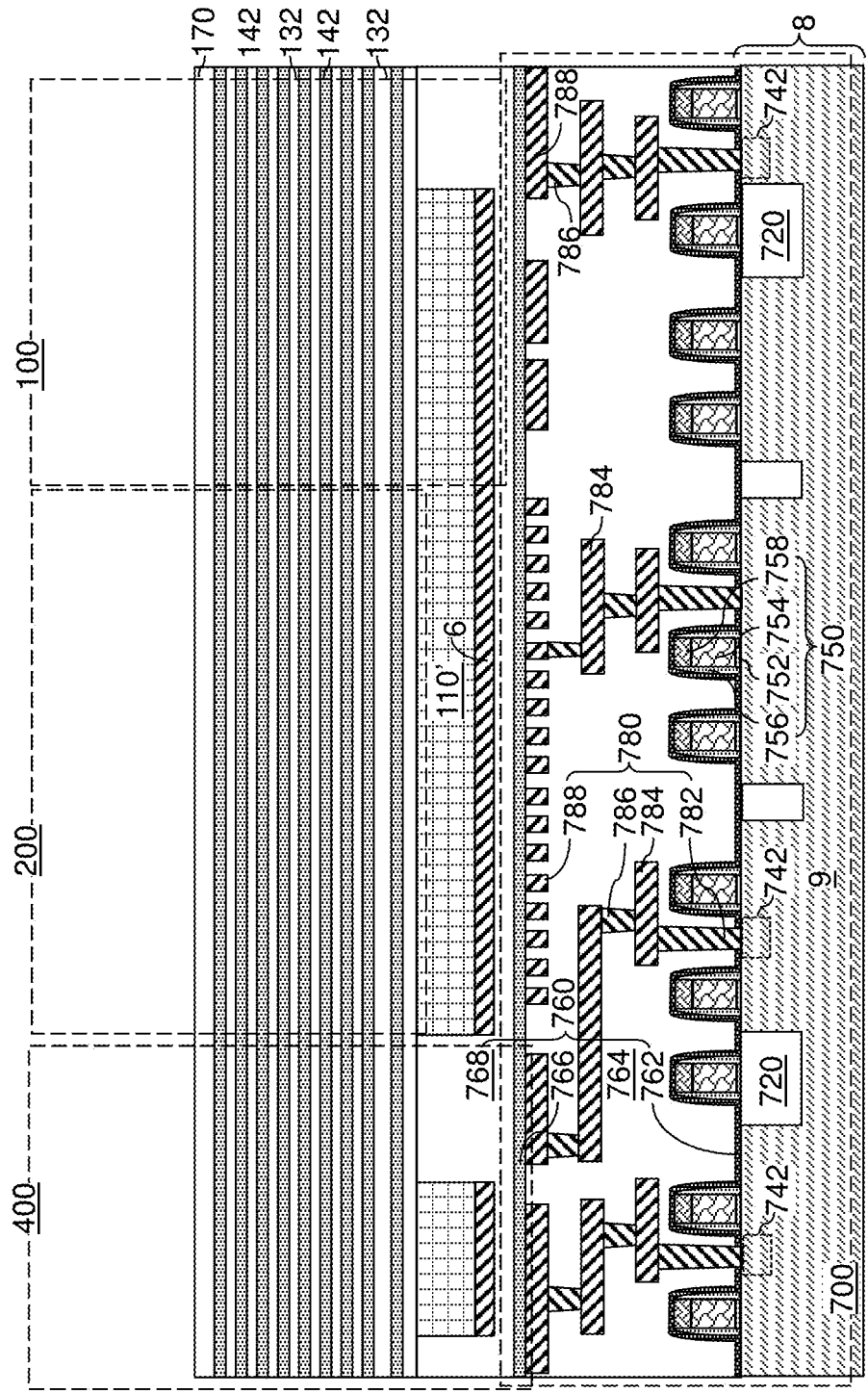
FIG. 22 is a vertical cross-sectional view of the second exemplary structure after formation of a first-tier alternating stack of first insulting layers and first spacer material layers according to an embodiment of the present disclosure.

Referring to FIG. 22, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 23:
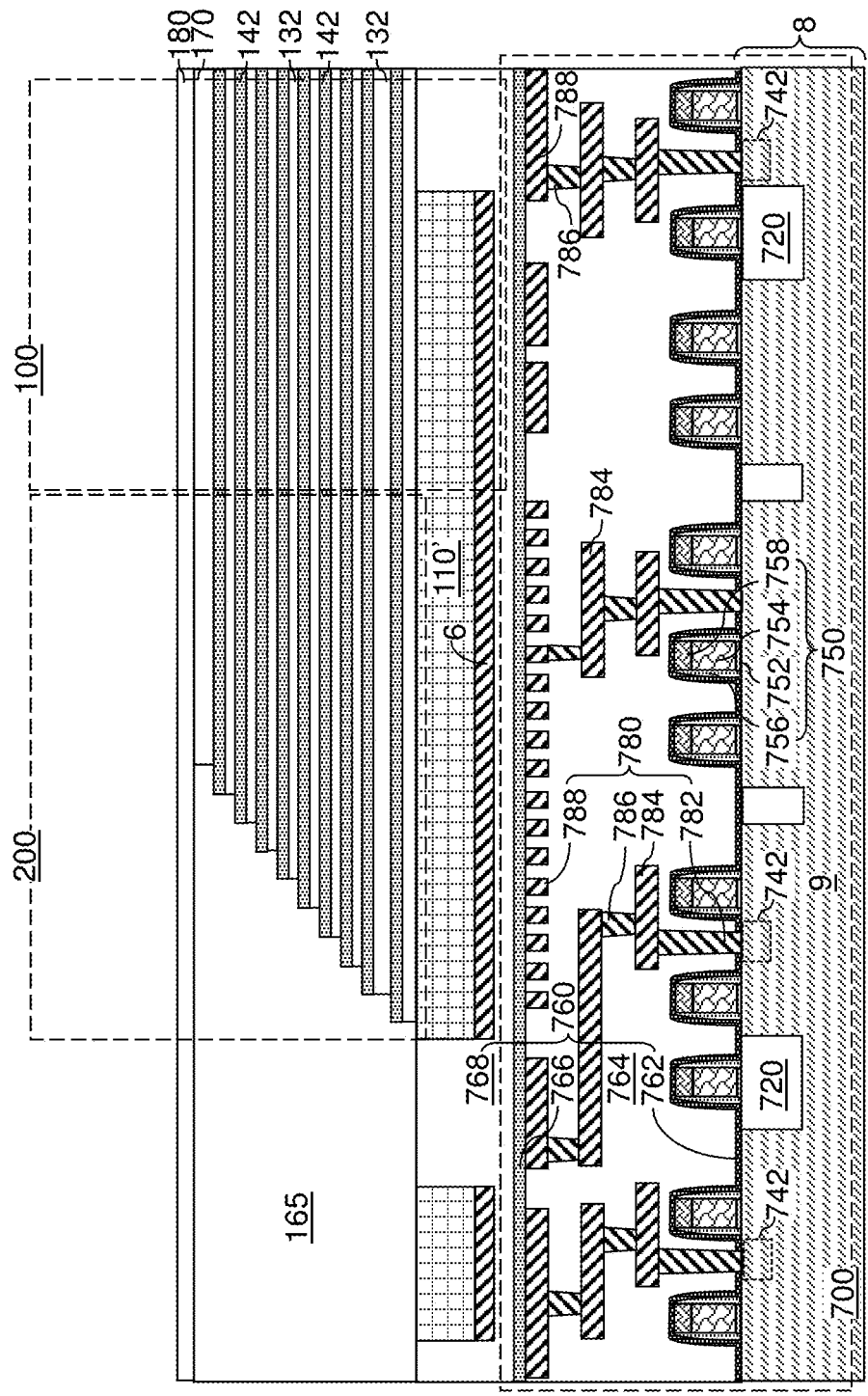
FIG. 23 is a vertical cross-sectional view of the second exemplary structure after patterning a first-tier staircase region, a first retro-stepped dielectric material portion, and an inter-tier dielectric layer according to an embodiment of the present disclosure.

Referring to FIG. 23, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 24A:
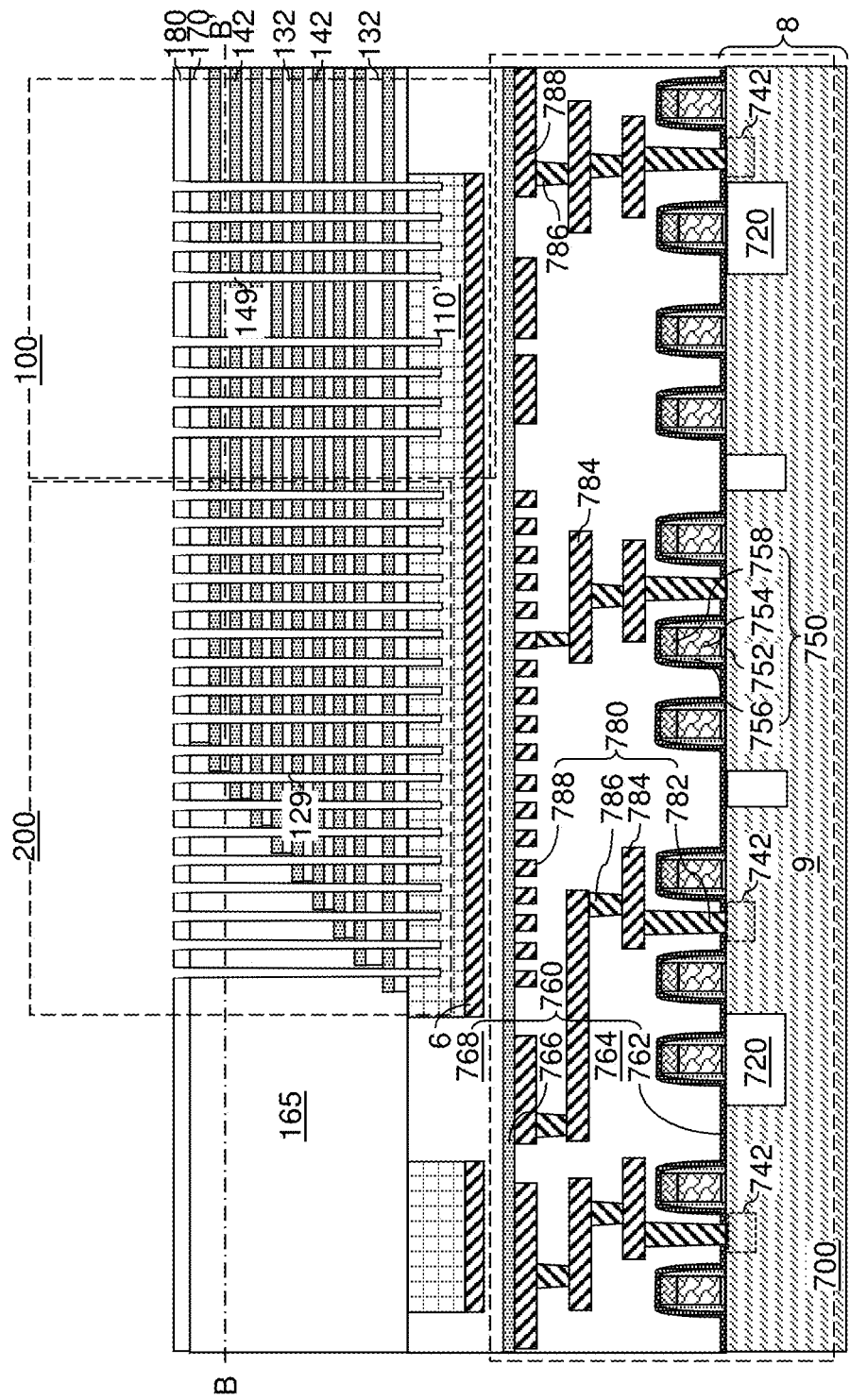
FIG. 24A is a vertical cross-sectional view of the second exemplary structure after formation of first-tier memory openings and first-tier support openings according to an embodiment of the present disclosure.
Figure 24B:
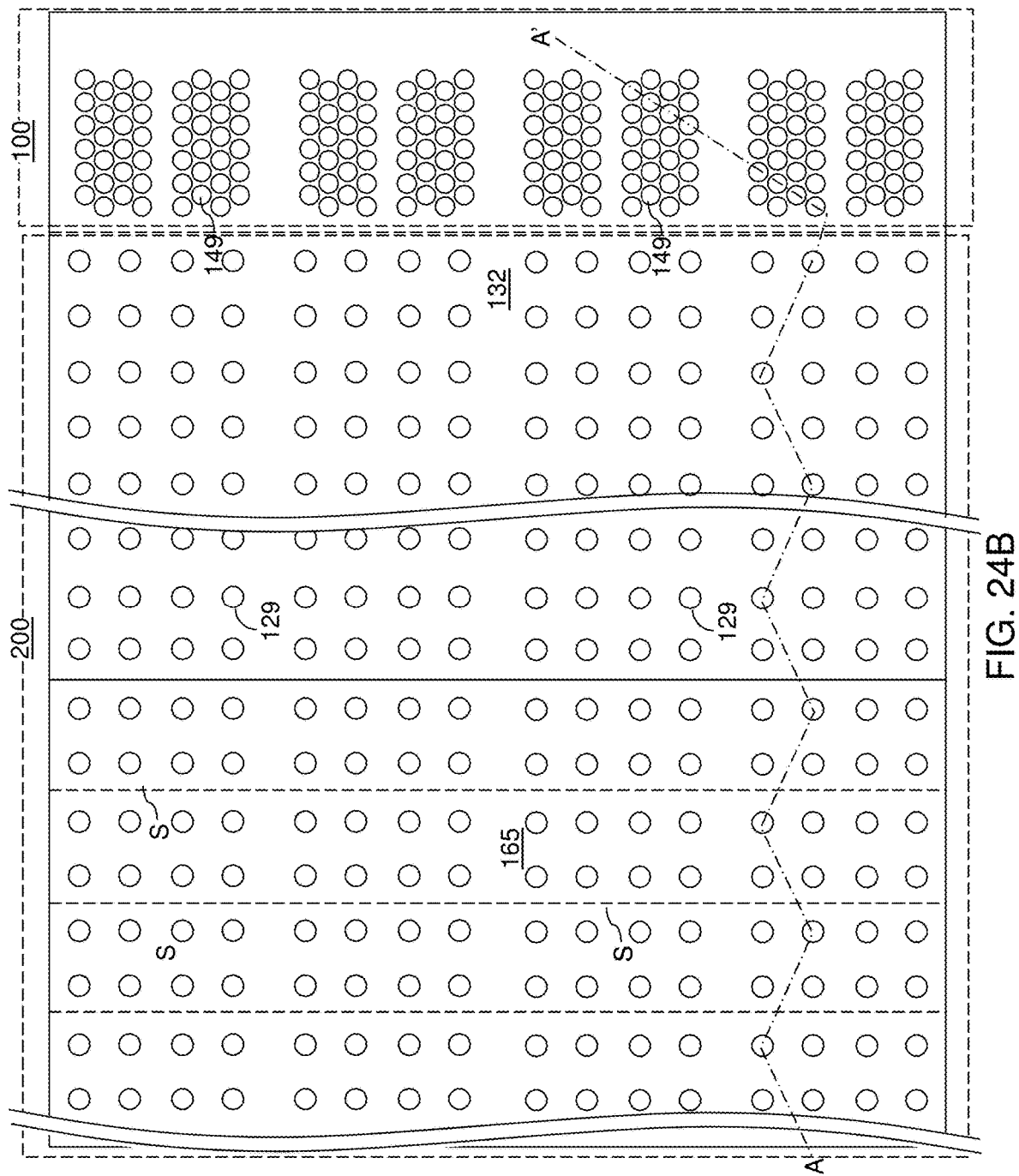
FIG. 24B is a horizontal cross-sectional view of the second exemplary structure of FIG. 24A. The hinged vertical plane A-A' corresponds to the plane of the vertical cross-sectional view of FIG. 24A.

Referring to FIGS. 24A and 24B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 24B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 25:
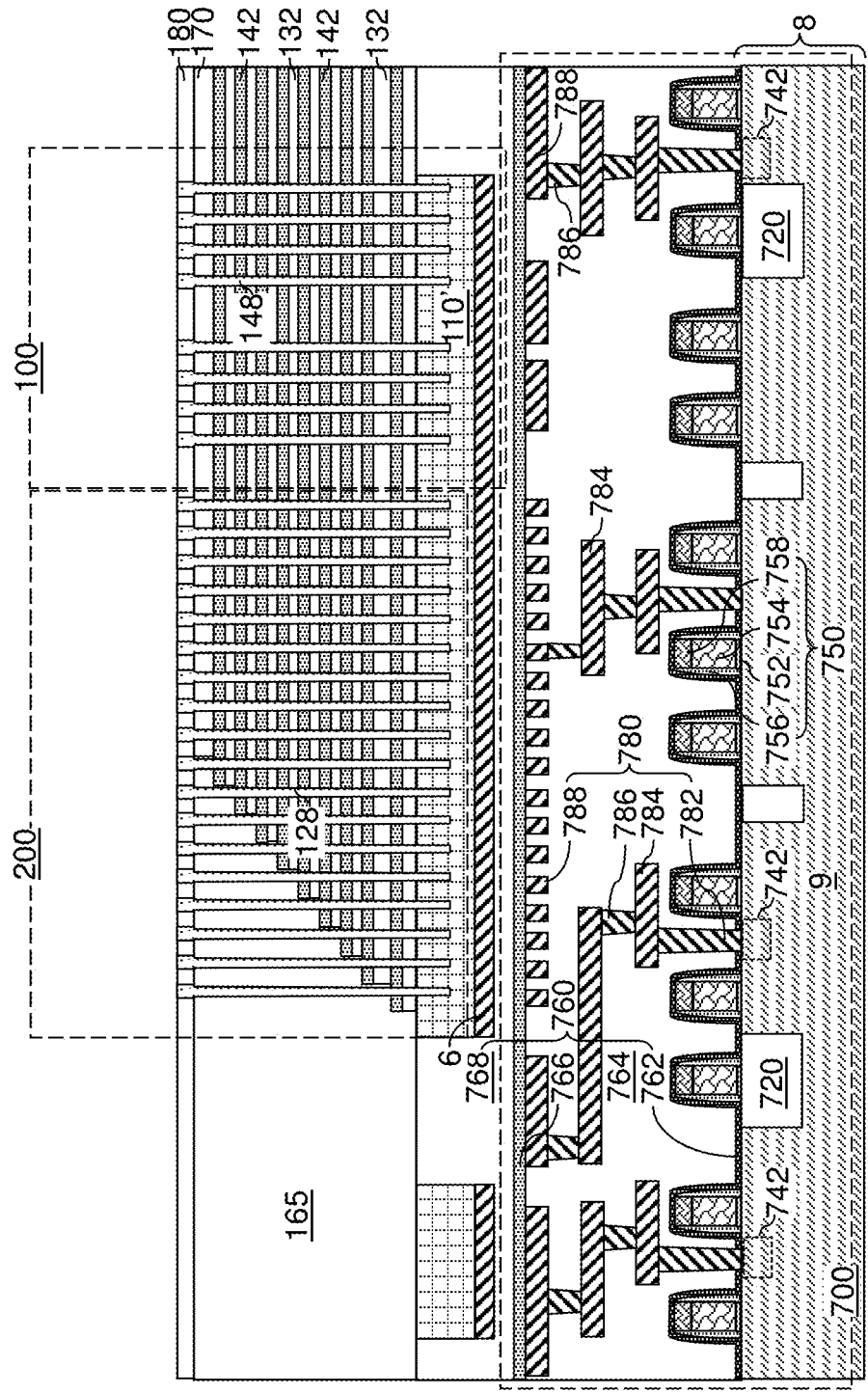
FIG. 25 is a vertical cross-sectional view of the second exemplary structure after formation of various sacrificial fill structures according to an embodiment of the present disclosure.

Referring to FIG. 25, sacrificial first-tier opening fill portions (148, 128) may be formed in the various first-tier openings (149, 129). For example, a sacrificial first-tier fill material is deposited concurrently in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 26:
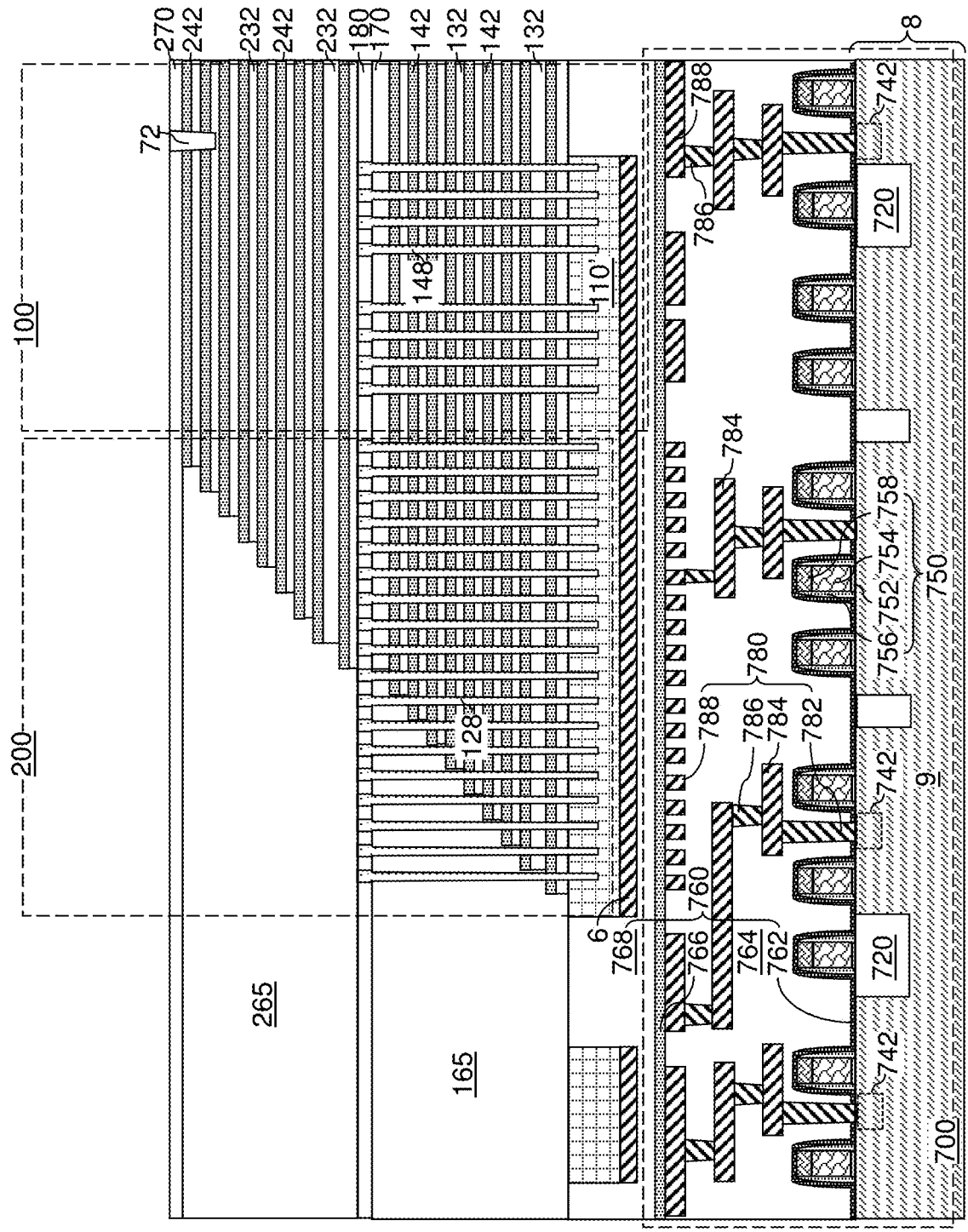
FIG. 26 is a vertical cross-sectional view of the second exemplary structure after formation of a second-tier alternating stack of second insulating layers and second spacer material layers, second stepped surfaces, and a second retro-stepped dielectric material portion according to an embodiment of the present disclosure.

Referring to FIG. 26, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 27A:
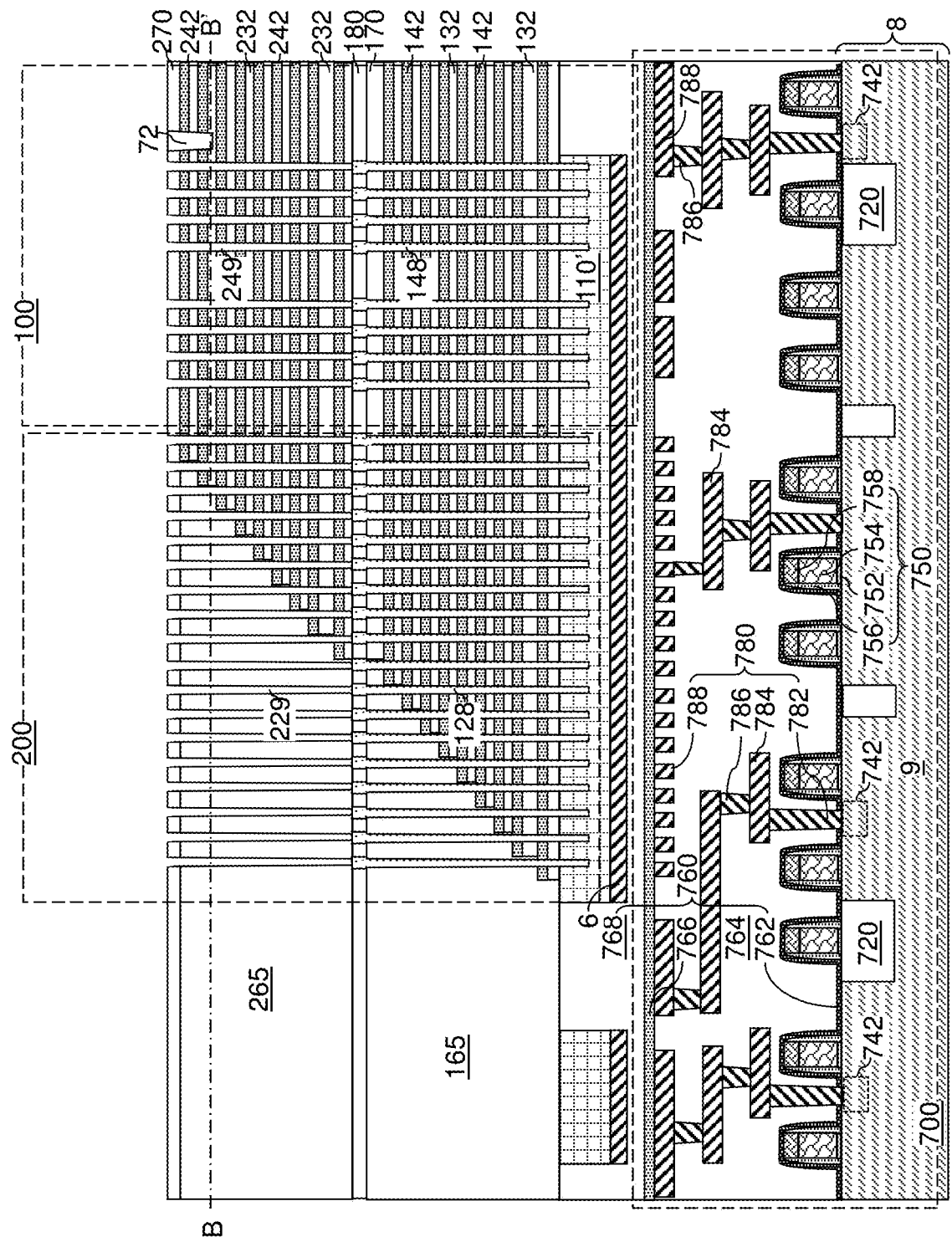
FIG. 27A is a vertical cross-sectional view of the second exemplary structure after formation of second-tier memory openings and second-tier support openings according to an embodiment of the present disclosure.
Figure 27B:
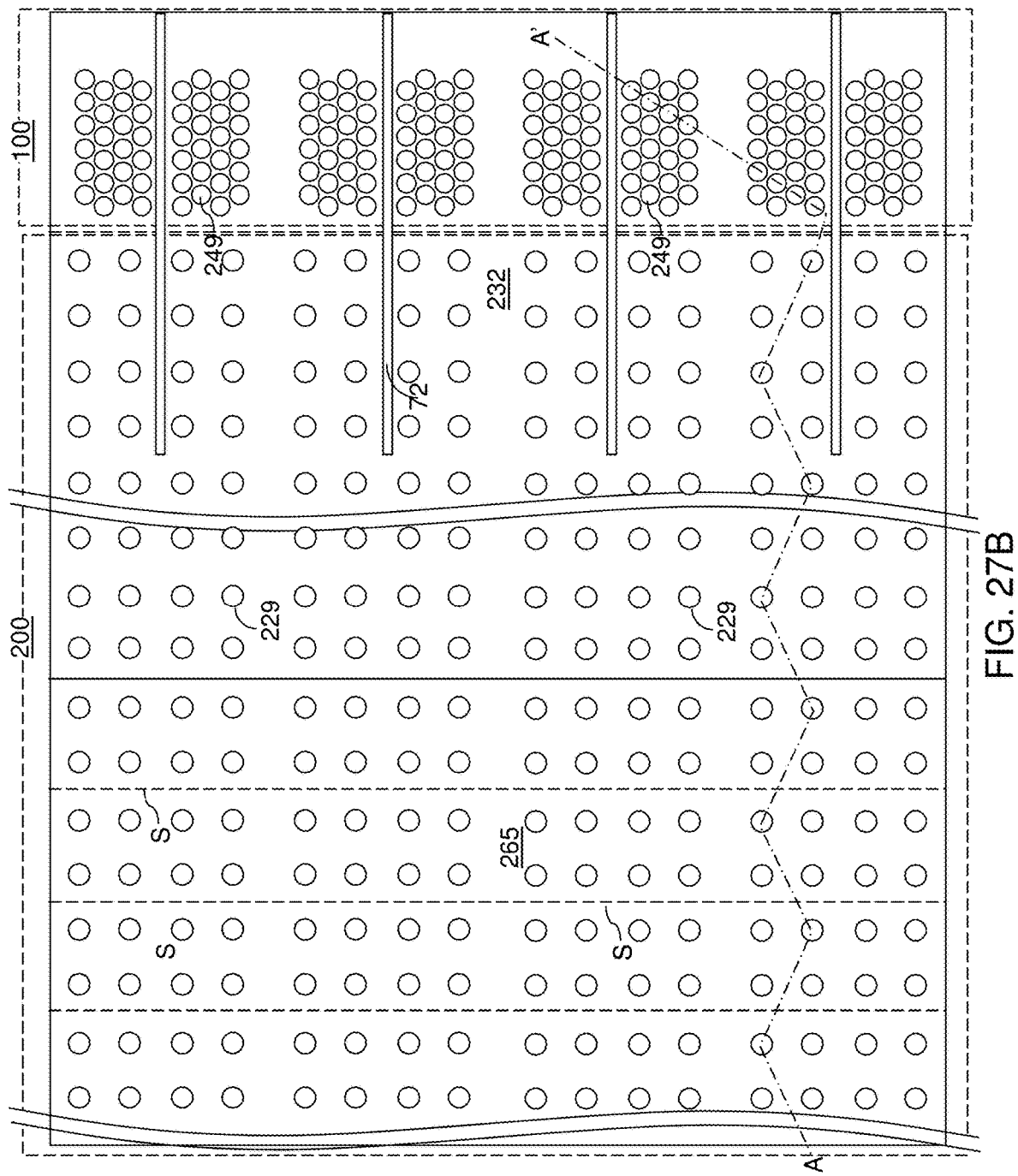
FIG. 27B is a horizontal cross-sectional view of the second exemplary structure along the horizontal plane B-B' of FIG. 27A. The hinged vertical plane A-A' corresponds to the plane of the vertical cross-sectional view of FIG. 27A.

Referring to FIGS. 27A and 27B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 27B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 28:
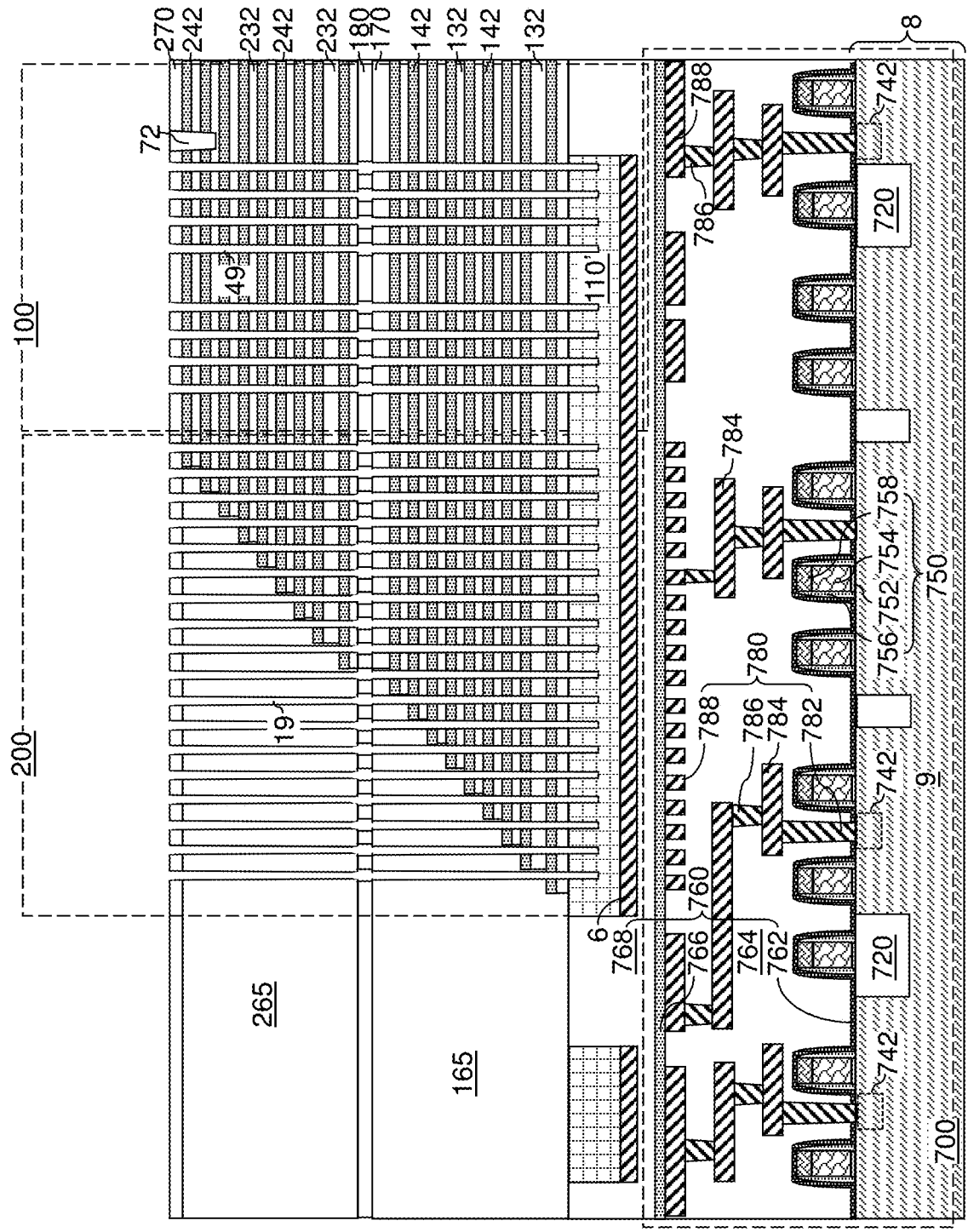
FIG. 28 is a vertical cross-sectional view of the second exemplary structure after formation of inter-tier memory openings and inter-tier support openings according to an embodiment of the present disclosure.

Referring to FIG. 28, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 29A-29D provide sequential cross-sectional views of a memory opening 49 during formation of a memory opening fill structure. The same structural change occurs in each of the memory openings 49 and the support openings 19.

Referring to FIG. 29A, a memory opening 49 in the second exemplary device structure of FIG. 28 is illustrated. The memory opening 49 extends through the first-tier structure and the second-tier structure.

Referring to FIG. 29B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/\text{cm}^3$ to $1.0\times10^{18}/\text{cm}^3$, such as from $1.0\times10^{14}/\text{cm}^3$ to $1.0\times10^{17}/\text{cm}^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/\text{cm}^3$ to $1.0\times10^{18}/\text{cm}^3$, such as from $1.0\times10^{14}/\text{cm}^3$ to $1.0\times10^{17}/\text{cm}^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 29C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 29D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{19}/\text{cm}^3$ to $2.0\times10^{21}/\text{cm}^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 30:
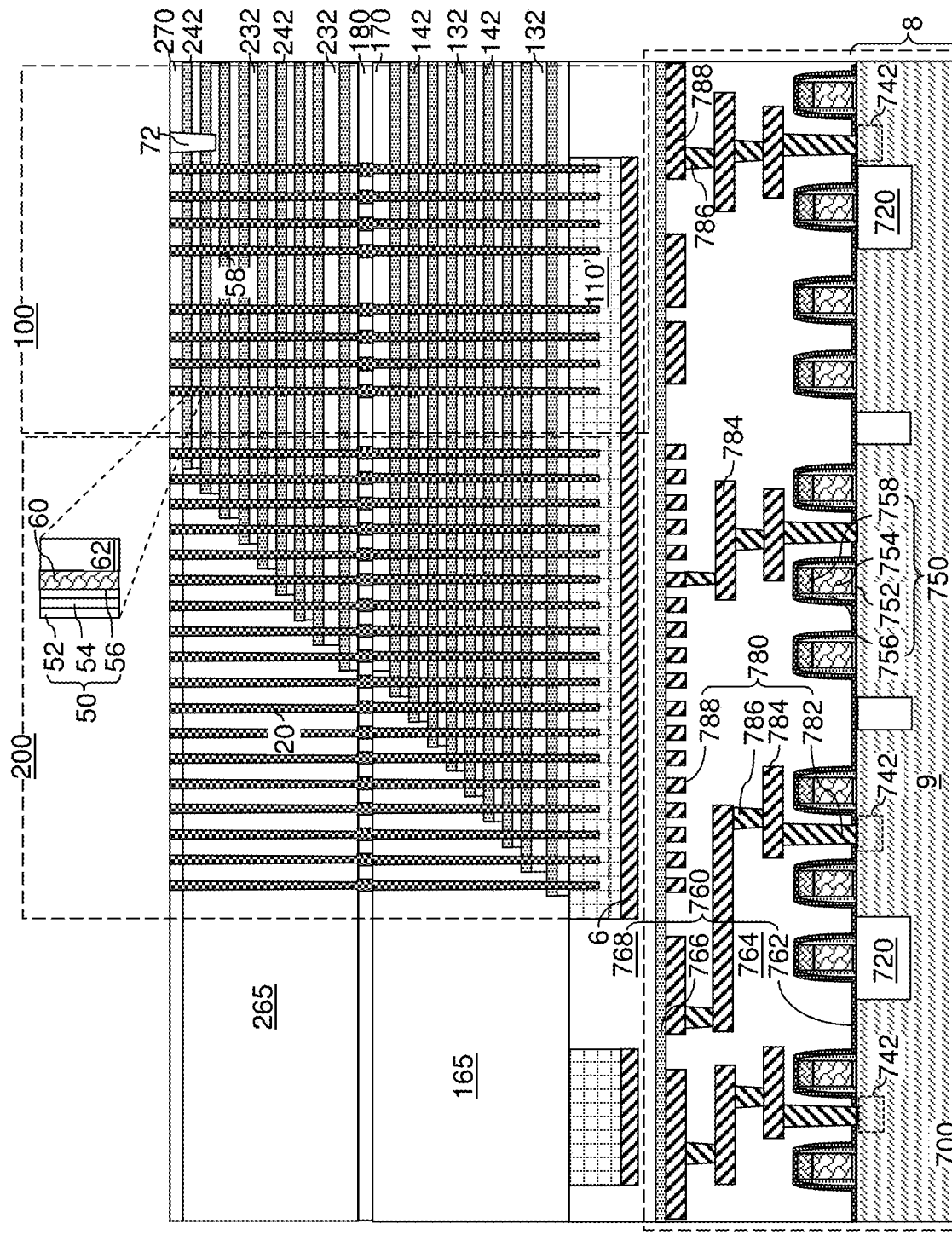
FIG. 30 is a vertical cross-sectional view of the second exemplary structure after formation of memory opening fill structures and support pillar structures according to an embodiment of the present disclosure.

Referring to FIG. 30, the second exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 31A:
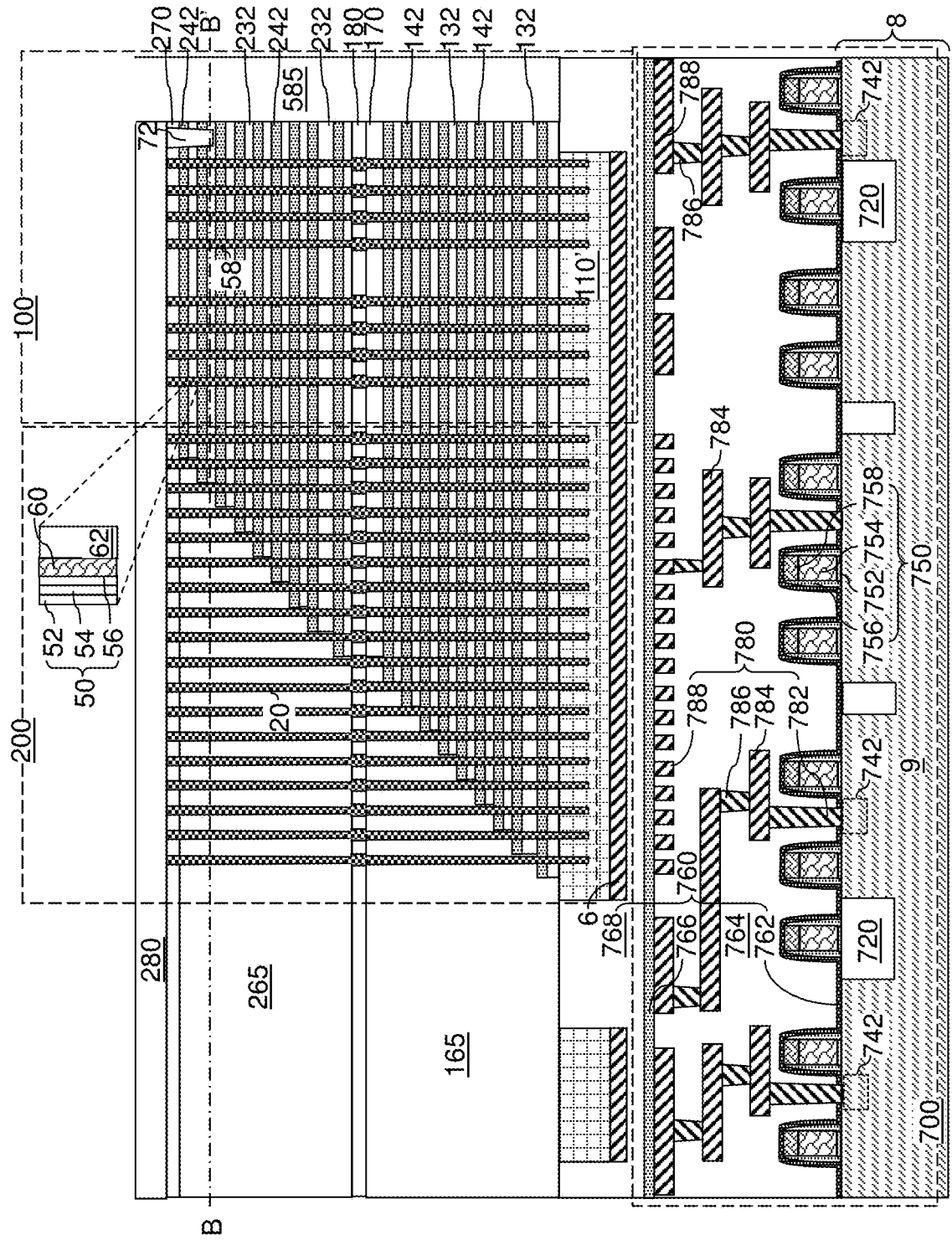
FIG. 31A is a vertical cross-sectional view of the second exemplary structure after formation of pillar cavities according to an embodiment of the present disclosure.
Figure 31B:
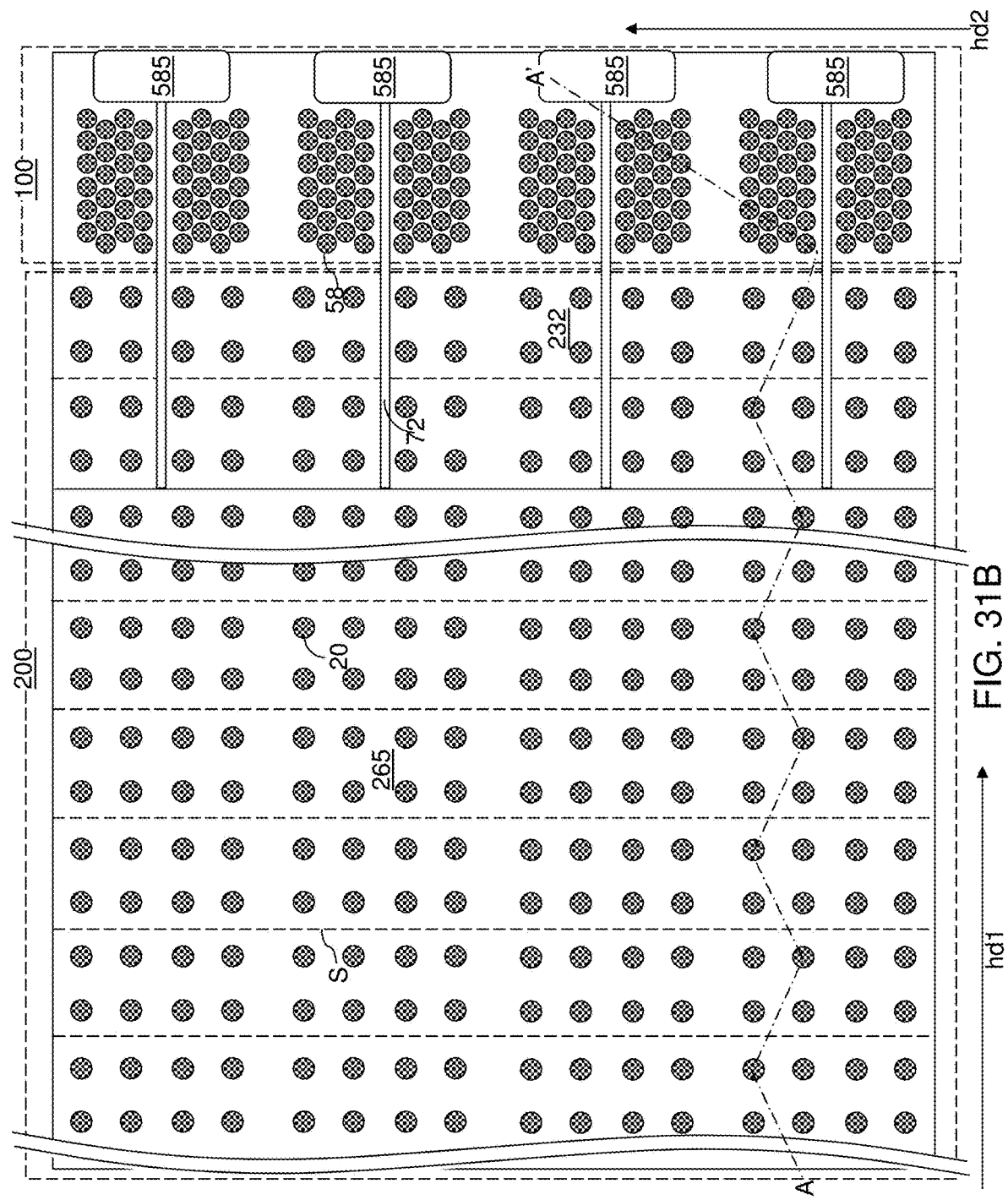
FIG. 31B is a horizontal cross-sectional view of the second exemplary structure along the horizontal plane B-B' of FIG. 31A. The hinged vertical plane A-A' corresponds to the plane of the vertical cross-sectional view of FIG. 31A.

Referring to FIGS. 31A and 31B, a first contact level dielectric layer 280 may be formed over the second-tier structure (232, 242, 270, 265, 72). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer (not shown) may be applied over the first contact level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Referring to FIG. 32, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact level dielectric layer 280 by a planarization process. Remaining portions of the dielectric material in the vertical interconnection region cavities 585 constitute interconnection region dielectric fill material portions 584.

Figure 33A:
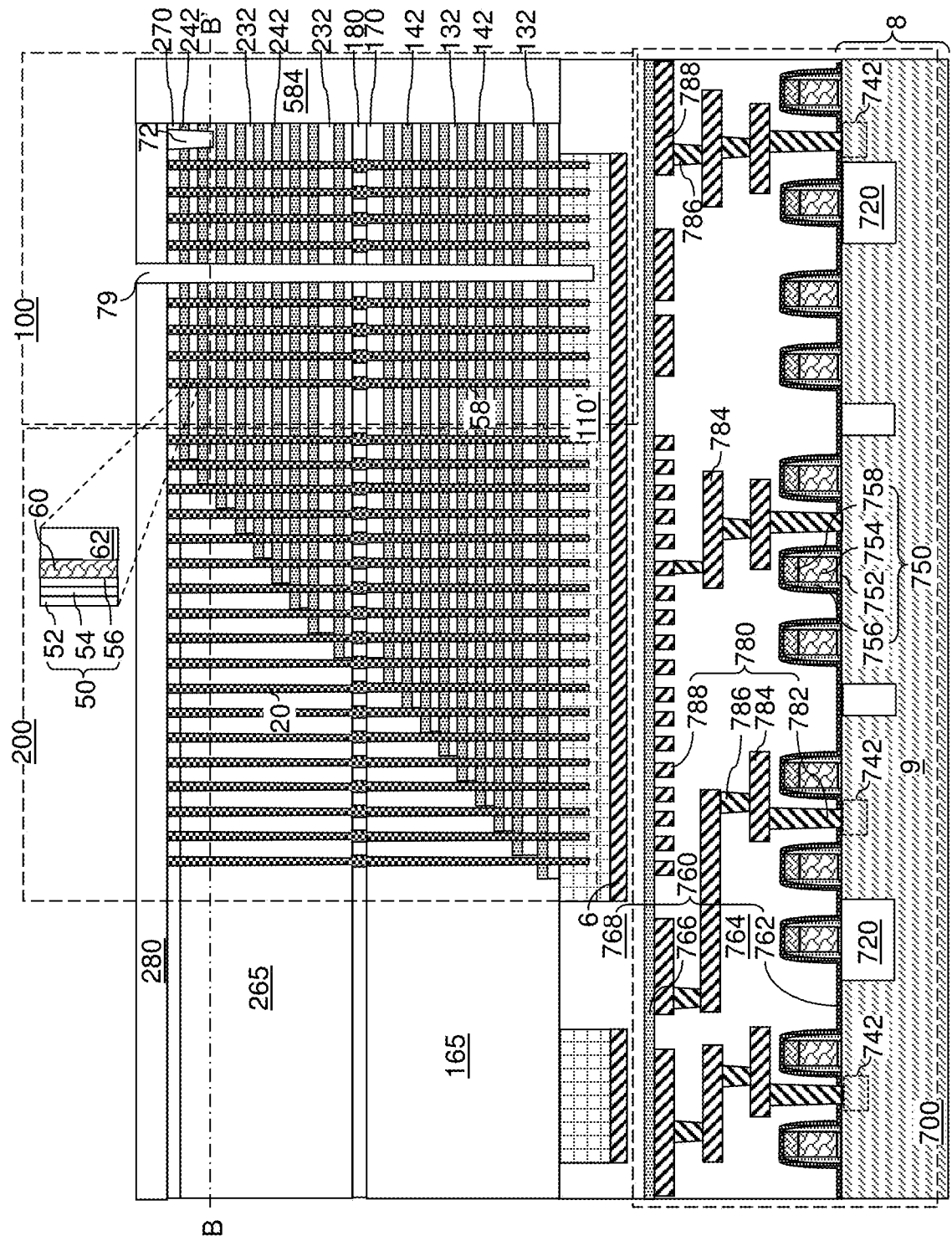
FIG. 33A is a vertical cross-sectional view of the second exemplary structure after formation of a first contact level dielectric layer and backside trenches according to an embodiment of the present disclosure.
Figure 33B:
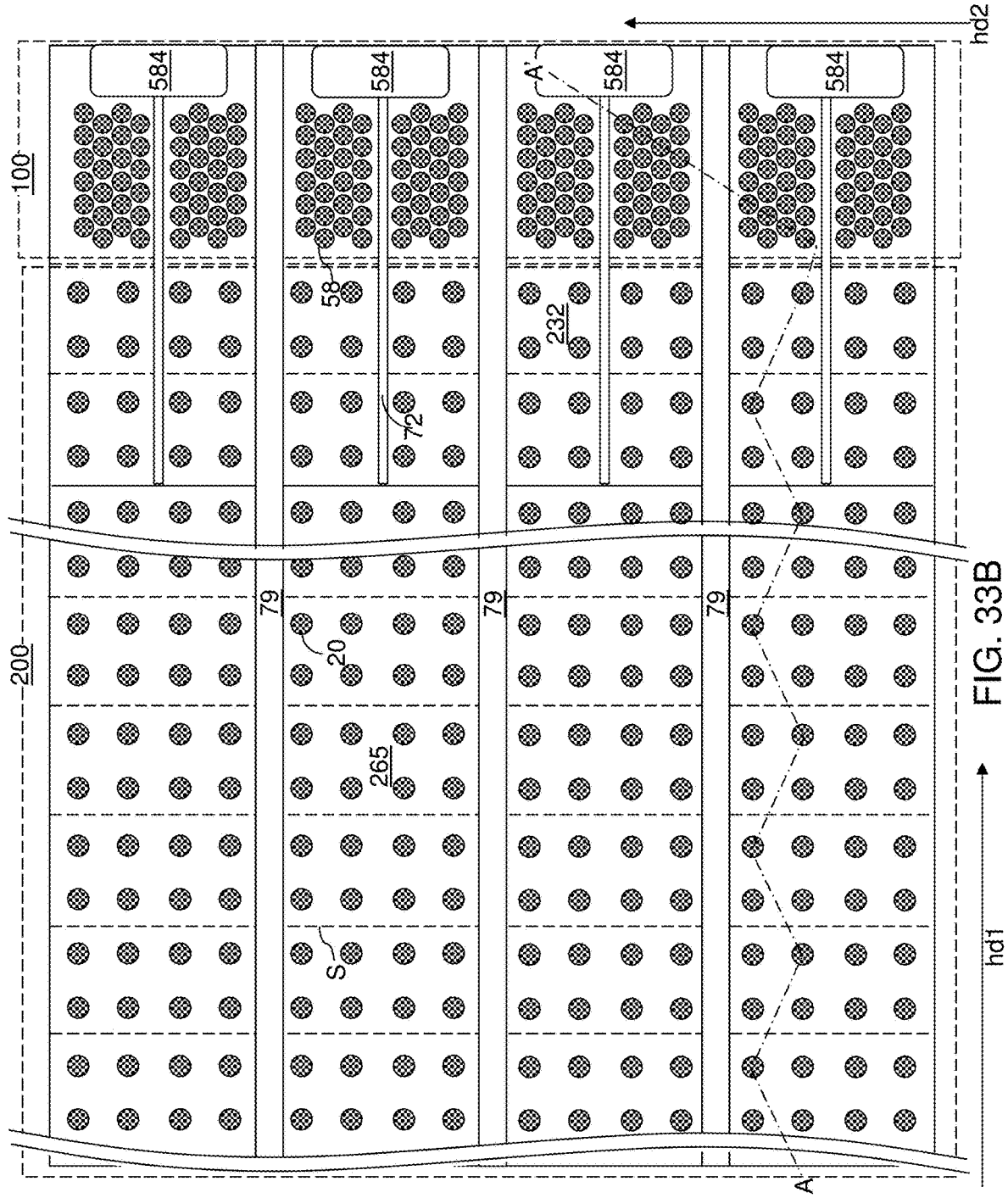
FIG. 33B is a horizontal cross-sectional view of the second exemplary structure along the horizontal plane B-B' of FIG. 33A. The hinged vertical plane A-A' corresponds to the plane of the vertical cross-sectional view of FIG. 33A.

Referring to FIGS. 33A and 33B, a photoresist layer may be applied over the first contact level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact level dielectric layer 280, the second-tier structure (232, 242, 270, 265, 72), and the first-tier structure (132, 142, 170, 165), and into the in-process source-level material layers 110'. Portions of the first contact level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. While the backside trenches 79 are schematically illustrated with straight sidewalls, it is understood that sidewalls of the backside trenches 79 can have width variations due to the nature of the anisotropic etch process. Specifically, local electrical field variations around etched portions of the first contact level dielectric layer 280, the second-tier structure (232, 242, 270, 265, 72), the first-tier structure (132, 142, 170, 165) introduce random variations in the vertical cross-sectional profiles of the backside trenches 79, which will be discussed later. The photoresist layer can be subsequently removed, for example, by ashing.

Figure 34:
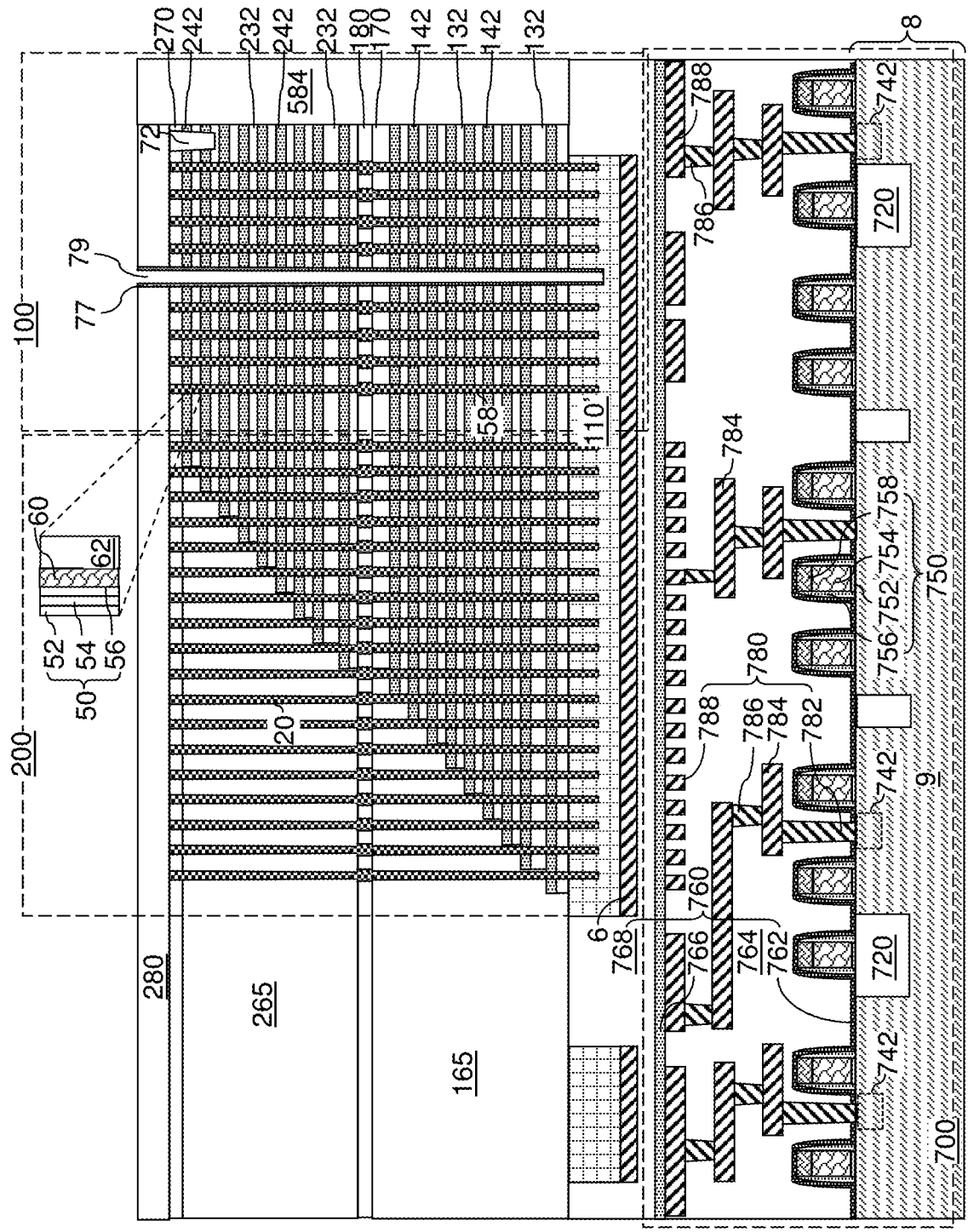
FIG. 34 is a vertical cross-sectional view of the second exemplary structure after formation of backside trench spacers according to an embodiment of the present disclosure.
Figure 35A:
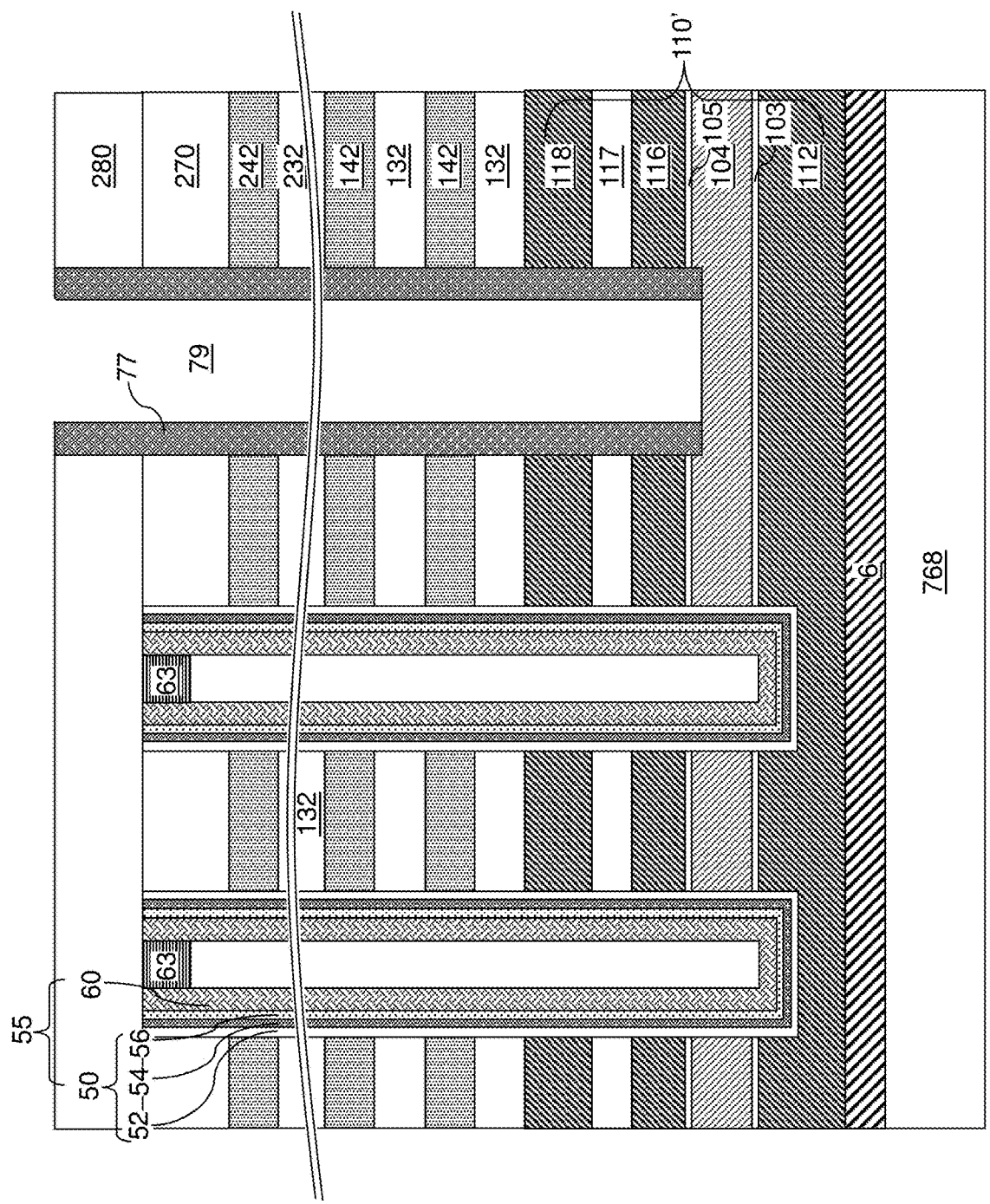
FIGS. 35A-35E illustrate sequential vertical cross-sectional views of memory opening fill structures and a backside trench during formation of source-level material layers according to an embodiment of the present disclosure.

Referring to FIGS. 34 and 35A, a backside trench spacer 77 may be formed on sidewalls of each backside trench 79. For example, a conformal spacer material layer may be deposited in the backside trenches 79 and over the first contact level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 35B:
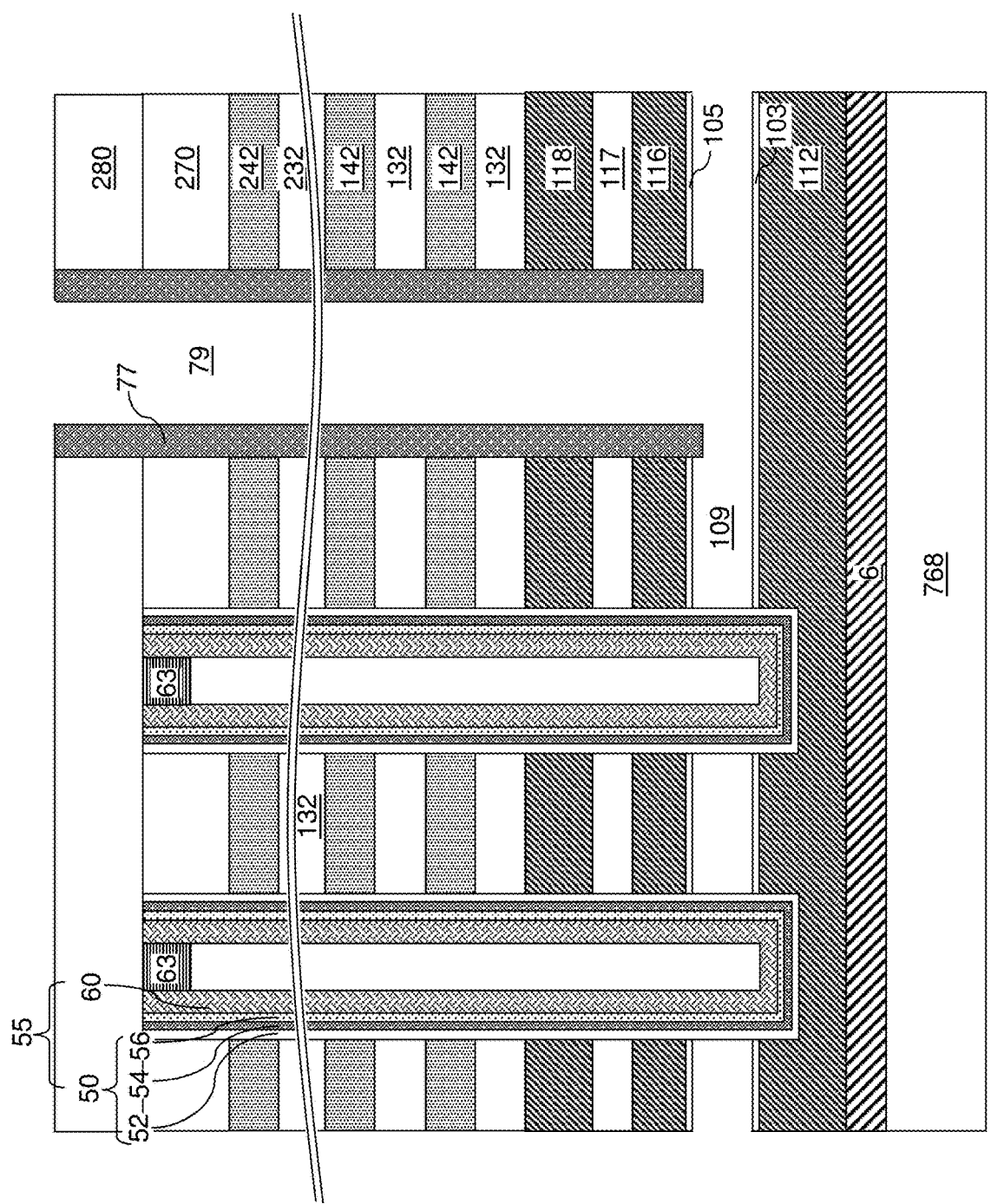

Referring to FIG. 35B, an etchant that etches the material of the source-level sacrificial layer 104 selective to the materials of the first alternating stack (132, 142), the second alternating stack (232, 242), the first and second insulating cap layers (170, 270), the first contact level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the second exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 35C:
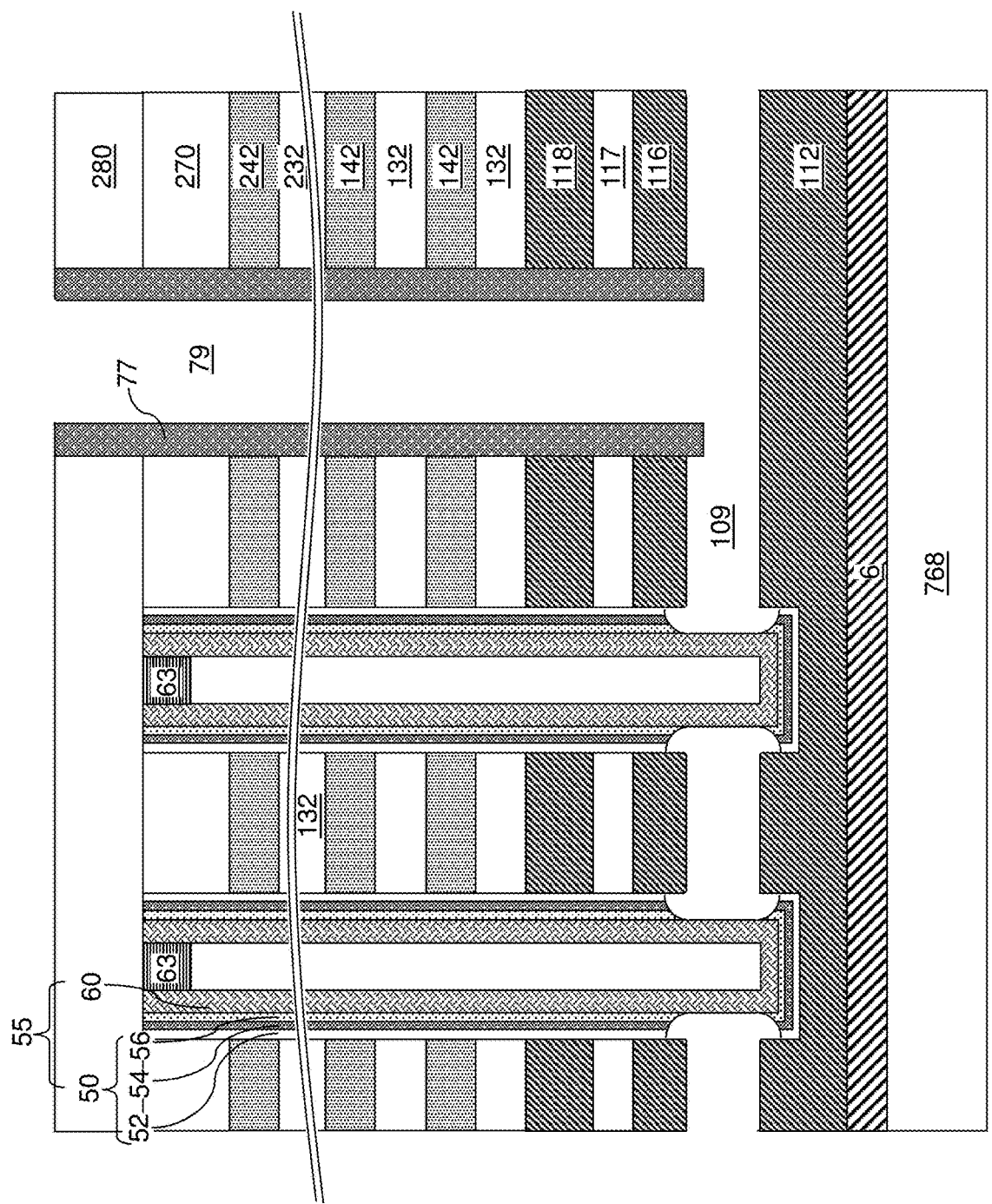

Referring to FIG. 35C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 35D:
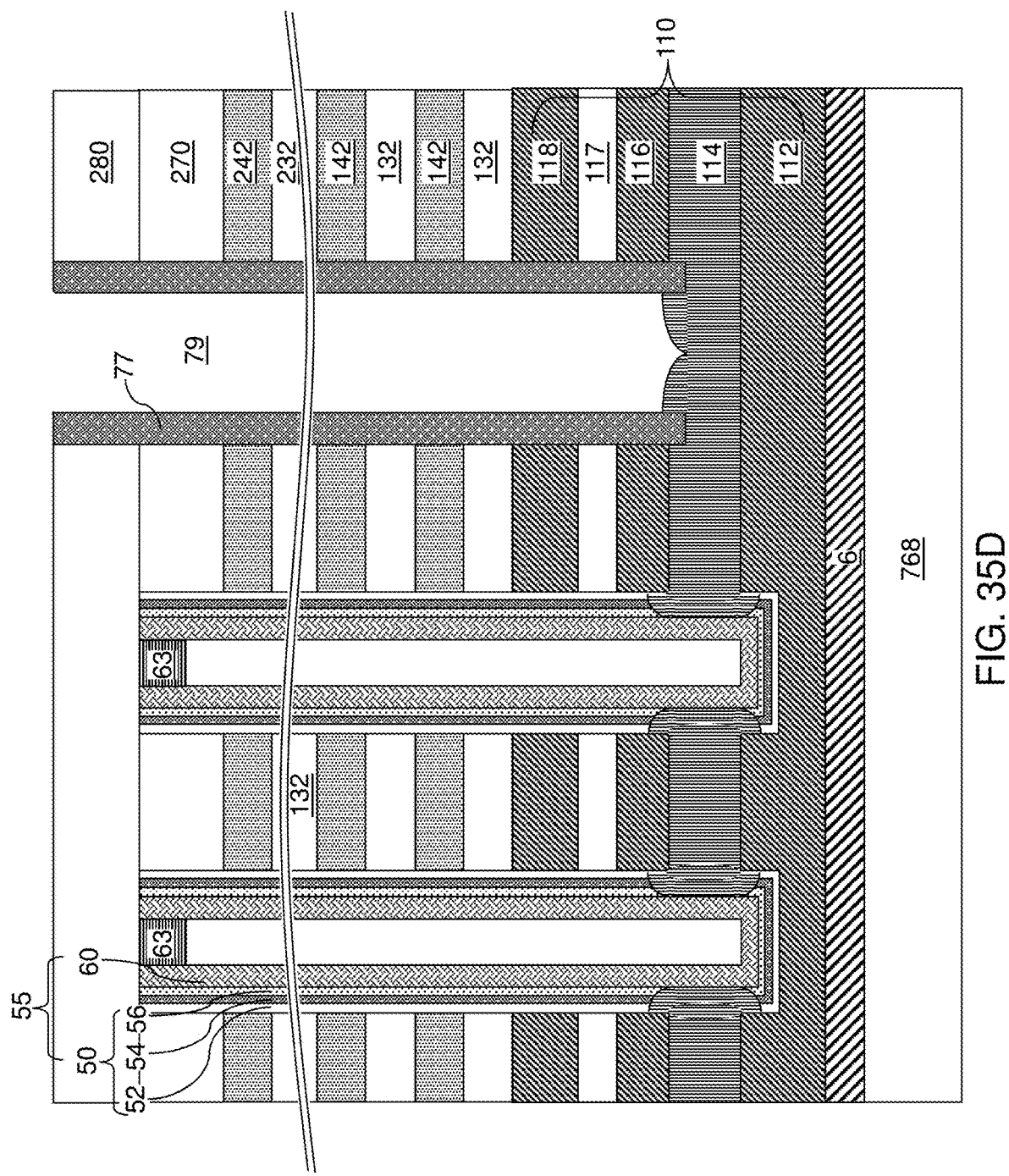

Referring to FIG. 35D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the second exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 35E:
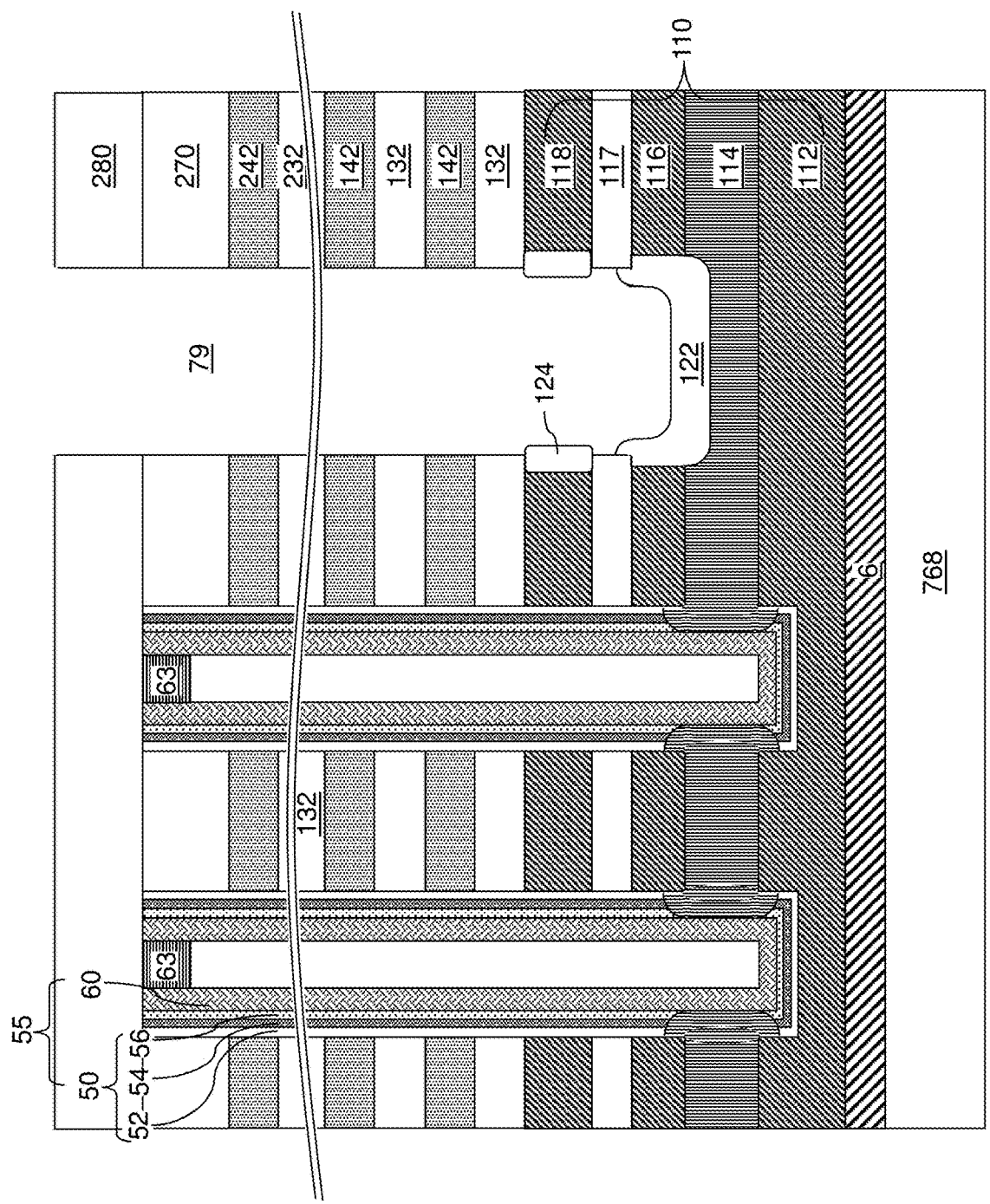
Figure 36:
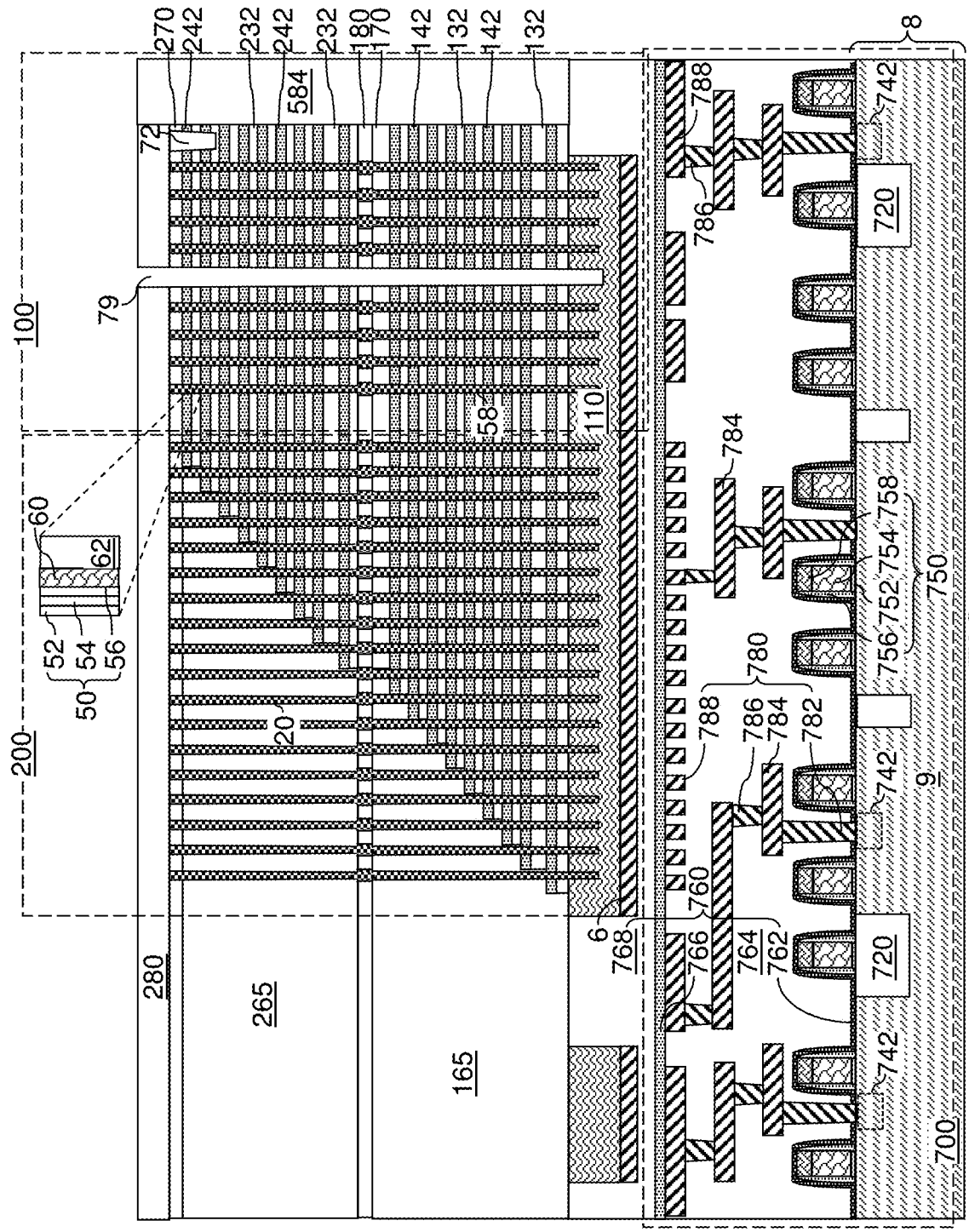
FIG. 36 is a vertical cross-sectional view of the second exemplary structure after formation of source-level material layers according to an embodiment of the present disclosure.

Referring to FIGS. 35E and 36, the backside trench spacers 77 may be removed selective to the insulating layers (132, 232), the first and second insulating cap layers (170, 270), the first contact level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 37:
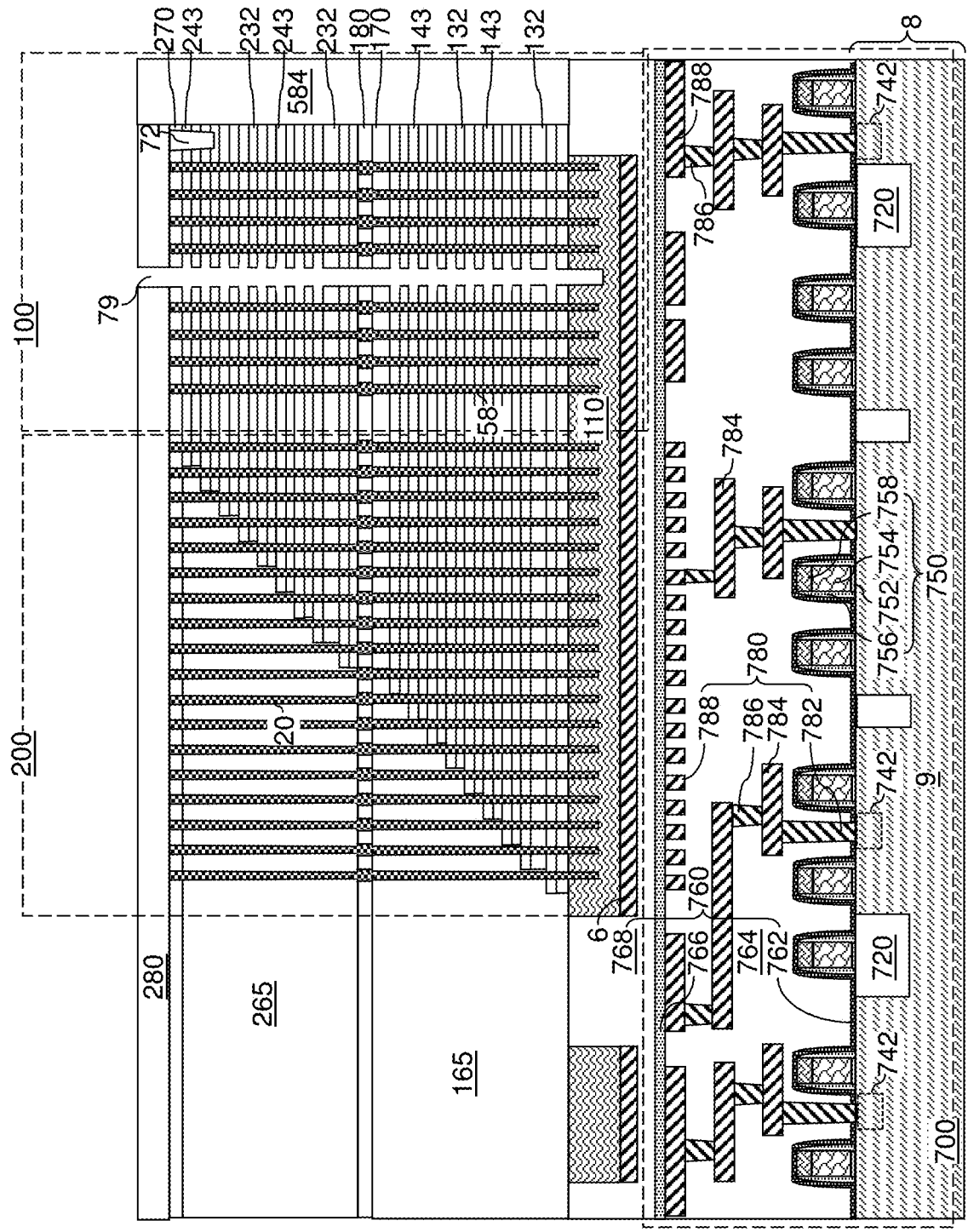
FIG. 37 is a vertical cross-sectional view of the second exemplary structure after formation of backside recesses according to an embodiment of the present disclosure.

Referring to FIG. 37, the sacrificial material layers (142, 242) are may be removed selective to the insulating layers (132, 232), the first and second insulating cap layers (170, 270), the first contact level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the second exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 38A:
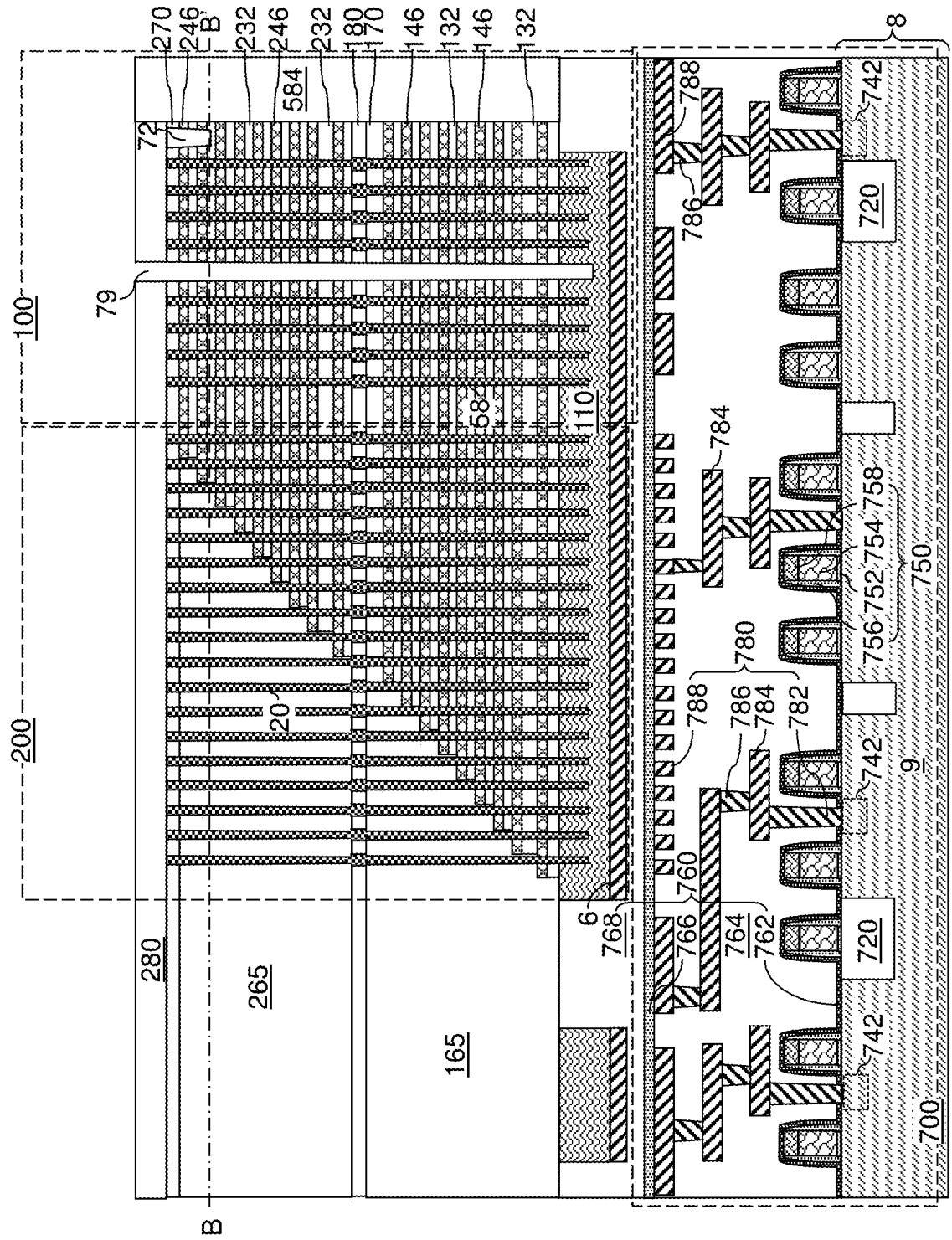
FIG. 38A is a vertical cross-sectional view of the second exemplary structure after formation of electrically conductive layers according to an embodiment of the present disclosure.
Figure 38B:
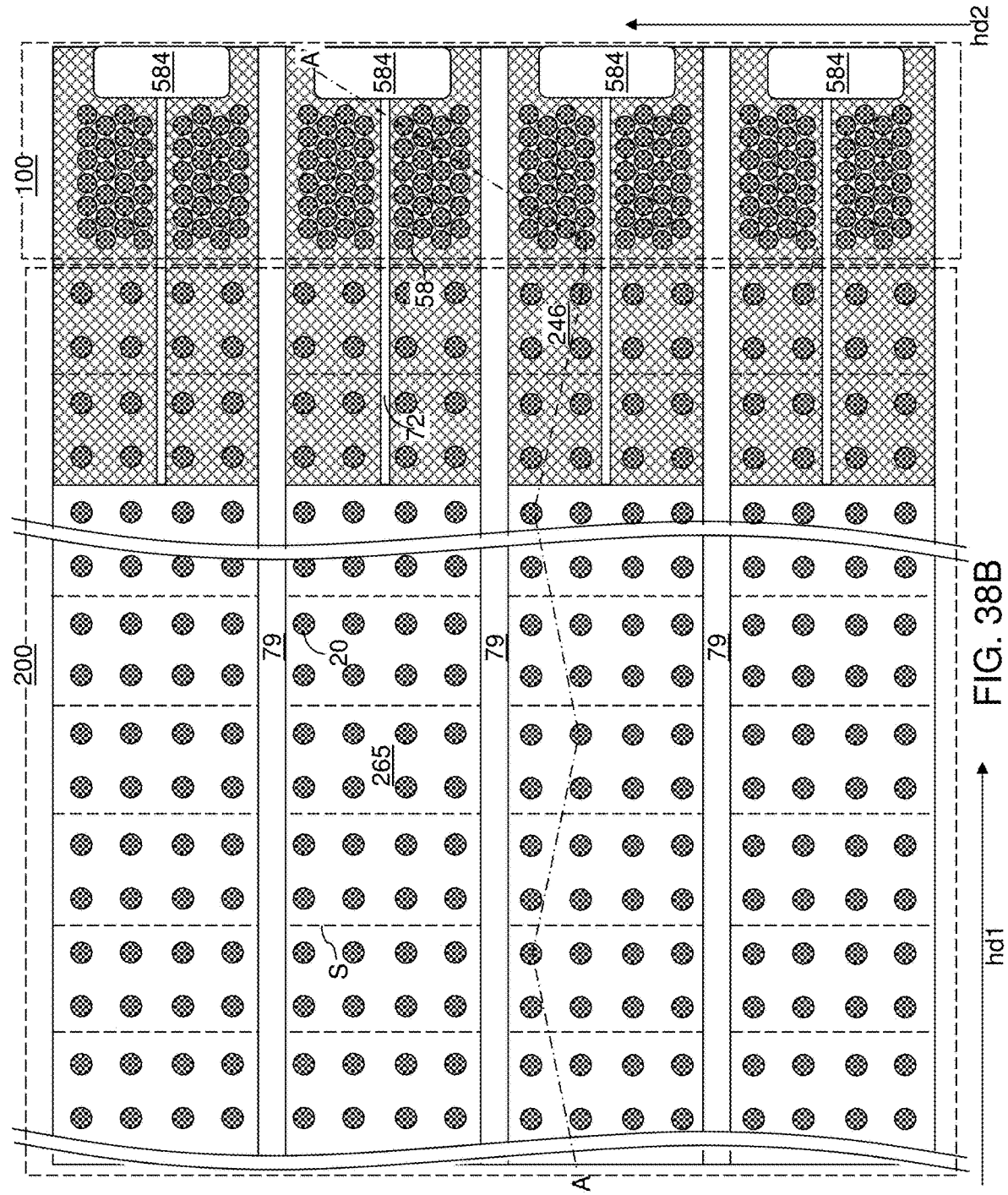
FIG. 38B is a horizontal cross-sectional view of the second exemplary structure along the horizontal plane B-B' of FIG. 38A. The hinged vertical plane A-A' corresponds to the plane of the vertical cross-sectional view of FIG. 38A.

Referring to FIGS. 38A and 38B, a backside blocking dielectric layer (not shown) may be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIG. 39, a region around a backside trench 79 is illustrated for a first configuration of the second exemplary structure. An etch-resistant dielectric spacer 171 may be optionally formed at the level of the second insulating cap layer 270 and the first contact level dielectric layer 280 during formation of the backside trenches at the processing steps of FIGS. 33A and 33B. In this case, each etch-resistant dielectric spacer 171 can include an etch-resistant dielectric material such as a dielectric metal oxide (e.g., aluminum oxide). The thickness of the etch-resistant dielectric spacer 171 may be in a range from 1 nm to 10 nm, although lesser and greater thicknesses can also be employed.

As discussed above, local electrical field variations that occur during etching of the etched portions of the first contact level dielectric layer 280, the second-tier structure (232, 242, 270, 265, 72), the first-tier structure (132, 142, 170, 165) introduce random variations in the vertical cross-sectional profiles of the backside trenches 79, thereby forming non-vertical surfaces for the sidewalls of the backside trenches 79. For example, a lengthwise sidewall of each backside trench 79 may include a non-vertical segment such as a concave segment, a convex segment, and/or a tapered segment. FIG. 39 illustrates an example in which a vertical cross-sectional profile of a backside trench 79 includes an upper tapered segment, an upper bulging segment including concave sidewall segments, a connecting segment including convex sidewall segments, a lower bulging segment including additional concave sidewall segments, and a tapered segment extending to the underlying semiconductor region, which may include the source-level material layers 110 of the second embodiment or the horizontal semiconductor channel 59 and the source region 61 located in the substrate (9, 10) of the first embodiment. Generally, a backside trench 79 may have any non-straight profile that causes difficulty in formation of a voidless fill structure, or may have a straight profile with insufficient taper angle that makes it difficult to form a voidless fill structure therein.

A laterally-insulated conductive via structure can be formed in each of the backside trenches 79. For example, an isolation dielectric layer can be conformally deposited in each backside trench 79, and can be subsequently anisotropically etched to form an isolation dielectric spacer 172. The isolation dielectric spacer 172 in each backside trench 79 includes a dielectric material such as undoped silicate glass, a doped silicate glass, or organosilicate glass. The anisotropic etch process etches narrower portions of the isolation dielectric layer at a greater etch rate than wider portions of the outer dielectric fill material layer. Thus, the anisotropic etching of the isolation dielectric layer during formation of the isolation dielectric spacer 172 has the effect of reducing the magnitude of lateral undulation of inner sidewalls of the isolation dielectric spacer 172 relative to the magnitude of the lateral undulation of sidewalls of the respective backside trench 79 in which the isolation dielectric spacer 172 is formed. An underlying surface of the semiconductor region, such as a surface of a source contact layer 114 of the source-level material layers 110 of the second embodiment or the source region 61 of the first embodiment can be physically exposed after the anisotropic etch process. The maximum lateral thickness of each isolation dielectric spacer 172 may be in arrange from 5% to 40%, such as from 10% to 35%, of the maximum lateral width of a respective backside trench 79 in which the isolation dielectric spacer 172 is formed. An isolation dielectric spacer 172 can have a non-straight outer sidewall and can have a non-uniform width that changes with a vertical distance from an underlying semiconductor region, such as the source contact layer 114 of the second embodiment or the source region 61 of the first embodiment. Each isolation dielectric spacer 172 can be formed in the backside trenches 79 on the sidewalls of the insulating layers 32 and the electrically conductive layers 46 that constitute a neighboring pair of alternating stacks (132, 246, 232, 246).

A conductive material can be subsequently deposited by a conformal deposition process on inner sidewalls of the isolation dielectric spacers 172 and on each physically exposed surface of the underlying semiconductor region, such as the source contact layer 114 of the second embodiment or the source region 61 of the first embodiment. The conductive material can include a metallic material or a heavily-doped semiconductor material. For example, the conductive material can include a conductive metallic nitride material such as TiN, TaN, WN, or a combination thereof. The conformally deposited conductive material forms a conductive liner 182 that continuously extends from the source-level material layers 110 to a top surface of the first contact level dielectric layer 280 and overlies the top surface of the first contact level dielectric layer 280. The thickness of the conductive liner 182 can be in a range from 1% to 30%, such as from 3% to 20% of the maximum lateral width of each backside trench 79.

In one embodiment, the conductive liner 182 can include at least one tapered segment in which a lateral separation distance between a pair of inner sidewalls of the conductive liner 182 increases with a vertical distance from an underlying semiconductor region (such as the source contact layer 114 or the source region), and at least one reverse-tapered segment in which the lateral separation distance between the pair of inner sidewalls of the conductive liner 182 decreases with the vertical distance from an underlying semiconductor region (such as a source contact layer 114 or the source region 61). A conductive liner 182 may include at least one concave segment in which a portion of an outer sidewall of the conductive liner 182 has a concave profile in a vertical cross-sectional view, and/or may include at least one convex segment in which a portion of an outer sidewall of the conductive liner 182 has a convex profile in a vertical cross-sectional view. The conductive liner 182 can have a uniform thickness throughout. The conductive liner 182 can be formed on inner sidewalls of the isolation dielectric spacers 172 and on a top surface of an underlying semiconductor region (such as the source contact layer 114 or the source region 61).

An outer dielectric fill material layer 273L can be formed in the backside trenches 79 by a conformal deposition process. The outer dielectric fill material layer 273L includes a dielectric material such as undoped silicate glass, a doped silicate glass, or organosilicate glass. The thickness of the outer dielectric fill material layer 273L is selected that a vertically-extending void is present within each backside trench 79 after deposition of the outer dielectric fill material layer 273L. Each void can have a generally tapered profile in which the width of the void increases with a vertical distance from an underlying semiconductor region (such as the source contact layer 114 or the source region 61).

Referring to FIG. 40, an anisotropic etch process can be performed to remove the horizontal portion of the outer dielectric fill material layer 273L overlying the alternating stacks (132, 146, 232, 246) and surface portions of the outer dielectric fill material layer 273L using the conductive liner as an etch stop. The anisotropic etch process etches narrower portions of the outer dielectric fill material layer 273L at a greater etch rate than wider portions of the outer dielectric fill material layer 273L. Thus, the anisotropic etch has the effect of reducing the lateral undulation of the voids in the backside trenches 79 and providing a more uniform taper to inner sidewalls of the remaining portions of the outer dielectric fill material layer 273L. Each remaining portion of the dielectric fill material of the outer dielectric fill material layer 273L constitutes an outer dielectric fill material portion 273. At least one outer dielectric fill material portion 273 is formed within each backside trench 79 from remaining portions of the outer dielectric fill material layers 273L. In one embodiment, a plurality of outer dielectric fill material portions 273 that are vertically spaced apart may be formed in a backside trench 79. In this case, inner sidewalls of conductive liner 182 can be physically exposed between a vertically-neighboring pair of outer dielectric fill material portions 273. Each outer dielectric fill material portion 273 can include, and/or consist essentially of, a dielectric fill material selected from undoped silicate glass, a doped silicate glass, and organosilicate glass. Each outer dielectric fill material portion 273 can be laterally enclosed by, and contact, a lower portion of a conductive liner 182.

Figure 41:
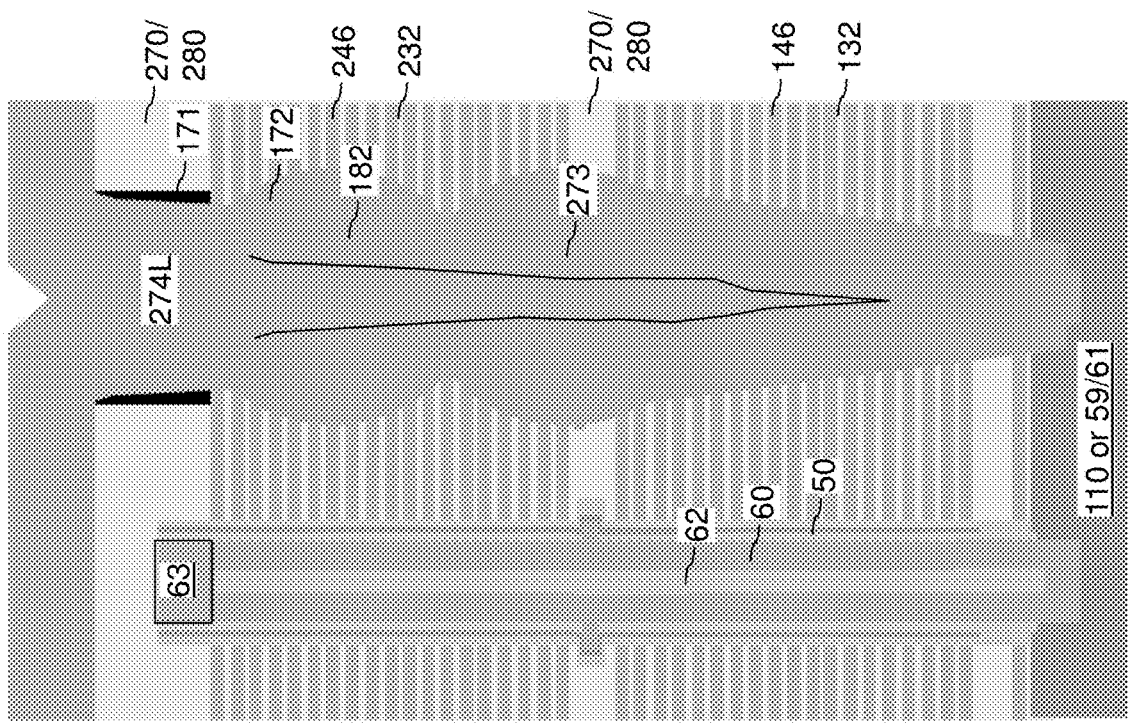
FIG. 41 is a vertical cross-sectional view of a region of the first configuration of the second exemplary structure after formation of a dielectric core material layer in each backside trench according to an embodiment of the present disclosure.

Referring to FIG. 41, a dielectric core material layer 274L including a dielectric core material can be conformally deposited to fill each void in the backside trenches 79. The dielectric core material can include undoped silicate glass, a doped silicate glass, or organosilicate glass. The dielectric core material be the same as, or may be different from, the dielectric material of the outer dielectric fill material portions 273. The conformal deposition process that deposits the dielectric core material layer 274L may be, for example, low pressure chemical vapor deposition (LPCVD) process. The dielectric core material layer 274L can be deposited directly on inner surfaces of the outer dielectric fill material portions 273 and may be deposited on physically exposed portions of the inner sidewalls of the conductive liner 182 in the backside trenches 79.

Figure 42:
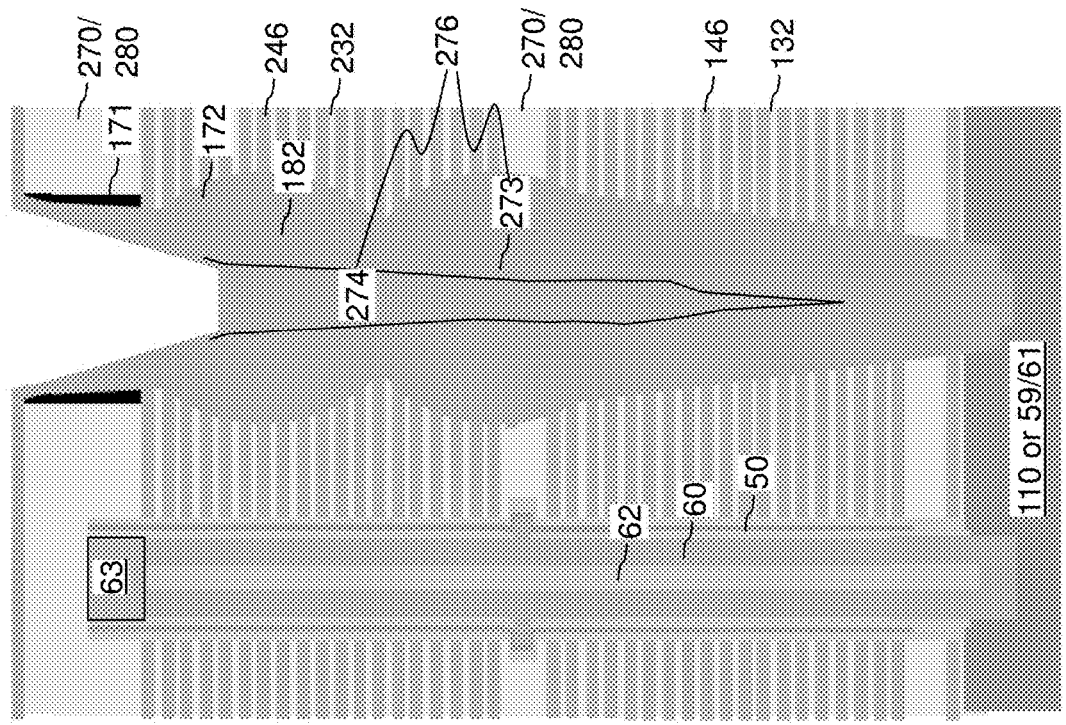
FIG. 42 is a vertical cross-sectional view of a region of the first configuration of the second exemplary structure after formation of a dielectric core in each backside trench according to an embodiment of the present disclosure.

Referring to FIG. 42, the dielectric core material can be vertically recessed such that tapered inner surfaces of the conductive liner 182 is physically exposed in an upper region of each backside trench 79. A recess etch process can be employed, which can include an anisotropic etch process or an isotropic etch process. The recess etch process can be selective to the material of the conductive liner 182 which is used as an etch stop. In one embodiment, each physically exposed tapered inner surface of the conductive liner 182 in an upper region of a backside trench 79 can extend from the topmost surface of the conductive liner 182 to a height located below the topmost surface of the alternating stacks (132, 146, 232, 246).

Each remaining portion of the dielectric core material layer 274L in the backside trenches 79 constitutes a dielectric core 274. Each dielectric core 274 is laterally enclosed by, and is contacted by, at least one outer dielectric fill material portion 273. In one embodiment, the at least one outer dielectric fill material portion 273 comprises a plurality of outer dielectric fill material portions 273 that are vertically spaced apart among one another and laterally surrounds and contacts the dielectric core 62. The set of material portions located inside the conductive liner 182 in a backside trench 79 constitutes a composite non-metallic core 276, which may be a composite dielectric core that includes a dielectric core 274 and at least one outer dielectric fill material portion 273. In one embodiment, the composite non-metallic core 276 consists of the at least one outer dielectric fill material portion 273 and the dielectric core 274.

Referring to FIG. 43, at least one conductive material can be deposited directly on physically exposed surfaces of the conductive liner 182 and on top surfaces of the dielectric cores 274. The at least one conductive material can include a metallic nitride liner material such as TiN, TaN, and/or WN, and a metallic pad material such as W, Cu, Ru, Co, Mo, another elemental metal, or an intermetallic alloy. The deposited metallic nitride liner material forms a metallic nitride liner layer, and the deposited metallic pad material forms a metallic pad material layer. The metallic pad material layer, the metallic nitride liner layer, and a horizontal portion of the conductive liner 182 can be patterned, for example, by applying and patterning a photoresist layer over the metallic pad material layer, and by transferring the pattern in the photoresist layer through the metallic pad material layer, the metallic nitride liner layer, and the horizontal portion of the conductive liner 182 employing an etch process such as an anisotropic etch process. Each patterned portion of the metallic pad material layer constitutes a metallic pad material portion 178B. Each patterned portion of the metallic nitride liner layer constitutes a metallic nitride liner 178A. Each contiguous combination of a metallic pad material portion 178B and a metallic nitride liner 178A constitutes a conductive plug 178.

A conductive plug 178 can be formed over each backside trench 79. A composite non-metallic core 276 contacts a bottom surface of each conductive plug 178. The composite non-metallic core 276 can comprise at least one outer dielectric fill material portion 273 laterally enclosed by a lower portion of a conductive liner 182, and a dielectric core 274 contacting an inner sidewall of the at least one outer dielectric fill material portion 273.

The set of all material portions filling a backside trench 79 or extending into a volume of the backside trench 79 constitutes a backside contact assembly 186. Each backside contact assembly 186 can include, and may consist of, an isolation dielectric spacer 172, a conductive liner 182, a composite non-metallic core 276, and a conductive plug 178. The composite non-metallic core 276 comprises a dielectric core 274 and at least one outer dielectric fill material portion 273. The conductive plug 178 is formed directly on, and over, the conductive liner 182 and the dielectric core 274. Each conductive liner 182 is located on inner sidewalls of an isolation dielectric spacer 172 and a top surface of an underlying semiconductor region, such as the source contact layer 114 or the source region 61. In one embodiment, the conductive liner 182 can consist essentially of a conductive metal nitride.

In one embodiment, a first taper angle $\alpha 1$ of an interface between the conductive liner 182 and the conductive plug 178 is greater than a second taper angle $\alpha 2$ of an interface between the conductive liner 182 and a bottommost one of the at least one outer dielectric fill material portion 273.

In one embodiment, the conductive plug 178 comprises a tapered downward-protruding portion that contacts an inner tapered sidewall of the conductive liner 182 and vertically extending below a horizontal plane including a bottom surface of a topmost electrically conductive layer 246 (such as a topmost one of the second electrically conductive layers 246) within each of the alternating stacks (132, 146, 232, 246).

In one embodiment, the isolation dielectric spacer 172 comprises a vertical outer sidewall segment 1722 and an inner tapered sidewall segment 1724 above a horizontal plane including a topmost electrically conductive layer 246 within the alternating stacks (132, 146, 232, 246).

Figure 44:
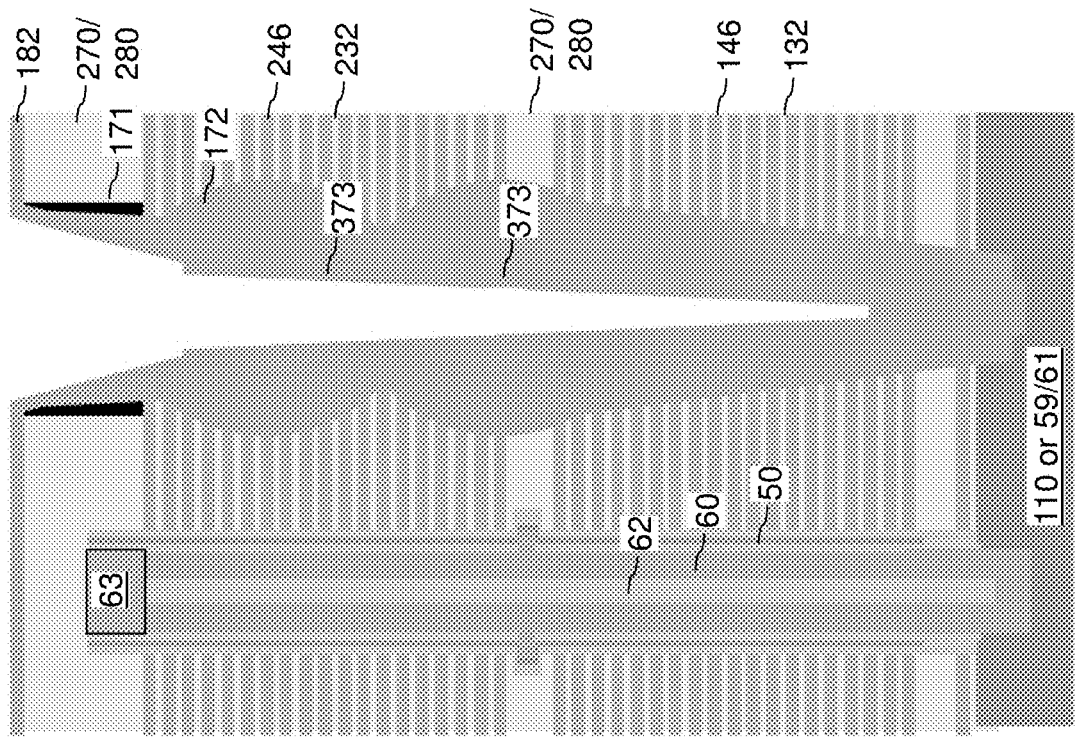
FIG. 44 is a vertical cross-sectional view of a region of a second configuration of the second exemplary structure after formation of an isolation dielectric spacer, a conductive liner, and at least one semiconductor fill material portion in each backside trench according to an embodiment of the present disclosure.

Referring to FIG. 44, a second configuration of the second exemplary structure is illustrated, which can be derived from the first configuration of the second exemplary structure illustrated in FIG. 39 by forming at least one semiconductor fill material portion in lieu of an outer dielectric fill material layers 273L. The semiconductor fill material portions can be formed by conformally depositing a conformal semiconductor fill material layer and anisotropically etching the conformal semiconductor material layer. The conformal semiconductor fill material layer includes a doped semiconductor material or an undoped semiconductor material. For example, the conformal semiconductor fill material layer can include silicon, a silicon-germanium alloy, or a compound semiconductor material. The conformal semiconductor fill material layer can include an amorphous semiconductor material (such as amorphous silicon) or a polycrystalline semiconductor material (such as polysilicon). The anisotropic etch process etches horizontal portions of the conformal semiconductor fill material layer. Remaining portions of the conformal semiconductor fill material layer in the backside trenches 79 constitute the semiconductor fill material portion 373. The semiconductor fill material portions 373 are formed on the conductive liners 182 in the backside trenches 79.

The anisotropic etch process employed to form the semiconductor fill material portions 373 etches narrower portions of the conformal semiconductor fill material layer at a greater etch rate than wider portions of the conformal semiconductor fill material layer. Thus, the anisotropic etching of the conformal semiconductor fill material layer has the effect of reducing the magnitude of lateral undulation of inner sidewalls of the semiconductor fill material portions 373 relative to the magnitude of the lateral undulation of inner sidewalls of a respective conductive liner 182.

Figure 45:
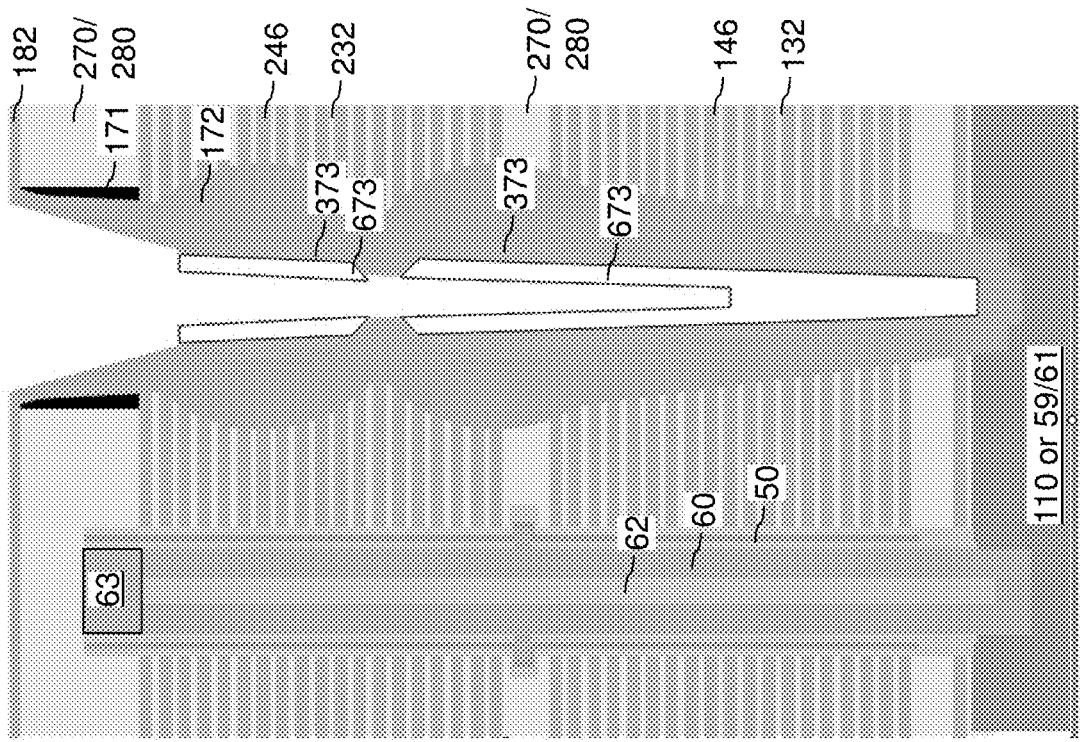
FIG. 45 is a vertical cross-sectional view of a region of the second configuration of the second exemplary structure after formation of at least one outer dielectric fill material portion in each backside trench according to an embodiment of the present disclosure.

Referring to FIG. 45, inner segments of the semiconductor fill material portions 373 can be converted into dielectric semiconductor oxide material portions, which are herein referred to as outer dielectric fill material portions 673. Each outer dielectric fill material portion 673 can include, and may consist essentially of, a dielectric oxide of the semiconductor material of the semiconductor fill material portions 373. For example, if the semiconductor fill material portions include amorphous silicon or polysilicon, the outer dielectric fill material portions 673 can include thermal silicon oxide. In some embodiments, a plurality of outer dielectric fill material portions 673 that are vertically spaced apart may be formed in a backside trench 79. In this case, a surface of a conductive liner 182 can be physically exposed between a vertically neighboring pair of outer dielectric fill material portions 673. A bottom portion of the conductive liner 182 within each backside trench 79 can be entirely covered by a conical portion of a bottommost one of the at least one outer dielectric fill material portion 673.

Referring to FIG. 46, a dielectric core material layer 274L can be formed by performing the processing steps of FIG. 41. The dielectric core material layer 274L contacts inner sidewalls of each outer dielectric fill material portion 673 and physically exposed inner sidewalls of the conductive liner 182.

Referring to FIG. 47, the dielectric core material layer 274L can be vertically recessed by performing the recess etch process of FIG. 42. Each remaining portion of the dielectric core material layer 274L in a backside trench 79 constitutes a dielectric core 274. A composite non-metallic core 376 is formed within each backside trench 79. Each composite non-metallic core 376 includes a dielectric core 274, at least one outer dielectric fill material portion 673, and at least one semiconductor fill material portion 373.

Figure 48:
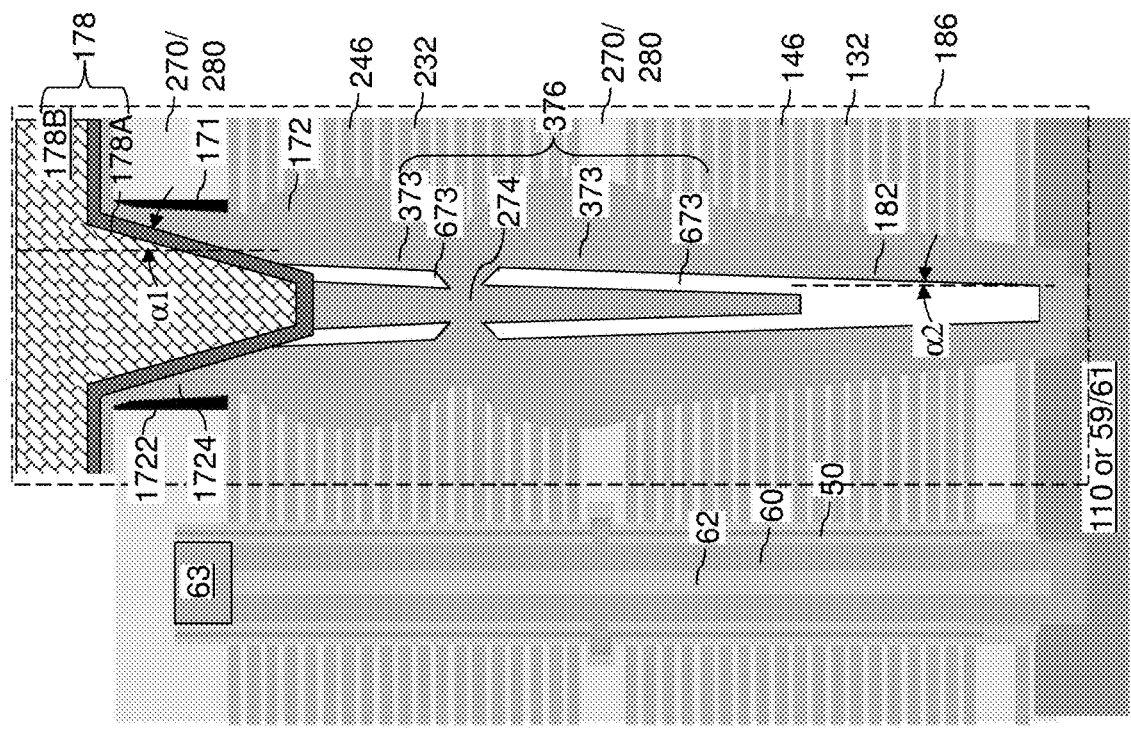
FIG. 48 is a vertical cross-sectional view of a region of the second configuration of the second exemplary structure after formation of a conductive plug over each backside trench according to an embodiment of the present disclosure.

Referring to FIG. 48, the processing steps of FIG. 43 can be performed to form a conductive plug 178 in each upper region of the backside trench 79. The set of all material portions filling a backside trench 79 or extending into a volume of the backside trench 79 constitutes a backside contact assembly 186. Each backside contact assembly 186 can include, and may consist of, an isolation dielectric spacer 172, a conductive liner 182, a composite non-metallic core 376, and a conductive plug 178. The composite non-metallic core 376 includes a dielectric core 274, at least one outer dielectric fill material portion 673, and at least one semiconductor fill material portion 373. The conductive plug 178 is formed directly on, and over, the conductive liner 182 and the dielectric core 274 and optionally on an outer dielectric fill material portion 673. Each conductive liner 182 is located on inner sidewalls of an isolation dielectric spacer 172 and a top surface of an underlying semiconductor region, such as the source contact layer 114 or the source region 61. In one embodiment, the conductive liner 182 can consist essentially of a conductive metal nitride.

Referring to FIG. 49, a region of a third configuration of the second exemplary structure is illustrated. The third configuration of the second exemplary structure can be the same as the first configuration of the second exemplary structure illustrated in FIG. 39.

Referring to FIG. 50, a densification process can be performed to density the outer dielectric fill material layer 273L. In one embodiment, the outer dielectric fill material layer 273L can include a doped silicate glass or undoped silicate glass formed by a conformal deposition process employing thermal decomposition of tetraethylorthosilicate (TEOS). In this case, the outer dielectric fill material layer 273L can consist of an undoped silicate glass layer or a doped silicate glass layer including hydrogen at an atomic concentration greater than 0.1%, such as greater than 1%. In this case, a thermal anneal process may be performed as the densification process. The outer dielectric fill material layer 273L can be converted into a densified outer dielectric fill material layer 473L which shrinks by 5 to 8 percent and in which the atomic concentration of hydrogen is reduced at least by 50% relative to the atomic concentration of hydrogen in the outer dielectric fill material layer 273L as deposited. The conductive liner 182, such as a titanium nitride liner, may be reacted with the underlying semiconductor (e.g., silicon) region (114 or 61) to form a silicide region, such as a titanium silicide region, during the densification process.

Figure 51:
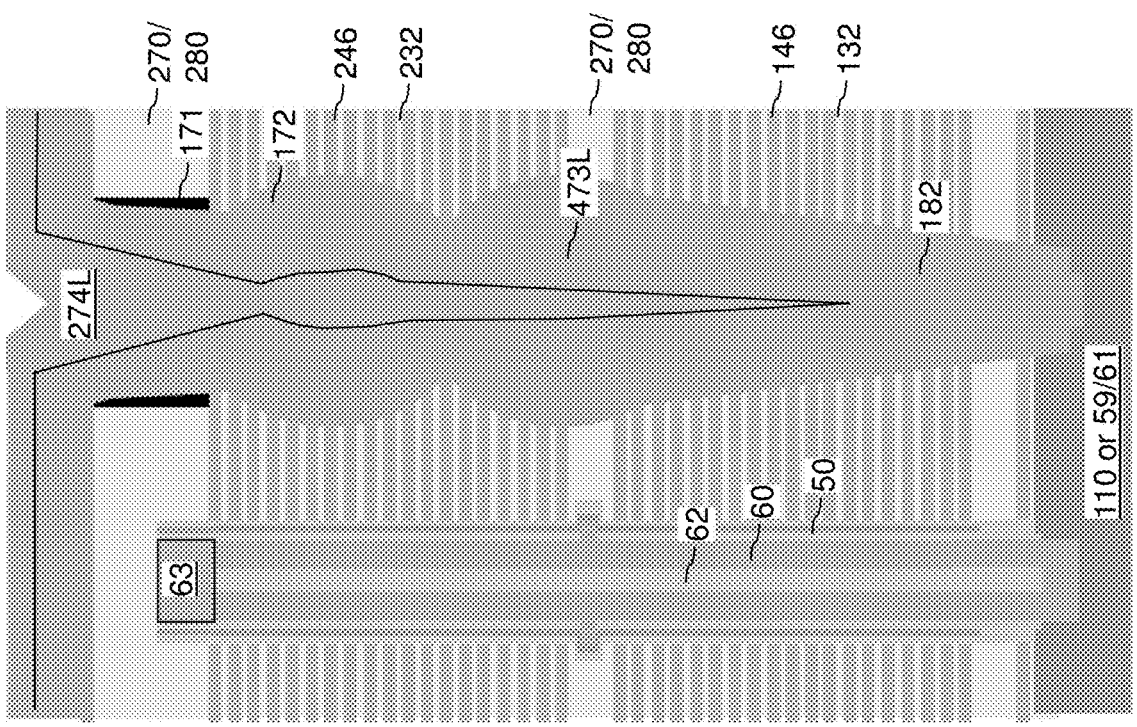
FIG. 51 is a vertical cross-sectional view of a region of the third configuration of the second exemplary structure after formation of a dielectric core material layer in each backside trench according to an embodiment of the present disclosure.

Referring to FIG. 51, a dielectric core material layer 274L can be formed by performing the processing steps of FIG. 41. The dielectric core material layer 274L contacts inner sidewalls of the densified outer dielectric fill material layer 473L in each backside trench 79.

Figure 52:
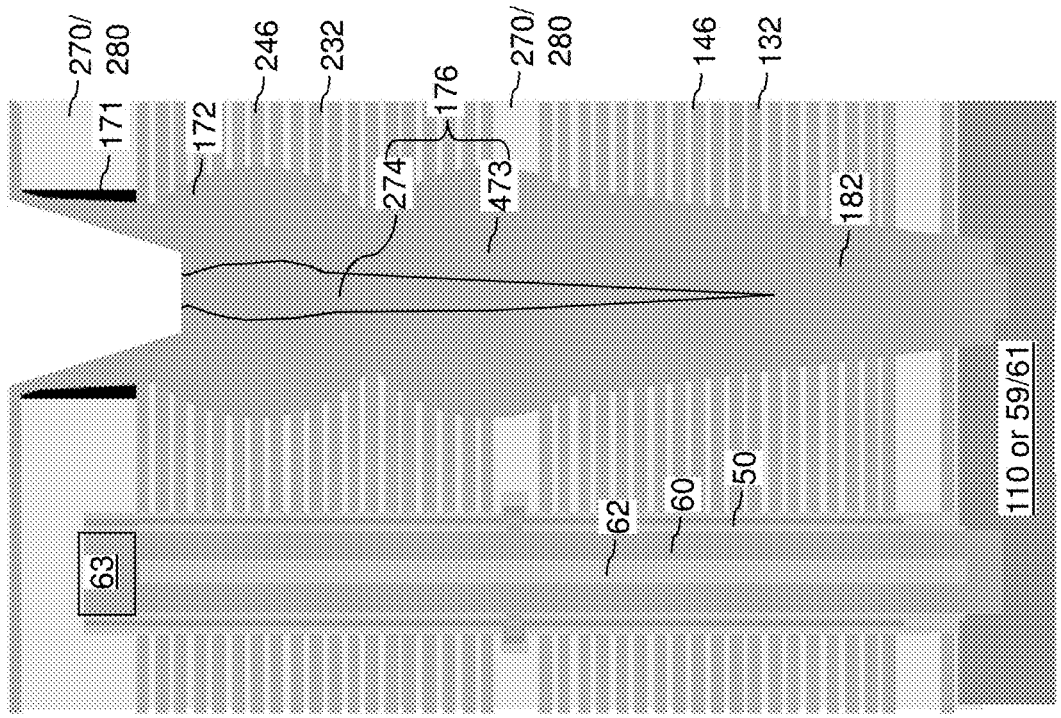
FIG. 52 is a vertical cross-sectional view of a region of the third configuration of the second exemplary structure after formation of a dielectric core in each backside trench according to an embodiment of the present disclosure.

Referring to FIG. 52, the dielectric core material layer 274L and the densified outer dielectric fill material layer 473L can be vertically recessed by performing the recess etch process of FIG. 42. Portions of the dielectric core material layer 274L and the densified outer dielectric fill material layer 473L located above a bottom periphery of upper tapered portions of the conductive liner 182 can be removed by a recess etch process, which may employ an anisotropic etch process or an isotropic etch process. The recess etch process can be selective to the material of the conductive liner 182. Each remaining portion of the dielectric core material layer 274L in a backside trench 79 constitutes a dielectric core 274. Each remaining portion of the densified outer dielectric fill material layer 473L in a backside trench 79 constitutes an outer dielectric fill material portion 473, which can be a continuous dielectric material portion. A composite non-metallic core 176 is formed within each backside trench 79. Each composite non-metallic core 176 includes a dielectric core 274 and an outer dielectric fill material portion 473.

Figure 53:
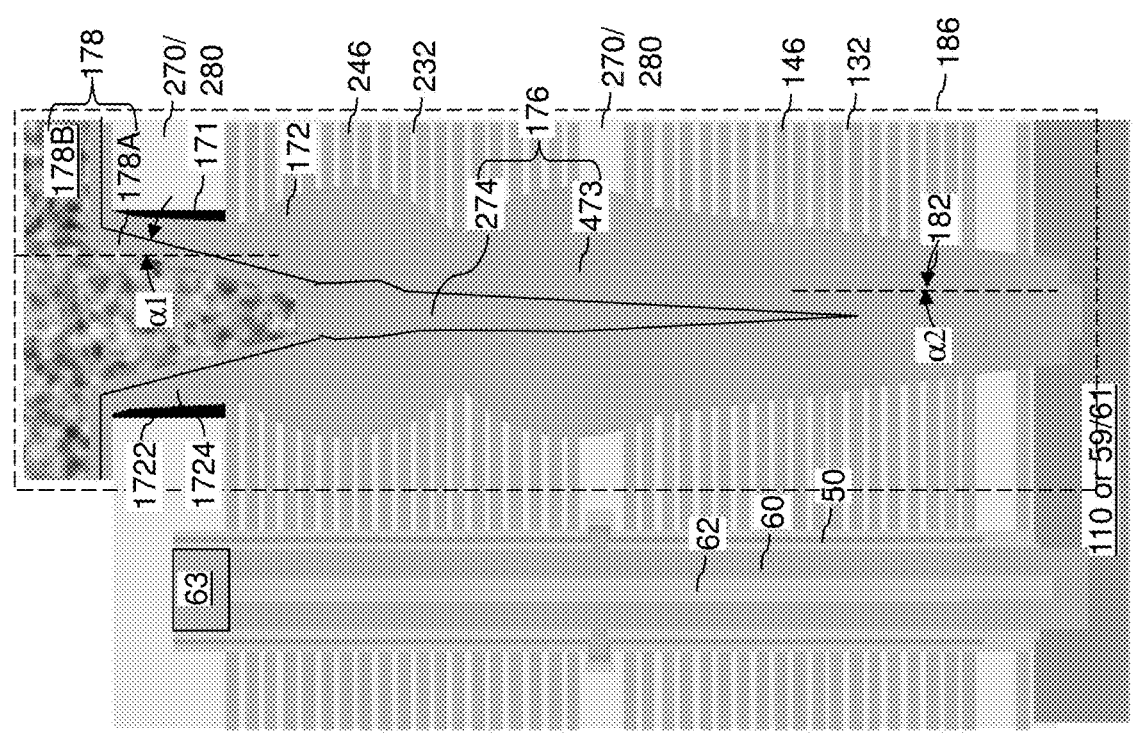
FIG. 53 is a vertical cross-sectional view of a region of the third configuration of the second exemplary structure after formation of a conductive plug over each backside trench according to an embodiment of the present disclosure.

Referring to FIG. 53, the processing steps of FIG. 43 can be performed to form a conductive plug 178 in each upper region of the backside trench 79. The set of all material portions filling a backside trench 79 or extending into a volume of the backside trench 79 constitutes a backside contact assembly 186. Each backside contact assembly 186 can include, and may consist of, an isolation dielectric spacer 172, a conductive liner 182, a composite non-metallic core 176, and a conductive plug 178. The composite non-metallic core 176 includes a dielectric core 274 and an outer dielectric fill material portion 473. The conductive plug 178 is formed directly on, and over, the conductive liner 182 and the dielectric core 274 and optionally on an outer dielectric fill material portion 473. Each conductive liner 182 is located on inner sidewalls of an isolation dielectric spacer 172 and a top surface of an underlying semiconductor region, such as the source contact layer 114 or the source region 61. In one embodiment, the conductive liner 182 can consist essentially of a conductive metal nitride.

Referring to FIGS. 54A and 54B, vertical cross-sectional views of a fourth configuration of the second exemplary structure are shown at two different locations that are laterally spaced apart along the lengthwise direction of a backside trench 79. The fourth configuration of the second exemplary structure can be derived from the first configuration of the second exemplary structure illustrated in FIG. 39 by increasing the thickness of the outer dielectric fill material layer 273L until a tapered uppermost portion of each backside trench 79 is filled within the outer dielectric fill material layer 273L. Voids 179V that are not filled with the outer dielectric fill material layer 273L can be present within the backside trenches 79. In one embodiment, a void 179V may be formed in each region of the backside trenches 79 including an opposing pair of concave sidewalls. In one embodiment, a plurality of voids may be formed in a backside trench 79.

Figure 55C:
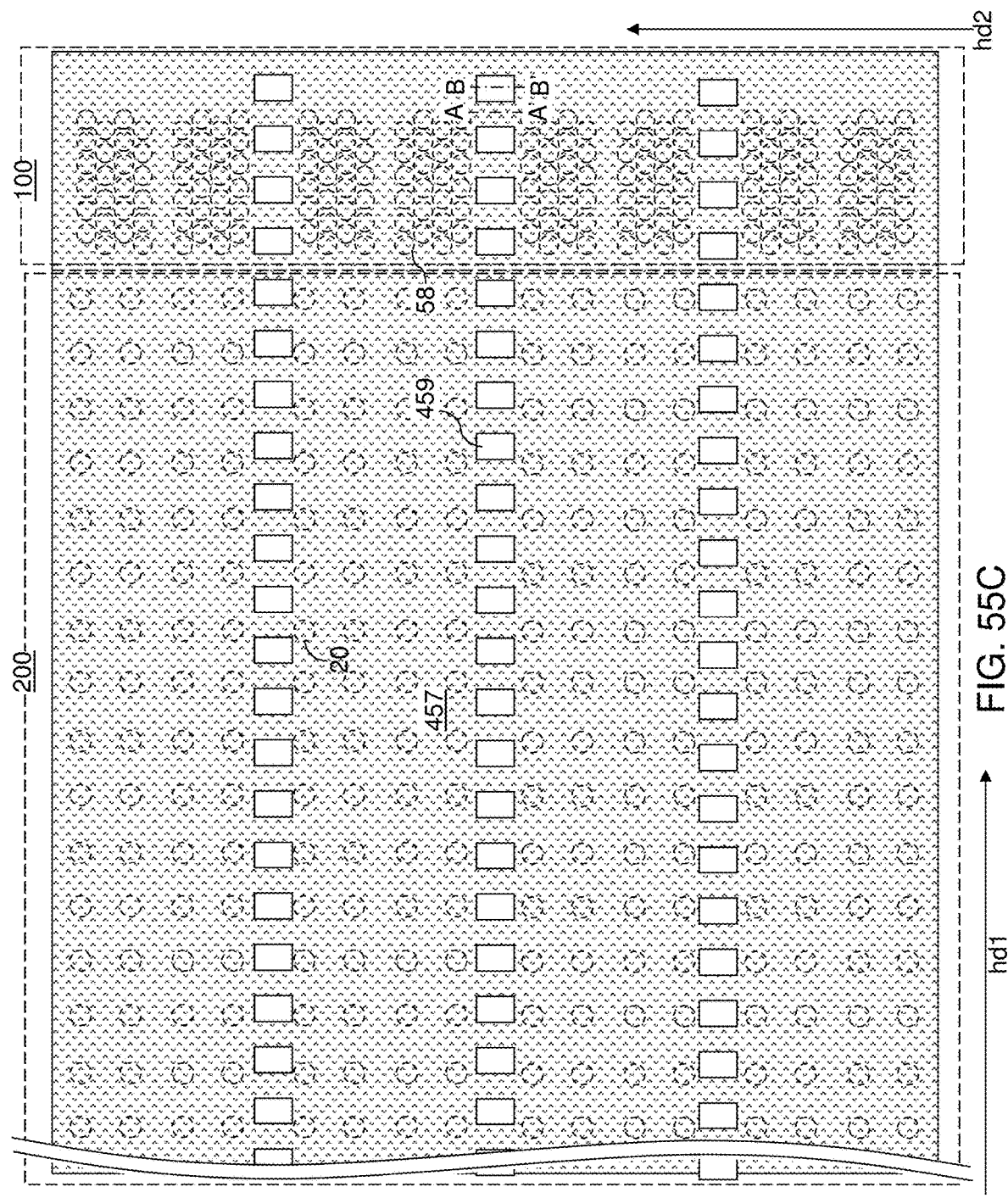
FIG. 55C is a top-down view of the fourth configuration of the second exemplary structure of FIGS. 55A and 55B. The vertical plane A-A' is the vertical cross-sectional plane of FIG. 55A, and the vertical plane B-B' is the vertical cross-sectional plane of FIG. 55B.

Referring to FIGS. 55A-55C, a mask, such as a hard mask and/or a patterned photoresist layer 457 can be applied over the top surface of the outer dielectric fill material layer 273L, and can be lithographically patterned to form rows of openings 459 over areas of the backside trenches 79. Each row of openings 459 can overlap with the area of an underlying backside trench 79, and can include a plurality of openings 459 that are laterally spaced apart along the lengthwise direction of each backside trench 79 (such as the first horizontal direction hd1). In one embodiment, the openings 459 may have a respective rectangular shape or any other suitable shape.

Referring to FIGS. 56A and 56B, unmasked regions of the outer dielectric fill material layer 273L can be etched by an anisotropic etch process. The anisotropic etch process is continued until recessed volumes formed by the anisotropic etch process reaches a bottommost void 179V embedded in unmasked areas of the outer dielectric fill material layer 273L. Physically exposed portions of the conductive liner 182 used as an etch stop and can subsequently be removed from within areas of the openings 459 of the photoresist layer 457. A backside cavity 279 can be formed within each area of the openings 459 in the photoresist layer 457.

Subsequently, the photoresist layer 457 can be removed, for example, by ashing. Remaining horizontal portions of the outer dielectric fill material layer 273L that overlie the first contact level dielectric layer 280 can be removed by an additional anisotropic etch process. The backside cavities 279 can be vertically extended during the additional anisotropic etch process. Each remaining portion of the outer dielectric fill material layer 273L that remains in a backside trench 79 constitutes an outer dielectric fill material portion 273.

Voids 179V can be present within areas in which the outer dielectric fill material layer 273L is masked with the patterned photoresist layer 457 at the processing steps of FIGS. 55A-55C. The backside cavity 279 can vertically extend within areas in which the outer dielectric fill material layer 273L is not masked with the patterned photoresist layer 457 at the processing steps of FIGS. 55A-55C. Each backside cavity 279 vertically extends through volumes of voids that existed at the processing steps of FIGS. 55A-55C, thereby eliminating isolated voids within areas that are not masked with the patterned photoresist layer 457 at the processing steps of FIGS. 55A-55C. Further, voids that are present within areas in which the outer dielectric fill material layer 273L is not masked with the patterned photoresist layer 457 at the processing steps of FIGS. 55A-55C can be laterally connected to a respective one of the backside cavities 279.

Each outer dielectric fill material portion 273 can have a height modulation along the lengthwise direction of a respective backside trench 79. The locations at which an outer dielectric fill material portion 273 has a greater height correspond to areas in which the outer dielectric fill material layer 273L is masked with the patterned photoresist layer 457 at the processing steps of FIGS. 55A-55C, and the locations at which an outer dielectric fill material portion 273 has a lesser height corresponds to areas in which the outer dielectric fill material layer 273L is not masked with the patterned photoresist layer 457 at the processing steps of FIGS. 55A-55C.

Horizontal portions of the conductive liner 182 can be removed from above the first contact level dielectric layer 280. Upper tapered portions of the conductive liner 182 can be removed in areas in which the backside cavities 279 are present. Tapered surfaces of an isolation dielectric spacers 172, a conductive liner 182, and an outer dielectric fill material portion can be physically exposed within each area of the openings 459 through the photoresist layer 457 at the processing steps of FIGS. 55A-55C.

Referring to FIGS. 57A and 57B, a dielectric core material layer 274L can be conformally deposited in the backside cavities 279 and in the voids 179V that are laterally connected to the backside cavities 279, and over the first contact level dielectric layer 280. The dielectric core material layer 274L is deposited on the outer dielectric fill material portions 273 in the backside trenches 79. The dielectric core material layer 274L includes a dielectric core material, which can include undoped silicate glass, a doped silicate glass, or organosilicate glass. The dielectric core material be the same as, or may be different from, the dielectric material of the outer dielectric fill material portions 273. The conformal deposition process that deposits the dielectric core material layer 274L may be, for example, low pressure chemical vapor deposition (LPCVD) process. The dielectric core material layer 274L at least partially fills each of the backside cavities 279 and voids 179V that are laterally connected to the backside cavities 279. In one embodiment, a remaining encapsulated void 179 encapsulated by the dielectric core material layer 274L may be present in one or more of the backside trenches 79. The dielectric core material layer 274L can include laterally-protruding portions 274P that fills respective voids 179V that are laterally connected to a backside cavity 279 at the processing steps of FIGS. 56A and 56B.

Referring to FIGS. 58A and 58B, the dielectric core material layer 274L and upper regions of the outer dielectric fill material portions 273 overlying upper tapered portions of the conductive liner 182 can be vertically recessed by performing the recess etch process of FIG. 42. Portions of the dielectric core material layer 274L and the outer dielectric fill material portions 273 located above a bottom periphery of upper tapered portions of the conductive liner 182 can be removed by a recess etch process, which may employ an anisotropic etch process or an isotropic etch process. The recess etch process can be selective to the material of the conductive liner 182. Each remaining portion of the dielectric core material layer 274L in a backside trench 79 constitutes a dielectric core 274. The outer dielectric fill material portions 273 can be vertically recessed during the recess etch process so that tapered inner sidewalls of the conductive liner 182 are physically exposed with openings in areas that correspond to the areas that are not masked by the photoresist layer 457 at the processing steps of FIGS. 55A-55C. A dielectric core 274 may include one or more laterally-protruding portions 274P that fills a respective void that is laterally connected to a backside cavity 279 at the processing steps of FIGS. 56A and 56B. A composite non-metallic core 476 is formed within each backside trench 79. Each composite non-metallic core 476 includes a dielectric core 274, an outer dielectric fill material portion 273, and optionally one or more void 179 that is encapsulated within the dielectric core 274.

Referring to FIGS. 59A and 59B, the processing steps of FIG. 43 can be performed to form a conductive plug 178 in each upper region of the backside trench 79. The set of all material portions filling a backside trench 79 or extending into a volume of the backside trench 79 constitutes a backside contact assembly 186. Each backside contact assembly 186 can include, and may consist of, an isolation dielectric spacer 172, a conductive liner 182, a composite non-metallic core 476, and a conductive plug 178. The composite non-metallic core 476 includes a dielectric core 274 and an outer dielectric fill material portion 273. A dielectric core 274 may encapsulate one or more void 179 therein. Each void 179 can be entirely encapsulated by an inner surface of a respective dielectric core 274. The conductive plug 178 is formed directly on, and over, the conductive liner 182, the isolation dielectric spacer 172, and the dielectric core 274. Each conductive liner 182 is located on inner sidewalls of an isolation dielectric spacer 172 and a top surface of an underlying semiconductor region, such as the source contact layer 114 or the source region 61. In one embodiment, the conductive liner 182 can consist essentially of a conductive metal nitride. An outer dielectric fill material portion 273 may include laterally-extending cavities that are filled with a laterally-protruding portion 274P of a dielectric core 274.

Referring to FIG. 60, a region of a fifth configuration of the second exemplary structure is illustrated. The fifth configuration of the second exemplary structure can be the same as the first configuration of the exemplary structure illustrated in FIG. 39. Layer 273L may be relatively thin in this embodiment, having a thickness of 5 to 20 nm, such as 10 to 15 nm.

Referring to FIG. 61, an oxidation process is performed to convert a proximal sub-layer of the conductive liner 182 into a metal oxide layer 184. For example, the conductive liner 182 as formed at the processing steps of FIG. 60 can include a metallic nitride material such as TiN, TaN, and/or WN, and the outer dielectric fill material layer 273L can include undoped silicate glass or a doped silicate glass. The oxidation process provides oxygen atoms that diffuse through the outer dielectric fill material layer 273L and reacts a proximal portion (i.e., an inner portion in a backside trench 79 or an upper portion over the first contact level dielectric layer 280) of the conductive liner 182. The proximal portion of the conductive liner 182 is converted into the metal oxide layer 184. If the conductive liner 182 comprises TiN, then the metal oxide layer 184 may comprise titanium oxide (e.g., stoichiometric or non-stoichiometric). The titanium oxide may include some remaining nitrogen. The remaining titanium nitride conductive liner 182 may include some oxygen (e.g., may comprise titanium oxynitride). The thickness of the metal oxide layer 184 can be in a range from 1 nm to 60 nm, such as from 3 nm to 20 nm, although lesser and greater thicknesses can also be employed. The thickness of the remaining portion of the conductive liner 182 can be in a range from 5 nm to 120 nm, such as from 10 nm to 60 nm, although lesser and greater thicknesses can also be employed. The layer stack of the conductive liner 182 and the metal oxide layer 184 constitutes a composite liner stack 582.

The outer dielectric fill material layer 273L can be converted into a densified outer dielectric fill material layer 473L during the oxidation process. The atomic concentration of hydrogen in the densified outer dielectric fill material layer 473L can be less than 50% of the atomic concentration of hydrogen in the outer dielectric fill material layer 273L as deposited.

Figure 62:
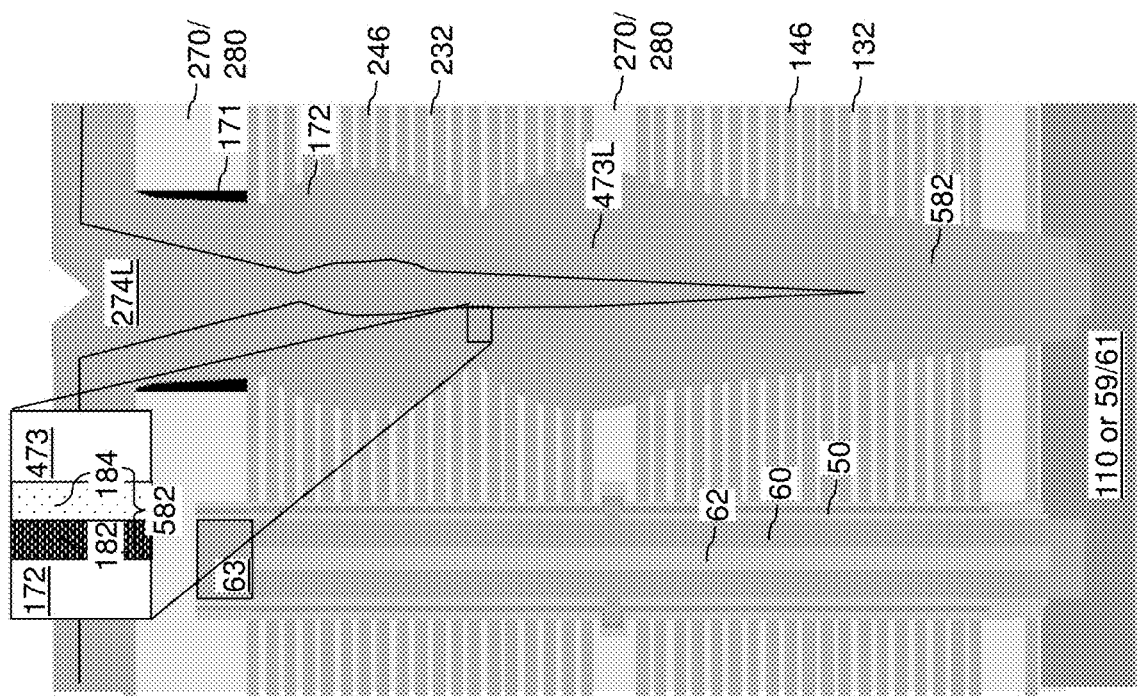
FIG. 62 is a vertical cross-sectional view of a region of the fifth configuration of the second exemplary structure after formation of a dielectric core material layer in each backside trench according to an embodiment of the present disclosure.

Referring to FIG. 62, a dielectric core material layer 274L can be formed by performing the processing steps of FIG. 41. The dielectric core material layer 274L contacts inner sidewalls of the densified outer dielectric fill material layer 473L in each backside trench 79.

Figure 63:
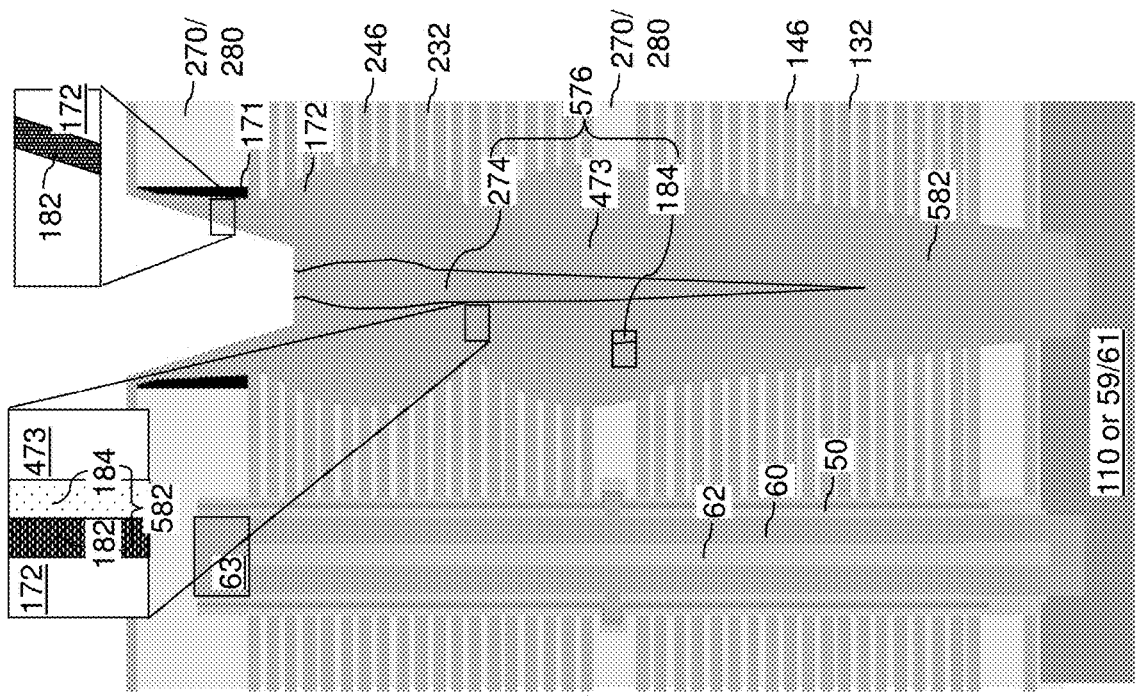
FIG. 63 is a vertical cross-sectional view of a region of the fifth configuration of the second exemplary structure after formation of a dielectric core in each backside trench according to an embodiment of the present disclosure.

Referring to FIG. 63, the dielectric core material layer 274L and the densified outer dielectric fill material layer 473L can be vertically recessed by performing the recess etch process of FIG. 42. Portions of the dielectric core material layer 274L and the densified outer dielectric fill material layer 473L located above a bottom periphery of upper tapered portions of the composite liner stack 582 can be removed by a recess etch process, which may employ an anisotropic etch process or an isotropic etch process. The recess etch process can etch physically exposed portions of the metal oxide layer 184, and can be selective to the material of the conductive liner 182. A tapered sidewall of the conductive liner 182 can be physically exposed in an upper region of each backside trench 79.

Each remaining portion of the dielectric core material layer 274L in a backside trench 79 constitutes a dielectric core 274. Each remaining portion of the densified outer dielectric fill material layer 473L in a backside trench 79 constitutes an outer dielectric fill material portion 473, which can be a continuous dielectric material portion. A composite non-metallic core 576 is formed within each backside trench 79. Each composite non-metallic core 576 includes a dielectric core 274, an outer dielectric fill material portion 473, and a metal oxide layer 184 formed by oxidation of a portion of the conductive liner 182 into dielectric metal oxide.

Referring to FIG. 64, the processing steps of FIG. 43 can be performed to form a conductive plug 178 in each upper region of the backside trench 79. The set of all material portions filling a backside trench 79 or extending into a volume of the backside trench 79 constitutes a backside contact assembly 186. Each backside contact assembly 186 can include, and may consist of, an isolation dielectric spacer 172, a conductive liner 182, a composite non-metallic core 576, and a conductive plug 178. The composite non-metallic core 576 includes a dielectric core 274, an outer dielectric fill material portion 473, and a dielectric metal oxide 184, such as titanium oxide. The conductive plug 178 is formed directly on, and over, the conductive liner 182 and the dielectric core 274 and optionally on an outer dielectric fill material portion 473. Each conductive liner 182 is located on inner sidewalls of an isolation dielectric spacer 172 and a top surface of an underlying semiconductor region, such as the source contact layer 114 or the source region 61. In one embodiment, the conductive liner 182 can consist essentially of a conductive metal nitride.

Figure 65A:
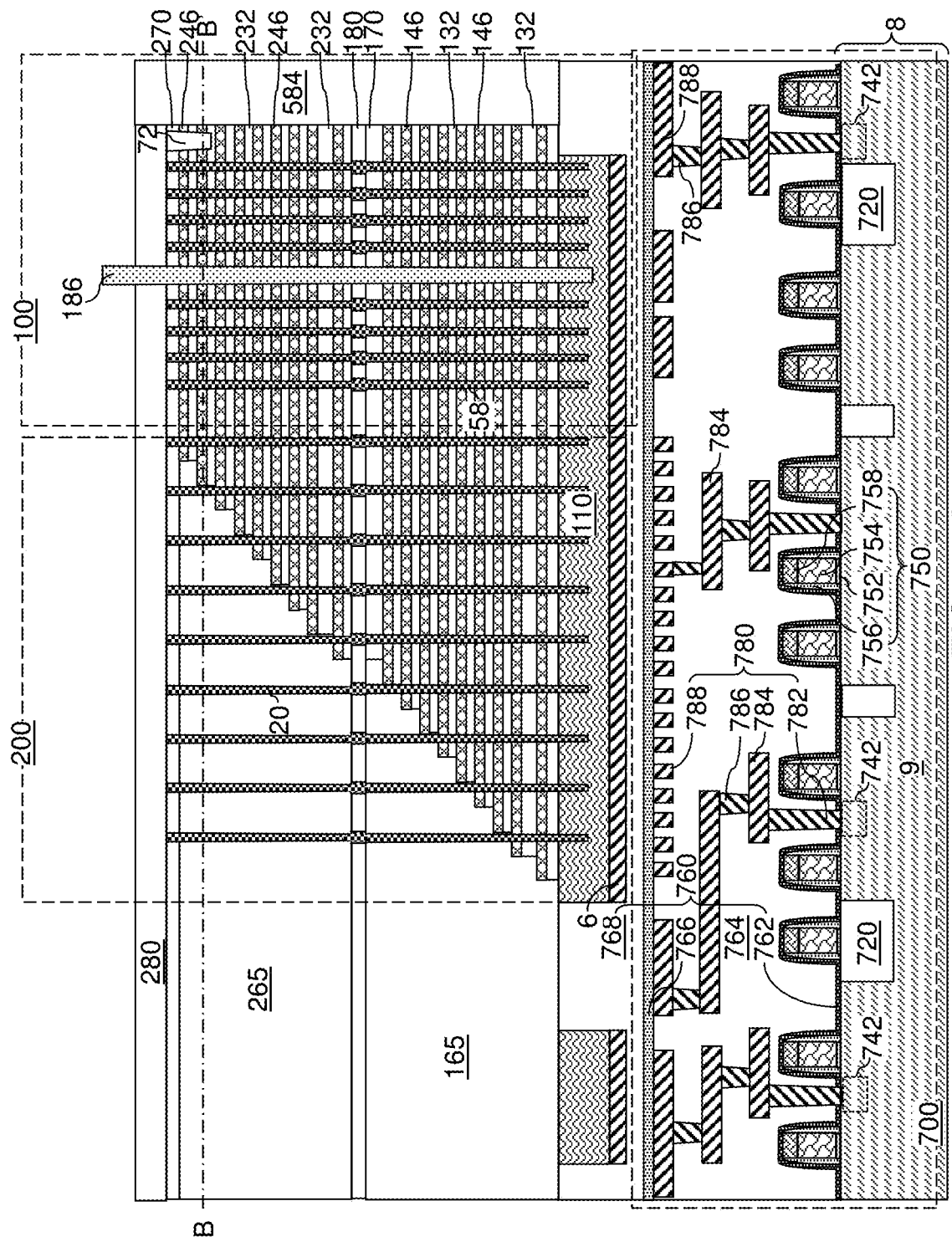
FIG. 65A is a vertical cross-sectional view of the second exemplary structure after formation of backside trench fill structures in the backside trenches according to an embodiment of the present disclosure.
Figure 65C:
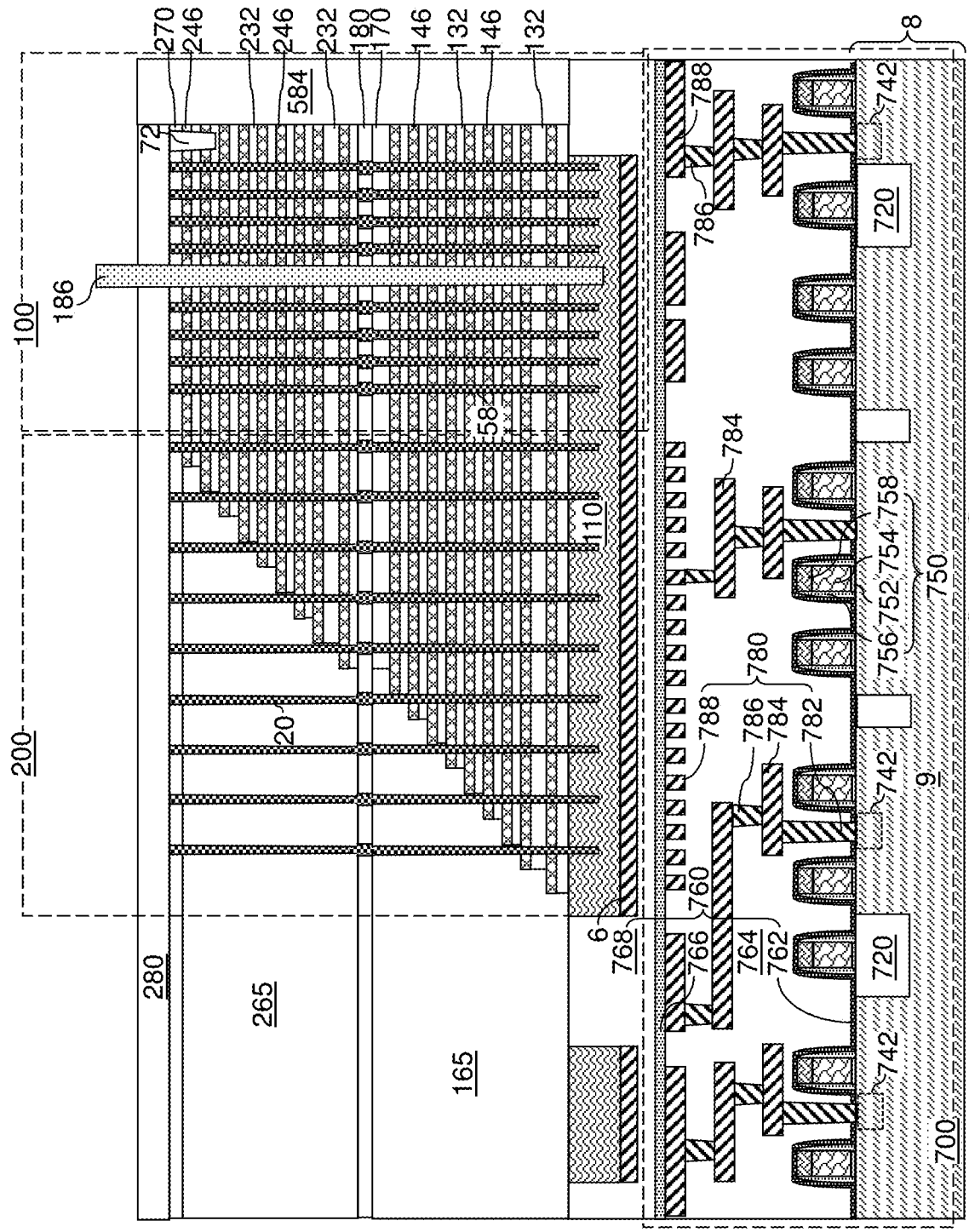
FIG. 65C is a vertical cross-sectional view of the second exemplary structure along the vertical plane C-C' of FIG. 65B.

Referring to FIGS. 65A-65C, the second exemplary structure is illustrated at the processing step of FIG. 43, FIG. 48, FIG. 53, FIGS. 59A and 59B, or FIG. 64. Backside contact assemblies 186 are located in the backside trenches 79 and protrude above the horizontal plane including the top surface of the first contact level dielectric layer 280. Each backside contact assembly 186 includes a laterally-insulated contact via structure that provides electrical contact to an underlying semiconductor region, such as the source contact layer 114 or the source region 61. The isolation dielectric spacer 172 provides electrical isolation from the electrically conductive layers (146, 246) in the alternating stacks (132, 246, 232, 246).

Generally, a backside contact assembly 186 includes a conductive plug 178 overlying a backside trench 79. A composite non-metallic core (176, 276, 376, 476, or 576) contacts a bottom surface of each conductive plug 178. The composite non-metallic core (176, 276, 376, 476, or 576) can comprise at least one outer dielectric fill material portion (273, 673, or 473) laterally enclosed by a lower portion of a conductive liner 182, and a dielectric core 274 contacting an inner sidewall of the at least one outer dielectric fill material portion (273, 673, or 473).

The set of all material portions filling a backside trench 79 or extending into a volume of the backside trench 79 constitutes a backside contact assembly 186. Each backside contact assembly 186 can comprise an isolation dielectric spacer 172, a conductive liner 182, a composite non-metallic core (176, 276, 376, 476, or 576), and a conductive plug 178. The composite non-metallic core (176, 276, 376, 476, or 576) comprises a dielectric core 274 and at least one outer dielectric fill material portion (273, 673, 473). The conductive plug 178 is formed directly on, and over, the conductive liner 182 and the dielectric core 274. Each conductive liner 182 is located on inner sidewalls of an isolation dielectric spacer 172 and a top surface of an underlying semiconductor region, such as the source contact layer 114 or the source region 61. In one embodiment, the conductive liner 182 can consist essentially of a conductive metal nitride, such as TiN.

In one embodiment, a first taper angle α1 of an interface between the conductive liner 182 and the conductive plug 178 is greater than a second taper angle α2 of an interface between the conductive liner 182 and a bottommost one of the at least one outer dielectric fill material portion 273.

In one embodiment, the conductive plug 178 comprises a tapered downward-protruding portion that contacts an inner tapered sidewall of the conductive liner 182 and vertically extending below a horizontal plane including a bottom surface of a topmost electrically conductive layer 246 (such as a topmost one of the second electrically conductive layers 246) within each of the alternating stacks (132, 146, 232, 246).

In one embodiment, the isolation dielectric spacer 172 comprises a vertical outer sidewall segment 1722 and an inner tapered sidewall segment 1724 above a horizontal plane including a topmost electrically conductive layer within the alternating stacks (132, 146, 232, 246).

Figure 66A:
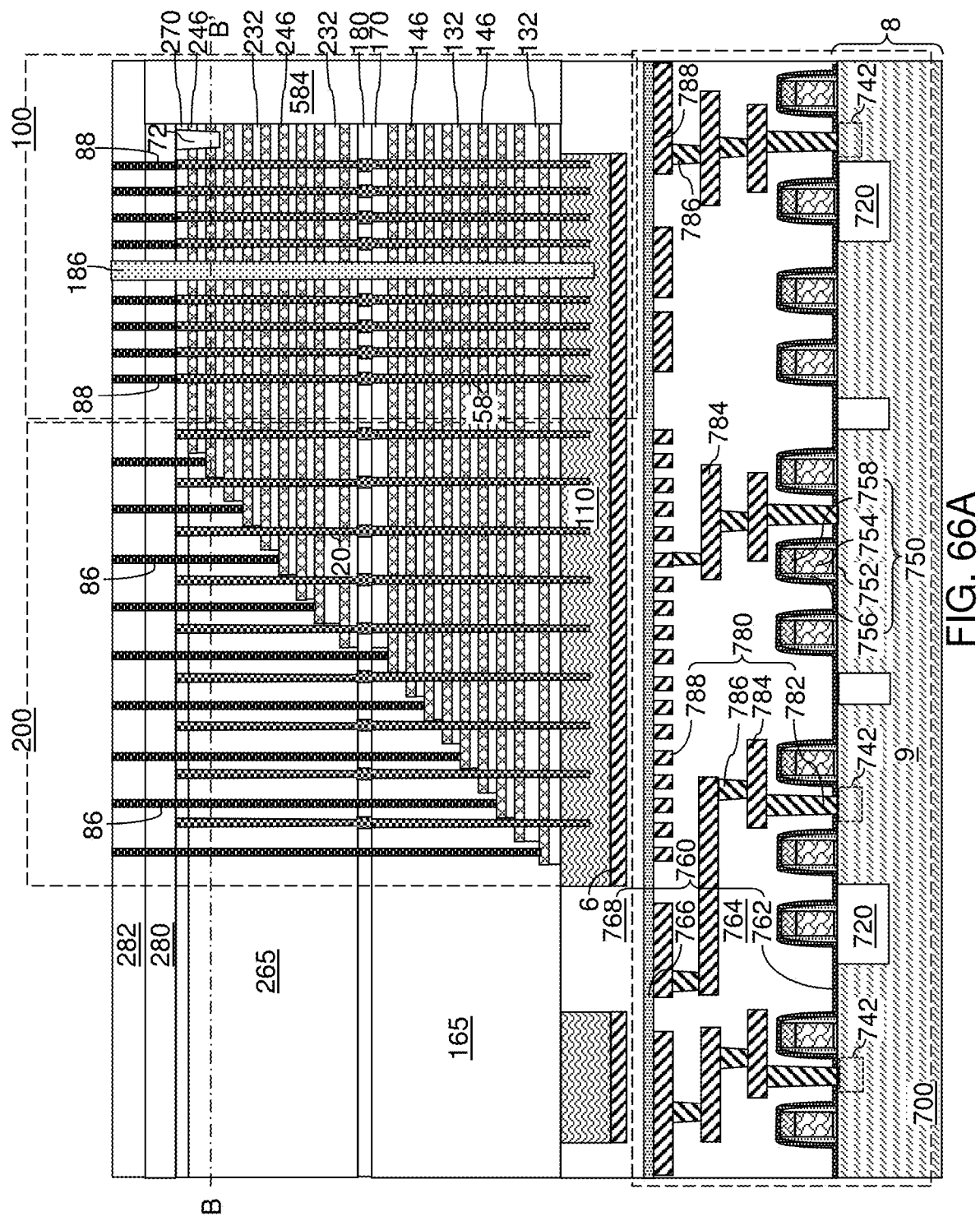
FIG. 66A is a vertical cross-sectional view of the second exemplary structure after formation of a second contact level dielectric layer and various contact via structures according to an embodiment of the present disclosure.
Figure 66B:
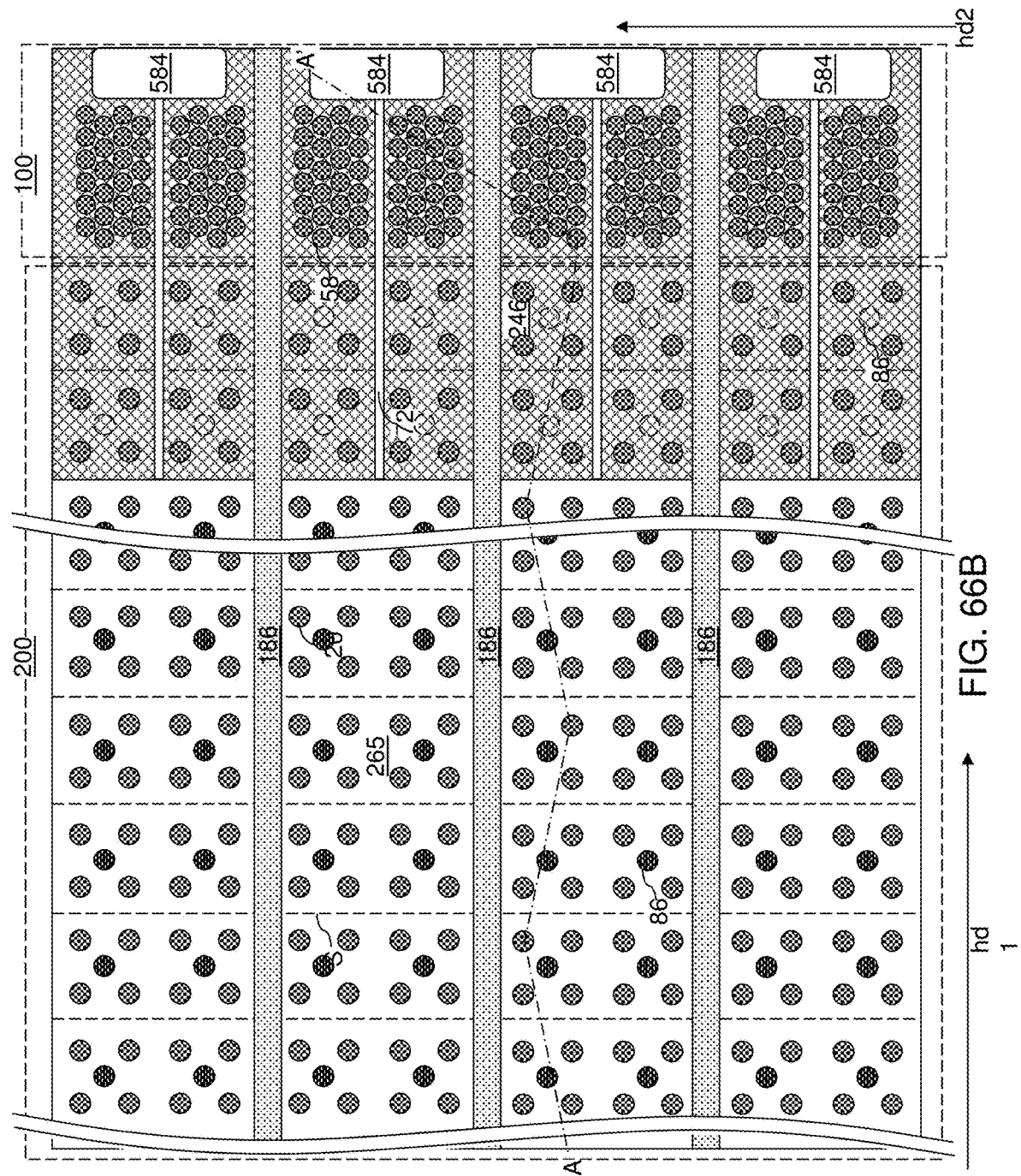
FIG. 66B is a horizontal cross-sectional view of the second exemplary structure along the vertical plane B-B' of FIG. 66A. The hinged vertical plane A-A' corresponds to the plane of the vertical cross-sectional view of FIG. 66A.

Referring to FIGS. 66A and 66B, a second contact level dielectric layer 282 may be formed over the first contact level dielectric layer 280. The second contact level dielectric layer 282 includes a dielectric material such as silicon oxide, and may have a thickness in a range from 100 nm to 600 nm, although lesser and greater thicknesses may also be used.

A photoresist layer (not shown) may be applied over the second contact level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 67:
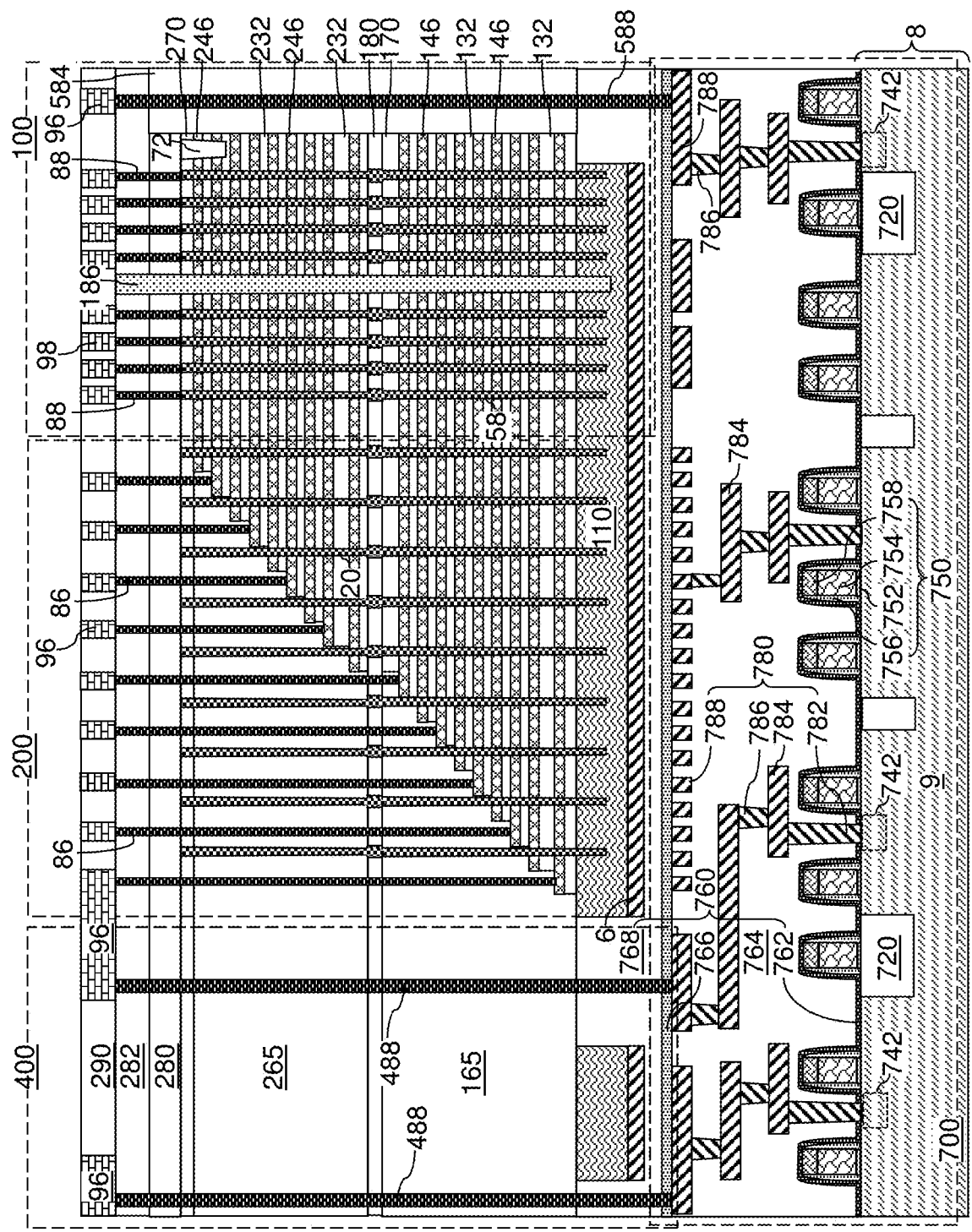
FIG. 67 is a vertical cross-sectional view of the second exemplary structure after formation of through-memory-level via structures and upper metal line structures according to an embodiment of the present disclosure.

Referring to FIG. 67, peripheral-region via cavities may be formed through the second and first contact level dielectric layers (282, 280), the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

Referring to all drawings and according to various embodiments of the present disclosure, a three-dimensional memory device is provided, which comprises: a pair of alternating stacks of insulating layers (132, 232) and electrically conductive layers (146, 246) located over a semiconductor region (such as a source contact layer 114 or a source region 61), and laterally spaced apart from each other by a backside trench 79; memory stack structures 55 extending through the pair of alternating stacks (132, 146, 232, 246); and a backside contact assembly 186 located in the backside trench 79. The backside contact assembly 186 comprises an isolation dielectric spacer 172 contacting a respective pair of alternating stacks (132, 146, 232, 246); a conductive liner 182 contacting inner sidewalls of the isolation dielectric spacer 172 and a top surface of the semiconductor layer; and a composite non-metallic core (176, 276, 376, 476, or 576) comprising at least one outer dielectric fill material portion (273, 673, 473) that is laterally enclosed by a lower portion of the conductive liner 182 and a dielectric core 274 contacting an inner sidewall of the at least one outer dielectric fill material portion (273, 673, 473).

In one embodiment, the backside contact assembly 186 further comprises a conductive plug 178 that contacts the conductive liner 182 and the dielectric core 274.

In one embodiment, a first taper angle $\alpha 1$ of an interface between the conductive liner 182 and the conductive plug 178 is greater than a second taper angle $\alpha 2$ of an interface between the conductive liner 182 and a bottommost one of the at least one outer dielectric fill material portion 273.

In one embodiment, the conductive plug 178 comprises a tapered downward-protruding portion that contacts an inner tapered sidewall of the conductive liner 182 and vertically extending below a horizontal plane including a bottom surface of a topmost electrically conductive layer (such as a topmost one of the second electrically conductive layers 246) within each pair of alternating stacks (132, 146, 232, 246).

In one embodiment, the isolation dielectric spacer 172 comprises a vertical outer sidewall segment 1722 and an inner tapered sidewall segment 1724 above a horizontal plane including a topmost electrically conductive layer within the pair of alternating stacks (132, 146, 232, 246).

In one embodiment, the conductive liner 182 comprises a conductive metal nitride. In one embodiment, each of the at least one outer dielectric fill material portion (273, 673, 473) comprises a dielectric fill material selected from undoped silicate glass, a doped silicate glass, and organosilicate glass.

In one embodiment, the conductive liner 182 comprises at least one tapered segment in which a lateral separation distance between a pair of inner sidewalls of the conductive liner 182 increases with a vertical distance from the semiconductor region (such as the source contact layer 114 or the source region) and at least one reverse-tapered segment in which the lateral separation distance between the pair of inner sidewalls of the conductive liner 182 decreases with the vertical distance from the semiconductor layer.

In one embodiment, the at least one outer dielectric fill material portion (273, 673, 473) comprises a plurality of outer dielectric fill material portions that are vertically spaced apart from each other, and the at least one outer dielectric fill material portion (273, 673, 473) comprises laterally surrounds and contacts the dielectric core 274.

In one embodiment, the composite non-metallic core (176, 276) consists of the at least one outer dielectric fill material portion (273, 473) and the dielectric core 274.

In one embodiment, the composite non-metallic core 376 comprises at least one semiconductor fill material portion 373 including a semiconductor fill material, wherein the at least one outer dielectric fill material portion 673 comprises an oxide of the semiconductor fill material.

In one embodiment, the at least one outer dielectric fill material portion 273 includes laterally-extending cavities that are filled with a laterally-protruding portion 274P of the dielectric core 274. In one embodiment, the backside contact assembly further comprises a metal oxide layer 184.

In one embodiment, the conductive plug 178 comprises at least one first tapered sidewall that contacts a respective tapered inner sidewall of the conductive liner 182 and laterally spaced from the isolation dielectric spacer 172 (illustrated in FIG. 59A); and at least one second tapered sidewall that contacts a respective tapered inner sidewall of an upper portion of the isolation dielectric spacer 172 (as illustrated in FIG. 59B). In one embodiment, the at least one first tapered sidewall of the conductive plug 178 comprises a plurality of first tapered sidewalls; and the at least one second tapered sidewall of the conductive plug 178 comprises a plurality of second tapered sidewalls that alternate with the plurality of first tapered sidewalls along a lengthwise direction of the backside contact assembly 186.

The backside contact assembly 186 includes a composite non-metallic core (176, 276, 376, 476, or 576), which includes at least one non-metallic material. The composite non-metallic core (176, 276, 376, 476, or 576) can consist of dielectric material portions or can include dielectric material portions and semiconductor material portions. The non-metallic material of the composite non-metallic core (176, 276, 376, 476, or 576) that reduces mechanical stress in the backside trenches 79. Specifically, the silicate glass material in at least one outer dielectric fill material portion (273, 473) and the dielectric core 274, the semiconductor material in the optional semiconductor fill material portions 373, and the dielectric metal oxide in the optional metal oxide layer 184 can absorb, and/or compensate for, the stress generated by the electrically conductive layers (146, 246) in the alternating stacks (132, 146, 232, 246). Thus, the composite non-metallic core (176, 276, 376, 476, or 576) can reduce the stress and the resultant substrate warping.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
a pair of alternating stacks of insulating layers and electrically conductive layers located over a semiconductor region, and laterally spaced from each other by a backside trench;
memory stack structures extending through the pair of alternating stacks of insulating layers and electrically conductive layers, each memory stack structure comprising a vertical semiconductor channel and a memory film; and
a backside contact assembly located in the backside trench and comprising:
an isolation dielectric spacer contacting the pair of alternating stacks;
a conductive liner contacting inner sidewalls of the isolation dielectric spacer and a top surface of the semiconductor region; and
a composite non-metallic core comprising:
at least one outer dielectric fill material portion that is laterally enclosed by a lower portion of the conductive liner; and
a dielectric core contacting an inner sidewall of the at least one outer dielectric fill material portion,
wherein the backside contact assembly further comprises a conductive plug that contacts the conductive liner and the dielectric core, and
wherein the three-dimensional memory device comprises at least one feature selected from:
a first feature that a first taper angle of an interface between the conductive liner and the conductive plug is greater than a second taper angle of an interface between the conductive liner and a bottommost one of the at least one outer dielectric fill material portion;
a second feature that the conductive plug comprises a tapered downward-protruding portion that contacts an inner tapered sidewall of the conductive liner and vertically extending below a horizontal plane including a bottom surface of a topmost electrically conductive layer within each pair of the alternating stacks;
a third feature that the isolation dielectric spacer comprises a vertical outer sidewall segment and an inner tapered sidewall segment above a horizontal plane including a topmost electrically conductive layer within each pair of the alternating stacks; or
a fourth feature that the conductive plug comprises at least one first tapered sidewall that contacts a respective tapered inner sidewall of the conductive liner and laterally spaced from the isolation dielectric spacer, and at least one second tapered sidewall that contacts a respective tapered inner sidewall of an upper portion of the isolation dielectric spacer.

2. The three-dimensional memory device of claim 1, wherein the three-dimensional memory device comprises the first feature.

3. The three-dimensional memory device of claim 1, wherein the three-dimensional memory device comprises the second.

4. The three-dimensional memory device of claim 1, wherein the three-dimensional memory device comprises the third feature.

5. The three-dimensional memory device of claim 1, wherein the conductive liner comprises a conductive metal nitride.

6. The three-dimensional memory device of claim 1, wherein each of the at least one outer dielectric fill material portion comprises a dielectric fill material selected from undoped silicate glass, a doped silicate glass, and organosilicate glass.

7. The three-dimensional memory device of claim 6, wherein the conductive liner comprises at least one tapered segment in which a lateral separation distance between a pair of inner sidewalls of the conductive liner increases with a vertical distance from the semiconductor region and at least one reverse-tapered segment in which the lateral separation distance between the pair of inner sidewalls of the conductive liner decreases with the vertical distance from the semiconductor region.

8. The three-dimensional memory device of claim 6, wherein the at least one outer dielectric fill material portion comprises a plurality of outer dielectric fill material portions that are vertically spaced apart from each other, and the at least one outer dielectric fill material portion laterally surrounds and contacts the dielectric core.

9. The three-dimensional memory device of claim 6, wherein the composite non-metallic core consists of the at least one outer dielectric fill material portion and the dielectric core.

10. The three-dimensional memory device of claim 6, wherein the composite non-metallic core comprises at least one semiconductor fill material, wherein the at least one outer dielectric fill material portion comprises an oxide of the semiconductor fill material.

11. The three-dimensional memory device of claim 6, wherein the at least one outer dielectric fill material portion includes laterally-extending cavities that are filled with a laterally-protruding portion of the dielectric core.

12. The three-dimensional memory device of claim 6, wherein the backside contact assembly further comprises a metal oxide layer.

13. The three-dimensional memory device of claim 1, wherein the three-dimensional memory device comprises the fourth feature.

14. A three-dimensional memory device, comprising:
a pair of alternating stacks of insulating layers and electrically conductive layers located over a semiconductor region, and laterally spaced from each other by a backside trench;
memory stack structures extending through the pair of alternating stacks of insulating layers and electrically conductive layers, each memory stack structure comprising a vertical semiconductor channel and a memory film; and
a backside contact assembly located in the backside trench and comprising:
an isolation dielectric spacer contacting the pair of alternating stacks;
a conductive liner contacting inner sidewalls of the isolation dielectric spacer and a top surface of the semiconductor region; and
a composite non-metallic core comprising:
at least one outer dielectric fill material portion that is laterally enclosed by a lower portion of the conductive liner; and
a dielectric core contacting an inner sidewall of the at least one outer dielectric fill material portion,
wherein each of the at least one outer dielectric fill material portion comprises a dielectric fill material selected from undoped silicate glass, a doped silicate glass, and organosilicate glass; and wherein the three-dimensional memory device comprises at least one feature selected from:
- a first feature that the conductive liner comprises at least one tapered segment in which a lateral separation distance between a pair of inner sidewalls of the conductive liner increases with a vertical distance from the semiconductor region and at least one reverse-tapered segment in which the lateral separation distance between the pair of inner sidewalls of the conductive liner decreases with the vertical distance from the semiconductor region;
- a second feature that the at least one outer dielectric fill material portion comprises a plurality of outer dielectric fill material portions that are vertically spaced apart from each other, and the at least one outer dielectric fill material portion laterally surrounds and contacts the dielectric core;
- a third feature that the composite non-metallic core comprises at least one semiconductor fill material, wherein the at least one outer dielectric fill material portion comprises an oxide of the semiconductor fill material;
- a fourth feature that the at least one outer dielectric fill material portion includes laterally-extending cavities that are filled with a laterally-protruding portion of the dielectric core; or
- a fifth feature that the backside contact assembly further comprises a metal oxide layer.

15. The three-dimensional memory device of claim 14, wherein the three-dimensional memory device comprises the first feature.

16. The three-dimensional memory device of claim 14, wherein the three-dimensional memory device comprises the second feature.

17. The three-dimensional memory device of claim 14, wherein the three-dimensional memory device comprises the third feature.

18. The three-dimensional memory device of claim 14, wherein the three-dimensional memory device comprises the fourth feature.

19. The three-dimensional memory device of claim 14, wherein the three-dimensional memory device comprises the fifth feature.

* * * * *